(12) United States Patent
Anderson et al.

(10) Patent No.: US 9,140,859 B2
(45) Date of Patent: Sep. 22, 2015

(54) MANAGED FIBER CONNECTIVITY SYSTEMS

(75) Inventors: John Anderson, Eden Prairie, MN (US); Steven J. Brandt, Savage, MN (US); Joseph C. Coffey, Burnsville, MN (US); Kamlesh G. Patel, Chanhassen, MN (US); Cyle D. Petersen, Belle Plaine, MN (US); Michael D. Schroeder, Webster, MN (US); John Stasny, Lake Elmo, MN (US)

(73) Assignee: Tyco Electronics Services GMBH, Schaffhausen (CH)

( * ) Notice: Subject to any disclaimer, the term of this patent is extended or adjusted under 35 U.S.C. 154(b) by 1134 days.

(21) Appl. No.: 13/025,784

(22) Filed: Feb. 11, 2011

(65) Prior Publication Data

US 2011/0222819 A1 Sep. 15, 2011

Related U.S. Application Data

(60) Provisional application No. 61/303,961, filed on Feb. 12, 2010, provisional application No. 61/413,828, filed on Nov. 15, 2010, provisional application No. 61/437,504, filed on Jan. 28, 2011.

(51) Int. Cl.
*G02B 6/36* (2006.01)
*G02B 6/38* (2006.01)
*G02B 6/40* (2006.01)
*H05K 1/02* (2006.01)

(52) U.S. Cl.
CPC ............ *G02B 6/3807* (2013.01); *G02B 6/3825* (2013.01); *G02B 6/3879* (2013.01); *G02B 6/3895* (2013.01); *G02B 6/3897* (2013.01); *G02B 6/403* (2013.01); *H05K 1/0274* (2013.01)

(58) Field of Classification Search
USPC ............................................. 385/78
See application file for complete search history.

(56) References Cited

U.S. PATENT DOCUMENTS

| 3,243,761 | A | 3/1966 | Piorunneck |
| RE26,692 | E | 10/1969 | Ruehlemann |
| 3,954,320 | A | 5/1976 | Hardesty |
| 4,127,317 | A | 11/1978 | Tyree |

(Continued)

FOREIGN PATENT DOCUMENTS

| CA | 2499803 | 4/2004 |
| CN | 101968558 A | 2/2011 |

(Continued)

OTHER PUBLICATIONS

International Search Report and Written Opinion mailed Sep. 12, 2011 in related Application No. PCT/US2011/024652 (28 pages).

(Continued)

*Primary Examiner* — Uyen Chau N Le
*Assistant Examiner* — Hoang Tran
(74) *Attorney, Agent, or Firm* — Merchant & Gould P.C.

(57) ABSTRACT

A communications connection system includes a fiber optic connector including a storage device having memory configured to store physical layer information. The storage device also includes at least one contact member that is electrically connected to the memory. Certain types of fiber optic connectors have the storage device mounted to a key of the fiber optic connector. Certain types of fiber optic connectors have the storage device mounted in a cavity defined in the fiber optic connector.

35 Claims, 79 Drawing Sheets

(56) References Cited

U.S. PATENT DOCUMENTS

| | | |
|---|---|---|
| 4,737,120 A | 4/1988 | Grabbe et al. |
| 4,953,194 A | 8/1990 | Hansen et al. |
| 4,968,929 A | 11/1990 | Hauck et al. |
| 5,041,005 A | 8/1991 | McHugh |
| 5,052,940 A | 10/1991 | Bengal |
| 5,064,381 A | 11/1991 | Lin |
| 5,107,532 A | 4/1992 | Hansen et al. |
| 5,161,988 A | 11/1992 | Krupka |
| 5,166,970 A | 11/1992 | Ward |
| 5,199,895 A | 4/1993 | Chang |
| 5,222,164 A | 6/1993 | Bass, Sr. et al. |
| 5,265,187 A | 11/1993 | Morin et al. |
| 5,305,405 A | 4/1994 | Emmons et al. |
| 5,353,367 A | 10/1994 | Czosnowski et al. |
| 5,393,249 A | 2/1995 | Morgenstern et al. |
| 5,394,503 A | 2/1995 | Dietz, Jr. et al. |
| 5,413,494 A | 5/1995 | Dewey et al. |
| 5,418,334 A | 5/1995 | Williams |
| 5,419,717 A | 5/1995 | Abendschein et al. |
| 5,448,675 A | 9/1995 | Leone et al. |
| 5,467,062 A | 11/1995 | Burroughs |
| 5,470,251 A | 11/1995 | Sano |
| 5,473,715 A | 12/1995 | Schofield et al. |
| 5,483,467 A | 1/1996 | Krupka et al. |
| 5,579,425 A | 11/1996 | Lampert et al. |
| 5,674,085 A | 10/1997 | Davis et al. |
| 5,685,741 A | 11/1997 | Dewey et al. |
| 5,712,942 A | 1/1998 | Jennings et al. |
| 5,800,192 A | 9/1998 | David et al. |
| 5,821,510 A | 10/1998 | Cohen et al. |
| 5,854,824 A | 12/1998 | Bengal et al. |
| 5,871,368 A | 2/1999 | Erdner et al. |
| 5,910,776 A | 6/1999 | Black |
| 6,002,331 A | 12/1999 | Laor |
| 6,095,837 A | 8/2000 | David et al. |
| 6,095,851 A | 8/2000 | Laity et al. |
| 6,116,961 A | 9/2000 | Henneberger et al. |
| 6,222,908 B1 | 4/2001 | Bartolutti et al. |
| 6,222,975 B1 | 4/2001 | Gilbert et al. |
| 6,227,911 B1 | 5/2001 | Boutros et al. |
| 6,234,830 B1 | 5/2001 | Ensz et al. |
| 6,238,235 B1 | 5/2001 | Shavit et al. |
| 6,280,231 B1 | 8/2001 | Nicholls |
| 6,285,293 B1 | 9/2001 | German et al. |
| 6,300,877 B1 | 10/2001 | Schannach et al. |
| 6,330,148 B1 | 12/2001 | Won et al. |
| 6,330,307 B1 | 12/2001 | Bloch et al. |
| 6,350,148 B1 | 2/2002 | Bartolutti et al. |
| 6,364,694 B1 | 4/2002 | Lien |
| 6,409,392 B1 | 6/2002 | Lampert et al. |
| 6,421,322 B1 | 7/2002 | Koziy et al. |
| 6,422,895 B1 | 7/2002 | Lien |
| 6,424,710 B1 | 7/2002 | Bartolutti et al. |
| 6,437,894 B1 | 8/2002 | Gilbert et al. |
| 6,456,768 B1 | 9/2002 | Boncek et al. |
| D466,479 S | 12/2002 | Pein et al. |
| 6,499,861 B1 | 12/2002 | German et al. |
| 6,511,231 B2 | 1/2003 | Lampert et al. |
| 6,522,737 B1 | 2/2003 | Bartolutti et al. |
| 6,554,484 B2 | 4/2003 | Lampert |
| 6,574,586 B1 | 6/2003 | David et al. |
| 6,612,856 B1 | 9/2003 | McCormack |
| 6,626,697 B1 | 9/2003 | Martin et al. |
| 6,636,152 B2 | 10/2003 | Schannach et al. |
| 6,684,179 B1 | 1/2004 | David |
| 6,725,177 B2 | 4/2004 | David et al. |
| 6,743,044 B2 | 6/2004 | Musolf et al. |
| 6,793,408 B2 | 9/2004 | Levy et al. |
| 6,802,735 B2 | 10/2004 | Pepe et al. |
| 6,808,116 B1 | 10/2004 | Eslambolchi et al. |
| 6,811,446 B1 | 11/2004 | Chang |
| 6,814,624 B2 | 11/2004 | Clark et al. |
| 6,850,685 B2 | 2/2005 | Tinucci et al. |
| 6,898,368 B2 | 5/2005 | Colombo et al. |
| 6,905,363 B2 | 6/2005 | Musolf et al. |
| 6,932,517 B2 | 8/2005 | Swayze et al. |
| D510,068 S | 9/2005 | Haggay et al. |
| 6,939,168 B2 | 9/2005 | Oleynick et al. |
| 6,961,675 B2 | 11/2005 | David |
| 6,971,895 B2 | 12/2005 | Sago et al. |
| 6,976,867 B2 | 12/2005 | Navarro et al. |
| 7,077,710 B2 | 7/2006 | Haggay et al. |
| 7,081,808 B2 | 7/2006 | Colombo et al. |
| 7,088,880 B1 | 8/2006 | Gershman |
| 7,112,090 B2 | 9/2006 | Caveney et al. |
| 7,123,810 B2 | 10/2006 | Parrish |
| 7,153,142 B2 | 12/2006 | Shifris et al. |
| 7,165,728 B2 | 1/2007 | Durrant et al. |
| 7,193,422 B2 | 3/2007 | Velleca et al. |
| 7,207,819 B2 | 4/2007 | Chen |
| 7,210,858 B2 | 5/2007 | Sago et al |
| 7,226,217 B1 * | 6/2007 | Benton et al. .................. 385/89 |
| 7,234,944 B2 | 6/2007 | Nordin et al. |
| 7,241,157 B2 | 7/2007 | Zhuang et al. |
| 7,297,018 B2 | 11/2007 | Caveney et al. |
| 7,300,214 B2 | 11/2007 | Doo et al. |
| 7,312,715 B2 | 12/2007 | Shalts et al. |
| D559,186 S | 1/2008 | Kelmer |
| 7,315,224 B2 | 1/2008 | Gurovich et al. |
| 7,352,289 B1 | 4/2008 | Harris |
| 7,356,208 B2 | 4/2008 | Becker |
| 7,370,106 B2 | 5/2008 | Caveney |
| 7,384,300 B1 | 6/2008 | Salgado et al. |
| 7,396,245 B2 | 7/2008 | Huang et al. |
| 7,458,517 B2 | 12/2008 | Durrant et al. |
| 7,479,032 B2 | 1/2009 | Hoath et al. |
| 7,490,996 B2 | 2/2009 | Sommer |
| 7,497,709 B1 | 3/2009 | Zhang |
| 7,519,000 B2 | 4/2009 | Caveney et al. |
| 7,534,137 B2 | 5/2009 | Caveney et al. |
| 7,552,872 B2 | 6/2009 | Tokita et al. |
| 7,563,116 B2 | 7/2009 | Wang |
| 7,570,861 B2 | 8/2009 | Smrha et al. |
| 7,575,454 B1 | 8/2009 | Aoki et al. |
| 7,588,470 B2 | 9/2009 | Li et al. |
| 7,591,667 B2 | 9/2009 | Gatnau Navarro et al. |
| 7,607,926 B2 | 10/2009 | Wang |
| 7,635,280 B1 | 12/2009 | Crumlin et al. |
| 7,648,377 B2 | 1/2010 | Naito et al. |
| 7,682,174 B2 | 3/2010 | Chen |
| 7,722,370 B2 | 5/2010 | Chin |
| 7,727,026 B2 | 6/2010 | Qin et al. |
| 7,785,154 B2 | 8/2010 | Peng |
| 7,798,832 B2 | 9/2010 | Qin et al. |
| 7,811,119 B2 | 10/2010 | Caveney et al. |
| 7,814,240 B2 | 10/2010 | Salgado et al. |
| 7,867,017 B1 | 1/2011 | Chen |
| 7,869,426 B2 | 1/2011 | Hough et al. |
| 7,872,738 B2 | 1/2011 | Abbott |
| 7,880,475 B2 | 2/2011 | Crumlin et al. |
| 7,934,022 B2 | 4/2011 | Velleca et al. |
| 8,157,582 B2 | 4/2012 | Frey et al. |
| 8,282,425 B2 | 10/2012 | Bopp et al. |
| 8,287,316 B2 | 10/2012 | Pepe et al. |
| 8,690,593 B2 | 4/2014 | Anderson et al. |
| 2002/0008613 A1 | 1/2002 | Nathan et al. |
| 2002/0081076 A1 | 6/2002 | Lampert et al. |
| 2003/0031423 A1 | 2/2003 | Zimmel |
| 2004/0052471 A1 * | 3/2004 | Colombo et al. .................. 385/53 |
| 2004/0052498 A1 | 3/2004 | Colombo et al. |
| 2004/0117515 A1 | 6/2004 | Sago et al. |
| 2004/0240807 A1 | 12/2004 | Frohlich et al. |
| 2005/0249477 A1 | 11/2005 | Parrish |
| 2006/0160395 A1 | 7/2006 | Macauley et al. |
| 2006/0193591 A1 | 8/2006 | Rapp et al. |
| 2006/0228086 A1 | 10/2006 | Holmberg et al. |
| 2007/0116411 A1 | 5/2007 | Benton et al. |
| 2007/0237470 A1 | 10/2007 | Aronson et al. |
| 2007/0254529 A1 | 11/2007 | Pepe et al. |
| 2008/0090450 A1 | 4/2008 | Harano et al. |
| 2008/0090454 A1 | 4/2008 | Hoath et al. |
| 2008/0100456 A1 | 5/2008 | Downie et al. |
| 2008/0100467 A1 | 5/2008 | Downie et al. |
| 2008/0175532 A1 | 7/2008 | Ruckstuhl et al. |

(56) References Cited

U.S. PATENT DOCUMENTS

| | | |
|---|---|---|
| 2008/0175550 A1 | 7/2008 | Coburn et al. |
| 2009/0034911 A1 | 2/2009 | Murano |
| 2009/0097846 A1 | 4/2009 | Kozischek et al. |
| 2009/0148106 A1* | 6/2009 | Moore et al. .................... 385/89 |
| 2009/0166404 A1 | 7/2009 | German et al. |
| 2009/0215310 A1 | 8/2009 | Hoath et al. |
| 2009/0232455 A1 | 9/2009 | Nhep |
| 2010/0048064 A1 | 2/2010 | Peng |
| 2010/0211664 A1 | 8/2010 | Raza et al. |
| 2010/0211665 A1 | 8/2010 | Raza et al. |
| 2010/0211697 A1 | 8/2010 | Raza et al. |
| 2010/0215049 A1 | 8/2010 | Raza et al. |
| 2010/0303421 A1 | 12/2010 | He et al. |
| 2011/0043371 A1 | 2/2011 | German et al. |
| 2011/0115494 A1 | 5/2011 | Taylor et al. |
| 2011/0235979 A1 | 9/2011 | Anderson et al. |
| 2011/0255829 A1 | 10/2011 | Anderson et al. |
| 2011/0262077 A1 | 10/2011 | Anderson et al. |
| 2012/0003877 A1 | 1/2012 | Bareel et al. |
| 2012/0021636 A1 | 1/2012 | Debenedictis et al. |
| 2012/0208401 A1 | 8/2012 | Petersen |
| 2014/0038462 A1 | 2/2014 | Coffey et al. |
| 2014/0219656 A1 | 8/2014 | Lawson et al. |

FOREIGN PATENT DOCUMENTS

| | | |
|---|---|---|
| DE | 102 44 304 | 3/2004 |
| DE | 10 2004 033 940 A1 | 2/2006 |
| EP | 1 199 586 A2 | 4/2002 |
| EP | 1 237 024 A1 | 9/2002 |
| EP | 1 467 232 A1 | 10/2004 |
| EP | 1 662 287 A1 | 5/2006 |
| JP | 04-174406 | 6/1992 |
| WO | WO 00/65696 | 11/2000 |
| WO | WO 02/47215 A1 | 6/2002 |
| WO | WO 2007/061490 A2 | 5/2007 |
| WO | WO 2010/001400 A1 | 1/2010 |
| WO | WO 2010/081186 A1 | 7/2010 |
| WO | WO 2010/121639 A1 | 10/2010 |

OTHER PUBLICATIONS

International Search Report and Written Opinion mailed Sep. 19, 2011 in related Application No. PCT/US2011/024649 (27 pages).

International Search Report and Written Opinion mailed Sep. 22, 2011 in related Application No. PCT/US2011/024653 (25 pages).

International Search Report and Written Opinion mailed May 23, 2011 in related Application No. PCT/US2011/024650 (17 pages).

Partial International Search and Invitation to Pay Additional Fees mailed May 19, 2011 in related Application No. PCT/US2011/024653 (6 pages).

Ohtsuki, F. et al., "Design of Optical Connectors with ID Modules," *Electronics and Communications in Japan*, Part 1, vol. 77, No. 2, pp. 94-105 (Feb. 1994).

Partial International Search and Invitation to Pay Additional Fees mailed Jun. 8, 2011 in related Application No. PCT/US2011/024649 (8 pages).

Partial International Search and Invitation to Pay Additional Fees mailed Jun. 16, 2011 in related Application No. PCT/US2011/024652 (9 pages).

*Avaya's Enhanced Systimax® iPatch System Enables IT Managers to Optimise Network Efficiency and Cut Downtime*, Press Release, May 20, 2003, obtained from http://www.avaya.com/usa/about-avaya/newsroom/news-releases/2003/pr-030520 on Jan. 7, 2009.

*Avaya's Enhanced Systimax® iPatch System Enables IT Managers to Optimise Network Efficiency and Cut Downtime*, Press Release, May 9, 2003, obtained from http://www.avaya.com/usa/about-avaya/newsroom/news-releases/2003/pr-030509 on Jan. 7, 2009.

*Intelligent patching systems carving out a 'large' niche*, Cabling Installation & Maintenance, vol. 12, Issue 7, Jul. 2004 (5 pages).

*intelliMAC: The intelligent way to make Moves, Adds or Changes!* NORDX/CDT © 2003 (6 pages).

Meredith, L., "Managers missing point of intelligent patching," *Daa Center News*, Jun. 21, 2005, obtained Dec. 2, 2008 from http://searchdatacenter.techtarget.com/news/article/0,289142,sid80_gci1099991,00.html.

*Systimax® iPatch System Wins Platinum Network of the Year Award*, Press Release, Jan. 30, 2003, obtained from http://www.avaya.com/usa/about-avaya/newsroom/news-releases/2003/pr-030130a on Jan. 7, 2009.

FOCIS 10—Fiber Optic Connector Intermateability Standard—Type LC, TIA/EIA-604-10A, 38 pages (Mar. 2002).

International Search Report and Written Opinion for PCT/US2013/053441 mailed Dec. 16, 2013.

iTRACS Physical Layer Manager FAQ, obtained on Jun. 11, 2008 from http://www.itracs.com/products/physical-layer-manager-faqs.html (6 pages).

TrueNet; TFP Series Rack Mount Fiber Panels, Spec Sheet; May 2008; 8 pages.

\* cited by examiner

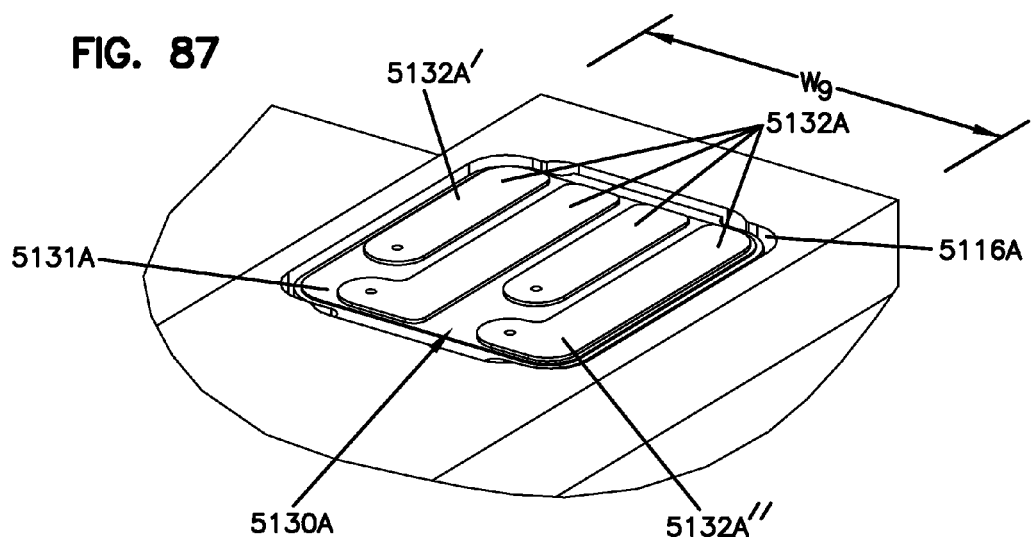
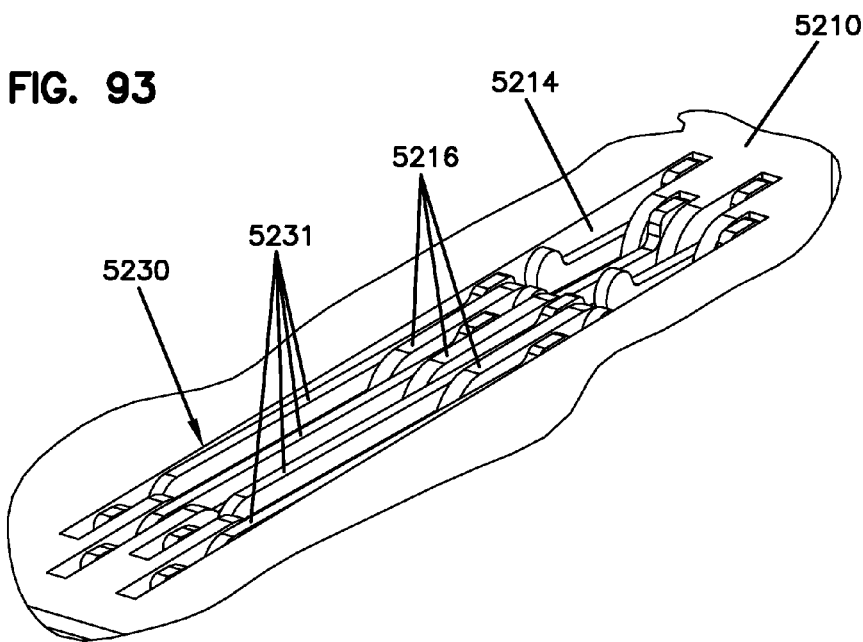

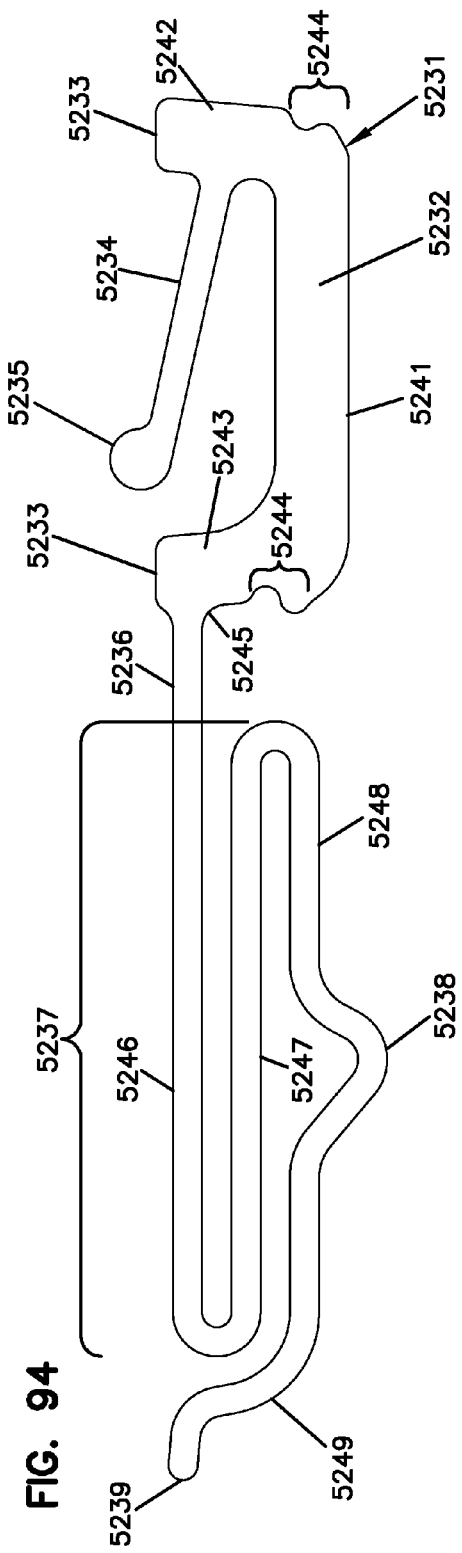
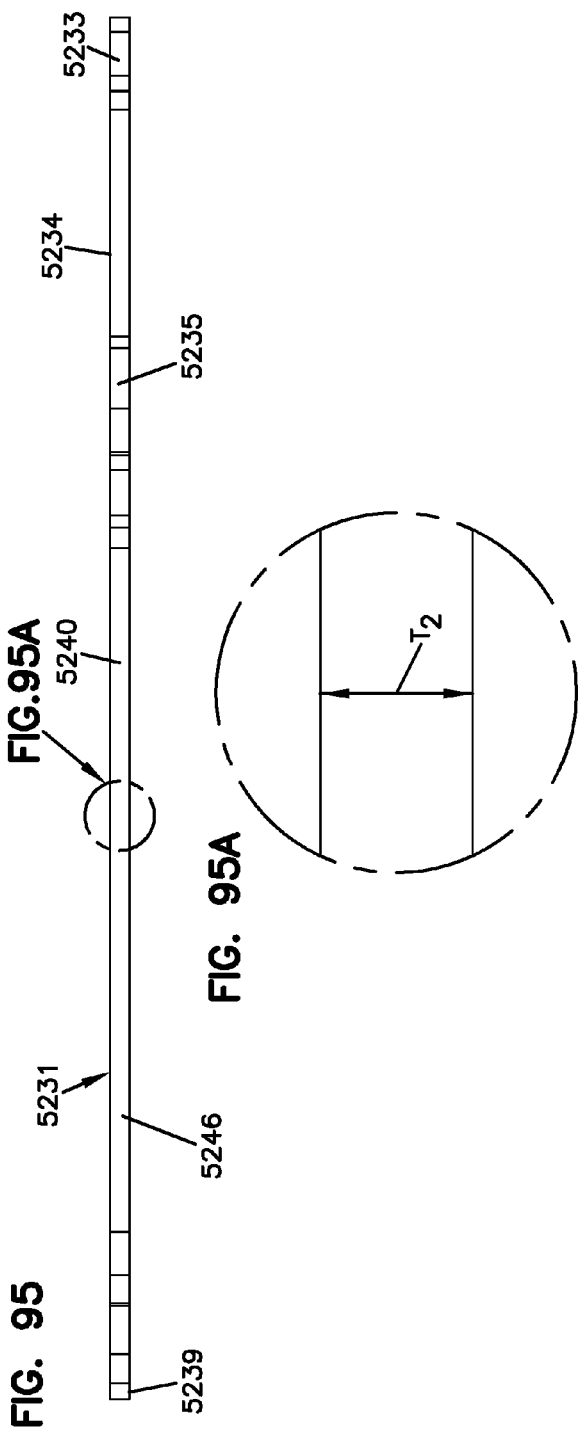
FIG. 94
FIG. 95
FIG. 95A

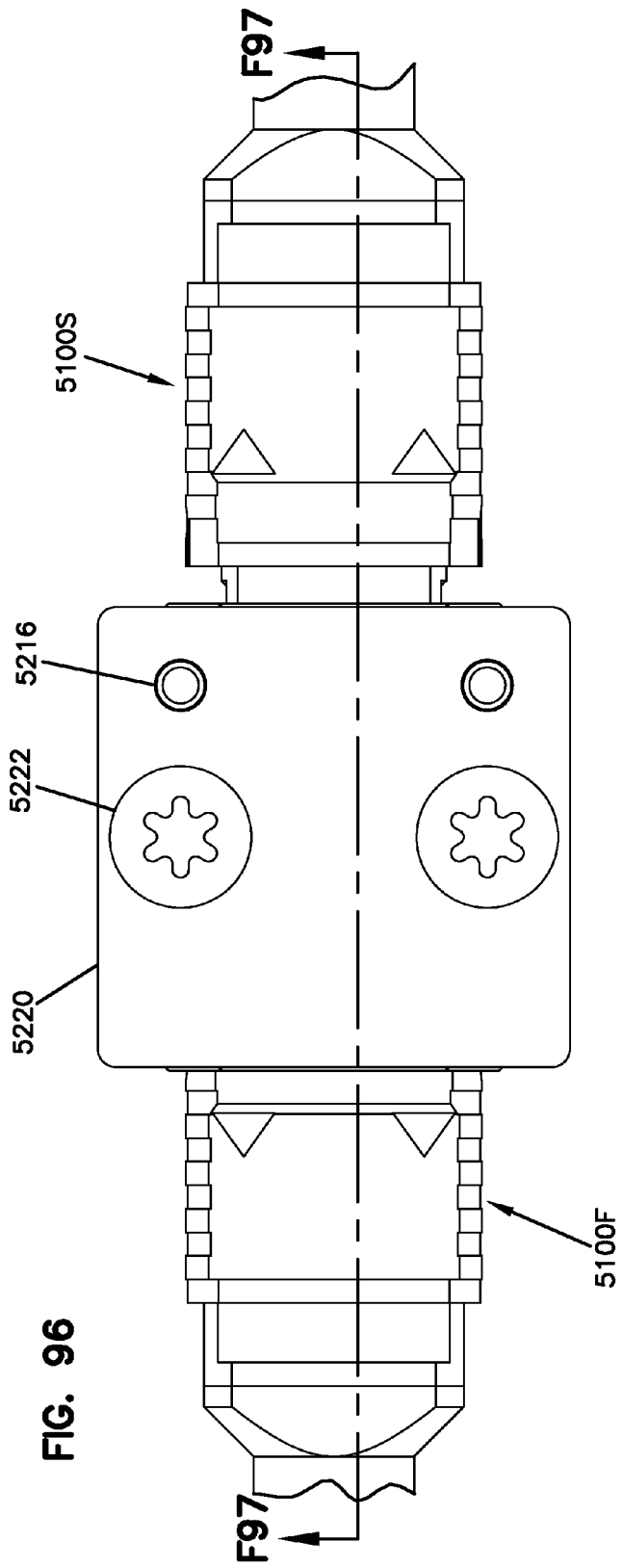

MANAGED FIBER CONNECTIVITY SYSTEMS

CROSS-REFERENCE TO RELATED APPLICATIONS

The present disclosure claims the benefit of U.S. Provisional Application No. 61/303,961, filed Feb. 12, 2010, titled "Fiber Plugs and Adapters for Managed Connectivity;" U.S. Provisional Application No. 61/413,828, filed Nov. 15, 2010, titled "Fiber Plugs and Adapters for Managed Connectivity;" and U.S. Provisional Application No. 61/437,504, filed Jan. 28, 2011, titled "Fiber Plugs and Adapters for Managed Connectivity," the disclosures of which are hereby incorporated by reference herein in their entirety.

BACKGROUND

In communications infrastructure installations, a variety of communications devices can be used for switching, cross-connecting, and interconnecting communications signal transmission paths in a communications network. Some such communications devices are installed in one or more equipment racks to permit organized, high-density installations to be achieved in limited space available for equipment.

Communications devices can be organized into communications networks, which typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

Network management systems (NMS) are typically aware of logical communication links that exist in a communications network, but typically do not have information about the specific physical layer media (e.g., the communications devices, cables, couplers, etc.) that are used to implement the logical communication links. Indeed, NMS systems typically do not have the ability to display or otherwise provide information about how logical communication links are implemented at the physical layer level.

SUMMARY

The present disclosure relates to communications connector assemblies and connector arrangements that provide physical layer management capabilities. In accordance with certain aspects, the disclosure relates to fiber optic connector assemblies and connector arrangements.

One aspect of the present disclosure relates to a communications panel systems and methods including one or more connector arrangements and connector assemblies implemented as LC-type fiber optic connections.

Another aspect of the present disclosure relates to a communications panel systems and methods including one or more connector arrangements and connector assemblies implemented as MPO-type fiber optic connections.

BRIEF DESCRIPTION OF THE DRAWINGS

The accompanying drawings, which are incorporated in and constitute a part of the description, illustrate several aspects of the present disclosure. A brief description of the drawings is as follows:

FIGS. 15-43 illustrate a second example implementation of a connector system that can be utilized on a connector assembly having PLI functionality as well as PLM functionality in accordance with aspects of the present disclosure;

FIGS. 73-95, 95A, and 96-107 illustrate a fourth example implementation of a connector system that can be utilized on a connector assembly having PLI functionality as well as PLM functionality in accordance with aspects of the present disclosure.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

Figure 1:
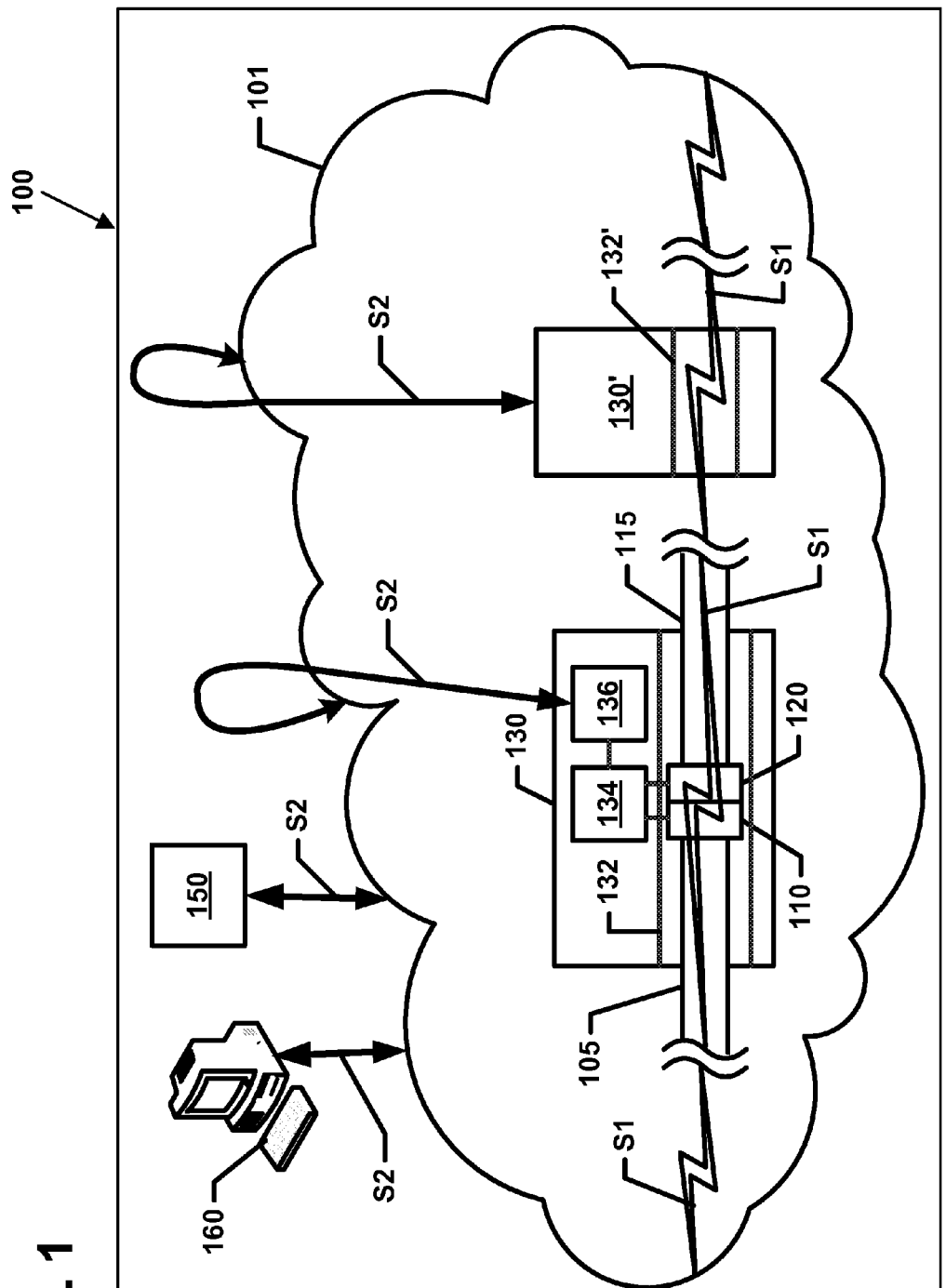
FIG. 1 is a block diagram of a portion of an example communications and data management system in accordance with aspects of the present disclosure.

FIG. 1 is a diagram of a portion of an example communications and data management system 100. The example system 100 shown in FIG. 1 includes a part of a communications network 101 along which communications signals S1 pass. In one example implementation, the network 101 can include an Internet Protocol network. In other implementations, however, the communications network 101 may include other types of networks.

The communications network 101 includes interconnected network components (e.g., connector assemblies, inter-networking devices, internet working devices, servers, outlets, and end user equipment (e.g., computers)). In one example implementation, communications signals S1 pass from a computer, to a wall outlet, to a port of communication panel, to a first port of an inter-networking device, out another port of the inter-networking device, to a port of the same or another communications panel, to a rack mounted server. In other implementations, the communications signals S1 may follow other paths within the communications network 101.

The portion of the communications network 101 shown in FIG. 1 includes first and second connector assemblies 130, 130' at which communications signals S1 pass from one portion of the communications network 101 to another portion of the communications network 101. Non-limiting examples of connector assemblies 130, 130' include, for example, rack-mounted connector assemblies (e.g., patch panels, distribution units, and media converters for fiber and copper physical communication media), wall-mounted connector assemblies (e.g., boxes, jacks, outlets, and media converters for fiber and copper physical communication media), and inter-networking devices (e.g., switches, routers, hubs, repeaters, gateways, and access points).

In the example shown, the first connector assembly 130 defines at least one port 132 configured to communicatively couple at least a first media segment (e.g., cable) 105 to at least a second media segment (e.g., cable) 115 to enable the communication signals S1 to pass between the media segments 105, 115. The at least one port 132 of the first connector assembly 130 may be directly connected to a port 132' of the second connector assembly 130'. As the term is used herein, the port 132 is directly connected to the port 132' when the communications signals S1 pass between the two ports 132, 132' without passing through an intermediate port. For example, plugging a first terminated end of a patch cable into the port 132 and a second terminated end of the patch cable into the port 132' directly connects the ports 132, 132'.

The port 132 of the first connector assembly 130 also may be indirectly connected to the port 132' of the second connector assembly 130'. As the term is used herein, the port 132 is indirectly connected to the port 132' when the communications signals S1 pass through an intermediate port when traveling between the ports 132, 132'. For example, in one implementation, the communications signals S1 may be routed over one media segment from the port 132 at the first connector assembly 130, to a port of a third connector assembly at which the media segment is coupled, to another media segment that is routed from the port of the third connector assembly to the port 132' of the second connector assembly 130'.

Non-limiting examples of media segments include optical cables, electrical cables, and hybrid cables. The media segments may be terminated with electrical plugs, electrical jacks, fiber optic connectors, fiber optic adapters, media converters, or other termination components. In the example shown, each media segment 105, 115 is terminated at a plug or connector 110, 120, respectively, which is configured to communicatively connect the media segments 105, 115. For example, in one implementation, the port 132 of the connector assembly 130 can be configured to align ferrules of two fiber optic connectors 110, 120. In another implementation, the port 132 of the connector assembly 130 can be configured to electrically connect an electrical plug with an electrical socket (e.g., a jack). In yet another implementation, the port 132 can include a media converter configured to connect an optical fiber to an electrical conductor.

In accordance with some aspects, the connector assembly 130 does not actively manage (e.g., is passive with respect to) the communications signals S1 passing through port 132. For example, in some implementations, the connector assembly 130 does not modify the communications signal S1 carried over the media segments 105, 115. Further, in some implementations, the connector assembly 130 does not read, store, or analyze the communications signal S1 carried over the media segments 105, 115.

In accordance with aspects of the disclosure, the communications and data management system 100 also provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system 101. In accordance with some aspects, physical layer information of the communications system 101 can include media information, device information, and location information.

As the term is used herein, "media information" refers to physical layer information pertaining to cables, plugs, connectors, and other such physical media. In accordance with some aspects, the media information is stored on or in the physical media, themselves. In accordance with other aspects, the media information can be stored at one or more data repositories for the communications system, either alternatively or in addition to the media, themselves.

Non-limiting examples of media information include a part number, a serial number, a plug or other connector type, a conductor or fiber type, a cable or fiber length, cable polarity, a cable or fiber pass-through capacity, a date of manufacture, a manufacturing lot number, information about one or more visual attributes of physical communication media (e.g., information about the color or shape of the physical communication media or an image of the physical communication media), and an insertion count (i.e., a record of the number of times the media segment has been connected to another media segment or network component). Media information also can include testing or media quality or performance information. The testing or media quality or performance information, for example, can be the results of testing that is performed when a particular segment of media is manufactured.

As the term is used herein, "device information" refers to physical layer information pertaining to the communications panels, inter-networking devices, media converters, computers, servers, wall outlets, and other physical communications devices to which the media segments attach. In accordance with some aspects, the device information is stored on or in the devices, themselves. In accordance with other aspects, the device information can be stored at one or more data repositories for the communications system, either alternatively or in addition to the devices, themselves. In accordance with still other aspects, the device information can be stored in the media segments attached thereto. Non-limiting examples of device information include a device identifier, a device type, port priority data (that associates a priority level with each port), and port updates (described in more detail herein).

As the term is used herein, "location information" refers to physical layer information pertaining to a physical layout of a building or buildings in which the network 101 is deployed. Location information also can include information indicating where each communications device, media segment, network component, or other component is physically located within the building. In accordance with some aspects, the location information of each system component is stored on or in the respective component. In accordance with other aspects, the location information can be stored at one or more data repositories for the communications system, either alternatively or in addition to the system components, themselves.

In accordance with some aspects, one or more of the components of the communications network 101 are configured to store physical layer information pertaining to the component as will be disclosed in more detail herein. In FIG. 1, the connectors 110, 120, the media segments 105, 115, and/or the connector assemblies 130, 130' may store physical layer information. For example, in FIG. 1, each connector 110, 120 may store information pertaining to itself (e.g., type of connector, data of manufacture, etc.) and/or to the respective media segment 105, 115 (e.g., type of media, test results, etc.).

In another example implementation, the media segments 105, 115 or connectors 110, 120 may store media information that includes a count of the number of times that the media segment (or connector) has been inserted into port 132. In such an example, the count stored in or on the media segment is updated each time the segment (or plug or connector) is inserted into port 132. This insertion count value can be used, for example, for warranty purposes (e.g., to determine if the connector has been inserted more than the number of times specified in the warranty) or for security purposes (e.g., to detect unauthorized insertions of the physical communication media).

One or more of the components of the communications network 101 can read the physical layer information from one or more media segments retained thereat. In certain implementations, one or more network components includes a media reading interface that is configured to read physical layer information stored on or in the media segments or connectors attached thereto. For example, in one implementation, the connector assembly 130 includes a media reading interface 134 that can read media information stored on the media cables 105, 115 retained within the port 132. In another implementation, the media reading interface 134 can read media information stored on the connectors or plugs 110, 120 terminating the cables 105, 115, respectively.

In accordance with some aspects of the disclosure, the physical layer information read by a network component may be processed or stored at the component. For example, in certain implementations, the first connector assembly 130 shown in FIG. 1 is configured to read physical layer information stored on the connectors 110, 120 and/or on the media segments 105, 115 using media reading interface 134. Accordingly, in FIG. 1, the first connector assembly 130 may store not only physical layer information about itself (e.g., the total number of available ports at that assembly 130, the number of ports currently in use, etc.), but also physical layer information about the connectors 110, 120 inserted at the ports and/or about the media segments 105, 115 attached to the connectors 110, 120.

The physical layer information obtained by the media reading interface may be communicated (see PLI signals S2) over the network 101 for processing and/or storage. In accordance with some aspects, the communications network 101 includes a data network (e.g., see network 218 of FIG. 2) along which the physical layer information is communicated. At least some of the media segments and other components of the data network may be separate from those of the communications network 101 to which such physical layer information pertains. For example, in some implementations, the first connector assembly 130 may include a plurality of "normal" ports (e.g., fiber optic adapter ports) at which connectorized media segments (e.g., optical fibers) are coupled together to create a path for communications signals S1. The first connector assembly 130 also may include one or more PLI ports 136 at which the physical layer information (see PLI signals S2) are passed to components of the data network (e.g., to one or more aggregation points 150 and/or to one or more computer systems 160).

In other implementations, however, the physical layer information may be communicated over the communications network 101 just like any other signal, while at the same time not affecting the communication signals S1 that pass through the connector assembly 130 on the normal ports 132. Indeed, in some implementations, the physical layer information may be communicated as one or more of the communication signals S1 that pass through the normal ports 132 of the connector assemblies 130, 130'. For example, in one implementation, a media segment may be routed between the PLI port 136 and one of the "normal" ports 132. In another implementation, the media segment may be routed between the PLI port 136 and a "normal" port of another connector assembly. In such implementations, the physical layer information may be passed along the communications network 101 to other components of the communications network 101 (e.g., to another connector assembly, to one or more aggregation points 150 and/or to one or more computer systems 160). By using the network 101 to communicate physical layer information pertaining to it, an entirely separate data network need not be provided and maintained in order to communicate such physical layer information.

For example, in the implementation shown in FIG. 1, each connector assembly 130 includes at least one PLI port 136 that is separate from the "normal" ports 132 of the connector assembly 130. Physical layer information is communicated between the connector assembly 130 and the communications network 101 through the PLI port 136. Components of the communications network 101 may be connected to one or more aggregation devices 150 and/or to one or more computing systems 160. In the example shown in FIG. 1, the connector assembly 130 is connected to a representative aggregation device 150, a representative computing system 160, and to other components of the network 101 (see looped arrows) via the PLI port 136.

In some implementations, some types of physical layer information pertaining to media segments can be obtained by the connector assembly 130 from a user at the connector assembly 130 via a user interface (e.g., a keypad, a scanner, a touch screen, buttons, etc.). For example, physical layer information pertaining to media that is not configured to store such information can be entered manually into the connector assembly 130 by the user. In certain implementations, the connector assembly 130 can provide the physical layer information obtained from the user to other devices or systems that are coupled to the communications network 101 and/or a separate data network.

In other implementations, some or all physical layer information can be obtained by the connector assembly 130 from other devices or systems that are coupled to the communications network 101 and/or a separate data network. For example, physical layer information pertaining to media that is not configured to store such information can be entered manually into another device or system (e.g., at the connector assembly 130, at the computer 160, or at the aggregation point 150) that is coupled to the network 101 and/or a separate data network.

In some implementations, some types of non-physical layer information (e.g., network information) also can be obtained by one network component (e.g., a connector assembly 130, an aggregation point 150, or a computer 160) from other devices or systems that are coupled to the communications network 101 and/or a separate data network. For example, the connector assembly 130 may pull non-physical layer information from one or more components of the network 101. In other implementations, the non-physical layer information can be obtained by the connector assembly 130 from a user at the connector assembly 130.

In some implementations, the connector assembly 130 is configured to modify (e.g., add, delete, and/or change) the physical layer information stored in or on the segment of physical communication media 105, 115 (i.e., or the associated connectors 110, 120). For example, in some implementations, the media information stored in or on the segment of physical communication media 105, 115 can be updated to include the results of testing that is performed when a segment of physical media is installed or otherwise checked. In other implementations, such testing information is supplied to the aggregation point 150 for storage and/or processing. The modification of the physical layer information does not affect the communications signals S1 passing through the connector assembly 130.

Figure 2:
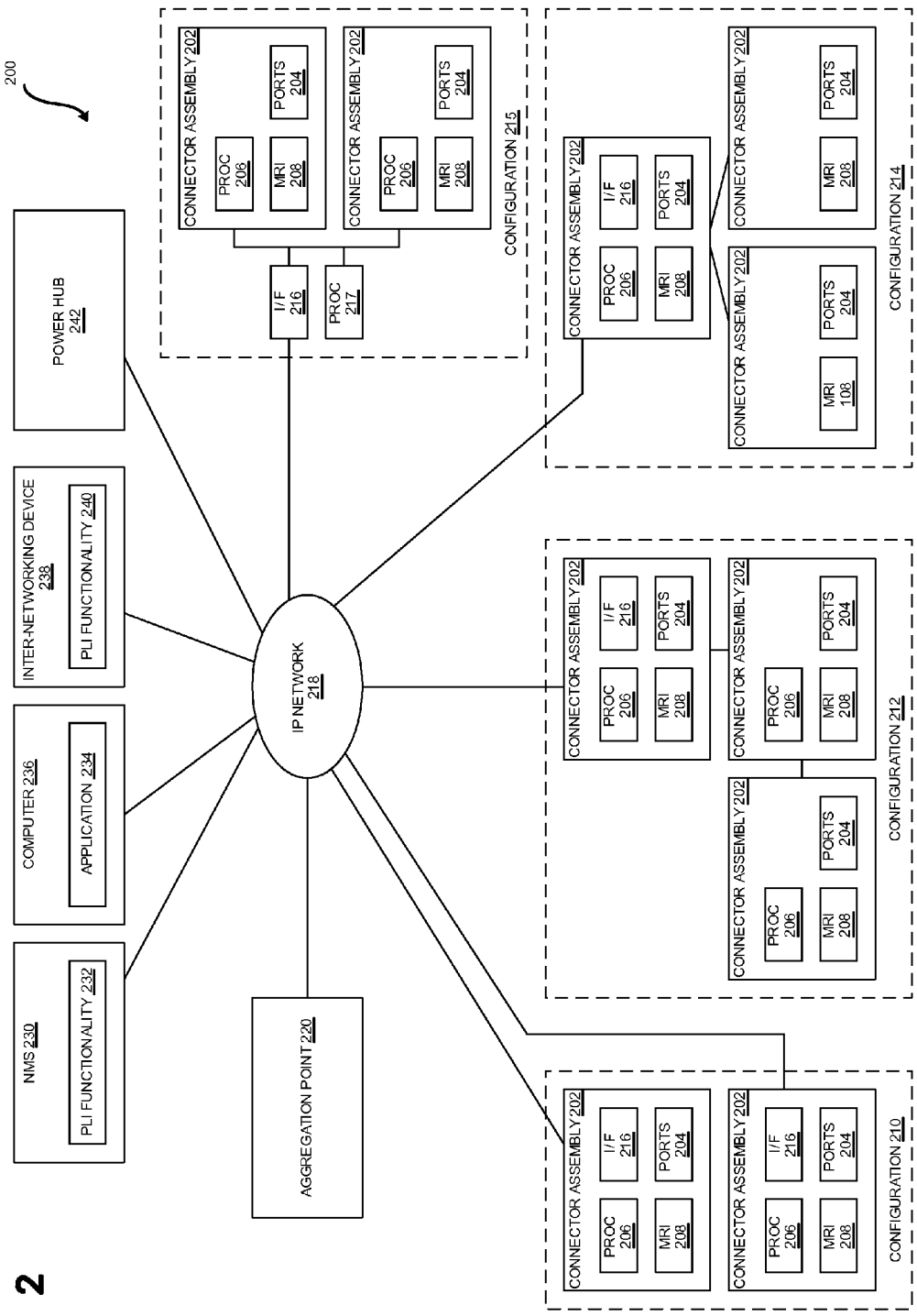
FIG. 2 is a block diagram of one embodiment of a communications management system that includes PLI functionality as well as PLM functionality in accordance with aspects of the present disclosure.

FIG. 2 is a block diagram of one example implementation of a communications management system 200 that includes PLI functionality as well as PLM functionality. The management system 200 comprises a plurality of connector assemblies 202. The management system 200 includes one or more connector assemblies 202 connected to an IP network 218. The connector assemblies 202 shown in FIG. 2 illustrate various example implementations of the connector assemblies 130, 30' of FIG. 1.

Each connector assembly 202 includes one or more ports 204, each of which is used to connect two or more segments of physical communication media to one another (e.g., to implement a portion of a logical communication link for communication signals S1 of FIG. 1). At least some of the connector assemblies 202 are designed for use with segments of physical communication media that have physical layer information stored in or on them. The physical layer information is stored in or on the segment of physical communication media in a manner that enables the stored information, when the segment is attached to a port 204, to be read by a programmable processor 206 associated with the connector assembly 202.

Each programmable processor 206 is configured to execute software or firmware that causes the programmable processor 206 to carry out various functions described below. Each programmable processor 206 also includes suitable memory (not shown) that is coupled to the programmable processor 206 for storing program instructions and data. In general, the programmable processor 206 determines if a physical communication media segment is attached to a port 204 with which that processor 206 is associated and, if one is, to read the identifier and attribute information stored in or on the attached physical communication media segment (if the segment includes such information stored therein or thereon) using the associated media reading interface 208.

In some implementations, each of the ports 204 of the connector assemblies 202 comprises a respective media reading interface 208 via which the respective programmable processor 206 is able to determine if a physical communication media segment is attached to that port 204 and, if one is, to read the physical layer information stored in or on the attached segment (if such media information is stored therein or thereon). In other implementations, a single media reading interface 208 may correspond to two or more ports 204. The programmable processor 206 associated with each connector assembly 202 is communicatively coupled to each of the media reading interfaces 208 using a suitable bus or other interconnect (not shown).

In FIG. 2, four example types of connector assembly configurations 210, 212, 214, and 215 are shown. In the first connector assembly configuration 210 shown in FIG. 2, each connector assembly 202 includes its own respective programmable processor 206 and its own respective network interface 216 that is used to communicatively couple that connector assembly 202 to an Internet Protocol (IP) network 218. In some implementations, the ports 204 of the connector assemblies 202 also connect to the IP network 218. In other implementations, however, only the network interfaces 216 couple to the IP network 218.

In the second type of connector assembly configuration 212, a group of connector assemblies 202 are physically located near each other (e.g., in a rack, rack system, or equipment closet). Each of the connector assemblies 202 in the group includes its own respective programmable processor 206. However, in the second connector assembly configuration 212, some of the connector assemblies 202 (referred to here as "interfaced connector assemblies") include their own respective network interfaces 216 while some of the connector assemblies 202 (referred to here as "non-interfaced connector assemblies") do not. The non-interfaced connector assemblies 202 are communicatively coupled to one or more of the interfaced connector assemblies 202 in the group via local connections. In this way, the non-interfaced connector assemblies 202 are communicatively coupled to the IP network 218 via the network interface 216 included in one or more of the interfaced connector assemblies 202 in the group. In the second type of connector assembly configuration 212, the total number of network interfaces 216 used to couple the connector assemblies 202 to the IP network 218 can be reduced. Moreover, in the particular implementation shown in FIG. 2, the non-interfaced connector assemblies 202 are connected to the interfaced connector assembly 202 using a daisy chain topology (though other topologies can be used in other implementations and embodiments).

In the third type of connector assembly configuration 214, a group of connector assemblies 202 are physically located near each other (e.g., within a rack, rack system, or equipment closet). Some of the connector assemblies 202 in the group (also referred to here as "master" connector assemblies 202) include both their own programmable processors 206 and network interfaces 216, while some of the connector assemblies 202 (also referred to here as "slave" connector assemblies 202) do not include their own programmable processors 206 or network interfaces 216. Each of the slave connector assemblies 202 is communicatively coupled to one or more of the master connector assemblies 202 in the group via one or more local connections. The programmable processor 206 in each of the master connector assemblies 202 is able to carry out the PLM functions for both the master connector assembly 202 of which it is a part and any slave connector assemblies 202 to which the master connector assembly 202 is connected via the local connections. As a result, the cost associated with the slave connector assemblies 202 can be reduced. In the particular implementation shown in FIG. 2, the slave connector assemblies 202 are connected to a master connector assembly 202 in a star topology (though other topologies can be used in other implementations and embodiments).

In the fourth type of connector assembly configuration 215, a group of connector assemblies (e.g., distribution modules) 202 are housed within a common chassis or other enclosure. Each of the connector assemblies 202 in the configuration 215 includes their own programmable processors 206. In the context of this configuration 215, the programmable processors 206 in the connector assemblies 202 are "slave" processors 206. Each of the slave programmable processors 206 in the group is communicatively coupled to a common "master" programmable processor 217 (e.g., over a backplane included in the chassis or enclosure). The master programmable processor 217 is coupled to a network interface 216 that is used to communicatively couple the master programmable processor 217 to the IP network 218.

In the fourth configuration 215, each slave programmable processor 206 is configured to manage the media reading interfaces 208 to determine if physical communication media segments are attached to the port 204 and to read the physical layer information stored in or on the attached physical communication media segments (if the attached segments have such information stored therein or thereon). The physical layer information is communicated from the slave programmable processor 206 in each of the connector assemblies 202 in the chassis to the master processor 217. The master processor 217 is configured to handle the processing associated with communicating the physical layer information read from by the slave processors 206 to devices that are coupled to the IP network 218.

In accordance with some aspects, the communications management system 200 includes functionality that enables the physical layer information captured by the connector assemblies 202 to be used by application-layer functionality outside of the traditional physical-layer management application domain. That is, the physical layer information is not retained in a PLM "island" used only for PLM purposes but is instead made available to other applications. For example, in the particular implementation shown in FIG. 2, the management system 200 includes an aggregation point 220 that is communicatively coupled to the connector assemblies 202 via the IP network 218.

The aggregation point 220 includes functionality that obtains physical layer information from the connector assemblies 202 (and other devices) and stores the physical layer information in a data store. The aggregation point 220 can be used to receive physical layer information from various types of connector assemblies 202 that have functionality for automatically reading information stored in or on the segment of physical communication media. Also, the aggregation point 220 and aggregation functionality 224 can be used to receive physical layer information from other types of devices that have functionality for automatically reading information stored in or on the segment of physical communication media. Examples of such devices include end-user devices—such as computers, peripherals (e.g., printers, copiers, storage devices, and scanners), and IP telephones—that include functionality for automatically reading information stored in or on the segment of physical communication media.

The aggregation point 220 also can be used to obtain other types of physical layer information. For example, in this implementation, the aggregation point 220 also obtains information about physical communication media segments that is not otherwise automatically communicated to an aggregation point 220. This information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The aggregation point 220 also includes functionality that provides an interface for external devices or entities to access the physical layer information maintained by the aggregation point 220. This access can include retrieving information from the aggregation point 220 as well as supplying information to the aggregation point 220. In this implementation, the aggregation point 220 is implemented as "middleware" that is able to provide such external devices and entities with transparent and convenient access to the PLI maintained by the access point 220. Because the aggregation point 220 aggregates PLI from the relevant devices on the IP network 218 and provides external devices and entities with access to such PLI, the external devices and entities do not need to individually interact with all of the devices in the IP network 218 that provide PLI, nor do such devices need to have the capacity to respond to requests from such external devices and entities.

For example, as shown in FIG. 2, a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. In certain implementations, the NMS 230 communicates with the aggregation point 220 over the IP network 218. In other implementations, the NMS 230 may be directly connected to the aggregation point 220.

As shown in FIG. 2, an application 234 executing on a computer 236 also can use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

In the example shown in FIG. 2, one or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

The aggregation point 220 can be implemented on a standalone network node (e.g., a standalone computer running appropriate software) or can be integrated along with other network functionality (e.g., integrated with an element management system or network management system or other network server or network element). Moreover, the functionality of the aggregation point 220 can be distribute across many nodes and devices in the network and/or implemented, for example, in a hierarchical manner (e.g., with many levels of aggregation points). The IP network 218 can include one or more local area networks and/or wide area networks (e.g., the Internet). As a result, the aggregation point 220, NMS 230, and computer 236 need not be located at the same site as each other or at the same site as the connector assemblies 202 or the inter-networking devices 238.

Also, power can be supplied to the connector assemblies 202 using conventional "Power over Ethernet" techniques specified in the IEEE 802.3af standard, which is hereby incorporated herein by reference. In such an implementation, a power hub 242 or other power supplying device (located near or incorporated into an inter-networking device that is coupled to each connector assembly 202) injects DC power onto one or more power cables (e.g., a power wire included in a copper twisted-pair cable) used to connect each connector assembly 202 to the IP network 218.

Figure 3:
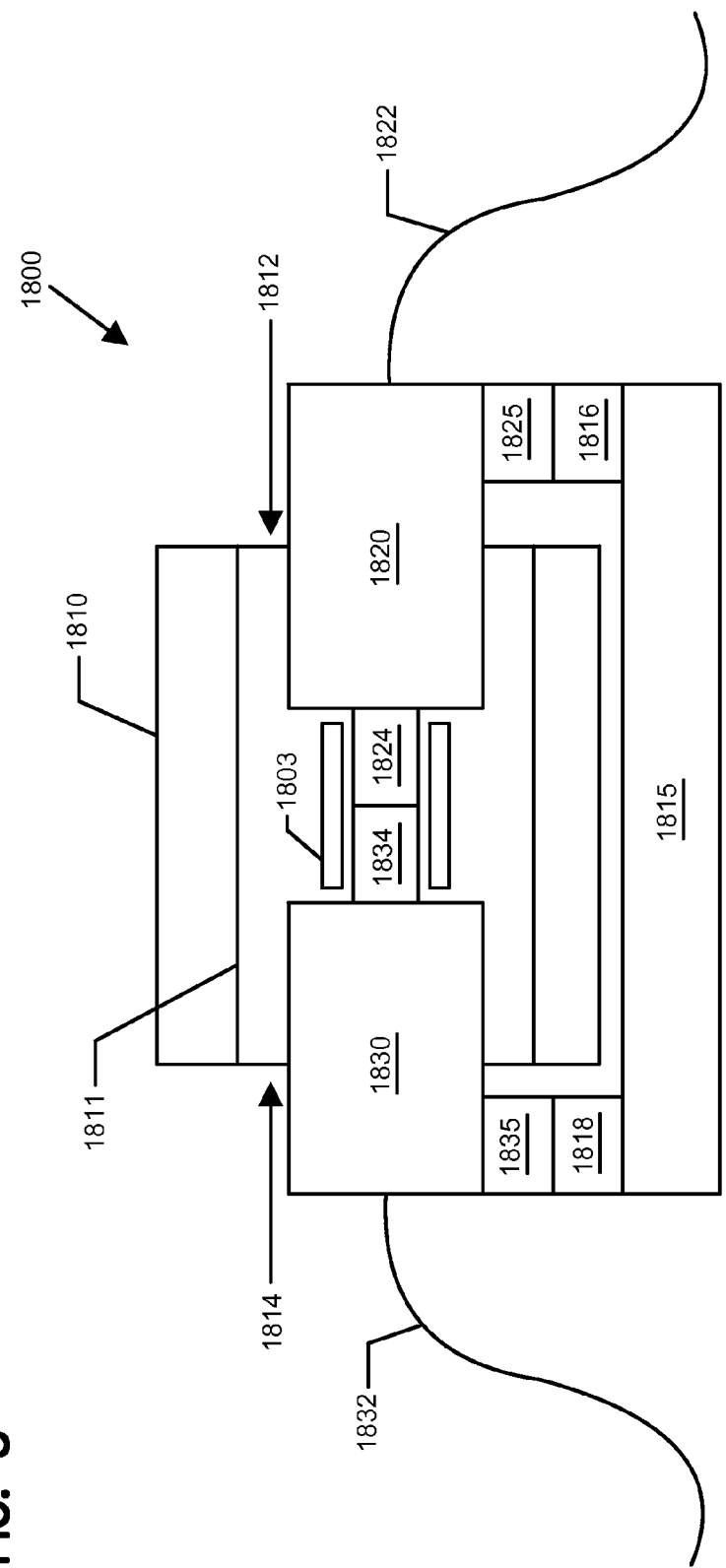
FIG. 3 is a block diagram of one high-level example of a coupler assembly and media reading interface that are suitable for use in the management system of FIG. 2 in accordance with aspects of the present disclosure.

FIG. 3 is a schematic diagram of one example connection system 1800 including a connector assembly 1810 configured to collect physical layer information from at least one segment of physical communications media. The example connector assembly 1810 of FIG. 3 is configured to connect segments of optical physical communications media in a physical layer management system. The connector assembly 1810 includes a fiber optic adapter defining at least one connection opening 1811 having a first port end 1812 and a second port end 1814. A sleeve (e.g., a split sleeve) 1803 is arranged within the connection opening 1811 of the adapter 1810 between the first and second port ends 1812, 1814. Each port end 1812, 1814 is configured to receive a connector arrangement as will be described in more detail herein.

A first example segment of optical physical communication media includes a first optical fiber 1822 terminated by a first connector arrangement 1820. A second example segment of optical physical communication media includes a second optical fiber 1832 terminated by a second connector arrangement 1830. The first connector arrangement 1820 is plugged into the first port end 1812 and the second connector arrangement 1830 is plugged into the second port end 1814. Each fiber connector arrangement 1820, 1830 includes a ferrule 1824, 1834 through which optical signals from the optical fiber 1822, 1832, respectively, pass.

The ferrules 1824, 1834 of the connector arrangements 1820, 1830 are aligned by the sleeve 1803 when the connector arrangements 1820, 1830 are inserted into the connection opening 1811 of the adapter 1810. Aligning the ferrules 1824, 1834 provides optical coupling between the optical fibers 1822, 1832. In some implementations, each segment of optical physical communication media (e.g., each optical fiber 1822, 1832) carries communication signals (e.g., communications signals S1 of FIG. 1). The aligned ferrules 1824, 1834 of the connector arrangements 1820, 1830 create an optical path along which the communication signals (e.g., signals S1 of FIG. 1) may be carried.

In some implementations, the first connector arrangement 1820 may include a storage device 1825 that is configured to store physical layer information (e.g., an identifier and/or attribute information) pertaining to the segment of physical communications media (e.g., the first connector arrangement 1820 and/or the fiber optic cable 1822 terminated thereby). In some implementations, the connector arrangement 1830 also includes a storage device 1835 that is configured to store information (e.g., an identifier and/or attribute information) pertaining to the second connector arrangement 1830 and/or the second optic cable 1832 terminated thereby.

In one implementation, each of the storage devices 1825, 1835 is implemented using an EEPROM (e.g., a PCB surface-mount EEPROM). In other implementations, the storage devices 1825, 1835 are implemented using other non-volatile memory device. Each storage device 1825, 1835 is arranged and configured so that it does not interfere or interact with the communications signals communicated over the media segments 1822, 1832.

In accordance with some aspects, the adapter 1810 is coupled to at least a first media reading interface 1816. In certain implementations, the adapter 1810 also is coupled to at least a second media interface 1818. In some implementations, the adapter 1810 is coupled to multiple media reading interfaces. In certain implementations, the adapter 1810 includes a media reading interface for each port end defined by the adapter 1810. In other implementations, the adapter 1810 includes a media reading interface for each connection opening 1811 defined by the adapter 1810. In still other implementations, the adapter 1810 includes a media reading interface for each connector arrangement that the adapter 1810 is configured to receive. In still other implementations, the adapter 1810 includes a media reading interface for only a portion of the connector arrangement that the adapter 1810 is configured to receive.

In some implementations, at least the first media reading interface 1816 is mounted to a printed circuit board 1815. In the example shown, the first media reading interface 1816 of the printed circuit board 1815 is associated with the first port end 1812 of the adapter 1810. In some implementations, the printed circuit board 1815 also can include the second media reading interface 1818. In one such implementation, the second media reading interface 1818 is associated with the second port end 1814 of the adapter 1810.

The printed circuit board 1815 of the connector assembly 1810 can be communicatively connected to one or more programmable processors (e.g., processors 216 of FIG. 2) and/or to one or more network interfaces (e.g., network interfaces 216 of FIG. 2). The network interface may be configured to send the physical layer information (e.g., see signals S2 of FIG. 1) to a physical layer management network (e.g., see communications network 101 of FIG. 1 or IP network 218 of FIG. 2). In one implementation, one or more such processors and interfaces can be arranged as components on the printed circuit board 1815. In another implementation, one or more such processor and interfaces can be arranged on separate circuit boards that are coupled together. For example, the printed circuit board 1815 can couple to other circuit boards via a card edge type connection, a connector-to-connector type connection, a cable connection, etc.

When the first connector arrangement 1820 is received in the first port end 1812 of the adapter 1810, the first media reading interface 1816 is configured to enable reading (e.g., by the processor) of the information stored in the storage device 1825. The information read from the first connector arrangement 1820 can be transferred through the printed circuit board 1815 to a physical layer management network, e.g., network 101 of FIG. 1, network 218 of FIG. 2, etc. When the second connector arrangement 1830 is received in the second port end 1814 of the adapter 1810, the second media reading interface 1818 is configured to enable reading (e.g., by the processor) of the information stored in the storage device 1835. The information read from the second connector arrangement 1830 can be transferred through the printed circuit board 1815 or another circuit board to the physical layer management network.

In some such implementations, the storage devices 1825, 1835 and the media reading interfaces 1816, 1818 each comprise three (3) leads—a power lead, a ground lead, and a data lead. The three leads of the storage devices 1825, 1835 come into electrical contact with three (3) corresponding leads of the media reading interfaces 1816, 1818 when the corresponding media segment is inserted in the corresponding port. In certain example implementations, a two-line interface is used with a simple charge pump. In still other implementations, additional leads can be provided (e.g., for potential future applications). Accordingly, the storage devices 1825, 1835 and the media reading interfaces 1816, 1818 may each include four (4) leads, five (5) leads, six (6) leads, etc.

FIGS. 4-12 illustrate a first example implementation of a connector system 1000 that can be utilized on a connector assembly (e.g., a communications panel) having PLI functionality as well as PLM functionality. One example connector assembly on which the connector system 1000 can be implemented is a bladed chassis.

Figure 8:
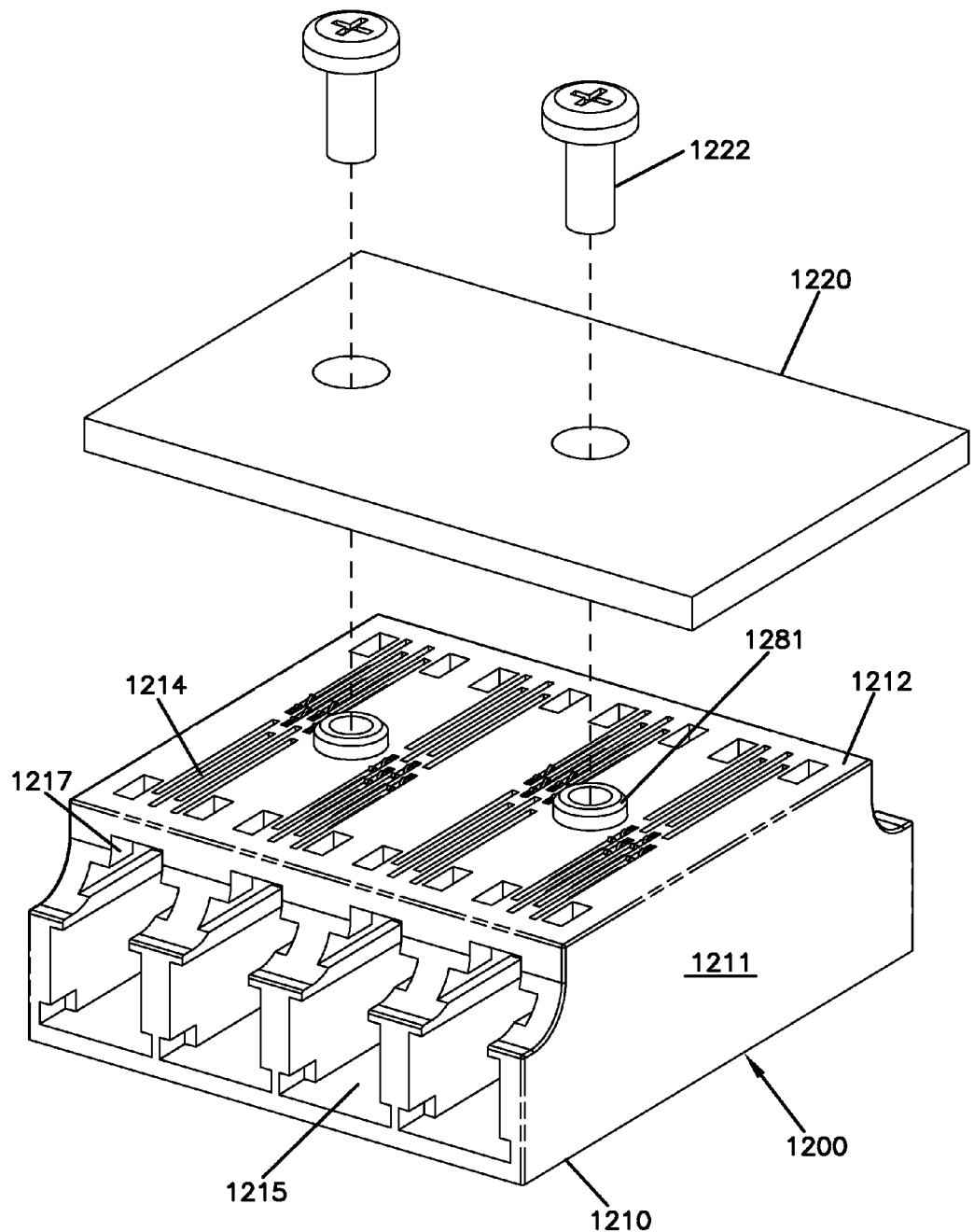

The connector system 1000 includes at least one example communications coupler assembly 1200 that can be mounted to a connector assembly, such as a communications panel. One or more example connector arrangements 1100, which terminate segments 1010 of communications media, are configured to communicatively couple to other segments of physical communications media at the coupler assembly 1200 (FIG. 8). Accordingly, communications data signals carried by a media segment terminated by a first connector arrangement 1100 can be propagated to another media segment (e.g., terminated by a second connector arrangement 1100) through the communications coupler assembly 1200.

FIGS. 4 and 8-14 show a portion of an example implementation of a communications coupler assembly 1200 implemented as a fiber optic adapter. The example adapter 1200 includes an adapter housing 1210 to which a printed circuit board 1220 is secured (e.g., via fasteners 1222). In the example shown, the adapter 1200 is a quadruplex fiber optic adapter. In other implementations, however, the adapter 1200 can define greater or fewer ports.

FIGS. 4-7 show another example implementation of a connector arrangement 1100 suitable for insertion into passages 1215 of an adapter housing 1210. The same reference numbers are used herein to designate like elements on both connector arrangements 1100 and 1100. The connector arrangement 1100 includes one or more fiber optic connectors 1110, each of which terminates one or more optical fibers 1010.

In accordance with some aspects, each connector arrangement 1100 is configured to terminate a single segment of physical communications media. For example, each connector arrangement 1100 can include a single connector housing 1110 that terminates a single optical fiber or a single electrical conductor. In one example implementation, each connector arrangement 1100 includes a single LC-type fiber optic connector 1110 that terminates a single optical fiber. In accordance with other aspects, each connector arrangement 1100 includes two or more connector housings 1110, each of which terminates a single segment of physical communications media. For example, a duplex connector arrangement 1100 may include two connector housings 1110, each of which terminates an optical fiber 1010. In other implementations, the connector housings 1110 can be an SC-type, an ST-type, an FC-type, an LX.5-type, etc.

In accordance with still other aspects, each connector arrangement 1100 can include one or more connector housings, each of which terminates a plurality of physical media segments. In one example implementation, each connector arrangement includes a single MPO-type fiber optic connector that terminates multiple optical fibers. In still other systems, other types of connector arrangements (e.g., electrical connector arrangements) can be secured to the communications coupler assembly 1200 or to a different type of connector assembly.

Figure 4:
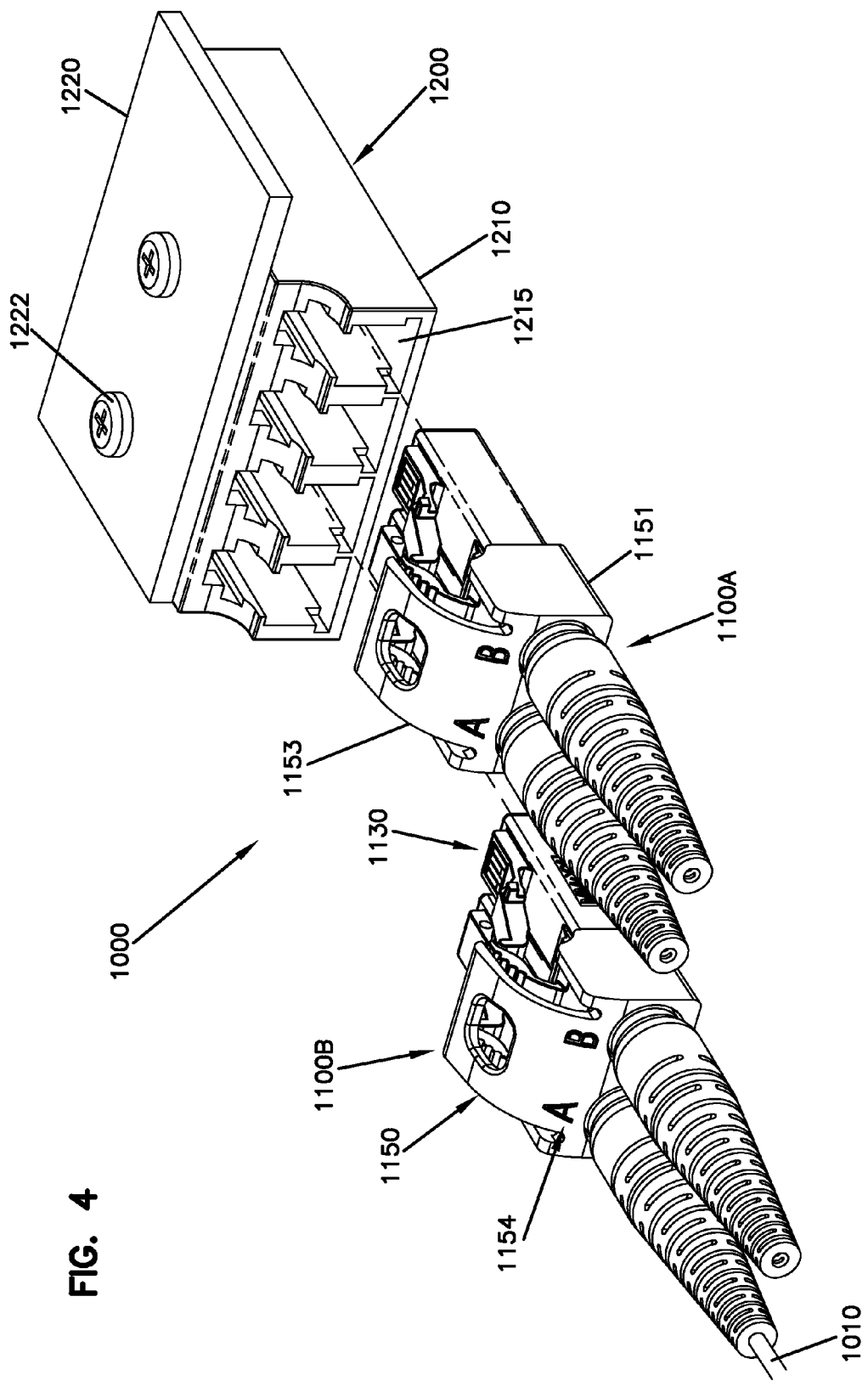
FIGS. 4-14 illustrate a first example implementation of a connector system that can be utilized on a connector assembly having PLI functionality as well as PLM functionality in accordance with aspects of the present disclosure.
Figure 5:
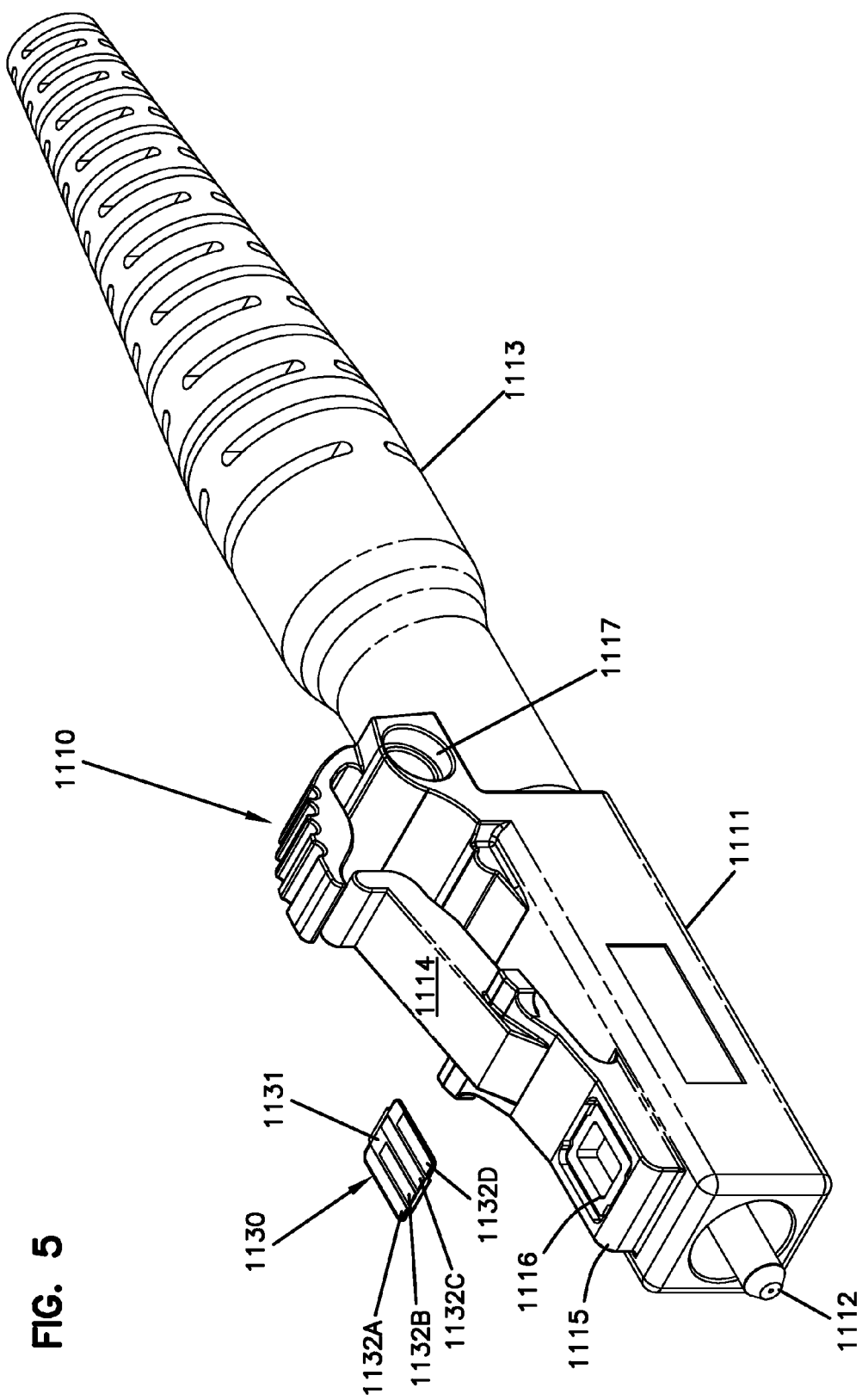

In the example shown in FIG. 4, the connector arrangement 1100 defines a duplex fiber optic connector arrangement including two LC-type fiber optic connectors 1110 held together using a clip 1150. As shown in FIG. 5, each fiber optic connector 1110 includes a connector body 1111 enclosing a ferrule 1112 that retains an optical fiber 1010. Each connector body 1111 is secured to a boot 1113 for providing bend protection to the optical fiber 1010. The connector body 1111 includes a fastening member (e.g., clip arm) 1114 that facilitates retaining the fiber optic connector 1110 within a passage 1215 in the adapter housing 1210. The body 1111 also defines a through hole (or opposing depressions) 1117 to facilitate maintaining the body 1111 within the clip 1150 (e.g., see FIG. 6).

Each connector arrangement 1100 is configured to store physical layer information. For example, the physical layer information can be stored on or in the body 1111 of one or more of the fiber optic connectors 1110. In the example shown, physical layer information is stored on only one fiber optic connector 1110 of the connector arrangement 1100. In other implementations, however, physical layer information can be stored on each fiber optic connector 1110.

One example storage device 1130 includes a printed circuit board 1131 on which memory circuitry can be arranged. In one example implementation, the storage device 1130 includes an EEPROM circuit arranged on the printed circuit board 1131. In other embodiments, however, the storage device 1130 can include any suitable type of memory. In the example shown in FIGS. 5-7, the memory circuitry is arranged on the non-visible side of the printed circuit board 1131.

Electrical contacts 1132 are arranged on the visible side of the printed circuit board 1131 in FIG. 4-7. The electrical contacts 1132 of each storage device 1130 are configured to engage with contacts of a media reading interface of the adapter 1200, which will be discussed in more detail herein. In the example shown in FIG. 5, the contacts 1132 define planar surfaces extending in a front-to-rear direction. In one implementation, the contacts 1132 are configured to promote even wear amongst the contacts 1132. In some implementations, the contacts 1132 alternate between long and short planar surfaces. For example, contacts 1132A and 1132C are longer than contacts 1132B and 1132D.

In the example in FIG. 5, the connector bodies 1111 each include a key 1115 configured to fit with latch engagement channels 1217 of the adapter body 1210. The key 1115 of one or more connectors 1110 is configured to accommodate a storage device 1130 on which the physical layer information can be stored. For example, the key 1115 of at least one of the connectors 1110 defines a cavity 1116 in which the storage device 1130 can be mounted. In some implementations, a cover can be positioned over the storage device 1130 to enclose the storage device 1130 within the respective connector housing 1111. In other implementations, the storage device 1130 is left exposed.

Figure 6:
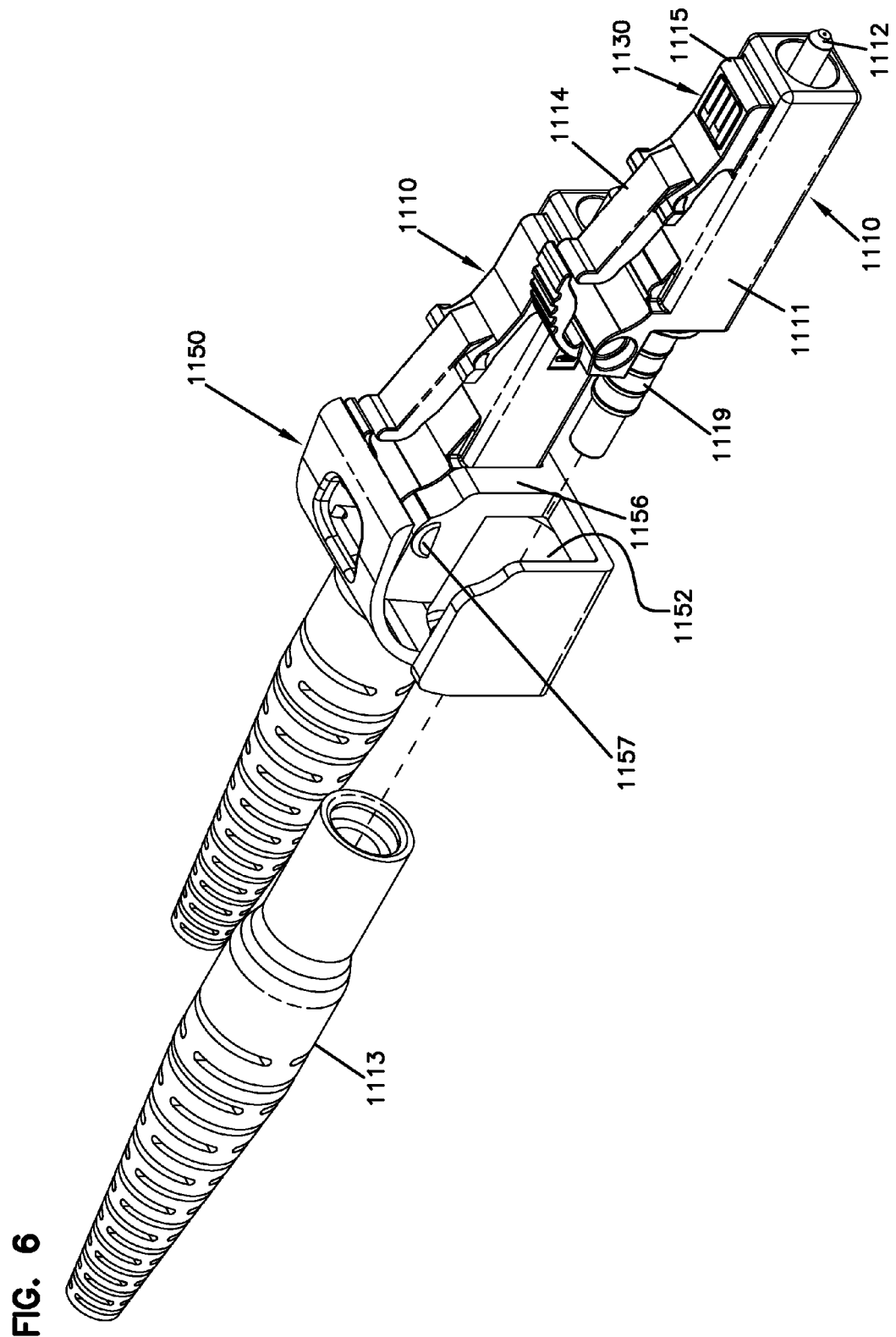
Figure 7:
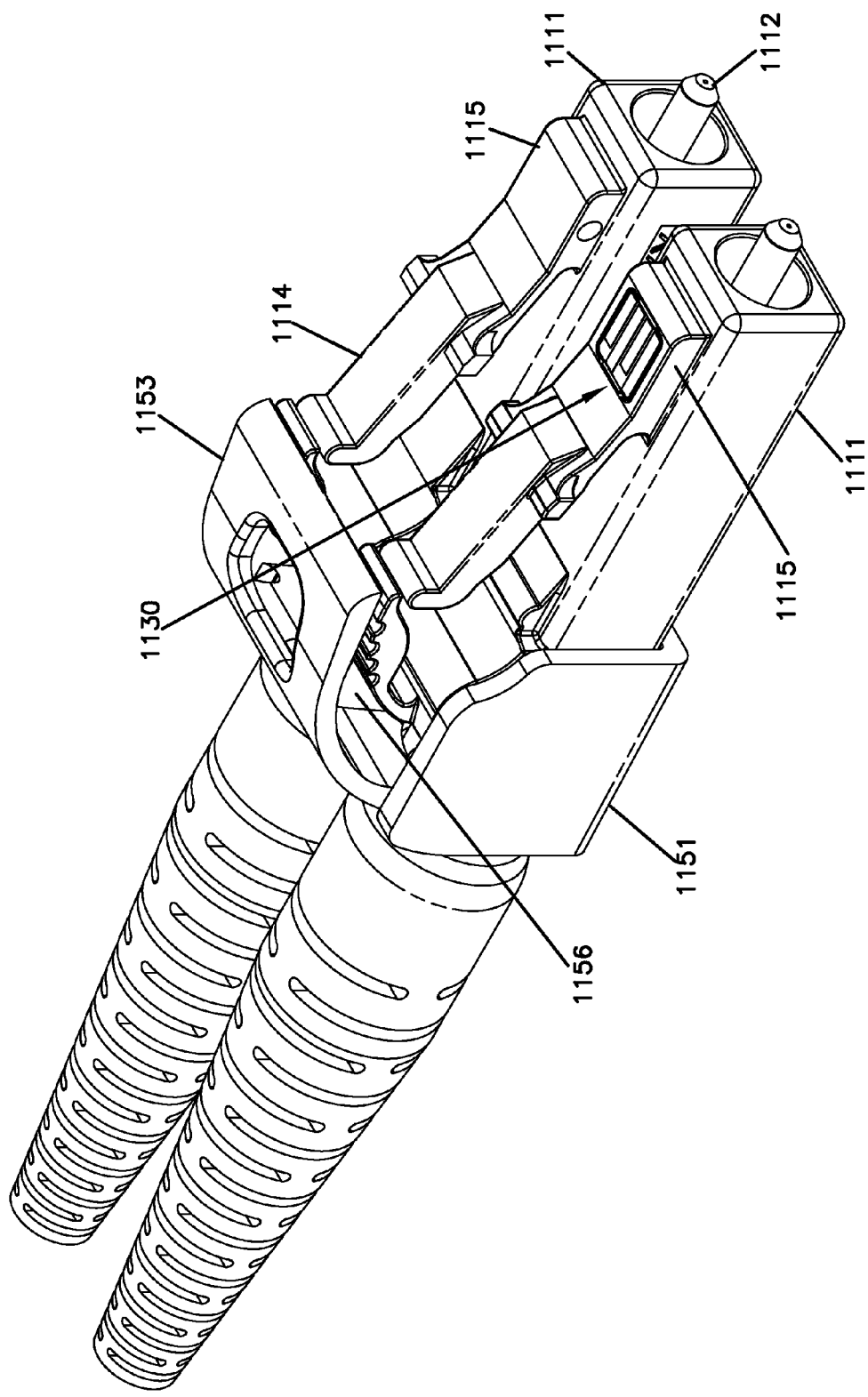

In the example shown in FIGS. 6 and 7, two fiber optic connectors 1110 are secured together using a clip 1150. The example clip 1150 includes a body 1151 that at least partially encloses the connectors 1110 to be secured. The clip 1150 defines openings or channels 1152 through which portions 1119 of the fiber optic connector bodies 1111 can extend (see FIG. 6). A flange 1153 curves upwardly and forwardly to extend over the fastening members 1114 of the connectors 1110 (see FIG. 7). In certain implementations, indicia 1154 can be printed on the clip 1150 to identify the fiber optic connectors 1110. In the example shown, the indicia 1154 are printed on or adjacent the flange 1153 at the rear side of the clip 1150 (see FIG. 4).

In the example shown, the clip 1150 has a monolithic body 1151 defining two channels 1152 separated by an interior wall 1156. Lugs 1157 are positioned on the inner surfaces of the exterior walls of the body 1151 and on both sides of the interior wall 1156. The lugs 1157 are configured to engage cavities/depressions 1117 defined in the fiber optic connector bodies 1111 to secure the connector bodies 1111 within the clip body 1151.

FIGS. 8-14 show a portion of one example implementation of a fiber optic adapter 1200. The example adapter 1200 includes an adapter housing 1210 to which a printed circuit board 1220 is secured (e.g., via fasteners 1222). In some implementations, the example adapter housing 1210 includes two annular walls 1281 in which the fasteners 1222 can be inserted to hold the printed circuit board 1220 to the adapter housing 1210. Non-limiting examples of suitable fasteners 1222 include screws, snaps, and rivets. For ease in understanding, only a portion of the printed circuit board 1220 is shown in FIGS. 4 and 8. It is to be understood that the printed circuit board 1220 electrically connects to a data processor and/or to a network interface (e.g., processor 217 and network interface 216 of FIG. 2). It is further to be understood that multiple adapters 1200 can be connected to the printed circuit board 1220 within a communications panel.

The example adapter housing 1210 shown in FIG. 8 is formed from opposing sides 1211 interconnected by first and second ends 1212. The sides 1211 and ends 1212 each extend between an open front and an open rear. The coupler housing 1210 defines one or more passages 1215 extending between the front and rear ends. Each end of each passage 1215 is configured to receive a connector arrangement or portion thereof (e.g., one fiber optic connector 1110 of duplex connector arrangement 1100 of FIG. 7).

In the example shown in FIG. 8, the adapter body 1210 defines four passages 1215. In other implementations, the adapter body 1210 can define greater or fewer passages 1215. Sleeves (e.g., split sleeves) 1216 are positioned within the passages 1215 to receive and align the ferrules 1112 of fiber optic connectors 1110 (see FIG. 14). The adapter housing 1210 also defines latch engagement channels 1217 at the front and rear of each passage 1215 to facilitate retention of the latch arms 1114 of the fiber optic connectors 1110.

The fiber optic adapter 1210 includes one or more media reading interfaces 1230, each configured to acquire the physical layer information from the storage device 1130 of a fiber optic connector 1110 plugged into the fiber optic adapter 1210. For example, in one implementation, the adapter 1210 can include a media reading interface 1230 associated with each passage 1215. In another implementation, the adapter 1210 can include a media reading interface 1230 associated with each connection end of each passage 1215. In still other implementations, the adapter 1210 can include a media reading interface 1230 associated with each set of ports that accommodates a connector arrangement 1100.

Figure 9:
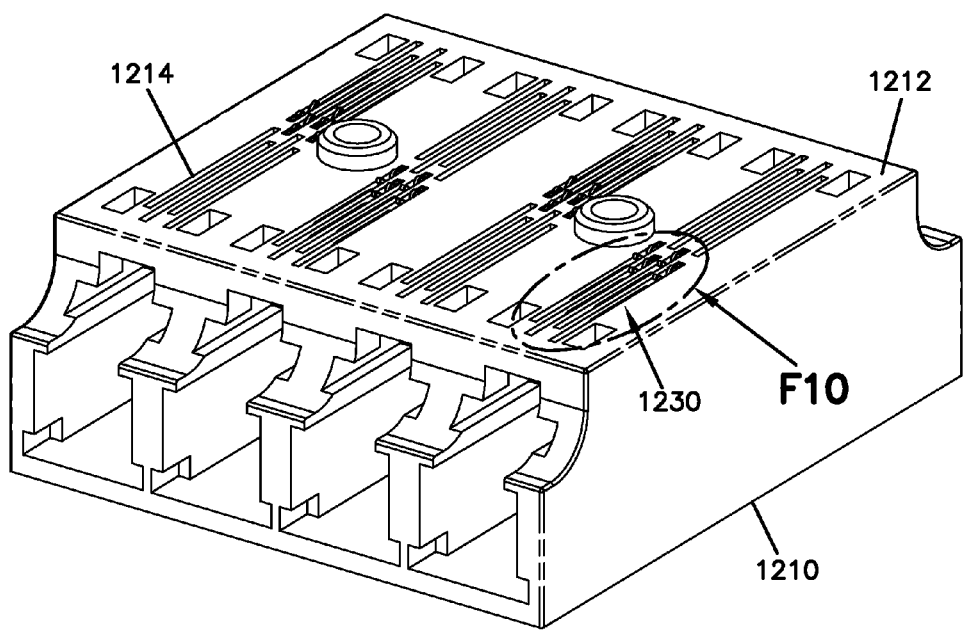

For example, the quadruplex adapter 1210 shown in FIG. 9 includes two media reading interfaces 1230 at the front to interface with two duplex fiber optic connector arrangements 1100 to be received thereat and two media reading interfaces 1230 at the rear to interface with two duplex fiber optic connector arrangements 1100 to be received thereat. In another implementation, the adapter housing 1210 can include two media reading interfaces 1230 at one side to interface with two duplex fiber optic connector arrangements 1100 and four media reading interfaces 1230 at the other side to interface with four fiber optic connectors 1110. In other implementations, the adapter housing 1210 can include any desired combination of front and rear media reading interfaces 1230.

Figure 11:
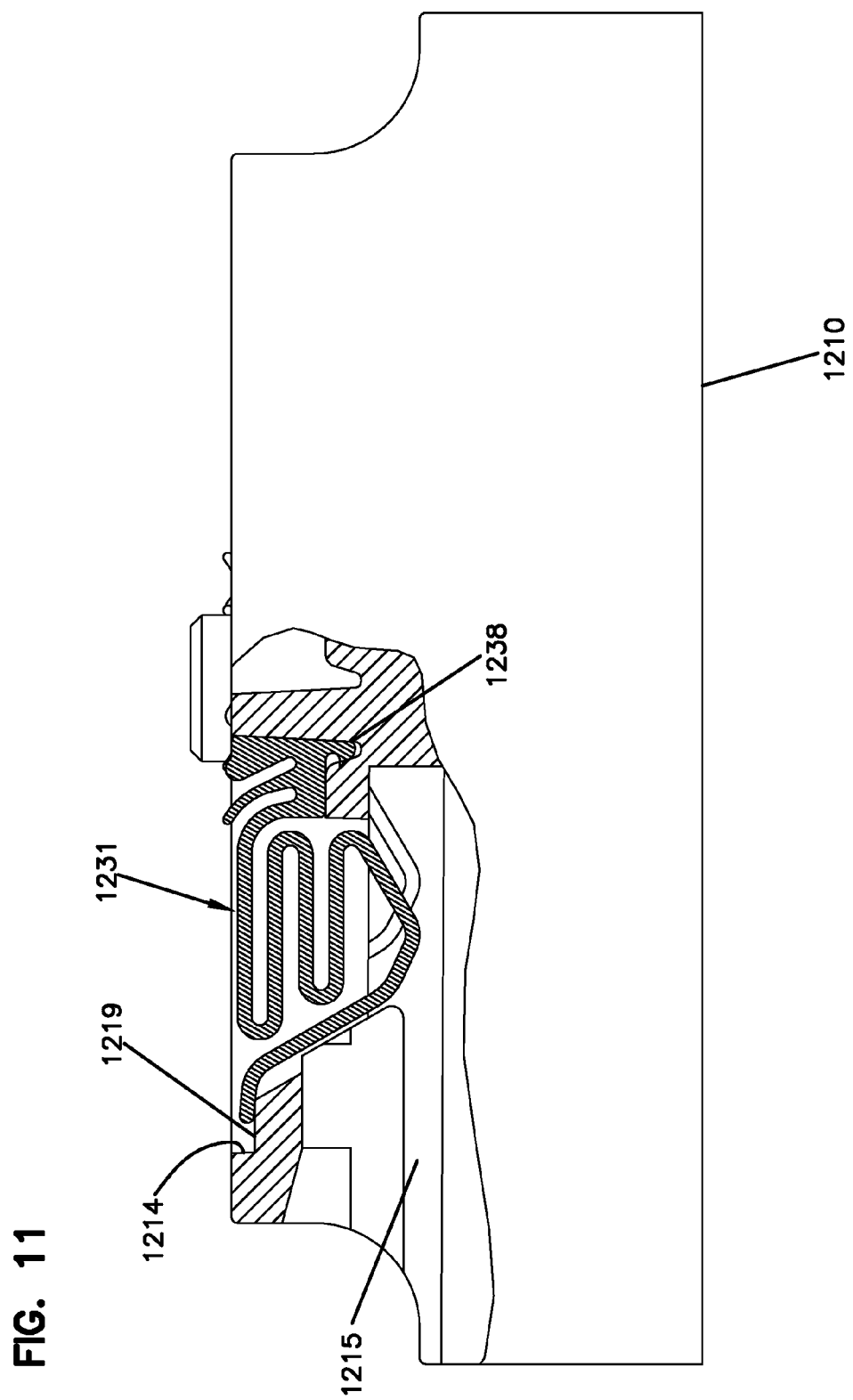
Figure 12:
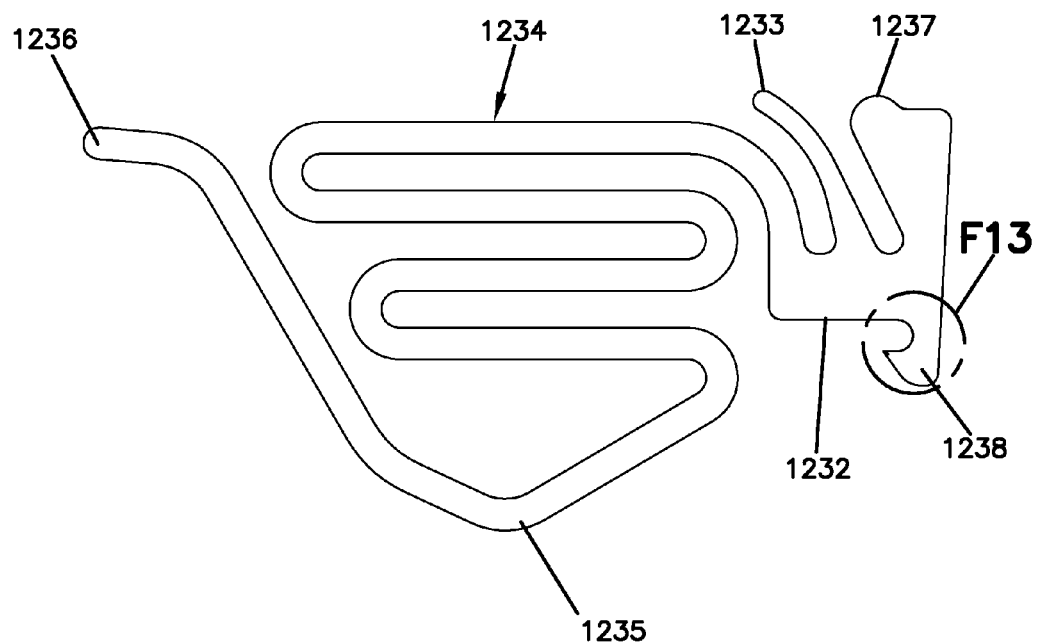

In general, each media reading interface 1230 is formed from one or more contact members 1231 (FIG. 12). In certain implementations, the adapter housing 1210 defines slots 1214 configured to receive one or more contact members 1231. In the example shown in FIGS. 9 and 10, the slots 1214 accommodating each media reading interface 1230 define four separate openings. In some implementations, the slots 1214 are configured so that portions of the contact members 1231 extend into the passages 1215 to engage the electrical contacts 1132 of the storage member 1130 positioned in the passages 1215 (see FIG. 11). Other portions of the contact members 1231 are configured to engage contacts and tracings on the printed circuit board 1220 associated with the adapter 1200. In the example shown in FIG. 8, the contacts and tracings on the printed circuit board 1220 that interact with the contact members 1231 are positioned on the non-visible side of the board 1220.

One example type of contact member 1231 is shown in FIG. 12. In one implementation, the contact member 1231 defines a planar body. In one implementation, the contact member 1231 is formed monolithically (e.g., from a continuous sheet of metal or other material). For example, in some implementations, the contact member 1231 may be manufactured by cutting a planar sheet of metal or other material. In other implementations, the contact member 1231 may be manufactured by etching a planar sheet of metal or other material. In other implementations, the contact member 1231 may be manufactured by laser trimming a planar sheet of metal or other material. In still other implementations, the contact member 1231 may be manufactured by stamping a planar sheet of metal or other material.

Each contact member 1231 defines at least three moveable contact locations 1233, 1235, and 1236. The flexibility of the contact surfaces 1233, 1235, and 1236 provides tolerance for differences in spacing between the contact member 1231 and the respective printed circuit board 1220 when the coupler assembly 1200 is manufactured. Certain types of contact members 1231 also include at least one stationary contact 1237.

Figure 14:
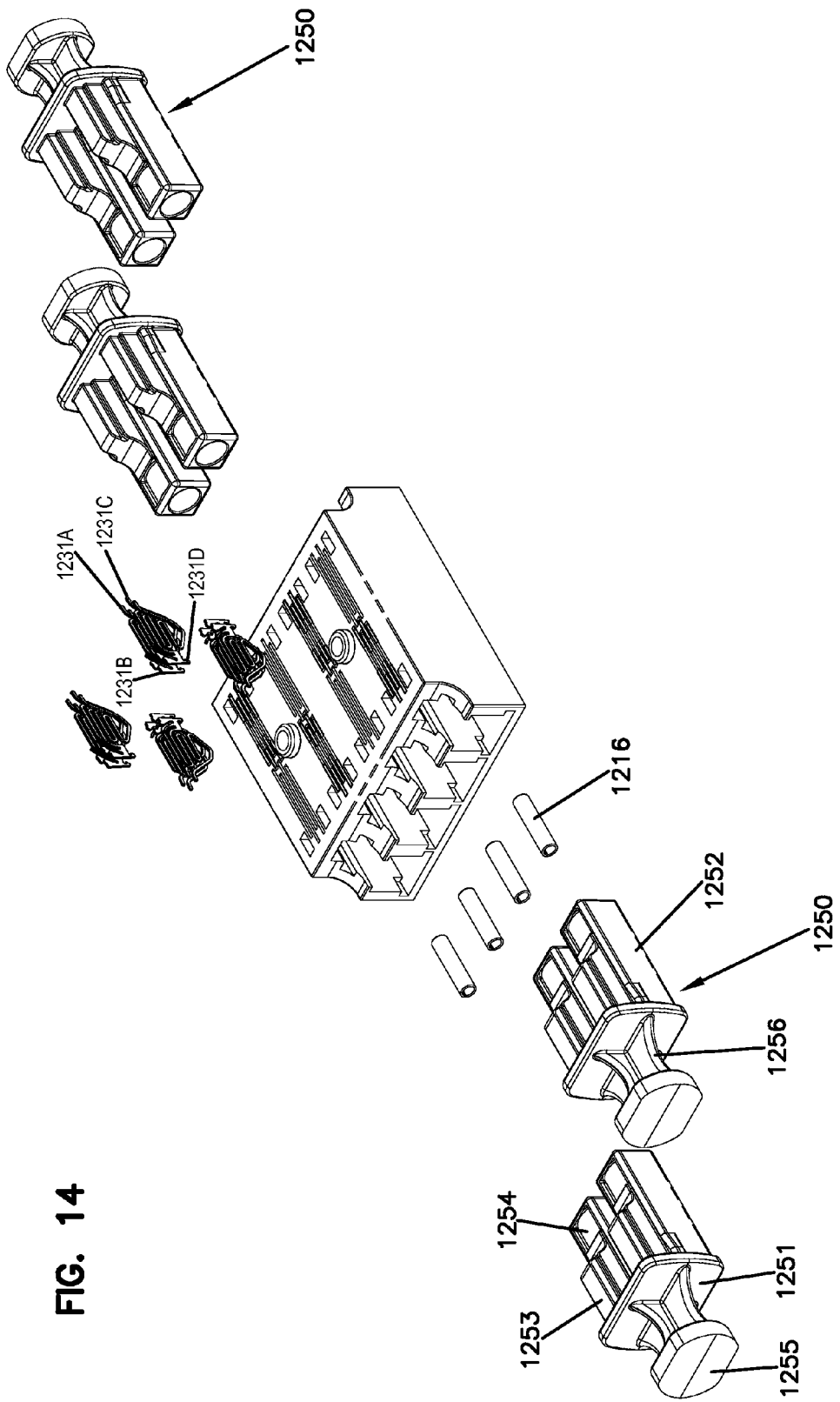

In some implementations, the contact members 1231 of a single media reading interface 1230 are positioned in a staggered configuration to facilitate access to the contact pads 1132 on the connector storage device 1130 of a connector arrangement 1100. For example, as shown in FIG. 14, alternating contact members 1231 can be staggered between at least front and rear locations within the slots 1214.

Figure 10:
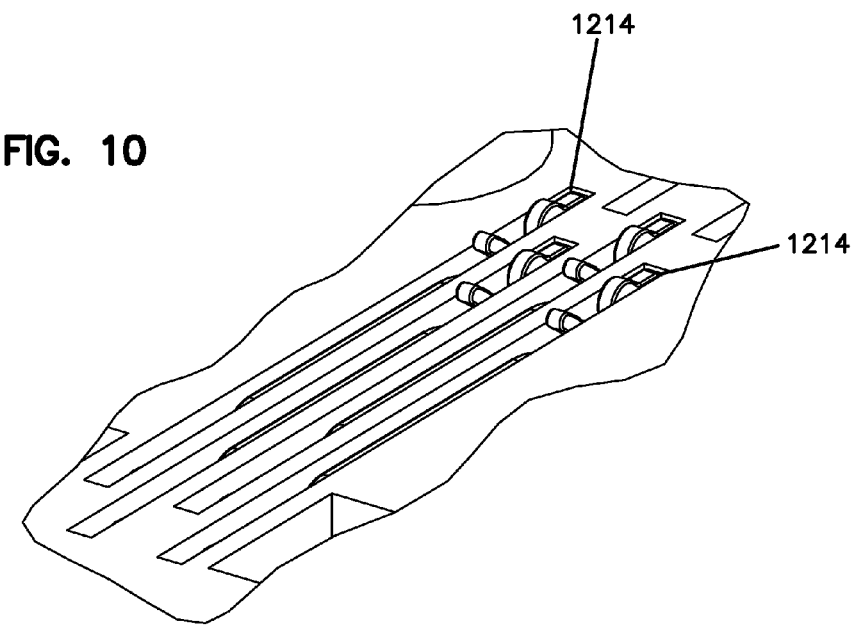

In some implementations, the contact members 1231 of a single media reading interface 1230 are staggered to facilitate access to the contact pads 1132 on the connector storage device 1130. For example, as shown in FIGS. 9 and 10, alternating contact members 1231 can be staggered between at least first and second locations within the slots 1214 (see configuration C2, shown in detail in FIG. 10). Likewise, in some implementations, the contact pads 1132 on each storage device 1130 can be arranged in staggered positions. In other implementations, the contact pads 1132 on each storage device 1130 can vary in size and/or shape to facilitate a one-to-one connection between the contact members 1231 and the contact pads 1132 (e.g., see pads 1132 in FIG. 5).

In the example shown in FIG. 9, each media reading interface 1230 of the fiber optic adapter 1200 includes four contact members 1231. A first contact member 1231A and a third contact member 1231C of the media reading interface 1230 are mounted at first positions with the slot 1214 (see FIG. 14). A second contact member 1231B and a fourth contact member 1231D of the media reading interface 1230 are mounted at second positions within the slot 1214. In the example shown in FIG. 14, first and third contact pads 1132A, 1132C of the storage device 1130 extend a first distance over the board 1131 and second and fourth contact pads 1132B, 1132D extend a second distance over the board 1131.

In the example shown in FIG. 11, at least portions of two contact members 1231 are visibly positioned within a slot 1214 defined in a fiber optic adapter 1210, shown in cross-section. Two additional contact members 1231 also are positioned in the slot 1214 (see FIG. 10), but cannot be seen since the additional contact members 1231 laterally align with the visible contact members 1231. In other implementations, however, greater or fewer contact members 1231 may be positioned within the housing 1210.

Figure 13:
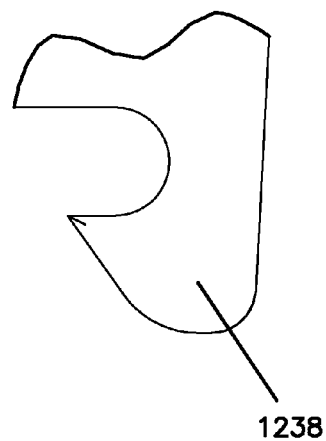

The example contact member 1231 shown includes a base 1232 that is configured to be positioned within a slot 1214 defined by an adapter 1210. The base 1232 of certain types of contact members 1231 is configured to secure (e.g., snap-fit, latch, pressure-fit, etc.) to the adapter 1210. The base 1232 also can include a retention section 1238 that secures the member 1231 in the adapter body 1210 (e.g., see FIG. 11). An exploded view of the retention section 1238 is shown in FIG. 13.

A stationary contact location 1237 may extend from the base 1232, through the slot 1214, toward the printed circuit board 1220 to touch a contact pad or a grounding line on the printed circuit board 1220. A first arm extends from the base 1232 to define the first contact location 1233. A second arm extends from the base 1232 to define a resilient section 1234, the second contact location 1235, and the third contact location 1236. The first and second arms extend generally away from the passage 1215 and toward an exterior of the adapter housing 1210 at the first and third contact locations 1233, 1236 (see FIG. 11).

At least the first moveable contact location 1233 is aligned and configured to extend outwardly of the adapter housing 1210 through the slots 1214 to touch a first contact pad on the corresponding circuit board 1220 when the printed circuit board 1220 is mounted to the adapter housing 1210. The ability of the first arm to flex relative to the stationary contact 1237 provides tolerance for placement of the contact member 1231 relative to the circuit board 1220. In certain implementations, the first moveable contact location 1233 touches the same contact pad as the stationary contact location 1237. In one implementation, the stationary contact location 1237 and the first moveable contact location 1233 provide grounding of the contact member 1231.

The second arm extends from the base 1232 to define the resilient section 1234, the second moveable contact location 1235, and the third moveable contact location 1236. In one implementation, the second contact location 1235 defines a trough located on the second arm between the resilient section 1234 and the third contact location 1236. The resilient section 1234 is configured to bias the second contact location 1235 towards the channel passage 1215 (see FIG. 11). In some implementations, the second contact location 1235 extends sufficiently into the passage 1215 to enable engagement between the second contact location 1235 and the connector body 1111 (e.g., key 1115) of the connector 1110.

The third contact location 1236 is configured to be positioned initially within the passage 1215. For example, the resilient section 1234 biases the third contact section 1236 away from an exterior of the housing 1210 when a fiber optic connector 1110 is not inserted into the passage 1215. The resilient section 1234 is configured to bias the third contact location 1236 through the slot 1214 to an exterior of the housing 1210 when a connector arrangement 1100 or other media segment pushes against the second contact location 1235. In the example shown, the resilient section 1234 is implemented as a looped/bent section of the second arm. In other implementations, the second arm can otherwise include springs, reduced width sections, or portions formed from more resilient materials. In other implementations, other types of contact members can be utilized.

In accordance with some aspects, insertion of the connector body 1111 into the passage 1215 causes the third contact location 1236 to contact the printed circuit board 1220. For example, in some implementations, the key 1115 of the connector body 1111 contacts the second contact location 1235 on the contact member 1231 when the connector 1110 is inserted into the passage 1215. When the key 1115 engages the second contact location 1235, the key 1115 pushes against the second contact location 1235 to move the third contact location 1236 against the bias of the resilient section 1234 toward the exterior of the adapter housing 1210 sufficient to contact the contact pads and tracings on the printed circuit board 1220.

As discussed above, a processor (e.g., processor 217 of FIG. 2) or other such equipment also can be electrically coupled to the printed circuit board 1220. Accordingly, the processor can communicate with the memory circuitry on the storage device 1130 via the contact members 1231 and the printed circuit board 1220. In accordance with some aspects, the processor is configured to obtain physical layer information from the storage device 1130. In accordance with other aspects, the processor is configured to write (e.g., new or revised) physical layer information to the storage device 1130. In accordance with other aspects, the processor is configured to delete physical layer information to the storage device 1130. In one example implementation, at least a first contact member 1231 transfers power, at least a second contact member 1231 transfers data, and at least a third contact member 1231 provide grounding. However, any suitable number of contact members 1231 can be utilized within each media reading interface 1230.

In accordance with some aspects, the contact members 1231 of a media reading interface 1230 are configured to form a complete circuit with the printed circuit board 1220 only when a portion (e.g., the key 1115) of a fiber optic connector 1110 is inserted within the respective passage 1215. For example, the second contact locations 1235 of each contact member 1231 can be configured to raise the third contact location 1236 external of the housing 1210 through the slot 1214 when the second contact location 1235 is lifted by the key 1115.

Accordingly, the contact members 1231 can function as presence detection sensors or switches. For example, a completion of a circuit between the printed circuit board 1220 and a media reading interface 1230 can indicate that fiber optic connector 1110 is received within the passage 1215. In other example implementations, the contact members 1231 can be configured to complete the circuit until one or more portions are pushed away from a shorting rod by a media segment. In accordance with other aspects, some implementations of the contact members 1231 can be configured to form a complete circuit with the printed circuit board 1220 regardless of whether a media segment is received in the passage 1215.

If the connector 1110 inserted into the passage 1215 carries a storage device 1130, then insertion of the connector 1110 sufficiently far into the passage 1215 aligns one or more contact pads 1132 on a storage device 1130 with contact members 1231 of the media reading interface 1230. Accordingly, the processor (e.g., a main processor) coupled to the printed circuit board 1220 is communicatively coupled to the storage device 1130 of the fiber optic connector 1110 through the contact member 1231. In some implementations, the second contact location 1235 of each contact member 1231 is aligned with one of the contact pads 1132 of a storage device 1130 when the connector 1110 is fully inserted into the passage 1215. In other implementations, the second contact locations 1235 are sufficiently aligned with the contact pads 1132 to enable communication between the printed circuit board 1220 and the storage device 1130 even before the connector 1110 is fully inserted into the passage 1215.

As shown in FIG. 14, dust caps 1250 can be mounted within the adapter passages 1215, 1215 when connectors 1110, 1110 are not received thereat. The dust caps 1250 can inhibit dust, dirt, or other contaminants from entering the passages 1215, 1215 when the passages 1215, 1215 are not being utilized.

One example dust cap 1250 is shown in FIG. 14. In the example shown, the dust cap 1250 includes a cover 1251 configured to fit over a mouth of a passage 1215, 1215. A handle including a grip 1255 and a stem 1256 extend outwardly from a first side of the cover 1251. The handle facilitates insertion and withdrawal of the dust cap 1250 from the passage 1215, 1215. Insertion members 1252 extend outwardly from a second side of the cover 1251. Each insertion member 1252 is configured to fit within a passage 1215, 1215 of the adapter housing 1210, 1210 to hold the dust cap 1250 at the port.

In the example shown, each dust cap 1250 is a duplex dust cap that includes two insertion members 1252. In other implementations, however, each dust cap 1250 can include greater or fewer insertion members 1252. In the example shown, each insertion member 1252 is shaped similarly to a fiber optic connector that is configured to be retained at a port of each passage 1215, 1215. For example, each insertion member 1252 can include a retaining member 1253 that is configured to interface with the latch engagement structures 1217, 1217 of the adapter housing 1210, 1210.

Figure 68:
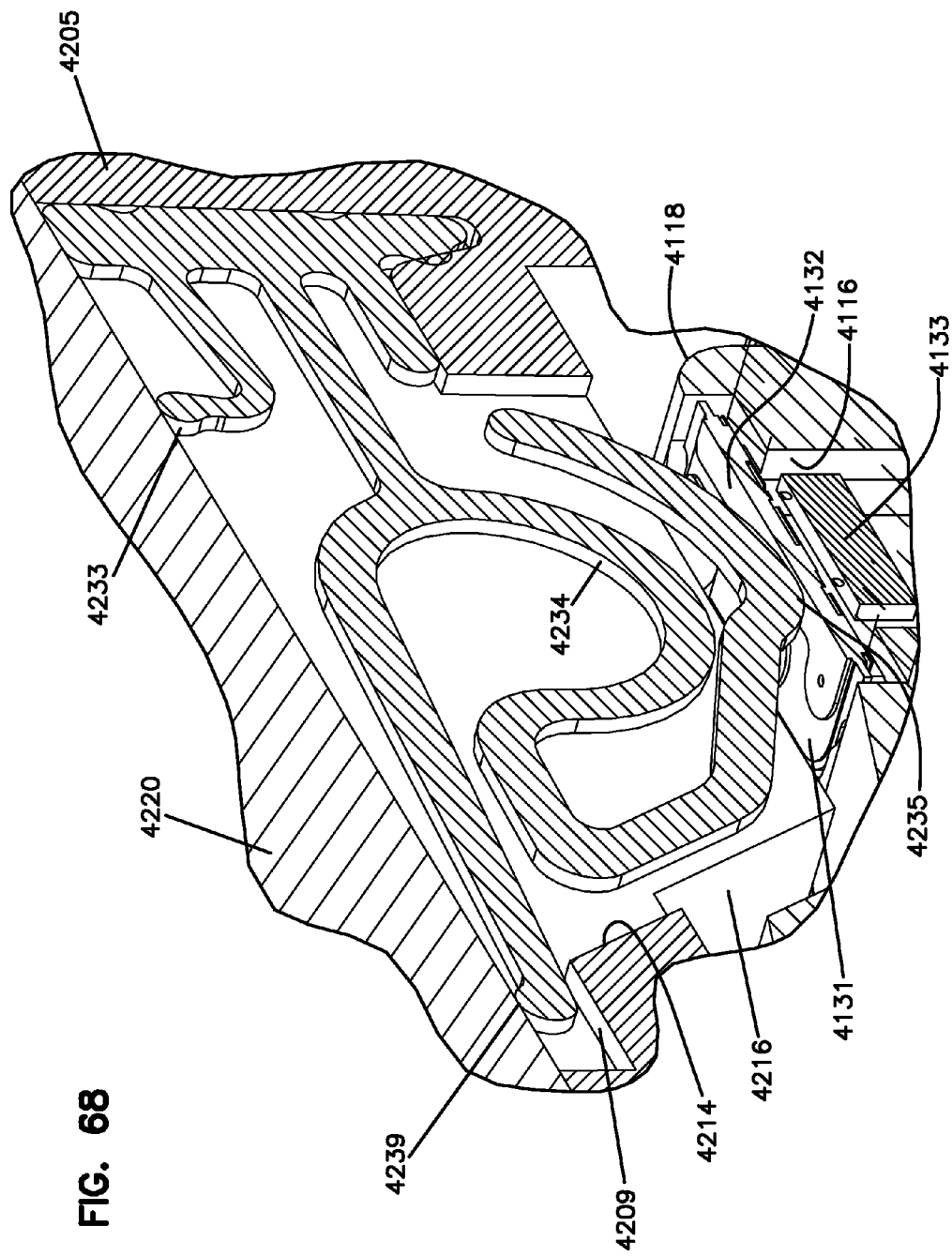
Figure 69:
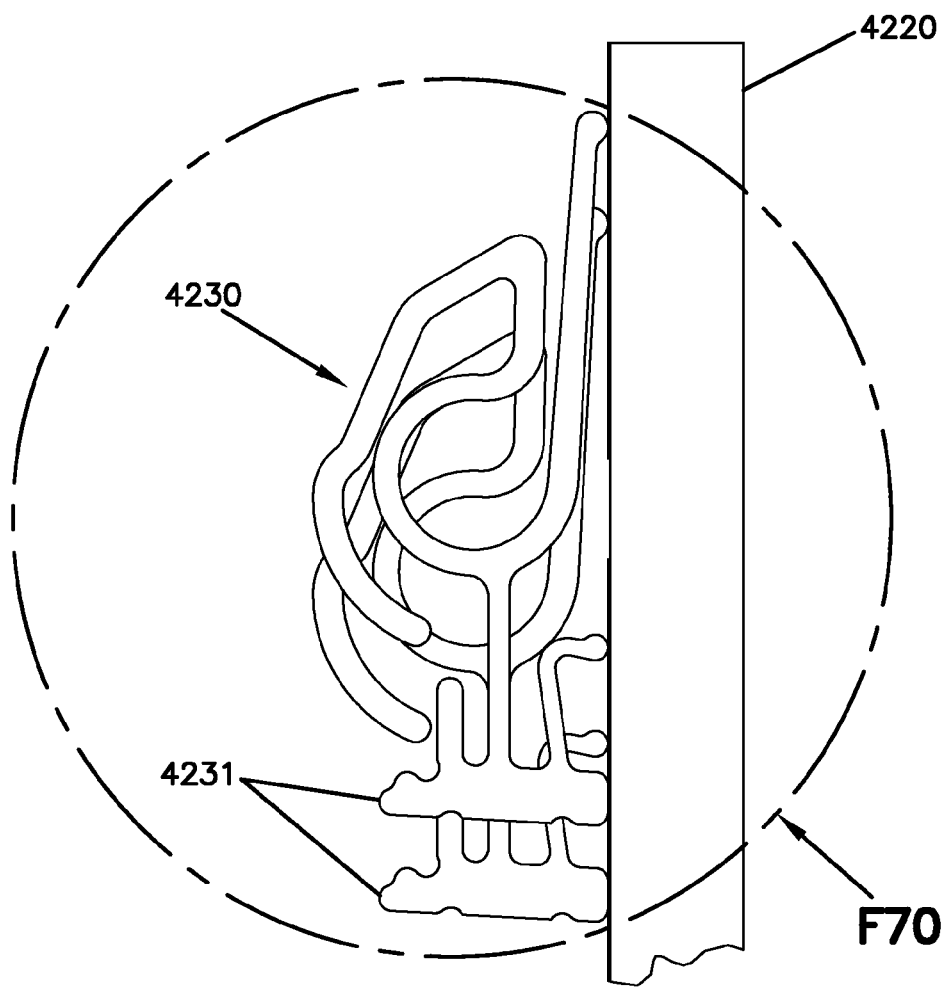
Figure 70:
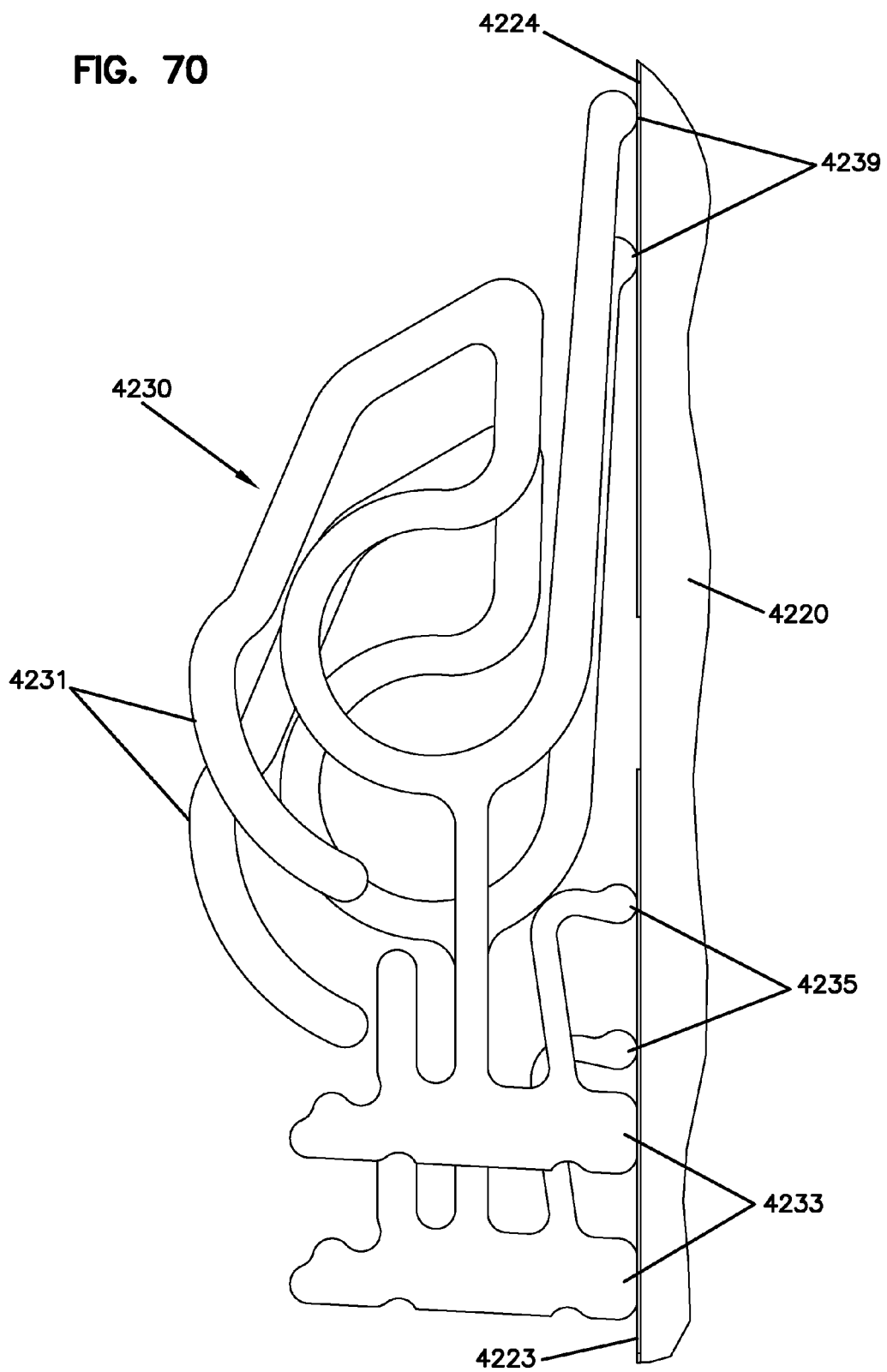
Figure 71:
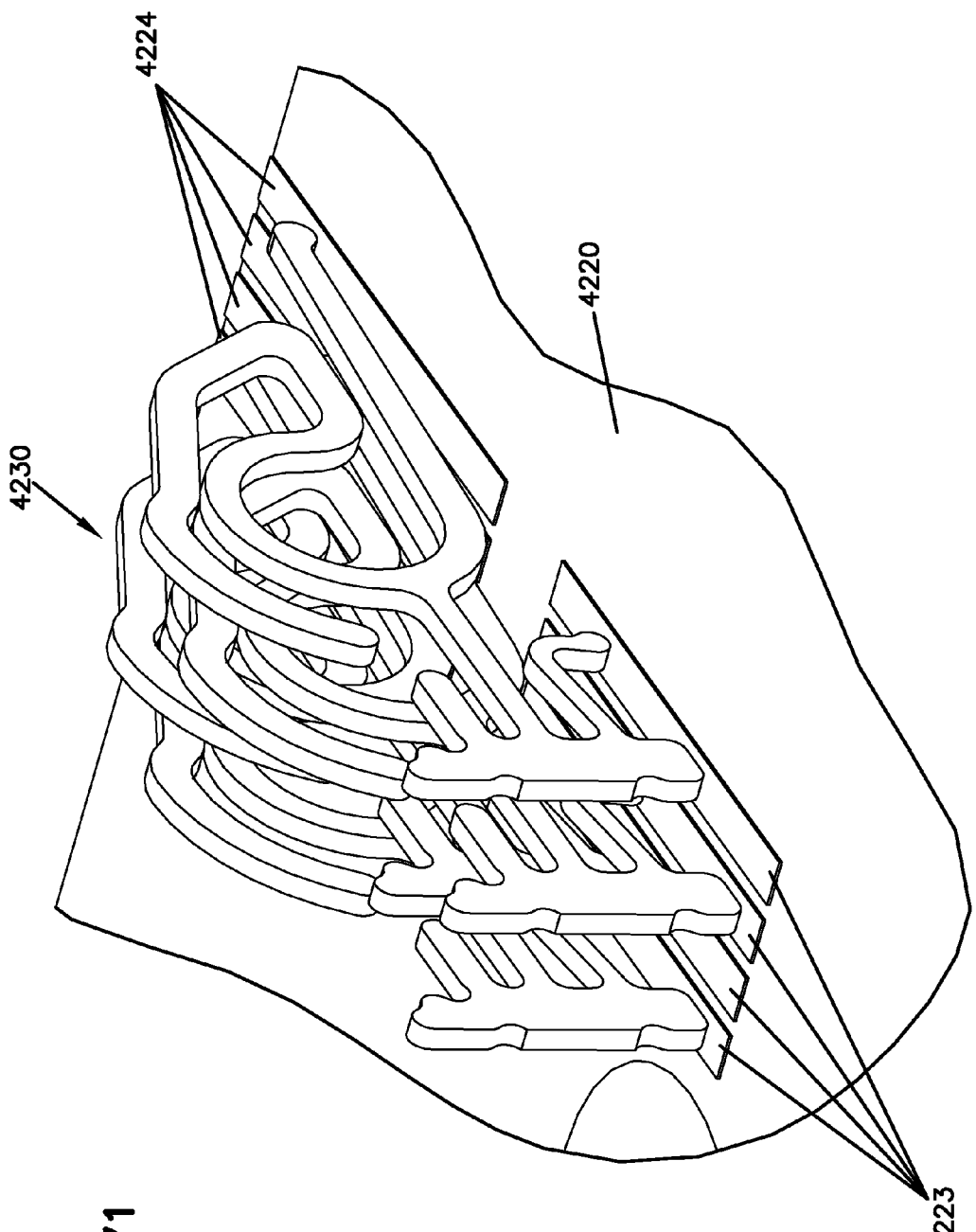

In some implementations, the dust caps 1250 are shaped and configured to avoid triggering the presence detection sensor/switch formed by the media reading interfaces (e.g., see FIGS. 68 and 155). Accordingly, insertion of a dust cap 1250 into a passage 1215, 1215 does not trigger the presence switch associated with the passage 1215, 1215. For example, the dust caps 1250 can be shaped and configured to inhibit engaging the second contact location 1235 of the contact members 1231 associated with the respective passage 1215. In the example shown, the front ends of the insertion members 1252 do not include raised portions (e.g., raised portions 1115, 1115 of fiber optic connectors 1110, 1110).

In other implementations, the dust caps 1250 may include storage devices containing physical layer information. In such implementations, the dust caps 1250 may be shaped and configured to trigger the presence switch through interaction with the contact members 1231, 1231 and to be read through the media reading interfaces 1230, 1230 of the passage 1215, 1215.

FIGS. 15-43 illustrate a second example implementation of a connector system 2000 that can be utilized on a connector assembly having PLI functionality as well as PLM functionality. The example connector system 2000 includes at least one communications coupler assembly 2200 positioned between two printed circuit boards 2220.

One or more example connector arrangements 2100 (FIG. 23), which terminate segments 1010 of communications media, are configured to communicatively couple to other segments of physical communications media at the one or more communications coupler assemblies 2200. The same reference numbers are used herein to designate like elements on both connector arrangements 2100 and 2100. Accordingly, communications data signals carried by the media segments 1010 terminated by the connector arrangements 2100 can be transmitted to other media segments.

Figure 15:
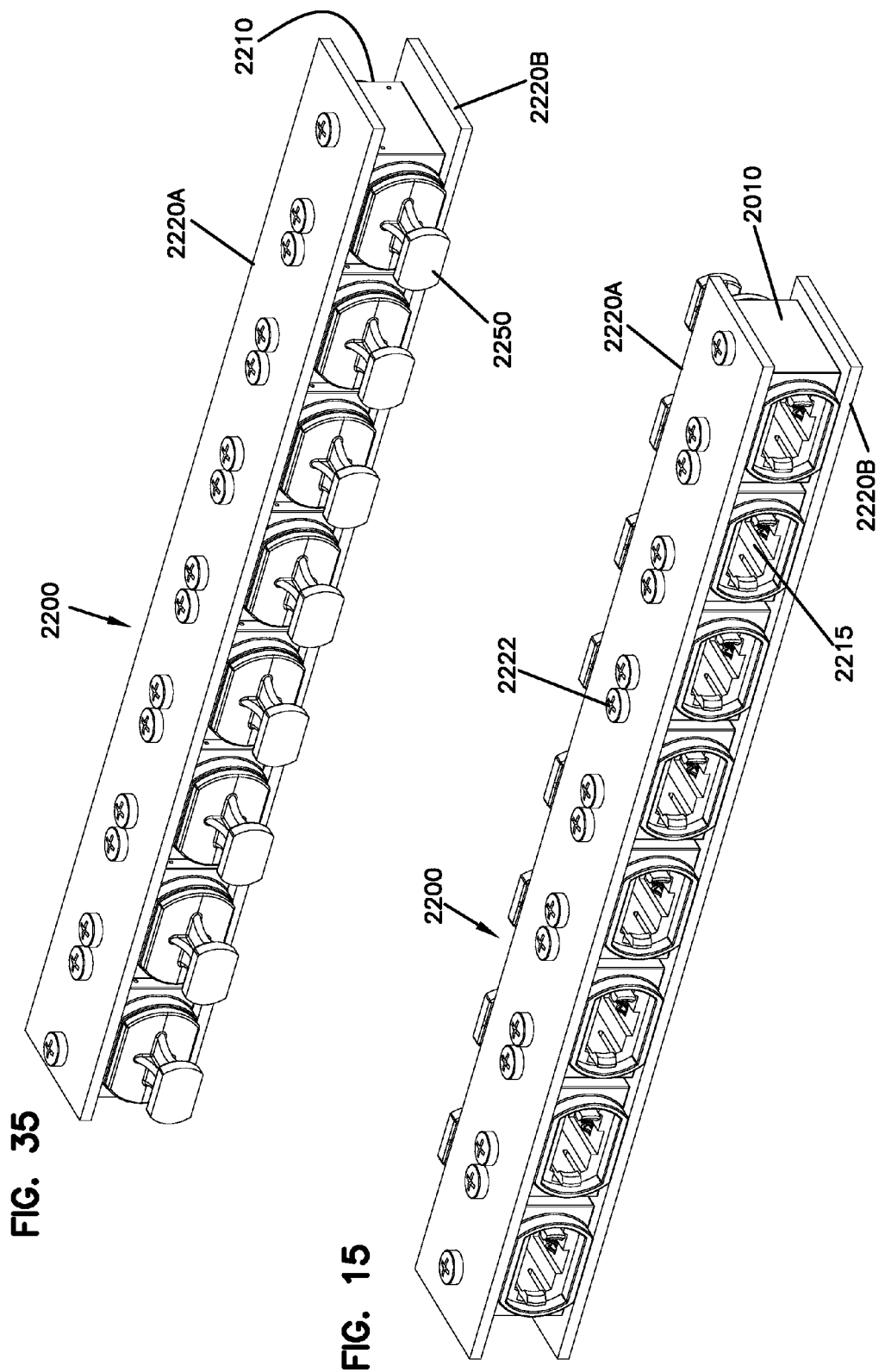
Figure 16:
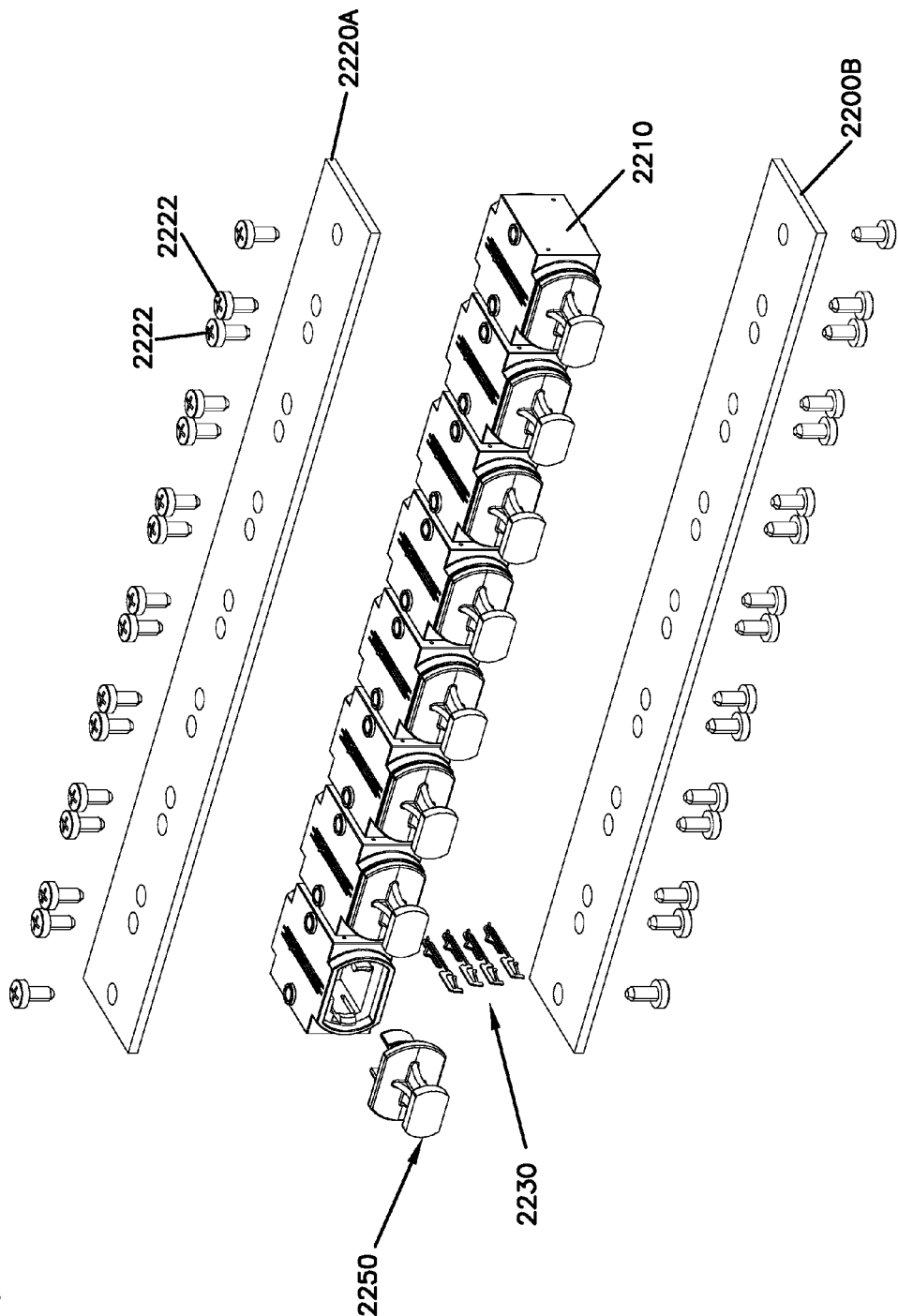
Figure 17:
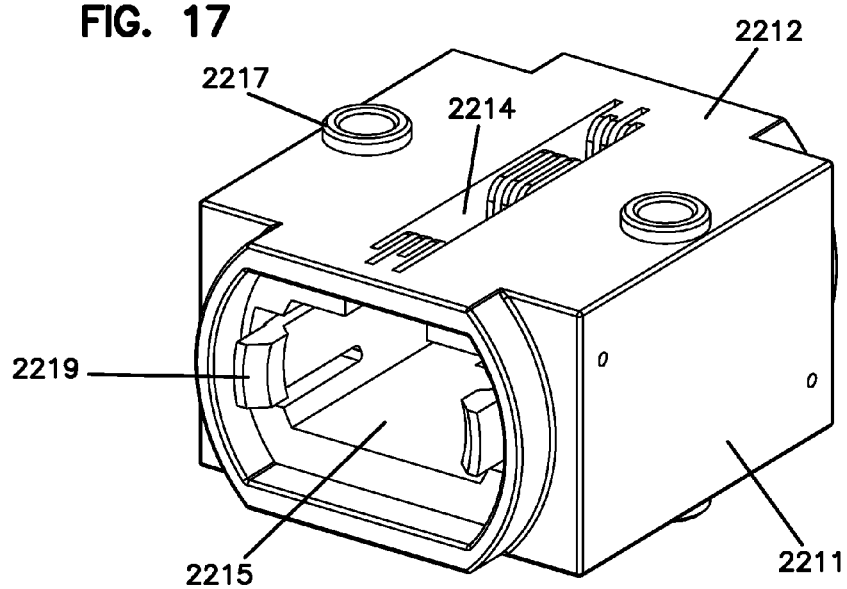
Figure 18:
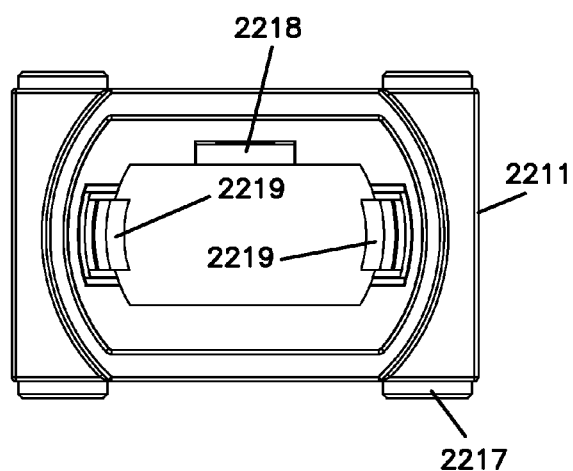
Figure 19:
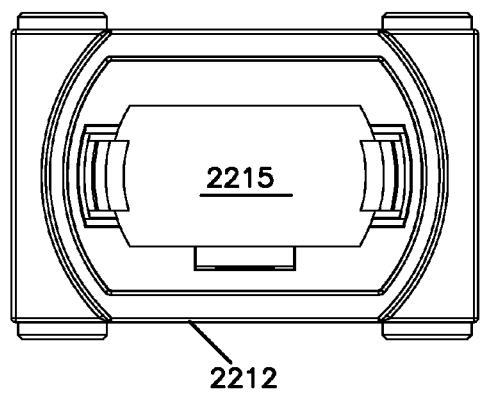
Figure 20:
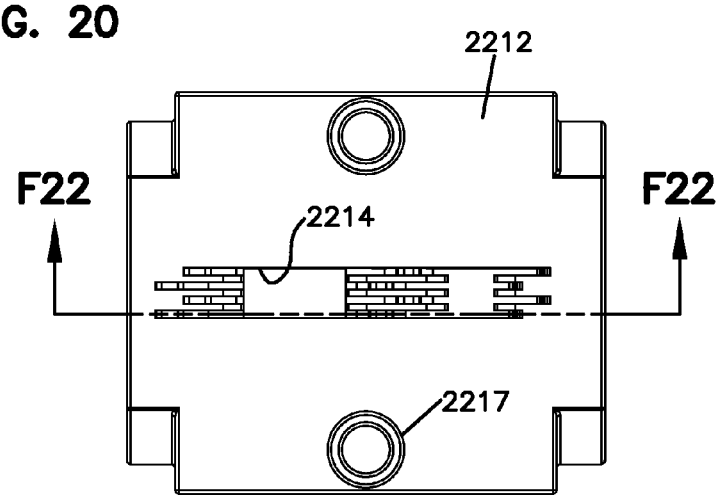
Figure 21:
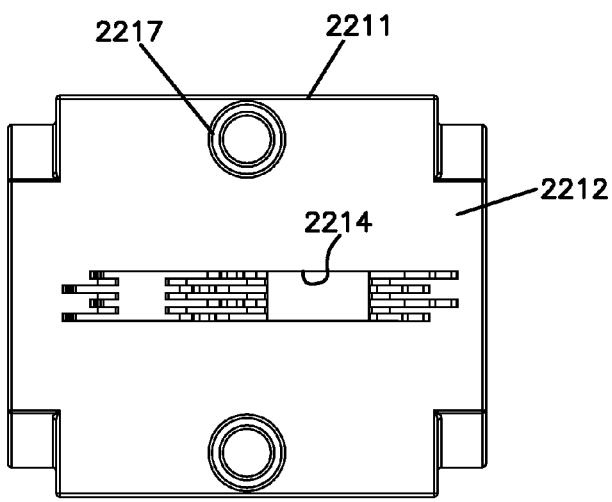
Figure 22:
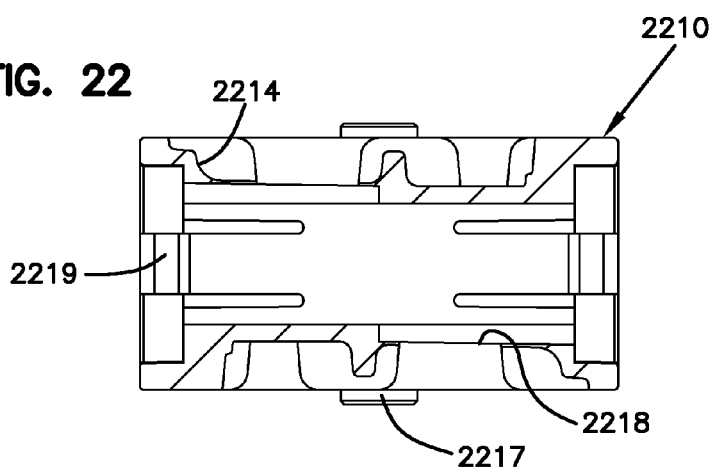

In the example shown in FIGS. 15 and 16, eight coupler housings 2210 are sandwiched between a first printed circuit board 2220A and a second printed circuit board 2220B (e.g., via fasteners 2222). In some implementations, the first printed circuit board 2220A can be electrically coupled to the second printed circuit board 2220B via a fixed connector (e.g., a card edge connector). In other implementations, the first printed circuit board 2220A can be electrically coupled to the second printed circuit board 2220B via a flexible or ribbon cable arrangement. In still other implementations, the printed circuit boards 2220A, 2220B are interconnected using other suitable circuit board connection techniques.

In the example shown, each coupler housing 2210 defines a single passage 2215 extending between opposite open ends. In other example implementations, however, each coupler housing 2210 can include a greater number (e.g., two, three, four, six, eight, twelve, etc.) of passages 2215. Each open end of each passage 2215 is configured to receive a segment of communications media (e.g., a connectorized end of an optical fiber) 1010. In other implementations, the example connector system 2000 can include greater or fewer coupler housings 2210.

For ease in understanding, only portions of the example printed circuit boards 2220 of the connector system 2000 are shown in FIGS. 15 and 16. It is to be understood that the printed circuit boards 2220 electrically connect to a data processor and/or to a network interface (e.g., processor 217 and network interface 216 of FIG. 2) as part of a connector assembly. As noted above, non-limiting examples of such connector assemblies include bladed chassis and drawer chassis. Furthermore, additional coupler housings 2210 can be connected to different portions of the printed circuit boards 2220 or at other locations within an example connector assembly.

Figure 23:
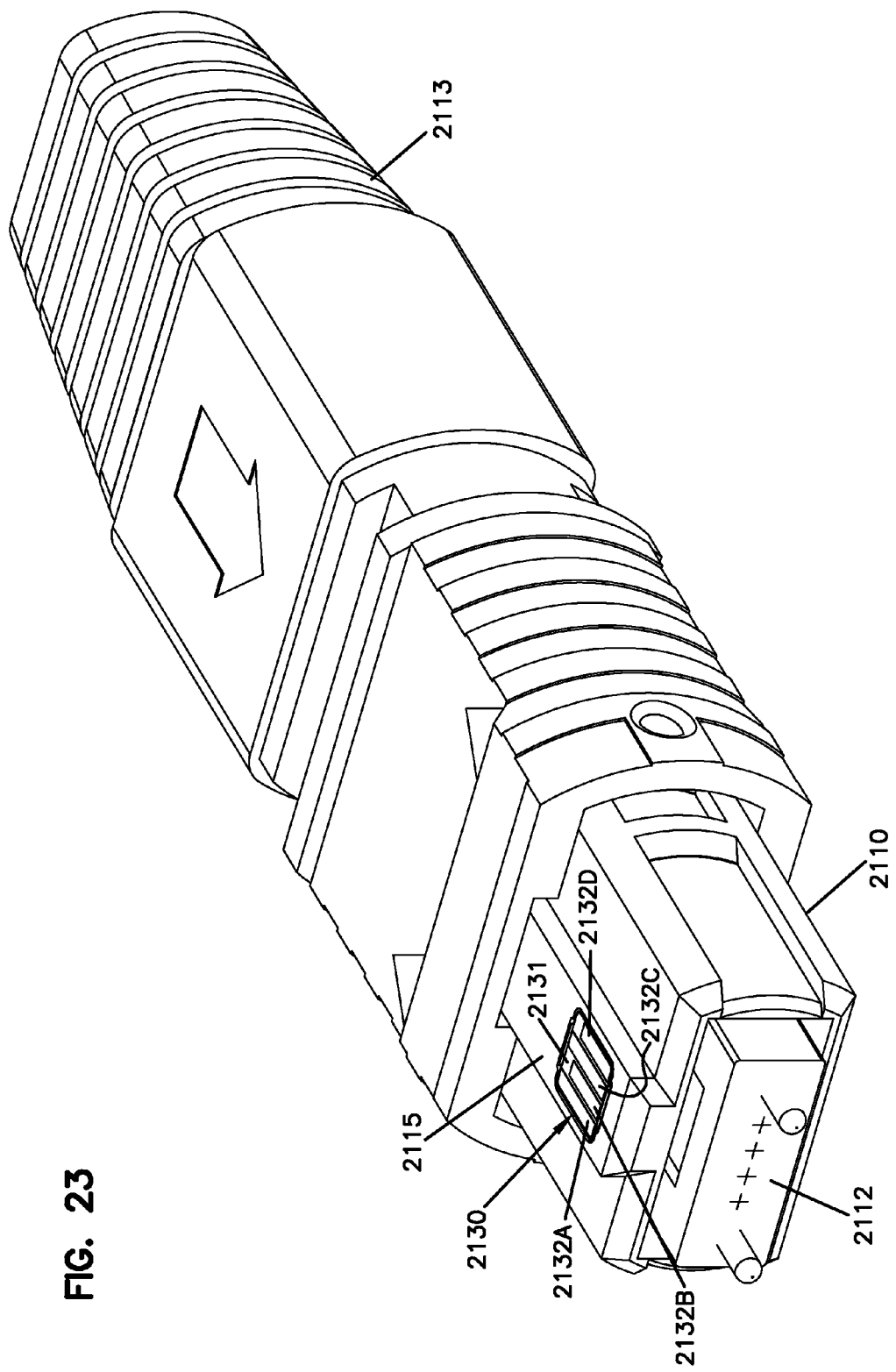
Figure 24:
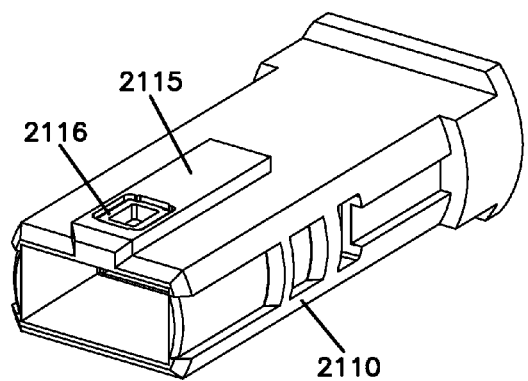
Figure 25:
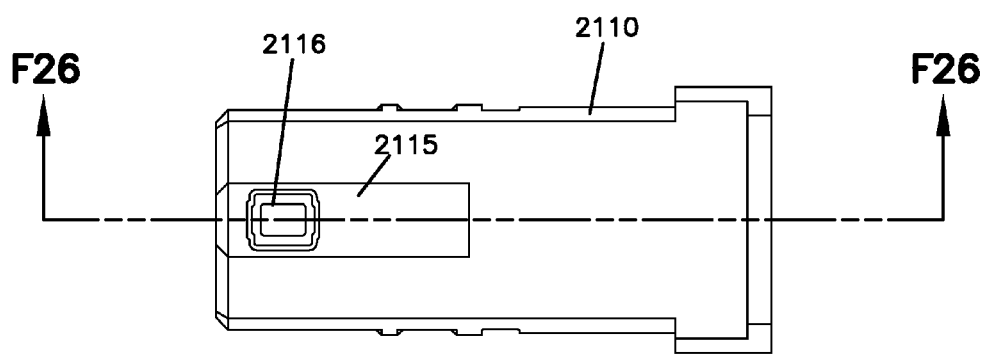
Figure 26:
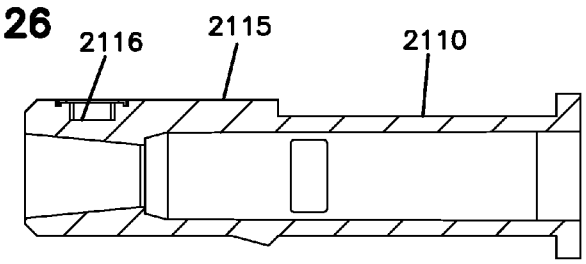
Figure 27:
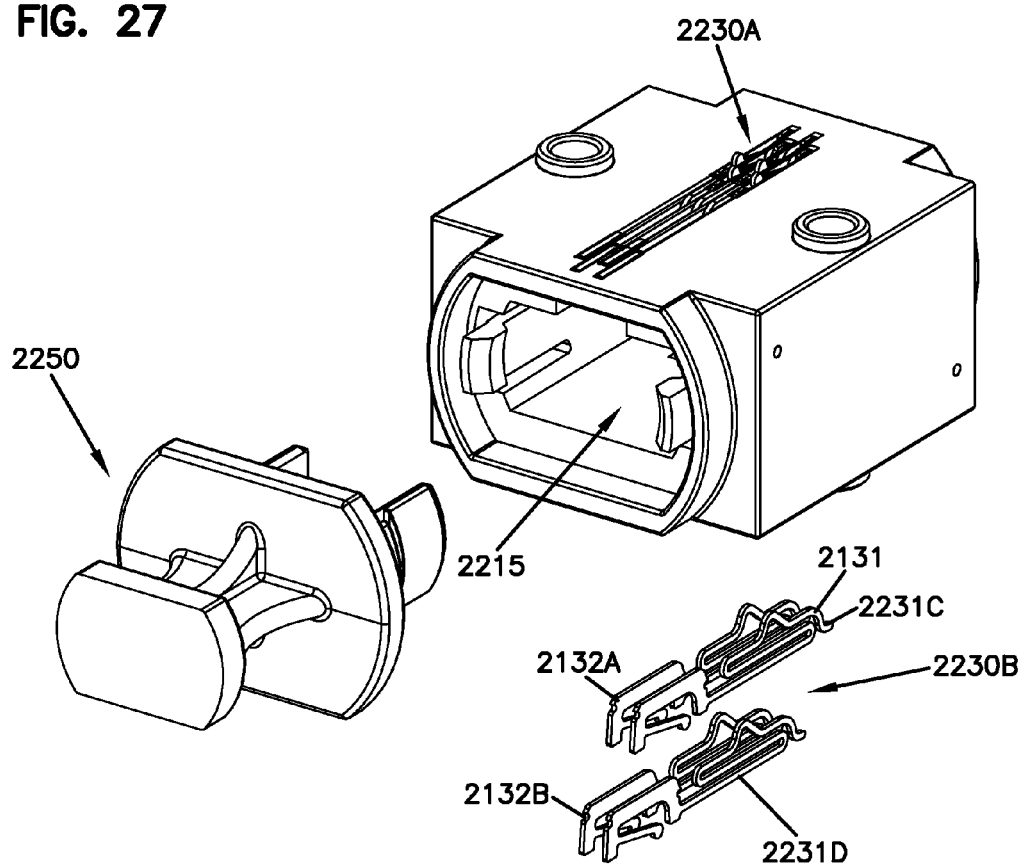

One example coupler housing 2210 is shown in FIGS. 17-22. In the example shown, each coupler housing 2210 is implemented as a fiber optic adapter configured to receive Multi-Fiber Push-On (MPO) connectors. Each passage 2215 of the MPO adapters 2210 is configured to align and connect two MPO connector arrangements 2100 (FIG. 23). In other implementations, each passage 2215 can be configured to connect other types of physical media segments. For example, one or more passages 2215 of the MPO adapters 2200 can be configured to communicatively couple together an MPO connector arrangement 2100 with a media converter (not shown) to convert the optical data signals into electrical data signals, wireless data signals, or other type of data signals.

The example coupler housing 2210 is formed from opposing sides 2211 interconnected by first and second ends 2212. The sides 2211 and ends 2212 each extend between an open front and an open rear to define passages 2215. In the example shown in FIG. 17, the sides 2211 are generally flat. The coupler housing 2210 also defines mounting stations 2217 at which fasteners 2222 can be received to secure the coupler housing 2210 to one or more printed circuit boards 2220. For example, the mounting stations 2217 can aid in securing the coupler housing 2210 to the upper circuit board 2220A and the lower circuit board 2220B shown in FIG. 15. In the example shown, each mounting station 2217 defines an opening in the first and second ends 2212 in which the fasteners 2222 can be inserted. Non-limiting examples of suitable fasteners 2222 include screws, snaps, and rivets. In other implementations, the mounting stations 2217 can include latches, panel guides, or other panel mounting arrangements.

In some implementations, flexible latching tabs 2219 are located at the entrances of the passages 2215 to aid in retaining connector arrangements within the passages 2215. In the example shown, each latching tab 2219 defines a ramped surface and latching surface. The coupler housings 2210 also define channels 2218 extending partly along the length of the passages 2215 (e.g., see FIGS. 19 and 22) to accommodate portions of the fiber connector arrangements 2100. In some implementations, the adapter 2210 may define a channel 2218 extending inwardly from each open end of the passage 2215. In one example implementation, a first channel 2218 extends along a top of the housing 2210 from a first end of each passage 2215 and a second channel 2218 extends along a bottom of the housing 2210 from a second end of each passage 2215.

Each adapter housing 2210 includes at least one media reading interface 2230 (e.g., see FIG. 16) configured to acquire the physical layer information from a storage device 2130 of a fiber connector arrangement 2100 (see FIGS. 23-26). In the example shown in FIG. 16, each MPO adapter 2210 includes at least one media reading interface 2230 that is configured to communicate with the storage device 2130 on an MPO connector 2110 plugged into the MPO adapter 2210. For example, in one implementation, the adapter 2210 can include a media reading interface 2230 associated with each passage 2215. In another implementation, the adapter 2210 can include a media reading interface 2230 associated with each connection end of a passage 2215.

FIGS. 23-26 show one example implementation of a connector arrangement implemented as an MPO connector 2100 that is configured to terminate multiple optical fibers. As shown in FIG. 23, each MPO connector 2100 includes a connector body 2110 enclosing a ferrule 2112 that retains multiple optical fibers (e.g., 2, 3, 4, 8, 12, or 16 fibers). The connector body 2110 is secured to a boot 2113 to provide bend protection to the optical fibers.

The connector arrangement 2100 is configured to store physical layer information (e.g., media information). For example, the physical layer information can be stored in a memory device 2130 mounted on or in the connector body 2110. In the example shown in FIG. 23, the connector body 2110 includes a key 2115 configured to accommodate the storage device 2130 on which the physical layer information is stored. The key 2115 includes a raised (i.e., or stepped up) portion of the connector body 2110 located adjacent the ferrule 2112. The raised portion 2115 defines a cavity 2116 in which the storage device 2130 can be positioned. In some implementations, the cavity 2116 is two-tiered (e.g., see FIGS. 24 and 26), thereby providing a shoulder on which the storage device 2130 can rest and space to accommodate circuitry located on a bottom of the storage device 2130. In other implementations, the storage device 2130 can be otherwise mounted to the connector housing 2110.

One example storage device 2130 includes a printed circuit board 2131 to which memory circuitry can be arranged. In one example embodiment, the storage device 2130 includes an EEPROM circuit arranged on the printed circuit board 2131. In other embodiments, however, the storage device 2130 can include any suitable type of memory. In the example shown in FIG. 23, the memory circuitry is arranged on the non-visible side of the printed circuit board 2131. Electrical contacts 2132 (FIG. 23) also are arranged on the printed circuit board 2131 for interaction with a media reading interface 2230 of the connector assembly 2200.

In the example shown in FIG. 23, the contacts 2132 define planar surfaces extending in a front-to-rear direction. In one implementation, the contacts 2132 are configured to promote even wear amongst the contacts 2132. In some implementations, the contacts 2132 alternate between long and short planar surfaces. For example, contacts 2132A and 2132C are longer than contacts 2132B and 2132D (see FIG. 23).

FIGS. 27-34 show the media reading interface 2230 of the MPO adapter 2200 in accordance with some implementations. In the example shown, the MPO adapter housing 2210 includes a first media reading interface 2230A and a second media reading interface 2230B. In some implementations, the first media reading interface 2230A is associated with a first connection end of the passage 2215 and the second media reading interface 2230B is associated with a second connection end of the passage 2215 (see FIGS. 32-33).

Figure 32:
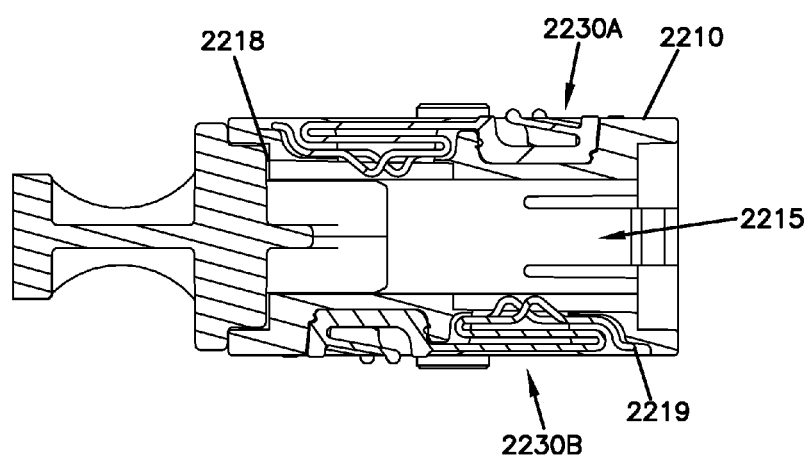
Figure 33:
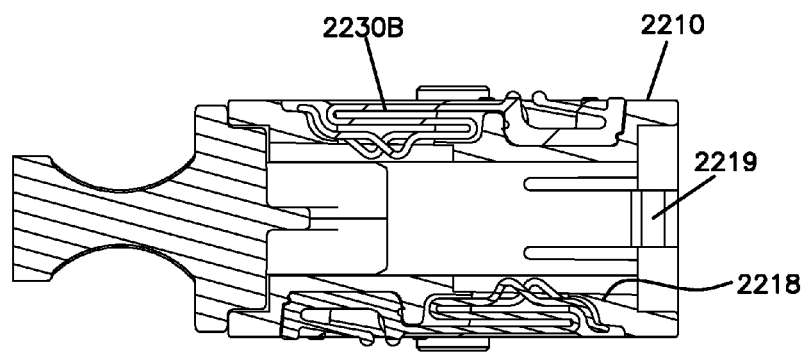
Figure 36:
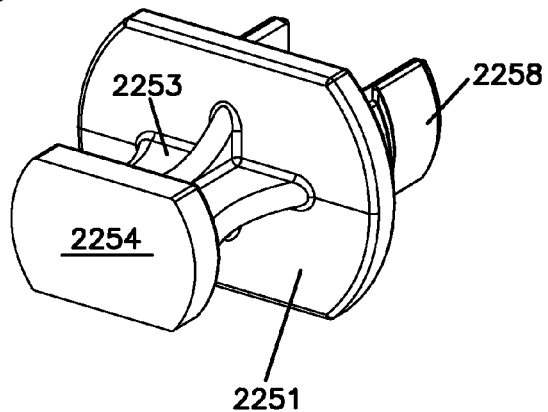
Figure 37:
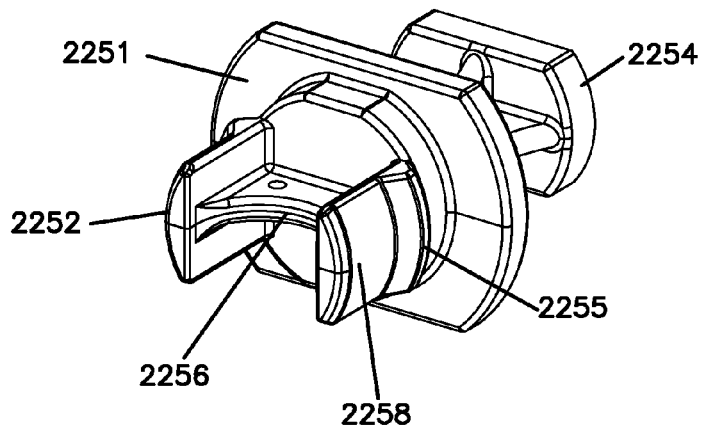
Figure 39:
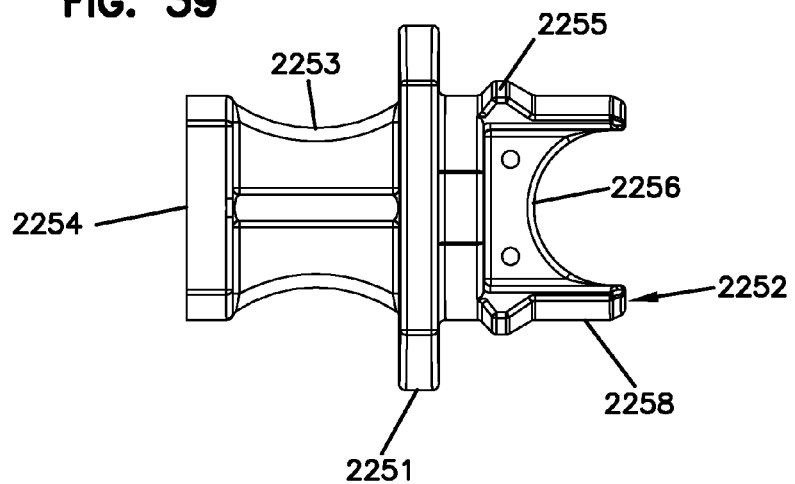
Figure 38:
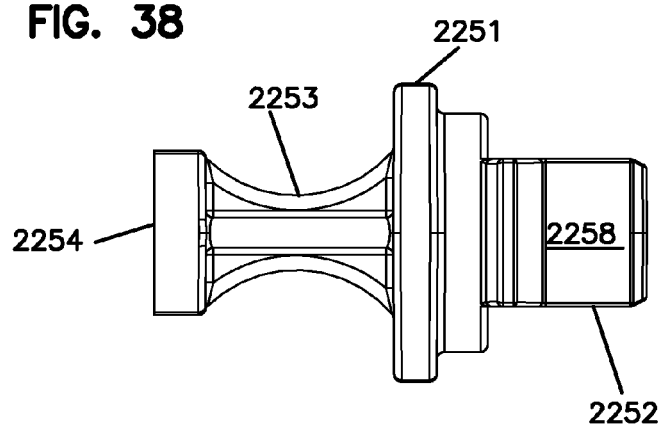
Figure 40:
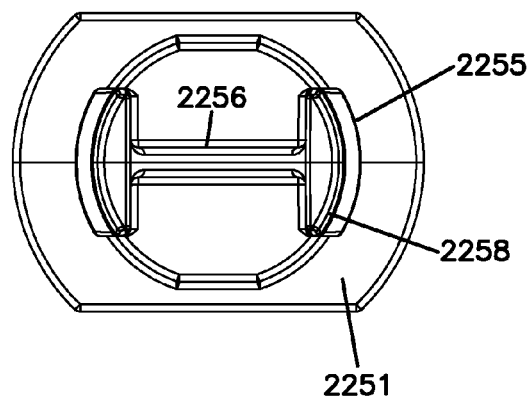
Figure 41:
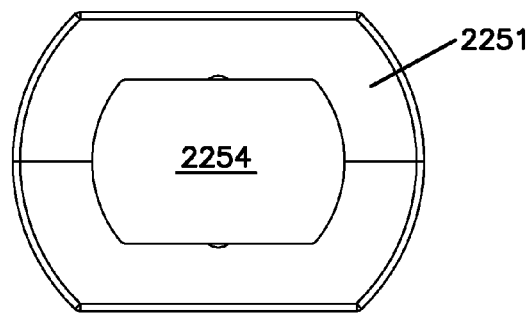
Figure 42:
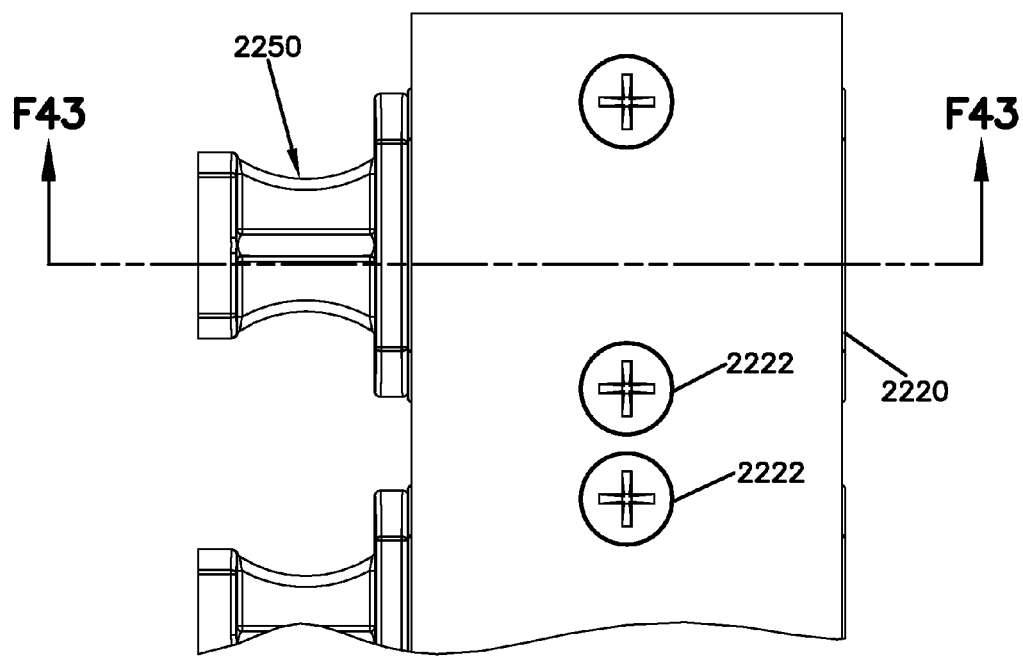

In the example shown, the second media reading interface 2230B is flipped (i.e., located on an opposite side of the housing 2210) relative to the first media reading interface 2230A (e.g., see FIGS. 32-33). In some such implementations, the channel 2218 extending inwardly from the first connection end of the passage 2215 also is flipped with respect to the channel 2218 extending inwardly from the second end of the passage 2215 (e.g., see FIG. 32). In some implementations, one or both ends 2212 of the adapter housing 2210 defines slots 2214 (e.g., see FIGS. 17 and 22) that lead to the channels 2218 (see FIGS. 32 and 33). The channels 2218 are each configured to receive a media reading interface 2230 through the respective slots 2214.

In the example shown in FIGS. 20, 21, 32, and 33, flipping the orientation of the connectors 2110 between the front and rear ports enables each of the major surfaces 2212 of the adapter 2210 to be configured to receive only one media reading interface 2130 for each passage 2215. For example, the media reading interfaces 2130 for the front ports of the passages 2215 are accommodated by a first of the major surfaces 2212 and the media reading interfaces 2130 for the rear ports of the passages 2215 are accommodated by a second of the major surfaces 2212. Such a configuration enables each slot 2214 to extend at least half-way between the front and rear of the adapter 2210.

In other implementations, each major surface 2212 of the adapter 2210 may accommodate the media reading interfaces 2130 for some of the front ports and some of the rear ports. For example, in one implementation, each major surface 2212 accommodates the media reading interfaces for alternating ones of the front and rear ports. In particular, a first slot in the first major surface 2212 may accommodate a media reading interface 2130 for a front port of a first passage 2215 and a first slot 2214 in the second major surface 2212 may accommodate a media reading interface 2130 for a rear port of the first passage 2215. A second slot 2214 in the first major surface 2212 may accommodate a media reading interface 2130 for a rear port of a second passage 2215 and a second slot 2214 in the second major surface 2212 may accommodate a media reading interface 2130 for a front port of the second passage 2215. Such configurations also enable each slot 2214 to extend more than half-way between the front and rear of the adapter 2210.

Lengthening the slots 2214 enables longer contact members 2231 to be received within each slot 2214. For example, each contact member 2231 may extend at least half-way across the adapter 2210 between the front and rear of the adapter 2210. In certain implementations, each contact member 2231 may extend across a majority of the distance between the front and rear of the adapter 2210. Lengthening the contact members 2231 increases the beam length of each contact member 2231. The beam length affects the ability of the contact member 2231 to deflect toward and away from the circuit boards 2220.

In general, each media reading interface 2230 is formed from one or more contact members 2231. Portions of the contact members 2231 extend into the passage 2215 of the MPO adapter 2210 through the respective channel 2218 (e.g., see FIGS. 32-33) to engage the electrical contacts 2132 of the storage member 2130 of any MPO connector positioned in the passage 2215. Other portions of the contact members 2231 are configured to protrude outwardly from the channel 2218 through the slots 2214 to engage contacts and tracings on a printed circuit board 2220 associated with the connector assembly 2200 (e.g., see FIG. 43).

Figure 34:
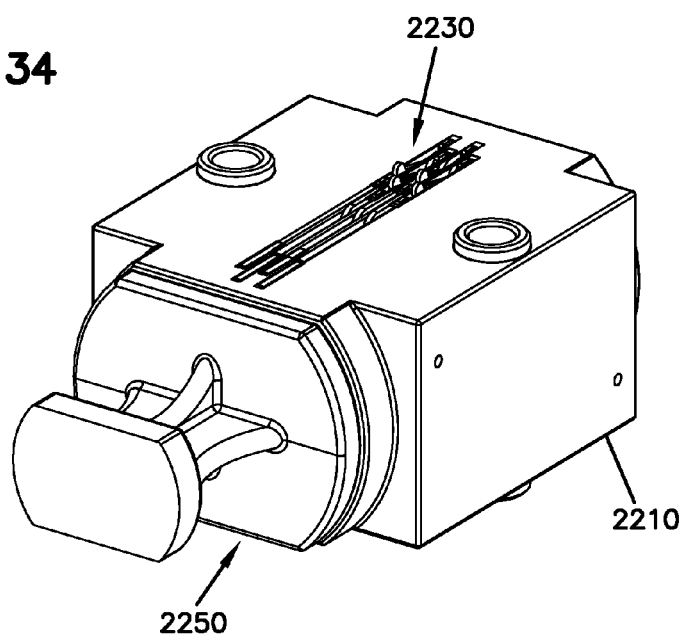

In some implementations, the contact members 2231 of a single media reading interface 2230 are positioned in a staggered configuration to facilitate access to the contact pads 2132 on the connector storage device 2130 of a connector arrangement 2100. For example, as shown in FIG. 34, alternating contact members 2231 can be staggered between at least front and rear locations within the channels 2218. Likewise, in some implementations, the contact pads 2132 on each storage device 2130 can be arranged in staggered positions. In other implementations, the contact pads 2132 on each storage device 2130 can vary in size and/or shape (e.g., see pads 2132 of FIG. 23) to facilitate a one-to-one connection between the contact members 2231 and the contact pads 2132.

Figure 28:
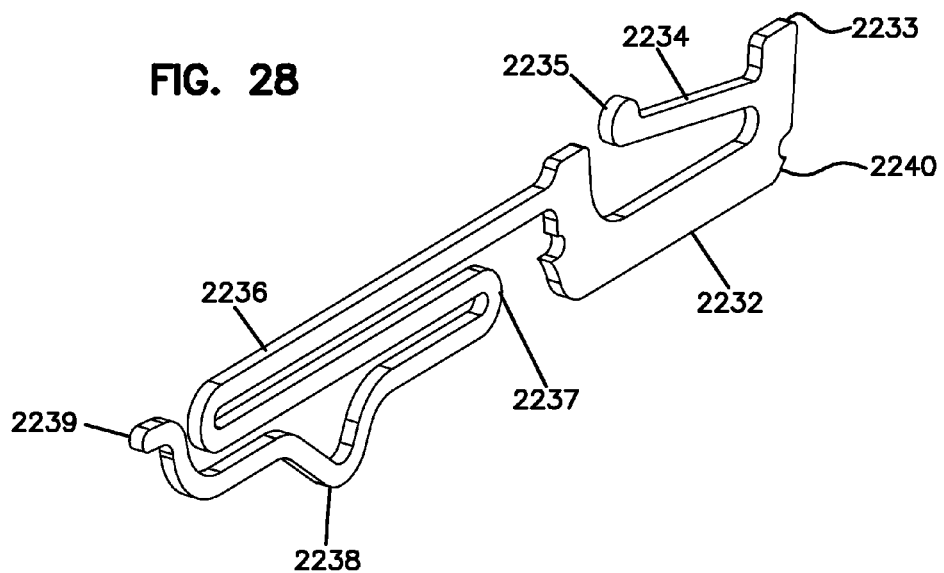
Figure 29:
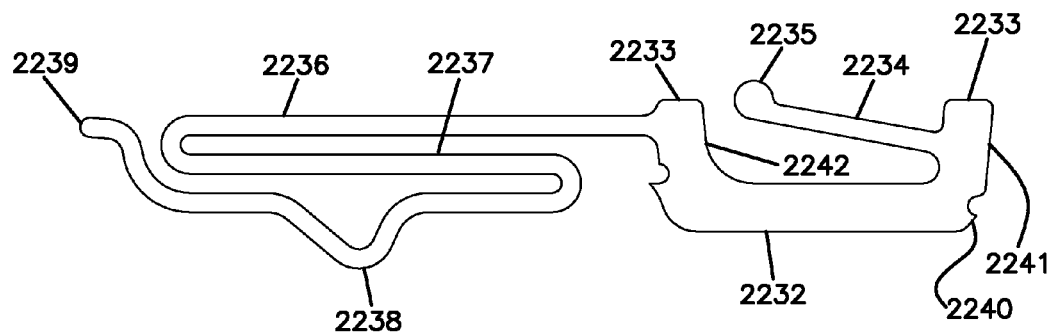
Figure 30:
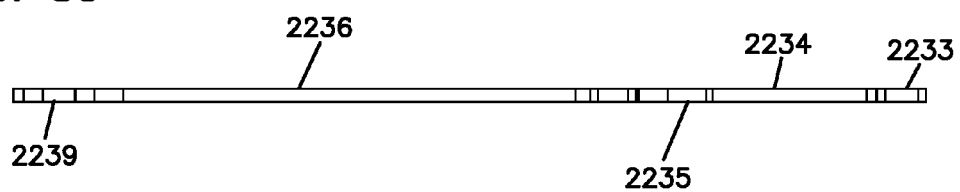

One example type of contact member 2231 is shown in FIGS. 28-30. In one implementation, the contact member 2231 defines a planar body. In one implementation, the contact member 2231 is formed monolithically. Each contact member 2231 defines at least three moveable contact locations 2235, 2238, and 2239. The flexibility of the contact surfaces 2235, 2238, and 2239 provides tolerance for differences in spacing between the contact member 2231 and the respective printed circuit board 2220 when the coupler assembly 2200 is manufactured. Certain types of contact members 2231 also include at least one stationary contact 2233.

In the example shown in FIGS. 32-33, two contact members 2231 are visibly positioned within a slot 2214 defined in a fiber optic adapter 2210, shown in cross-section. Two additional contact members 2231 also are positioned in the slot 2214, but cannot be seen since the additional contact members 2231 laterally align with the visible contact members 2231. In other implementations, however, greater or fewer contact members 2231 may be positioned within the housing.

The example contact member 2231 shown includes a base 2232 that is configured to be positioned within a slot 2214 defined by an adapter 2210. The base 2232 of certain types of contact members 2231 is configured to secure (e.g., snap-fit, latch, pressure-fit, etc.) to the adapter 1210. First and second legs 2241, 2242 extend from the base 2232. A first arm 2234 extends from the first leg 2241 and defines a first moveable contact location 2235 between the two legs 2241, 2242 (e.g., at a distal end of the arm 2234).

Figure 43:
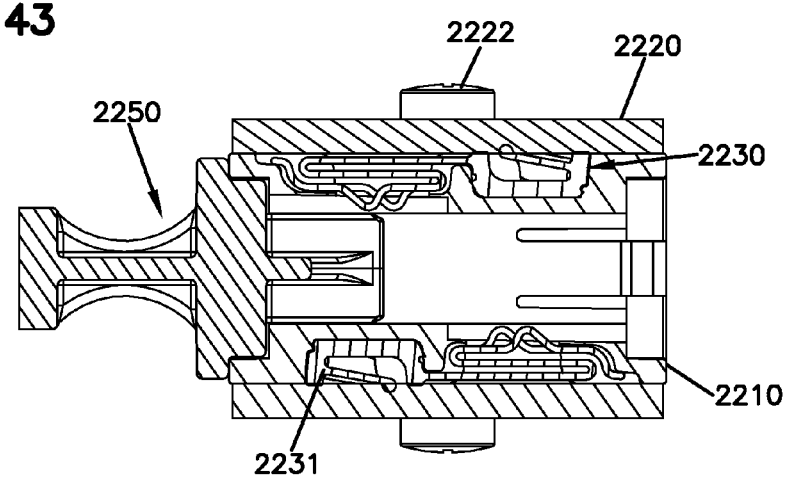

At least the first moveable contact location 2235 is aligned and configured to extend outwardly of the adapter housing 2210 through the slots 2214 to touch a first contact pad on the corresponding circuit board 2220 (e.g., see FIG. 43). The ability of the first arm to flex relative to the legs 2241, 2242 provides tolerance for placement of the contact member 2231 relative to the circuit board 2220. In certain implementations, each of the legs 2241, 2242 defines a stationary contact location 2233 that also touches the first contact pad on the circuit board 2220. In one implementation, the stationary contacts 2233 and first moveable contact 2235 provide grounding of the contact member 2231.

A second arm 2236 extends from the second leg 2242 to define a resilient section 2237, a second moveable contact location 2238, and a third moveable contact location 2239. In one implementation, the second contact location 2238 defines a trough located on the second leg 2234 between the resilient section 2237 and the third contact location 2239. The resilient section 2237 is configured to bias the second contact location 2238 towards the channel 2218 (e.g., see FIGS. 32 and 33). In the example shown, the resilient section 2237 is implemented as a looped/bent section of the second arm 2236. In other implementations, the second arm 2236 can otherwise include springs, reduced width sections, or portions formed from more resilient materials.

The third contact location 2239 is configured to be positioned initially within the slot 2214. The resilient section 2237 is configured to bias the third contact location 2239 through the slot 2214 to an exterior of the housing 2210 when a connector arrangement 2100 or other media segment pushes against the second contact location 2238. For example, inserting an MPO connector 2110 into a connection end of a passage 2215 of an MPO adapter 2210 would cause the storage section 2115 of the connector housing 2110 to slide through the channel 2218 and to engage the second contact location 2238 of each contact member 2231 associated with that connection end of the passage 2215. The storage section 2115 would push outwardly on the second contact location 2238, which would push the third contact location 2239 through the slots 2214 and toward the printed circuit board 2220 mounted to the adapter 2210 adjacent the slots 2214 (see FIG. 43).

As discussed above, a processor (e.g., processor 217 of FIG. 2) or other such equipment also can be electrically coupled to the printed circuit board 2220. Accordingly, the processor can communicate with the memory circuitry on the storage device 2130 via the contact members 2231 and the printed circuit board 2220. In accordance with some aspects, the processor is configured to obtain physical layer information from the storage device 2130. In accordance with other aspects, the processor is configured to write (e.g., new or revised) physical layer information to the storage device 2130. In accordance with other aspects, the processor is configured to delete physical layer information to the storage device 2130. In one example implementation, at least a first contact member 2231 transfers power, at least a second contact member 2231 transfers data, and at least a third contact member 2231 provide grounding. However, any suitable number of contact members 2231 can be utilized within each media reading interface 2230.

In accordance with some aspects, the contact members 2231 are configured to selectively form a complete circuit with one or more of the printed circuit boards 2220. For example, each printed circuit board 2220 may include two contact pads for each contact member. In certain implementations, a first portion of each contact member 2231 touches a first of the contact pads and a second portion of each contact member 2231 selectively touches a second of the contact pads. The processor coupled to the circuit board 2220 may determine when the circuit is complete. Accordingly, the contact members 2231 can function as presence detection sensors for determining whether a media segment has been inserted into the passages 2215.

In certain implementations, the first moveable contact 2235 of each contact member is configured to contact one of the contact pads of the circuit board 2220. In one implementation, the first moveable contact location 2235 is configured to permanently touch the contact pad as long as the circuit board 2220 and contact member 2231 are assembled on the adapter 2210. The third contact location 2239 of certain types of contact members 2231 is configured to touch a second contact pad of the printed circuit board 2220 only when a segment of physical communications media (e.g., an MPO connector 2110) is inserted within an adapter passage 2215 and pushes the second contact location 2238 out of the channel 2218, which pushes the third contact location 2239 through the slot 2214 and against the circuit board 2220. In accordance with other aspects, the contact members 2231 are configured to form a complete circuit with the printed circuit board 2220 regardless of whether a media segment is received in the passage 2215.

Referring to FIGS. 35-43, dust caps 2250 can be used to protect passages 2215 of the adapter housings 2210 when fiber optic connectors 2110 or other physical media segments are not received within the passages 2215. For example, a dust cap 2250 can be configured to fit within a front entrance or a rear entrance of each adapter passage 2215. The dust caps 2250 are configured to inhibit the ingress of dust, dirt, or other contaminants into the passage 2215. In accordance with some implementations, the dust caps 2250 are configured not to trigger the presence sensor/switch of the adapter 2210.

FIGS. 36-41 show one example implementation of an adapter dust cap 2250. The example dust cap 2250 includes a cover 2251 configured to fit over a mouth of the passage 2215. A handle including a stem 2253 and grip 2254 extend outwardly from a first side of the cover 2251. The handle facilitates insertion and withdrawal of the dust cap 2250 from the passage 2215. In the example shown, an outer side of the grip 2254 is generally flat. In other embodiments, the grip 2254 can be contoured, textured, or otherwise non-planar.

A retaining section 2252 extends outwardly from a second side of the cover 2251. The retaining section 2252 defines a concave contour 2256 extending between two fingers 2258. One or both fingers 2258 include lugs 2255 that are configured to interact with the flexible tabs 2219 of the adapter housing 2210 to retain the dust cap 2250 within the passage 2215. In the example shown, each lug 2255 defines a ramped surface.

In some implementations, the retaining section 2252 is configured to fit within the passage 2215 without pressing against the second contact location 2238 of each contact member 2231 of the first media reading interface 2230 (see FIG. 43). In the example shown, the retaining section 2252 defines a sufficiently concave contour to accommodate the second contact location 2238 of each contact member 2231. Insertion of the dust cap 2250 within the passage 2215 does not cause the third contact location 2239 to press against the first printed circuit board 2220A. Accordingly, insertion of the dust cap 2250 does not trigger the presence detection sensor/switch.

FIG. 43 shows a cross-sectional view of an MPO adapter housing 2210 sandwiched between a first printed circuit board 2220A and a second printed circuit board 2220B. The MPO adapter housing 2210 defines a passage 2215, a channel 2218 extending inwardly from each connection end of the passage 2215, and slots 2214 extending through opposing ends 2212 of the housing 2210. A first media reading interface 2230A is positioned in the first channel 2218 and interacts with the first printed circuit board 2220A. A second media reading interface 2230B is positioned in the second channel 2218 and interacts with the second printed circuit board 2220B.

FIGS. 44-81 illustrate a third example implementation of a connector system 4000 that can be utilized on a connector assembly (e.g., a communications panel) having PLI functionality as well as PLM functionality. One example connector assembly on which the connector system 4000 can be implemented is a bladed chassis. The connector system 4000 includes at least one example communications coupler assembly 4200 and at least two connector arrangements 4100.

The communications coupler assembly 4200 is configured to be mounted to a connector assembly, such as a communications blade or a communications panel. One or more connector arrangements 4100, which terminate segments 4010 of communications media, are configured to communicatively couple to other segments of physical communications media at the coupler assembly 4200 (e.g., see FIGS. 60-61). Accordingly, communications data signals carried by a media segment 4010 terminated by a first connector arrangement 4100 can be propagated to another media segment 4010 (e.g., terminated by a second connector arrangement 4100) through the communications coupler assembly 4200.

Figure 45:
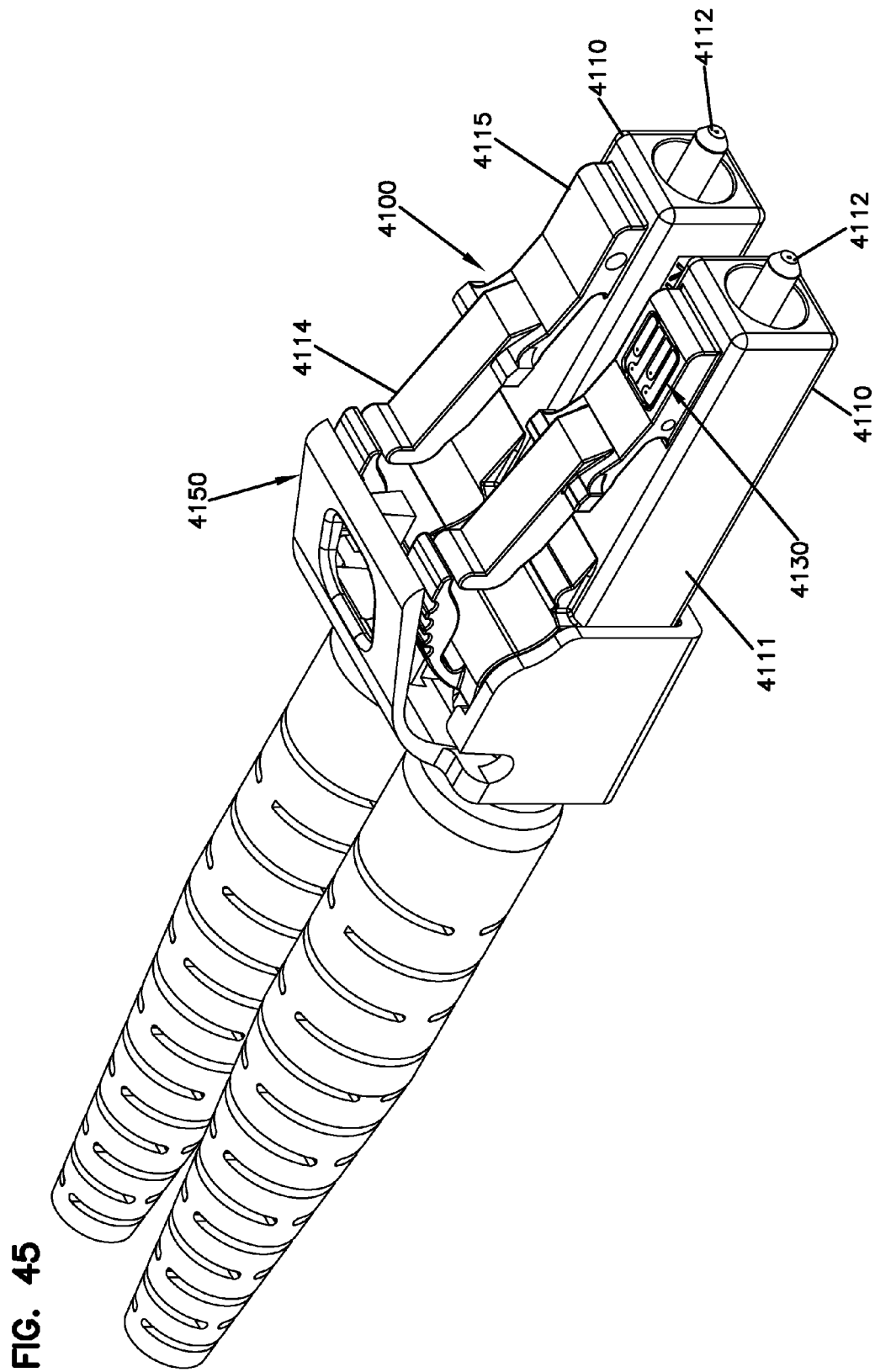

In accordance with some aspects, each connector arrangement 4100 is configured to terminate a single segment of physical communications media. For example, each connector arrangement 4100 can include a single connector 4110 that terminates a single optical fiber or a single electrical conductor (FIG. 45). In one example implementation, each connector arrangement 4100 includes a single LC-type fiber optic connector 4110 that terminates a single optical fiber. In accordance with other aspects, each connector arrangement 4100 includes two or more connectors 4110, each of which terminates a single segment of physical communications media. For example, each connector arrangement 4100 may define a duplex fiber optic connector arrangement including two connectors 4110, each of which terminates an optical fiber 4010 (FIG. 45). In other implementations, the connector 4110 can be an SC-type, an ST-type, an FC-type, an LX.5-type, etc.

Figure 31:
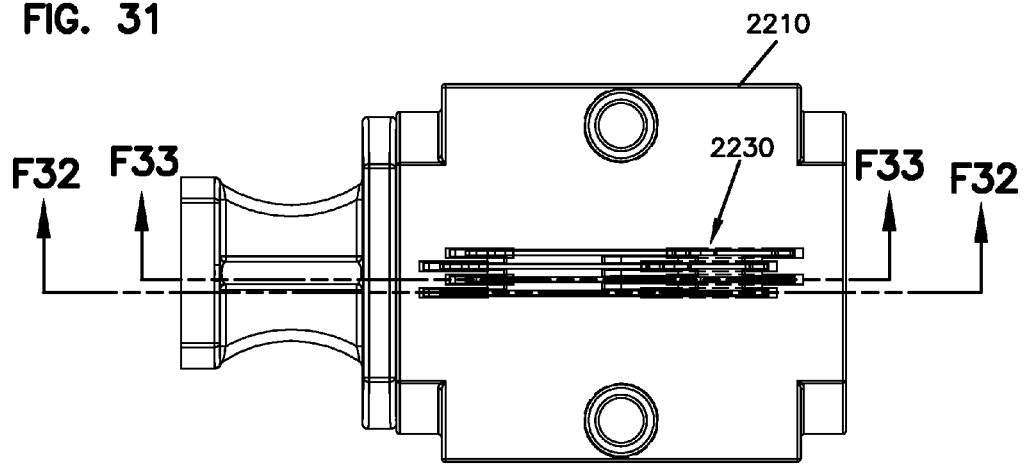
Figure 59:
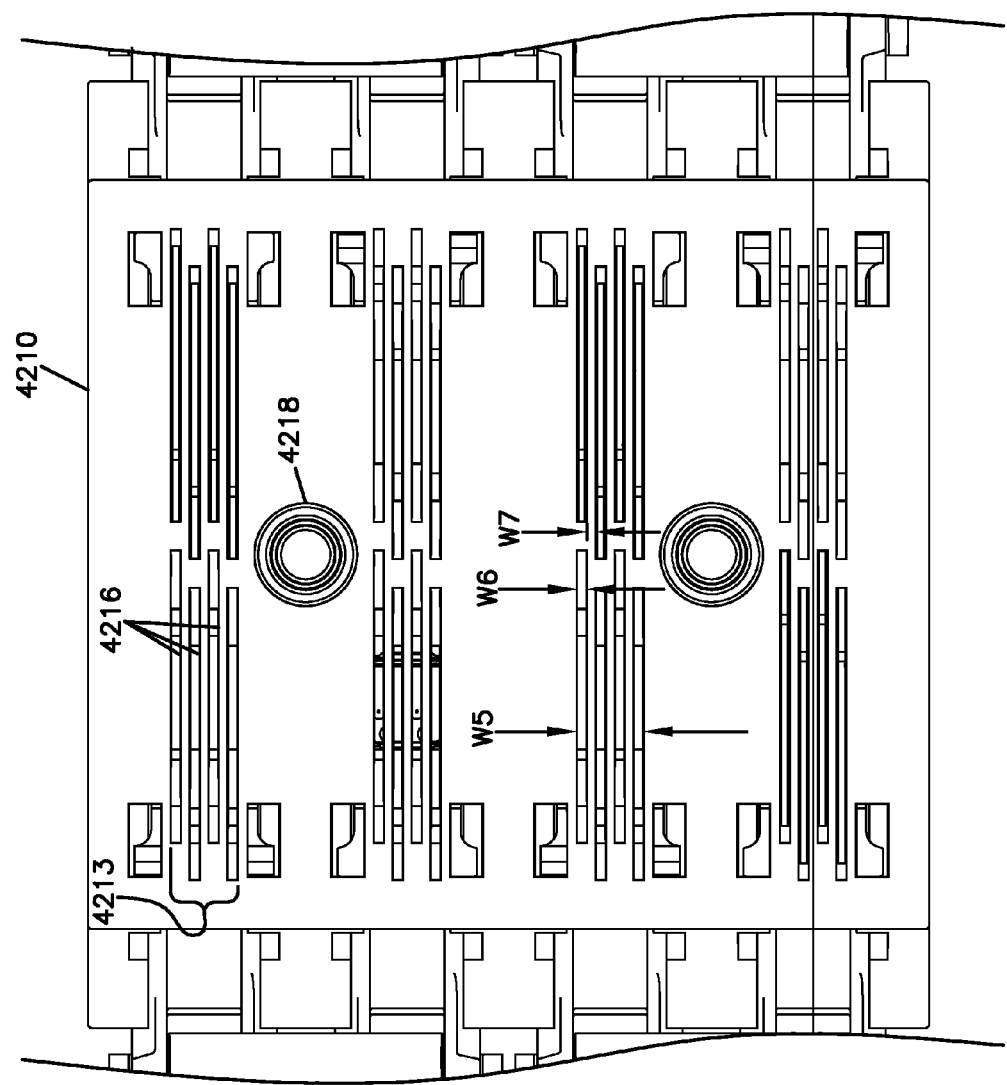
Figure 82:
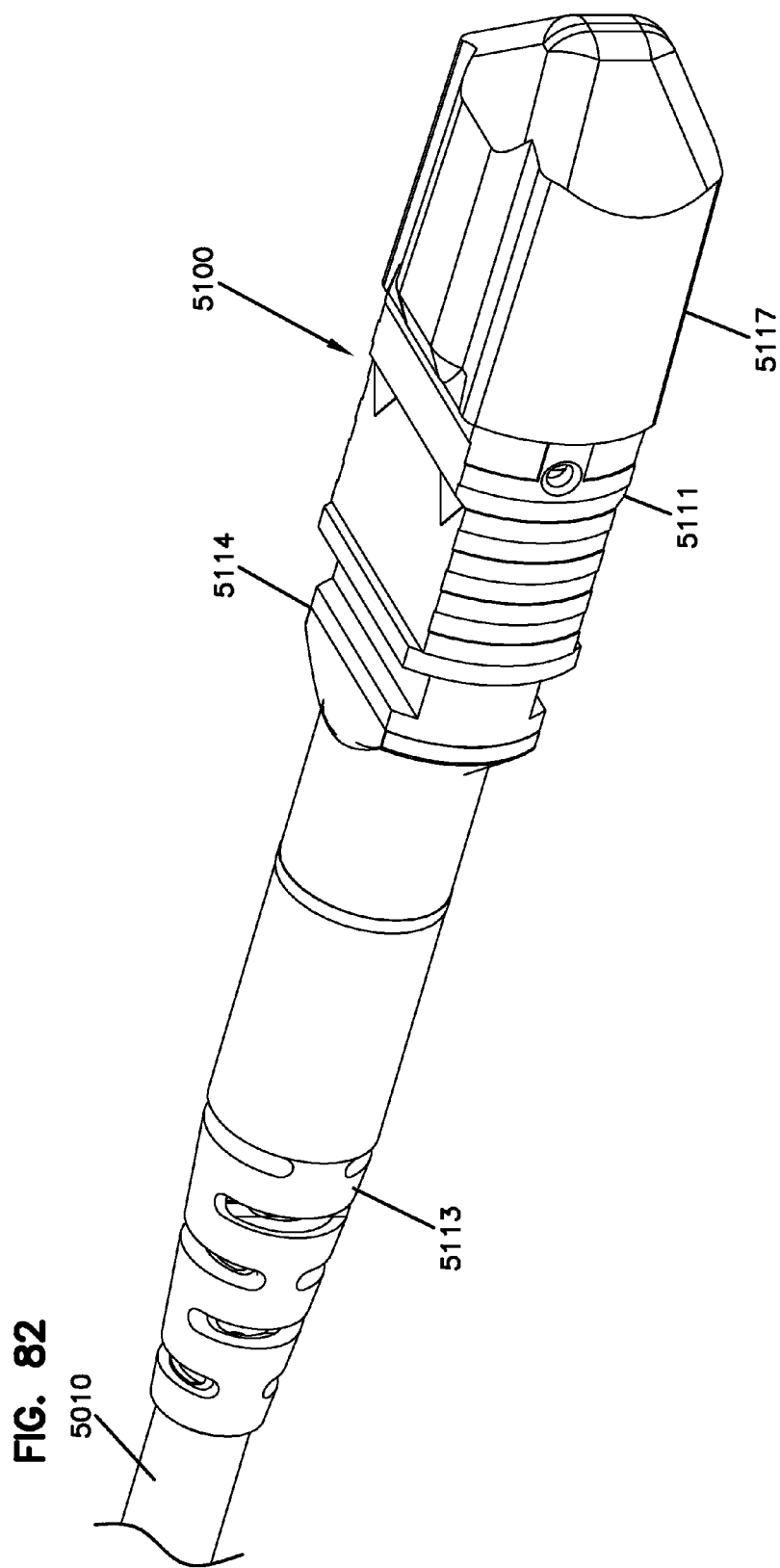

In accordance with still other aspects, each connector arrangement 4100 can include one or more connectors, each of which terminates a plurality of physical media segments (e.g., see connector arrangement 2100, 2100, and 5100 of FIGS. 31, 59, and 82). In one example implementation, each connector arrangement includes a single MPO-type fiber optic connector that terminates multiple optical fibers. In still other systems, other types of connector arrangements (e.g., electrical connector arrangements) can be secured to the communications coupler assembly 4200 or to a different type of coupler assembly.

In accordance with some aspects, each communications coupler assembly 4200 is configured to form a single link between segments of physical communications media 4010. For example, each communications coupler assembly 4200 can define a single passage at which a first connector arrangement is coupled to a second connector arrangement. In accordance with other aspects, however, each communications coupler assembly 4200 is configured to form two or more links between segments of physical communications media. For example, in the example shown in FIG. 44, the communications coupler assembly 4200 defines four passages 4215.

In some implementations, each passage 4215 of the communications coupler assembly 4200 is configured to form a single link between first and second connector arrangements 4100. In other example implementations, two or more passages 4215 can form a single link between connector arrangements 4100 (e.g., two sets of ports can form a single link between two duplex connector arrangements). In still other example implementations, each communications coupler assembly 4200 can form a one-to-many link. For example, the communications coupler assembly 4200 can connect a duplex connector arrangement to two simplex connector arrangements.

Example implementations of connector arrangements 4100 are shown in FIGS. 45-55. Each of the connector arrangements 4100 includes one or more fiber optic connectors 4110, each of which terminates one or more optical fibers 4010 FIG. 46). In the example shown in FIGS. 44-46, each connector arrangement 4100 defines a duplex fiber optic connector arrangement including two fiber optic connectors 4110 held together using a clip 4150. In another example implementation, a connector arrangement 4100 can define a simplex fiber optic connector 4110.

Figure 46:
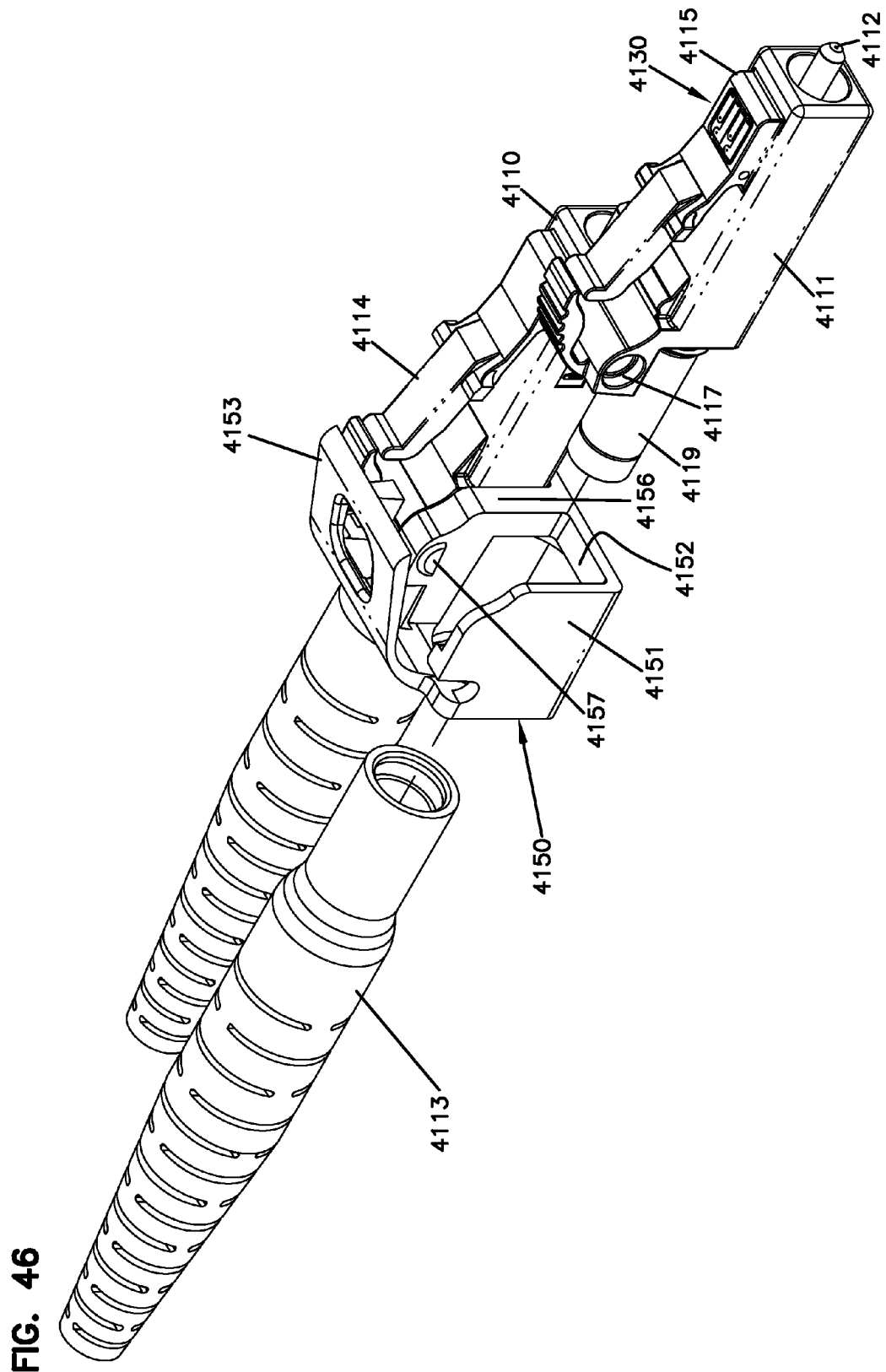

As shown in FIG. 46, each fiber optic connector 4110 includes a connector body 4111 protecting a ferrule 4112 that retains an optical fiber 4010. The connector body 4111 is secured to a boot 4113 for providing bend protection to the optical fiber 4010. In the example shown, the connector 4110 is an LC-type fiber optic connector. The connector body 4111 includes a fastening member (e.g., clip arm) 4114 that facilitates retaining the fiber optic connector 4110 within a passage 4215 in the communications coupler assembly 4200. The connector body 4111 also defines a through hole (or opposing depressions) 4117 to facilitate maintaining the body 4111 within the clip 4150 (e.g., see FIG. 46).

Figure 44:
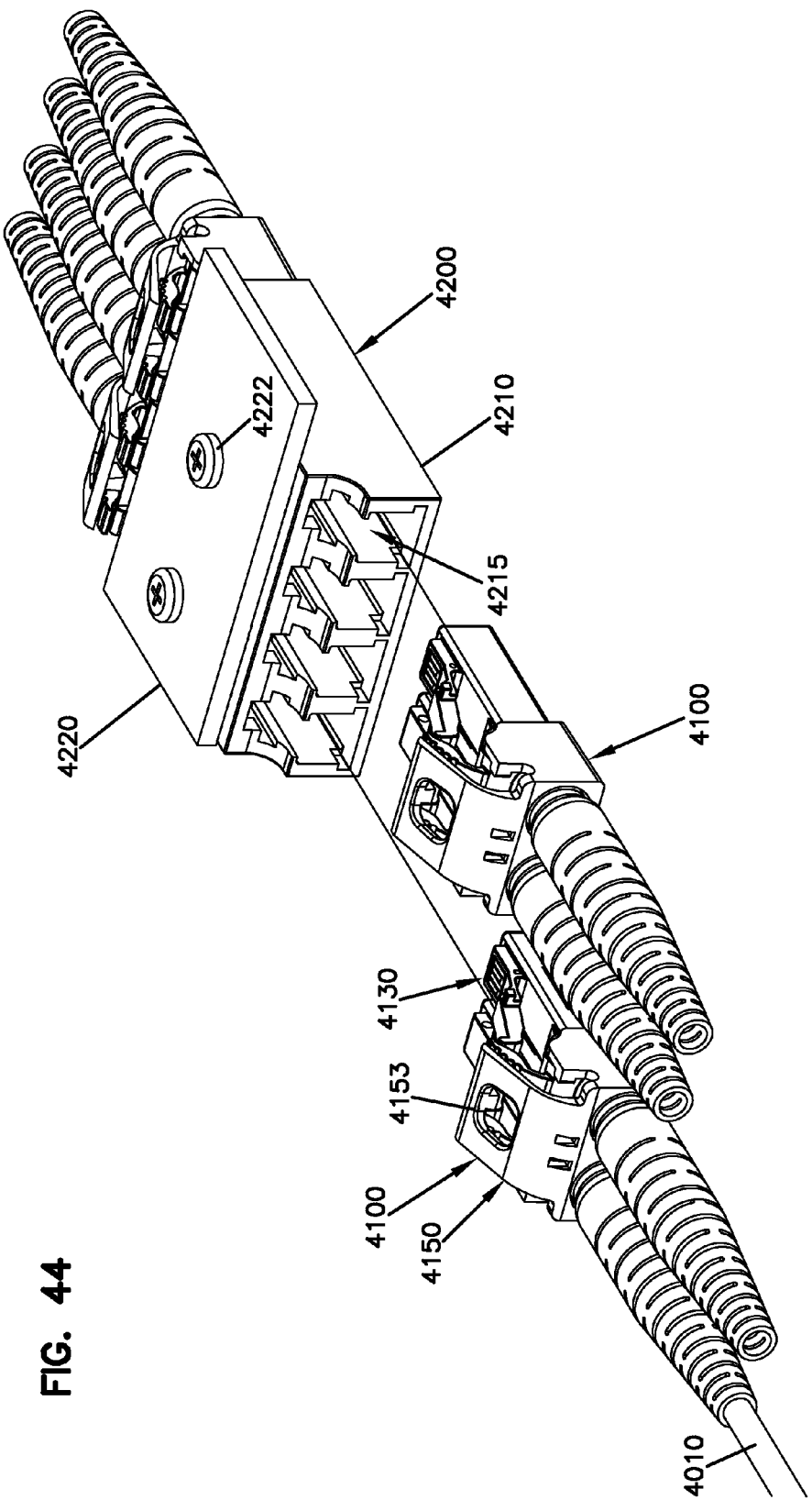
FIGS. 44-72 illustrate a third example implementation of a connector system that can be utilized on a connector assembly having PLI functionality as well as PLM functionality in accordance with aspects of the present disclosure.

One example clip 4150 is shown in FIGS. 44 and 46. The clip 4150 includes a body 4151 that defines openings or channels 4152 through which portions 4119 of the fiber optic connector bodies 4111 can extend (see FIG. 46). In the example shown, the clip 4150 has a monolithic body 4151 defining two channels 4152 separated by an interior wall 4156. Lugs 4157 are positioned on the inner surfaces of the exterior walls of the body 4151 and on both sides of the interior wall 4156. The lugs 4157 are configured to engage cavities/depressions 4117 defined in the fiber optic connector bodies 4111 to secure the connector bodies 4111 within the clip body 4151. A flange 4153 curves upwardly and forwardly to extend over the fastening members 4114 of the connectors 4110 (see FIG. 45). The flange 4153 is sufficiently flexible to enable the application of pressure on the clip arms 4114 of the connectors 4110 by pressing on a distal end of the flange 4153.

Each connector arrangement 4100 is configured to store physical layer information. For example, a storage device 4130 may be installed on or in the body 4111 of one or more of the fiber optic connectors 4110 of each connector arrangement 4100. In the example shown, the storage device 4130 is installed on only one fiber optic connector 4110 of a duplex connector arrangement 4100 (FIG. 45). In other implementations, however, a storage device 4130 may be installed on each fiber optic connector 4110 of a connector arrangement 4100.

One example storage device 4130 includes a printed circuit board 4131 (FIG. 65) on which memory circuitry can be arranged. Electrical contacts 4132 (FIG. 68) also may be arranged on the printed circuit board 4131 for interaction with a media reading interface of the communications coupler assembly 4200 (described in more detail herein). In one example implementation, the storage device 4130 includes an EEPROM circuit 4133 (FIG. 68) arranged on the printed circuit board 4131. In the example shown in FIG. 46, an EEPROM circuit 4133 is arranged on the non-visible side of the circuit board 4131. In other implementations, however, the storage device 4130 can include any suitable type of non-volatile memory.

Figure 47:
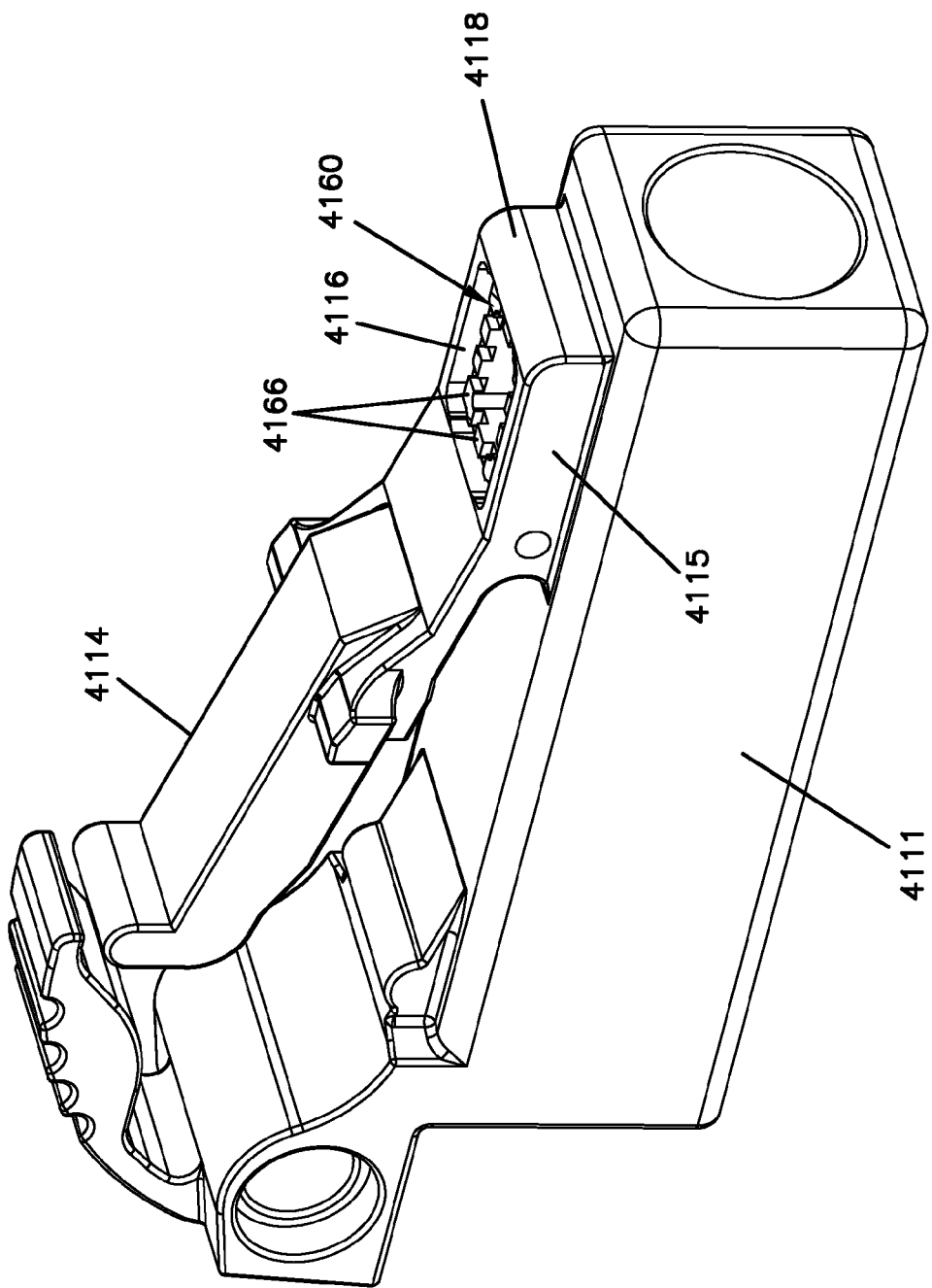
Figure 48:
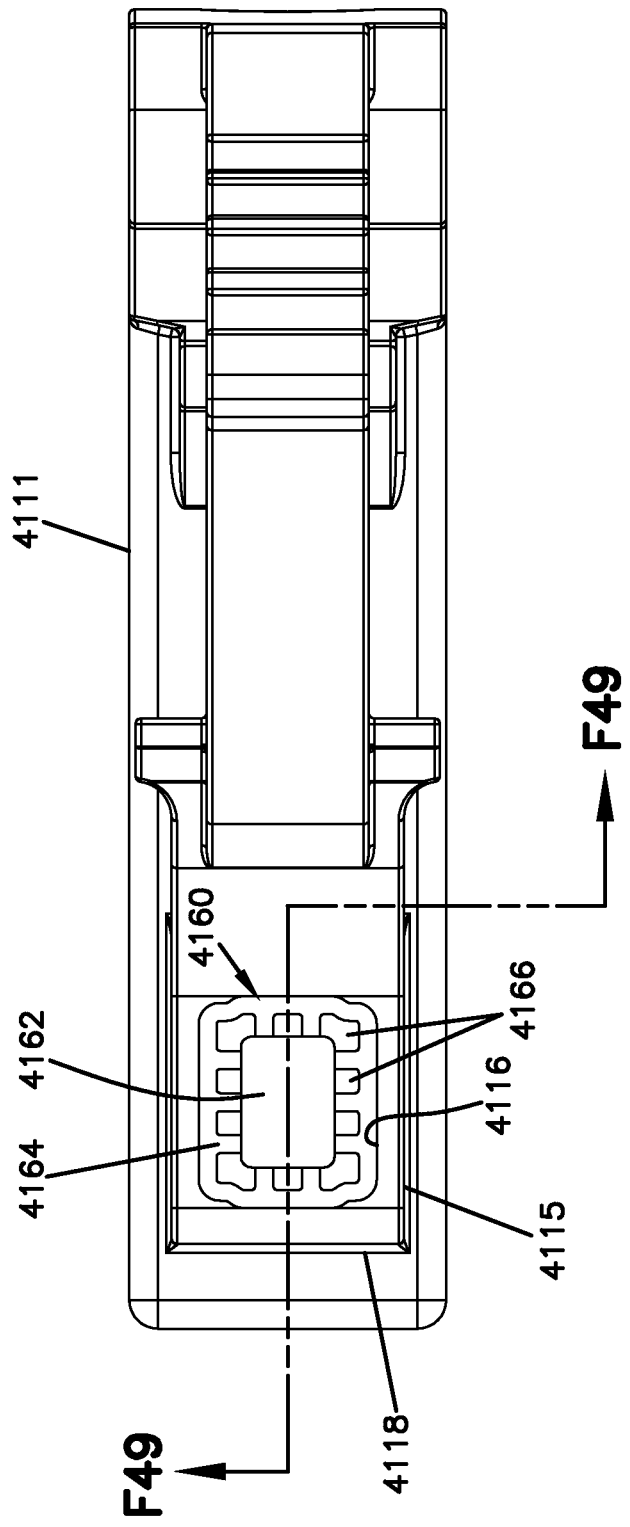
Figure 49:
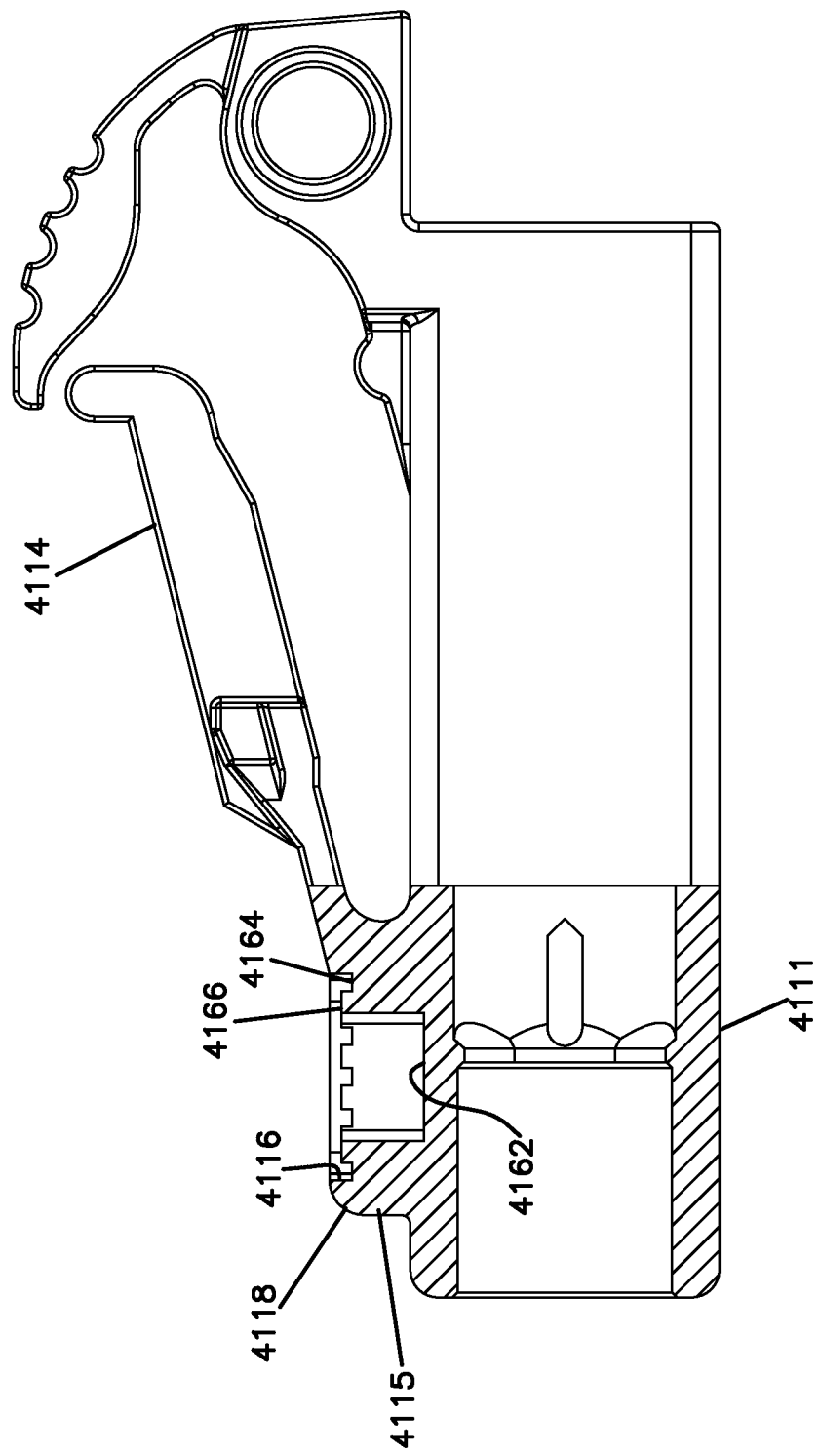

As shown in FIGS. 47-49, the body 4111 of one example fiber optic connector 4110 may define a recessed section or cavity 4116 in which the storage device 4130 may be positioned. In some implementations, the cavity 4116 is provided in the key 4115 of the connector 4110. In other implementations, the cavity 4116 may be provided elsewhere in the connector 4110. In some implementations, the cavity 4116 has a stepped configuration 4160 to facilitate positioning of the storage device 4130.

In the example shown, the cavity 4116 includes a well 4162 surrounded by a ledge 4164. The ledge 4164 is configured to support the storage device 4130. For example, the ledge 4164 may support the printed circuit board 4131 of an example storage device 4130. The well 4162 is sufficiently deep to accommodate an EEPROM circuit 4133 coupled to one side of the printed circuit board 4131. The ledge 4164 is recessed sufficiently within the connector body 4111 to enable electrical contacts 4132 provided on the opposite side of the printed circuit board 4131 to be generally flush with the key 4115 of the connector body 4111 (see FIG. 64).

In certain implementations, the ledge 4164 has a ridged or otherwise contoured surface to facilitate mounting the storage device within the cavity 4116. For example, in some implementations, contoured sections 4166 of the ledge 4164 may increase the surface area over which an adhesive may be applied to secure the storage device 4130 within the cavity 4116. In the example shown, the contoured sections 4166 include rectangular-shaped protrusions and/or depressions. In other implementations, however, the ledge 4164 may have bumps, ridges, or some other texture to increase the surface area over which adhesive is applied.

Figure 50:
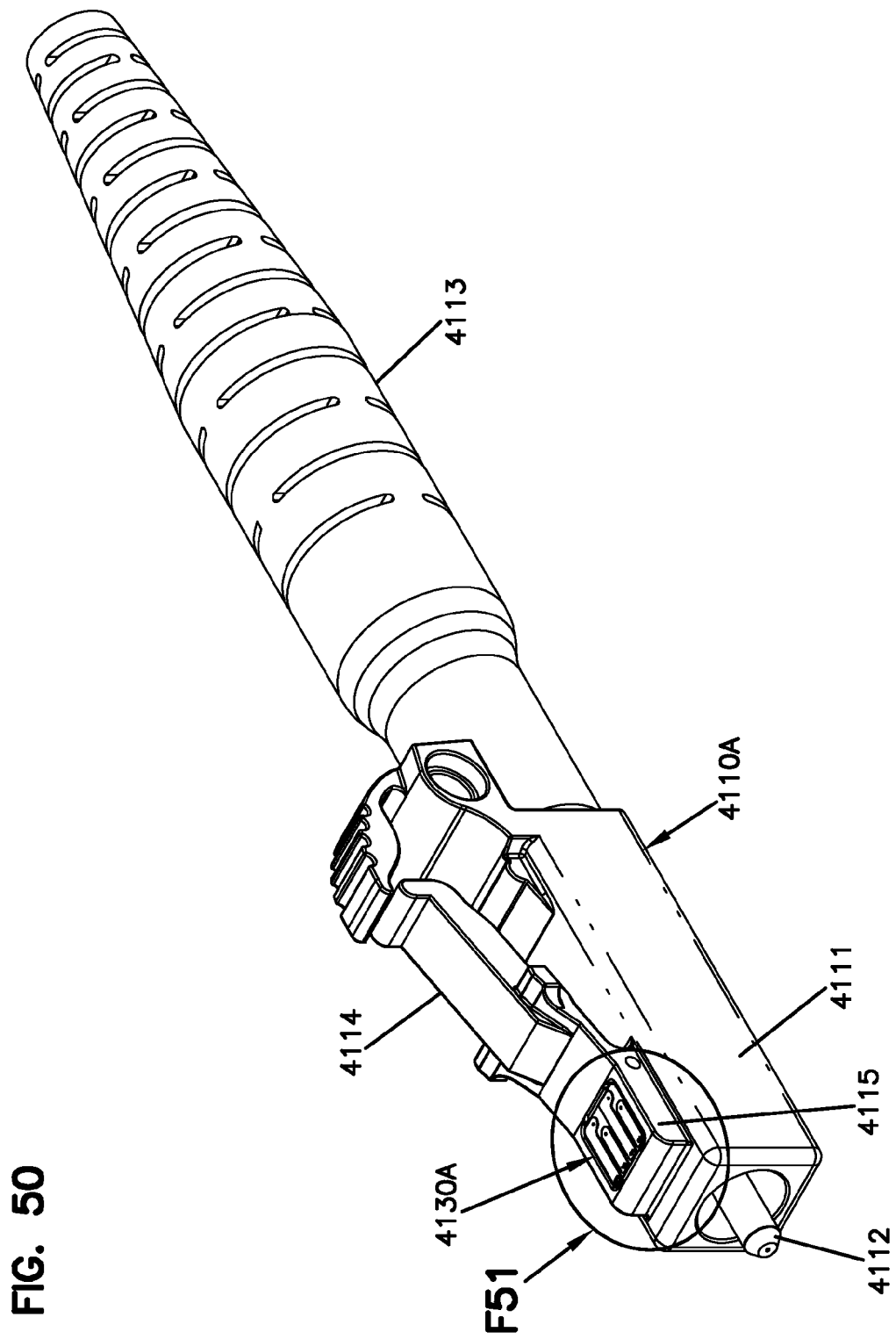
Figure 51:
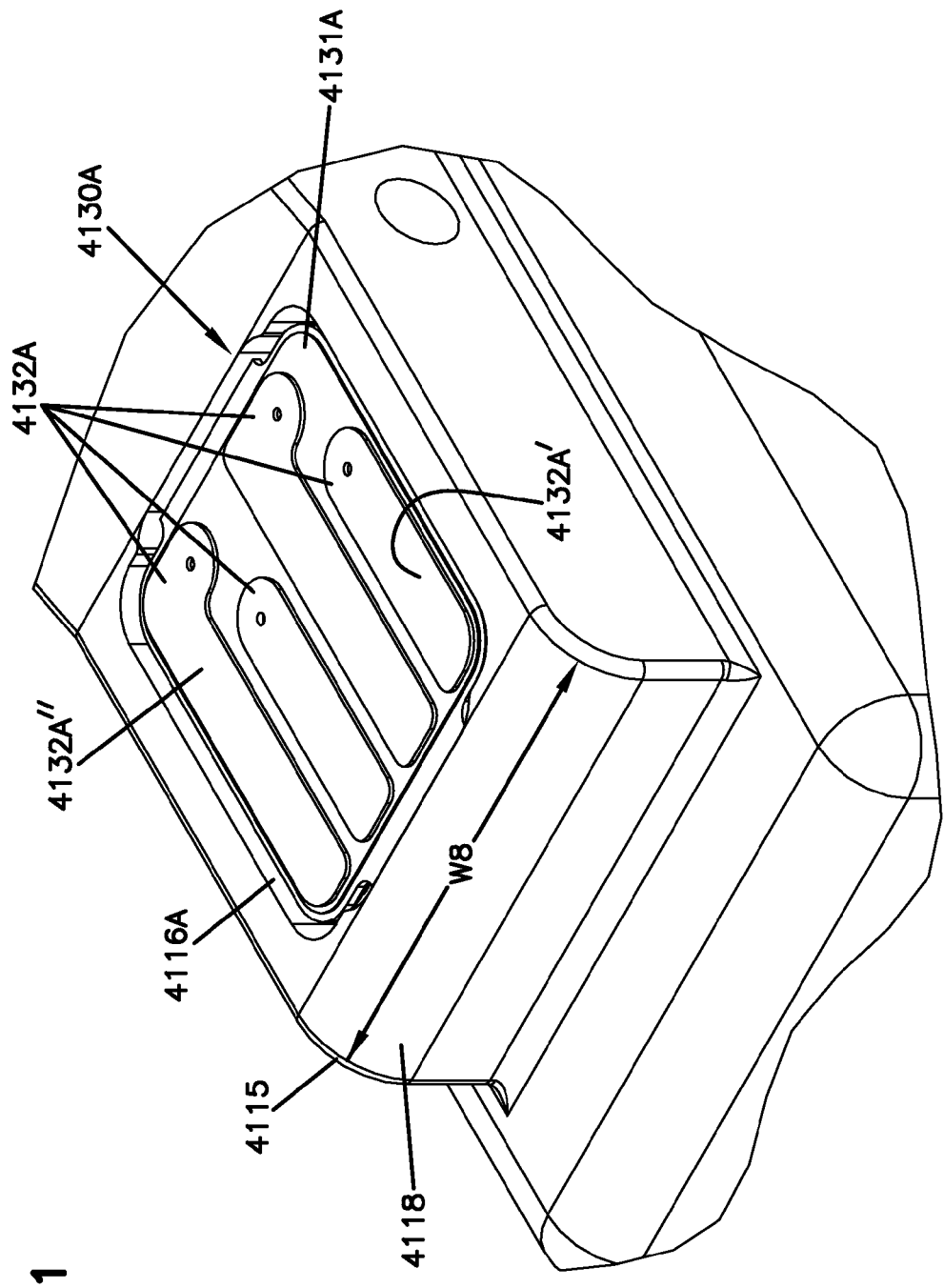

FIGS. 50-55 show three different implementations of an example storage device 4130 installed on an example connector 4110. FIGS. 50 and 51 show a first example connector 4110A that includes a key 4115 having a width W8. The key 4115 has a front surface 4118 against which contacts 4231 (see FIGS. 63-68) of the communications coupler assembly 4200 deflect during insertion of the connector 4110 as will be described in more detail herein. In the example shown, the deflection surface 4118 defines a bullnose. In other implementations, the deflection surface 4118 may define any suitable shape.

The key 4115 also defines a recessed section or cavity 4116A in which a storage device 4130A can be positioned (e.g., see FIG. 49). In the example shown in FIG. 51, the cavity 4116A is defined in a top of the key 4115 and not on or in the deflecting surface 4118. In some implementations, a cover can be positioned over the storage device 4130A to enclose the storage device 4130A within the recessed section 4116A of the connector housing 4111. In other implementations, the storage device 4130A is left uncovered and exposed.

The storage device 4130A shown in FIG. 51 includes generally planar contacts 4132A positioned on a generally planar circuit board 4131A. Memory 4133 (FIGS. 60-61) of the storage device 4130A, which is located on the non-visible side of the board in FIG. 51, is accessed by engaging the tops of the contacts 4132A with one or more electrically conductive contact members (e.g., contact member 4231 of FIG. 63). In certain implementations, the contact member 4231 initially contacts the deflecting surface 4118 and subsequently slides or wipes across the contacts 4132A (see FIGS. 63-68).

In some implementations, the contacts 4132A have different lengths. In certain implementations, the contacts 4132A have different shapes. For example, in some implementation, the contacts 4132A include one or more contact members 4132A' that have generally rounded ends at one or both ends of the contact members 4132A'. In certain implementations, the contacts 4132A also include one or more contact members 4132A" that are generally L-shaped. In the example shown, the L-shaped contacts 4132A" are longer than the rounded end contacts 4132A'. In other implementations, however, the contacts 4132A may have the same length or may each have different lengths.

Figure 52:
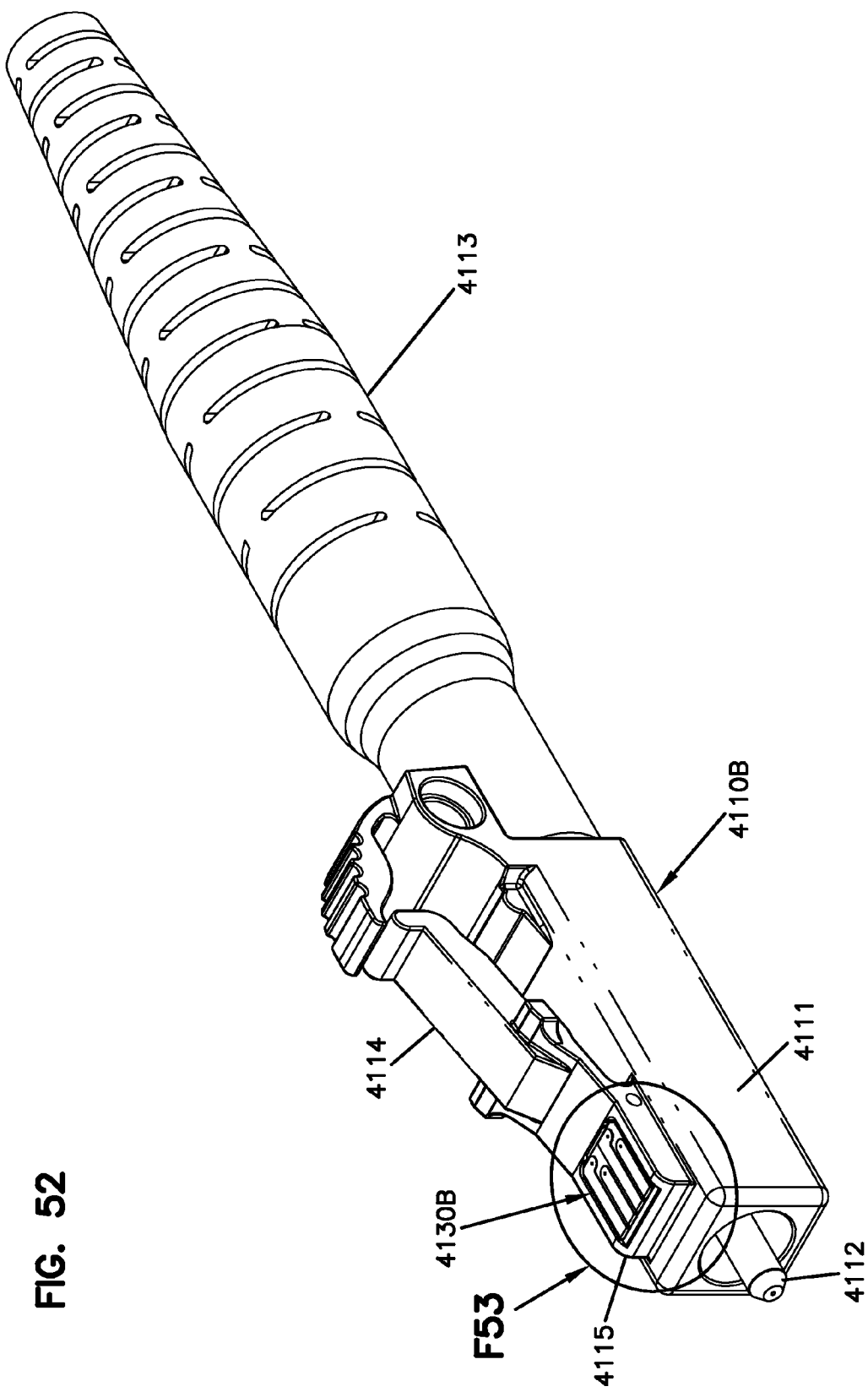
Figure 53:
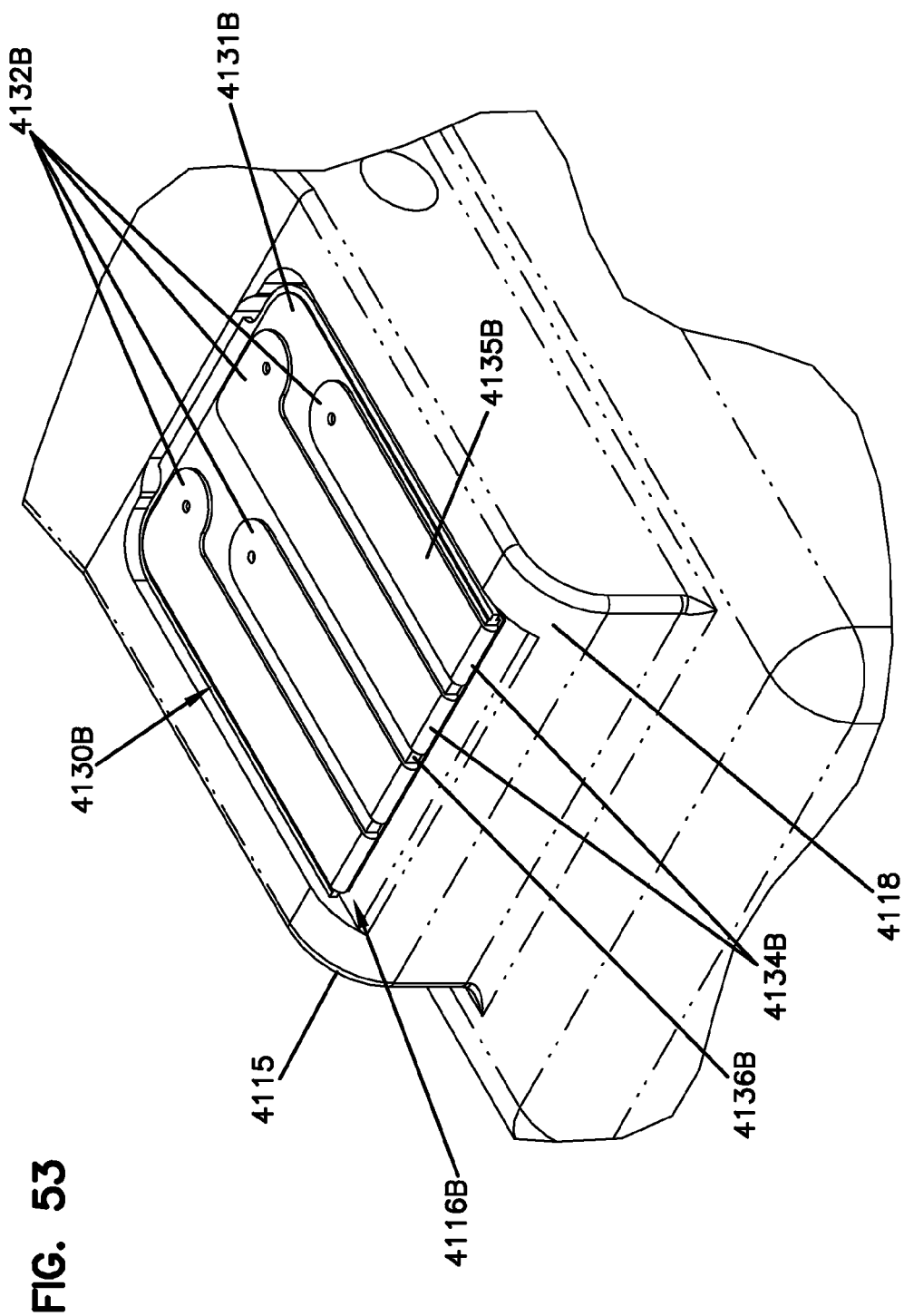

FIGS. 52 and 53 show a second example connector 4110B that includes a key 4115 having a deflection surface 4118. The key 4115 defines a recessed section or cavity 4116B in which a storage device 4130B can be positioned. In the example shown, the cavity 4116B cuts into the deflecting surface 4118 of the key 4115. In some implementations, a cover can be positioned over the storage device 4130B to enclose the storage device 4130B within the connector housing 4111. In other implementations, the storage device 4130B is left uncovered and exposed.

The storage device 4130B shown in FIG. 53 includes contacts 4132B having first sections 4135B that extend over a generally planar circuit board 4131B and folded sections 4134B that curve, fold, or bend over a front end 4136B of the board 4131B. In the example shown, the first sections 4135B of the contacts 4132B have two different lengths. In other implementations, however, the first sections 4135B of the contacts 4132B may all be the same length or may each be a different length. In certain implementations, at least some of the first sections 4135B may be L-shaped and at least some of the first sections 4135B may have a rounded edge. The memory 4133 of the storage device 4130B, which is located on the non-visible side of the board in FIG. 53, is accessed by sliding or wiping the contact member 4231 (FIG. 63) of the coupler assembly 4200 across the folded sections 4134B of the contacts 4132B and/or the planar sections 4135B of the contacts 4132B.

Figure 54:
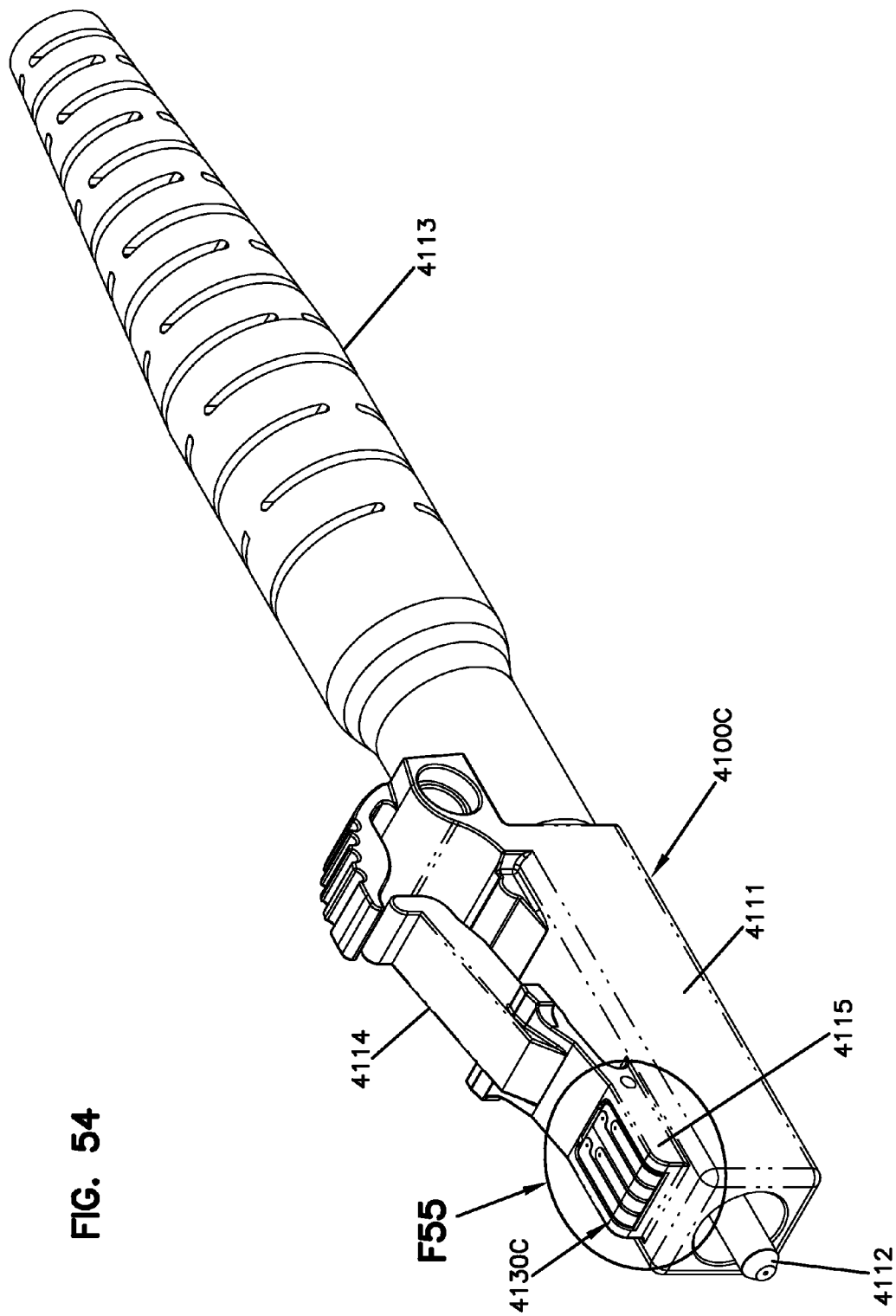
Figure 55:
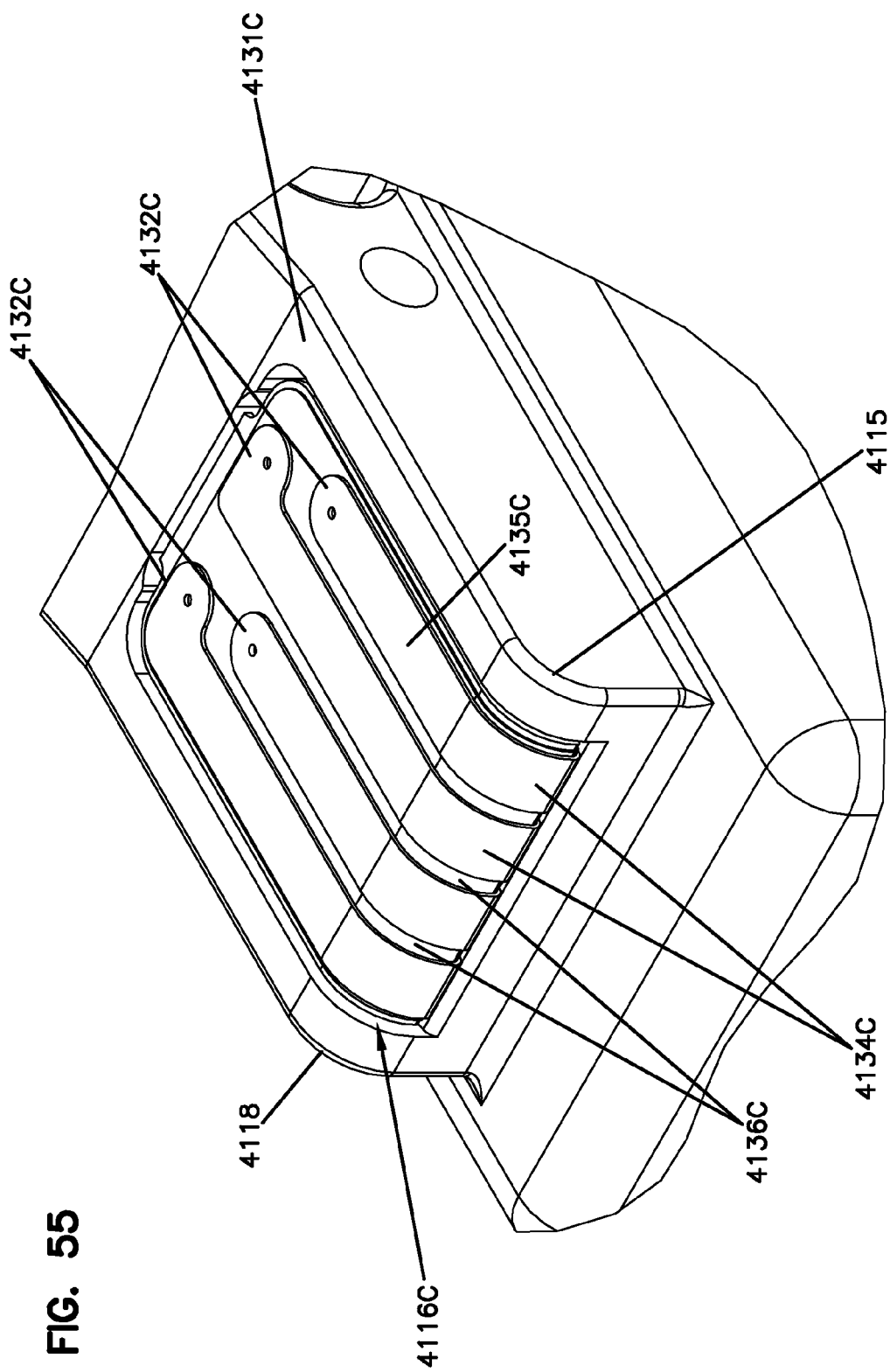
Figure 56:
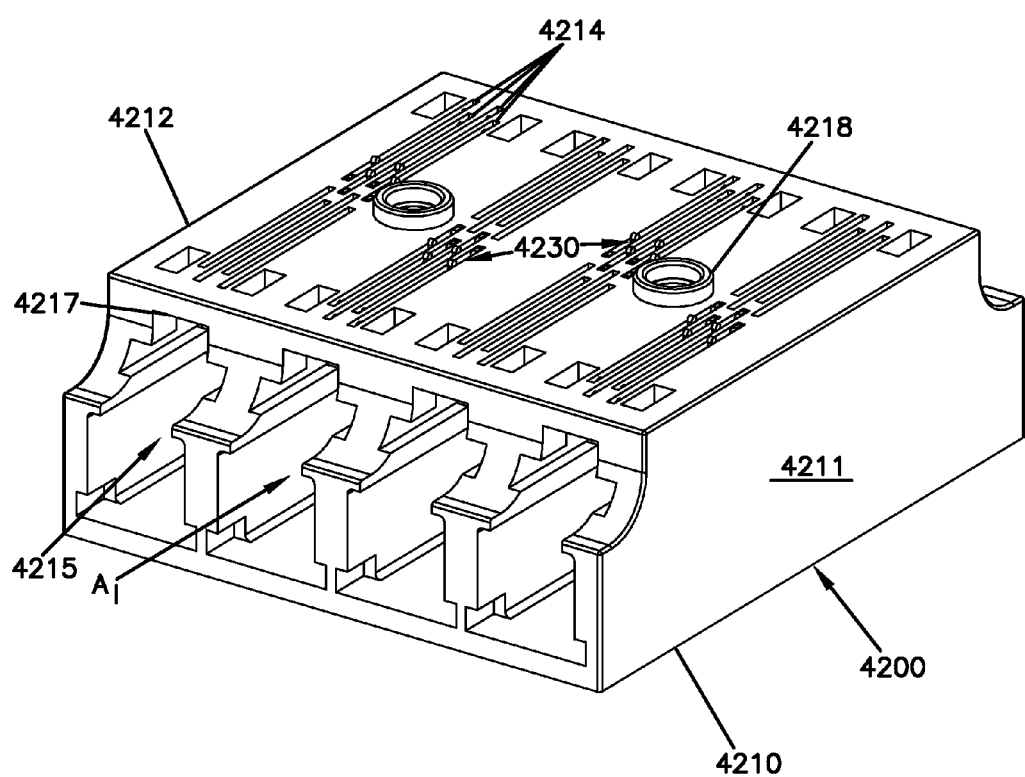
Figure 57:
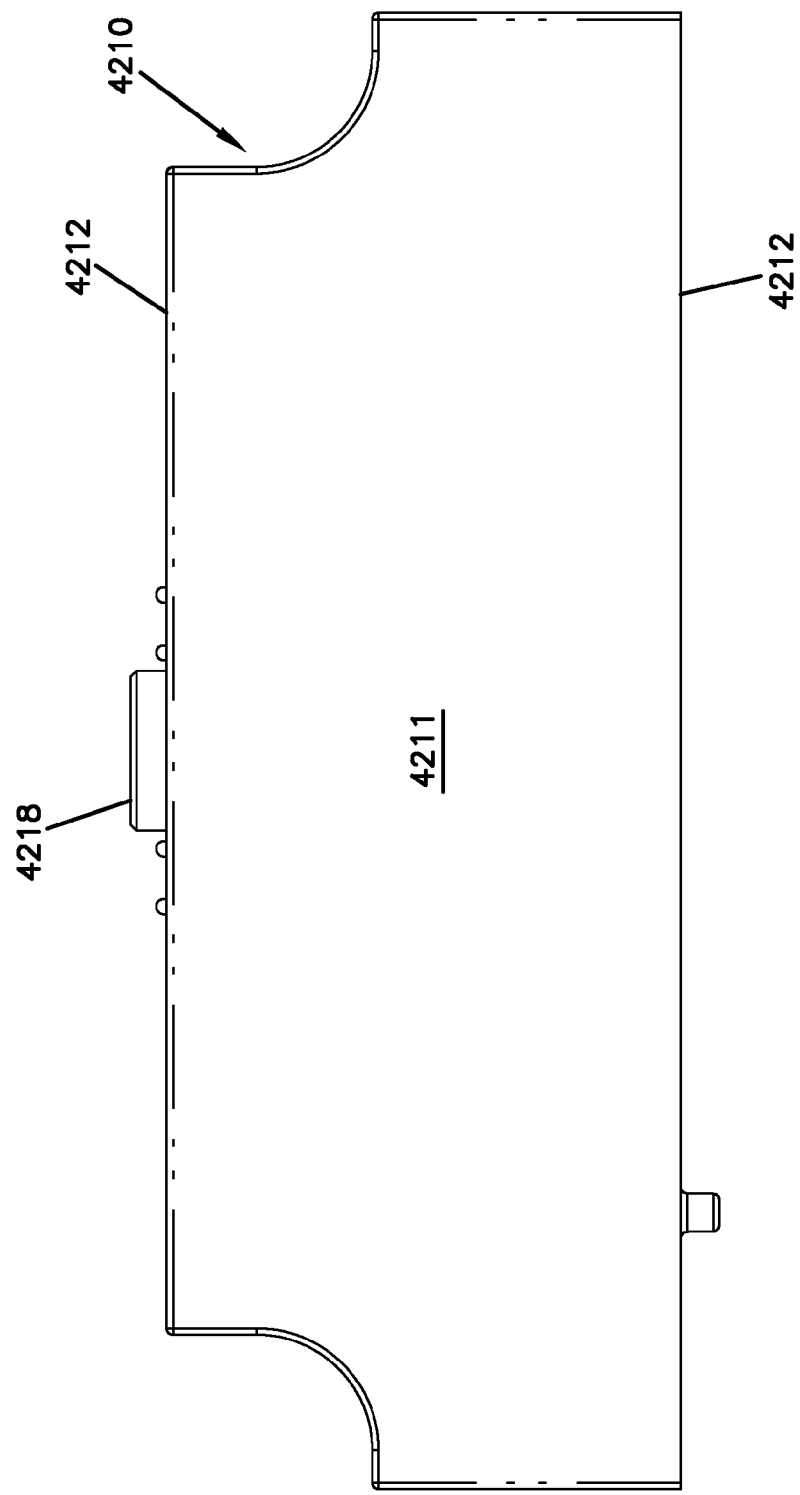

FIGS. 54 and 55 show a third example connector 4110C that includes a key 4115 having a deflection wall 4118. The key 4115 defines a recessed section or cavity 4116C in which a storage device 4130C can be positioned. In the example shown, the cavity 4116C cuts into the deflection wall 4118 of the key 4115. In some implementations, a cover can be positioned over the storage device 4130C to enclose the storage device 4130C within the connector housing 4111. In other implementations, the storage device 4130C is left uncovered and exposed.

The storage device 4130C shown in FIG. 55 includes contacts 4132C having first sections 4135C that extend over a generally planar circuit board 4131C and contoured sections 4134C that curve, fold, or bend over a contoured section 4136C at the front of the board 4131C. In the example shown, the first sections 4135C of the contacts 4132C have two different lengths. In other implementations, however, the first sections 4135C of the contacts 4132C may all be the same length or may each be a different length. In certain implementations, one or more of the first sections 4135C may be L-shaped and one or more of the first sections 4135C may have a rounded edge. The memory 4133 of the storage device 4130C, which is located on the non-visible side of the board in FIG. 55, is accessed by sliding or wiping the contact member 4231 (FIG. 63) of the coupler assembly 4200 across the contoured section 4134C of the contacts 4132C.

FIGS. 56-61 show one example implementation of a communications coupler assembly 4200 implemented as a fiber optic adapter. The example communications coupler assembly 4200 includes an adapter housing 4210 defining one or more passages 4215 configured to align and interface two or more fiber optic connectors 4110 (e.g., see FIG. 44). In other example implementations, however, one or more passages 4215 can be configured to communicatively couple together a fiber optic connector 4110 with a media converter (not shown) to convert the optical data signals into electrical data signals, wireless data signals, or other such data signals. In other implementations, however, the communications coupler assembly 4200 can include an electrical termination block that is configured to receive punch-down wires, electrical plugs (e.g., for electrical jacks), or other types of electrical connectors.

The example adapter housing 4210 shown in FIGS. 56-61 is formed from opposing sides 4211 interconnected by first and second ends 4212. The sides 4211 and ends 4212 each extend between a front and a rear. The adapter housing 4210 defines one or more passages 4215 extending between the front and rear ends. Each end of each passage 4215 is configured to receive a connector arrangement or portion thereof (e.g., one fiber optic connector 4110 of duplex connector arrangement 4100 of FIG. 44). In the example shown, the adapter housing 4210 defines four passages 4215. In other implementations, however, the adapter housing 4210 may define one, two, three, six, eight, ten, twelve, sixteen, or even more ports. Sleeves (e.g., split sleeves) 4206 are positioned within the passages 4215 to receive and align the ferrules 4112 of fiber optic connectors 4110 (see FIG. 61).

In the example shown, the body 4210 of the fiber optic adapter 4200 defines four passages 4215. In other implementations, the body 4210 can define greater or fewer passages 4215. For example, in some example implementations, the body 4210 of the fiber optic adapter 4200 can define a single passage 4215 that is configured to optically couple together two fiber optic connectors 4110. In other example implementations, the fiber optic adapter 4200 can define two, eight, or twelve passages 4215 that are each configured to optically couple together two fiber optic connectors 4110. In certain implementations, the adapter housing 4210 also defines latch engagement channel 4217 (FIG. 56) at each port to facilitate retention of the latch arms 4114 of the fiber optic connectors 4110. Each latch engagement channel 4217 is sized and shaped to receive the key 4115 of the connector 4110.

The fiber optic adapter 4210 includes one or more media reading interfaces 4230, each configured to acquire the physical layer information from the storage device 4130 of a fiber optic connector 4110 plugged into the fiber optic adapter 4210. For example, in one implementation, the adapter 4210 can include a media reading interface 4230 associated with each passage 4215. In another implementation, the adapter 4210 can include a media reading interface 4230 associated with each connection end of each passage 4215. In still other implementations, the adapter 4210 can include a media reading interface 4230 associated with each of a set of passages 4215 that accommodate a connector arrangement 4100.

Figure 58:
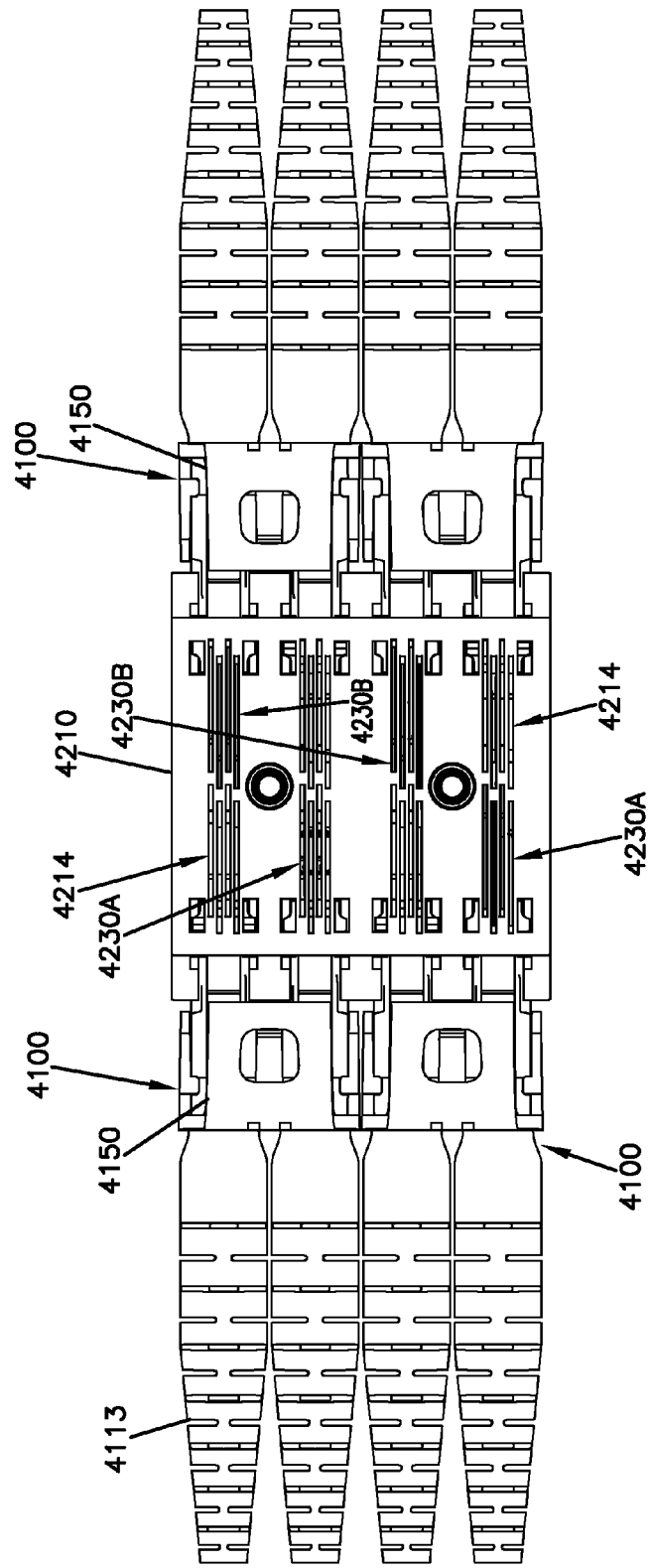

For example, the quadruplex adapter 4210 shown in FIG. 58 includes a media reading interface 4230A at the front connection end of two passages 4215 to interface with two duplex fiber optic connector arrangements 4100 received thereat and two media reading interfaces 4230B at the rear connection end of two passages 4215 to interface with two duplex fiber optic connector arrangements 4100 received thereat. In another implementation, one side of the adapter housing 4210 can include two media reading interfaces 4230 to interface with two duplex fiber optic connector arrangements 4100 and another side of the adapter housing 4210 can include four media reading interfaces to interface with four separate fiber optic connectors 4110. In other implementations, the adapter housing 4210 can include any desired combination of front and rear media reading interfaces 4230.

Figure 63:
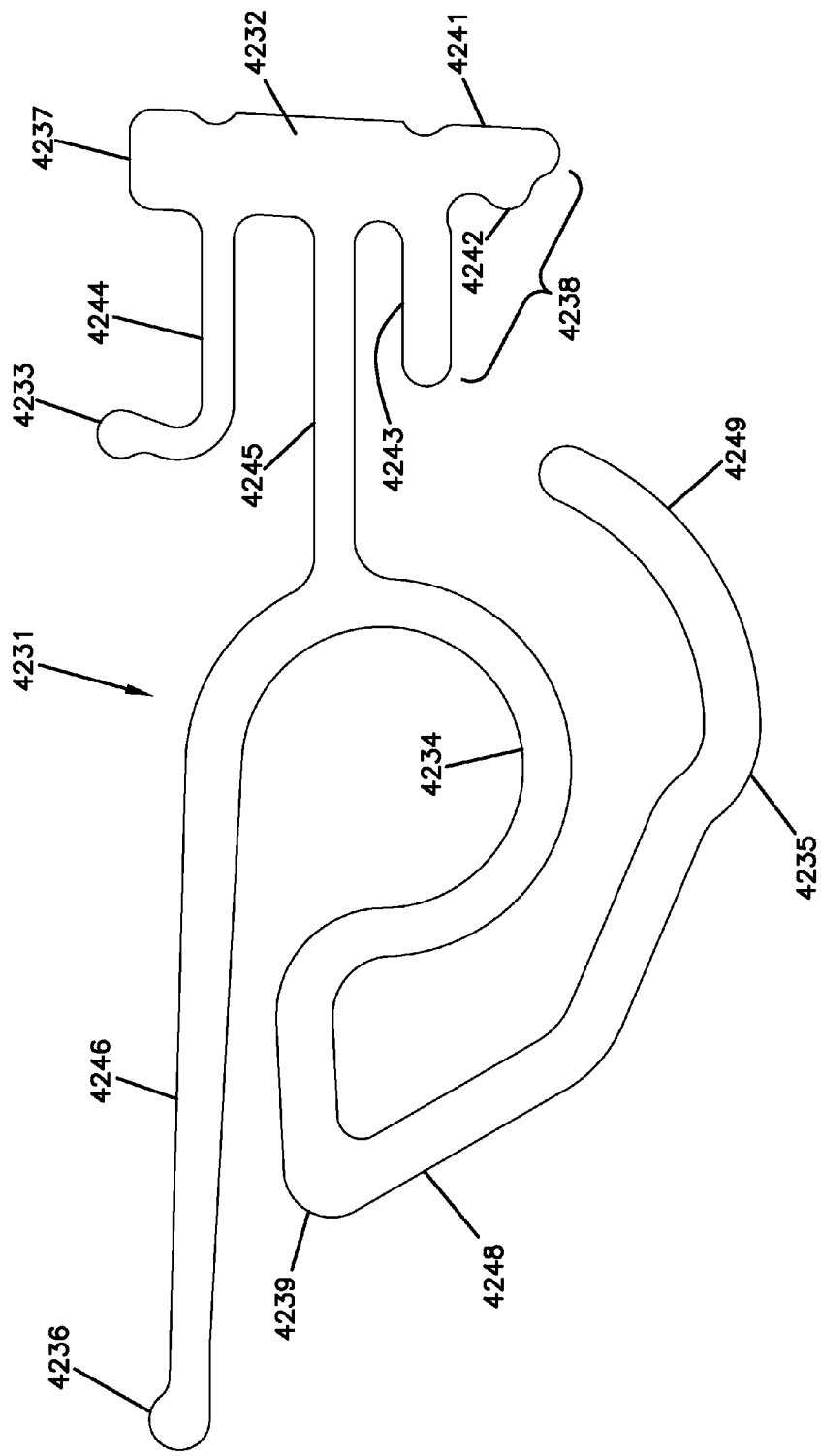

In general, each media reading interface 4230 is formed from one or more contact members 4231 (see FIG. 63). In certain implementations, a top surface of the coupler housing 4210 defines slots 4214 configured to receive one or more contact members 4231. When a connector 4110 with a storage device 4130 is inserted into one of the passages 4215 of the coupler housing 4210, the contact pads 4132 of the storage device 4130 are configured to align with the slots 4214 defined in the adapter housing 4210. Accordingly, the contact members 4231 held within the slots 4214 align with the contact pads 4132.

At least a portion of each slot 4214 extends through the top surface to the passage 4215. In some implementations, the material height of the top surface is at least 0.76 mm (0.03 inches). Indeed, in some implementations, the material height of the top surface is at least 1.02 mm (0.04 inches). In certain implementations, the material height of the top surface is at least 1.27 mm (0.05 inches).

In some implementations, the media reading interface 4230 includes multiple contact members 4231. For example, in certain implementations, the media reading interface 4230 includes at least a first contact member 4231 that transfers power, at least a second contact member 4231 that transfers data, and at least a third contact member 4231 that provides grounding. In one implementation, the media reading interface 4230 includes a fourth contact member. In other implementations, the media reading interface 4230 include greater or fewer contact members 4231.

Figure 60:
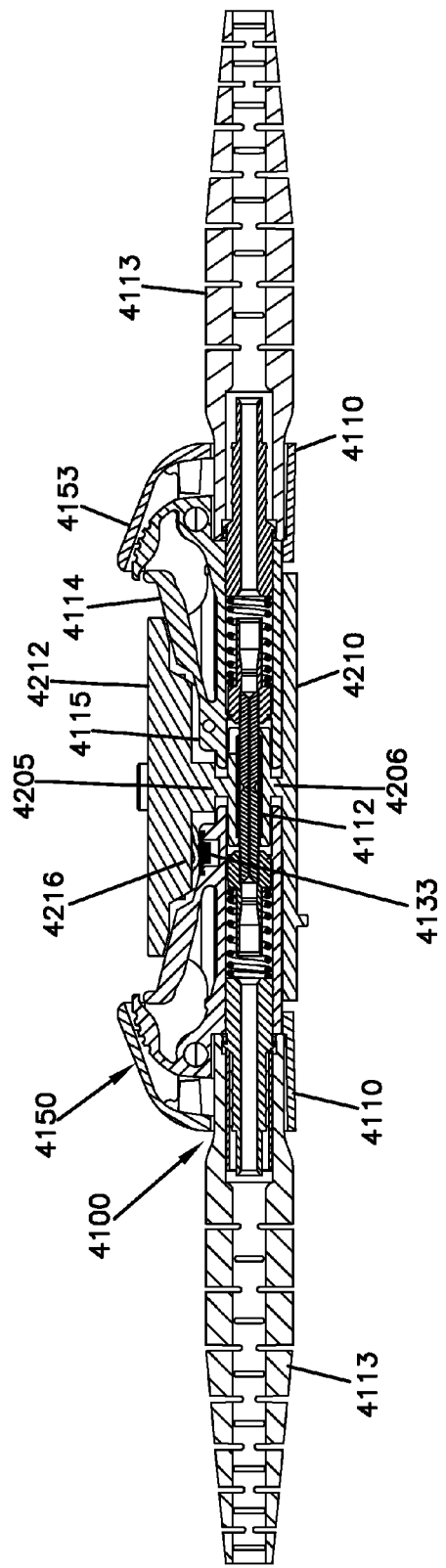
Figure 61:
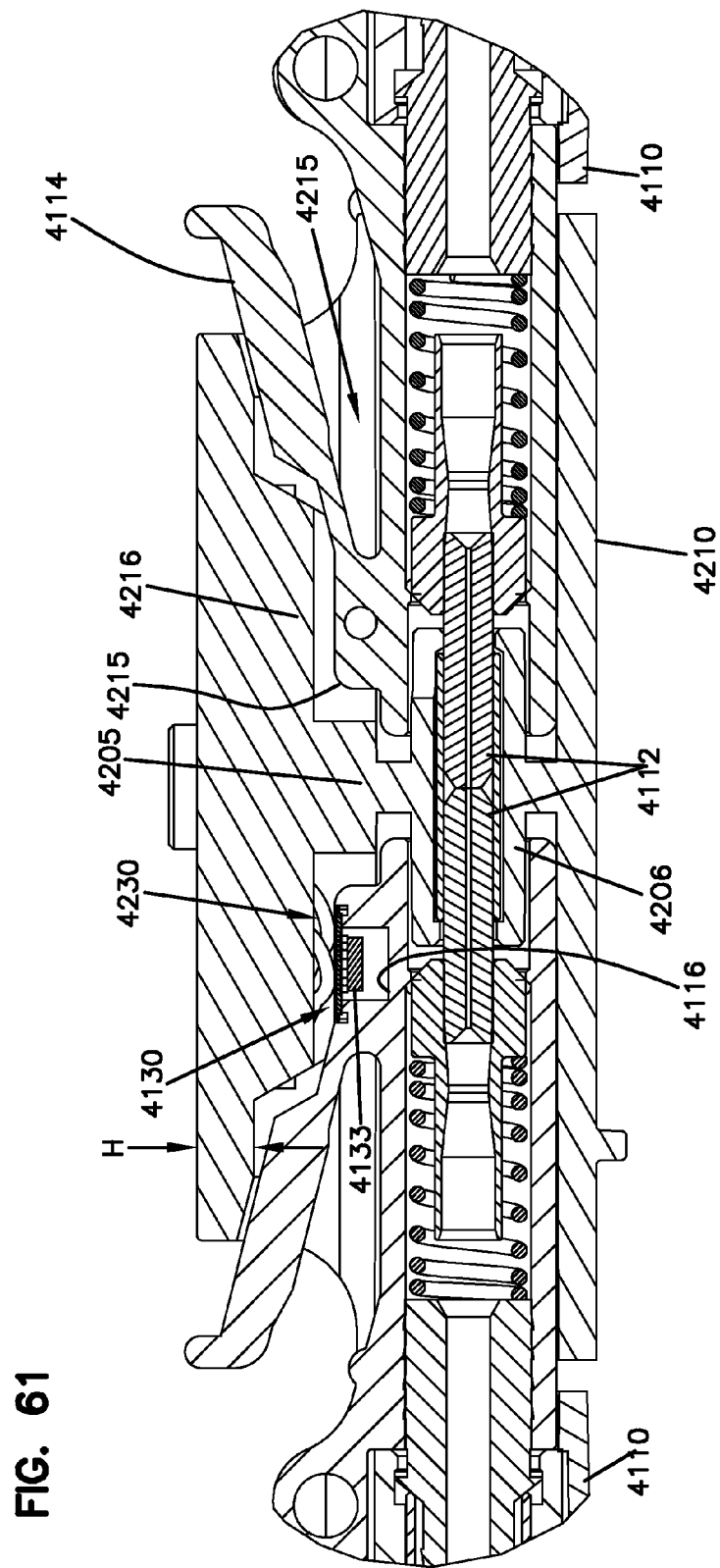

In some implementations, each contact member 4231 is retained within a separate slot 4214. For example, in the implementation shown in FIGS. 56-62, each media reading interface 4230 includes four contact members 4231 that are held in a set 4213 (FIG. 59) of four slots 4214 that align with four contact pads 4132 on a connector storage device 4130. The slots 4214 in each set 4213 are separated by intermediate walls 4216 (FIGS. 59 and 61). In other implementations, all of the contact members 4231 in a single media reading interface 4230 may be retained in a single slot 3214.

In some implementations, the adapter housing 4210 has more sets 4213 of slots 4214 than media reading interfaces 4230. For example, in some implementations, each adapter housing 4210 defines a set 4213 of slots 4214 at each connection end of each passage 4215. In other implementations, however, the adapter housing 4210 may have the same number of slot sets 4213 and media reading interfaces 4231. For example, in certain implementations, each adapter housing 4210 may defines a set 4213 of slots 4214 at only one connection end of each passage 4215. In other implementations, the adapter housing 4210 may define a set 4213 of slots 4214 at each connection end of alternate passages 4215.

In some implementations, the contact members 4231 of a single media reading interface 4230 are positioned in a staggered configuration. In some implementations, the slots 4214 accommodating the staggered contact members 4231 also are staggered. For example, as shown in FIGS. 58-59, alternating slots 4214 can be staggered in a front to rear direction. In other implementations, however, the slots 4214 accommodating the staggered contacts 4231 may each have a common length that is longer than a length of the staggered arrangement of contact members 4231. In still other implementations, the front and rear ends of the contact members 4231 of a single media reading interface 4230 are transversely aligned within similarly transversely aligned slots 4214.

In the example shown in FIGS. 58-59, the slots 4214 defined at front connection ends of the adapter passages 4215 axially align with slots 4214 defined at the rear connection ends. In other implementations, however, the slots 4214 at the front connection ends may be staggered from the slots 4214 at the rear connection ends. As shown in FIGS. 60 and 61, at least one support wall 4205 separates the forward slots 4214 from the rearward slots 4214. Each support wall 4205 extends from the slotted top surface 4212 of the adapter housing 4210 to at least the split sleeve 4206.

In some implementations, a single support wall 4205 extends along a center of the adapter housing 4210 transverse to the insertion axis $A_I$ (FIG. 56) of the passages 4215. For example, a single support wall 4205 may extend through an adapter housing 4210 that defines transversely aligned slots 4214. In other implementations, one or more support walls 4205 may extend between slots 4214 arranged in a staggered configuration. In the example shown, adjacent support walls 4205 are offset from each other along an insertion axis of the passages 4215 to accommodate the staggered slots 4214 arrangements. In certain implementations, the support walls 4205 may connect to or be continuous with the intermediate walls 4216.

As shown in FIG. 59, each set 4213 of slots 4214 accommodating one media reading interface 4230 has a width W5 and each slot 4214 has a width W6. Intermediate walls 4216, which separate the slots 4214 of each set 4213, each have a width W7. In general, the width W5 of each set 4213 of slots 4214 is smaller than the width W8 (FIG. 48) of the key 4115 of the connector 4110 positioned in the respective adapter passage 4215. In some implementations, the width W5 of each set 4213 of slots 4214 is less than 3.35 mm (0.13 inches). Indeed, in some implementations, the width W5 of each set 4213 of slots 4214 is less than about 3.1 mm (0.12 inches). In certain implementations, the width W5 of each set 4213 of slots 4214 is no more than about 2.5 mm (0.10 inches). In one example implementation, the width W5 of each set 4213 of slots 4214 is no more than 2.2 mm (0.09 inches). In one example implementation, the width W5 of each set 4213 of slots 4214 is about 2 mm (0.08 inches). In one example implementation, the width W5 of each set 4213 of slots 4214 is about 2.1 mm (0.081 inches).

In certain implementations, the width W7 of the intermediate walls 4216 is smaller than the width W6 of the slots 4214. In some implementations, the width W6 of each slot 4214 is within the range of about 0.25 mm (0.010 inches) to about 0.64 mm (0.025 inches). Indeed, in some implementations, the width W6 of each slot 4214 is within the range of about 0.28 mm (0.011 inches) to about 0.48 mm (0.019 inches). In one implementation, the width W6 of each slot is about 0.3 mm (0.012 inches). In one implementation, the width W6 of each slot is about 0.28 mm (0.011 inches). In one implementation, the width W6 of each slot is about 0.33 mm (0.013 inches). In some implementations, the width W7 of each intermediate wall 4216 is within the range of about 0.13 mm (0.005) inches to about 0.36 mm (0.014 inches). In one implementation, the width W7 of each intermediate wall 4216 is about 0.28 mm (0.011 inches). In another implementation, the width W7 of each intermediate wall 4216 is about 0.15 mm (0.006 inches).

Figure 62:
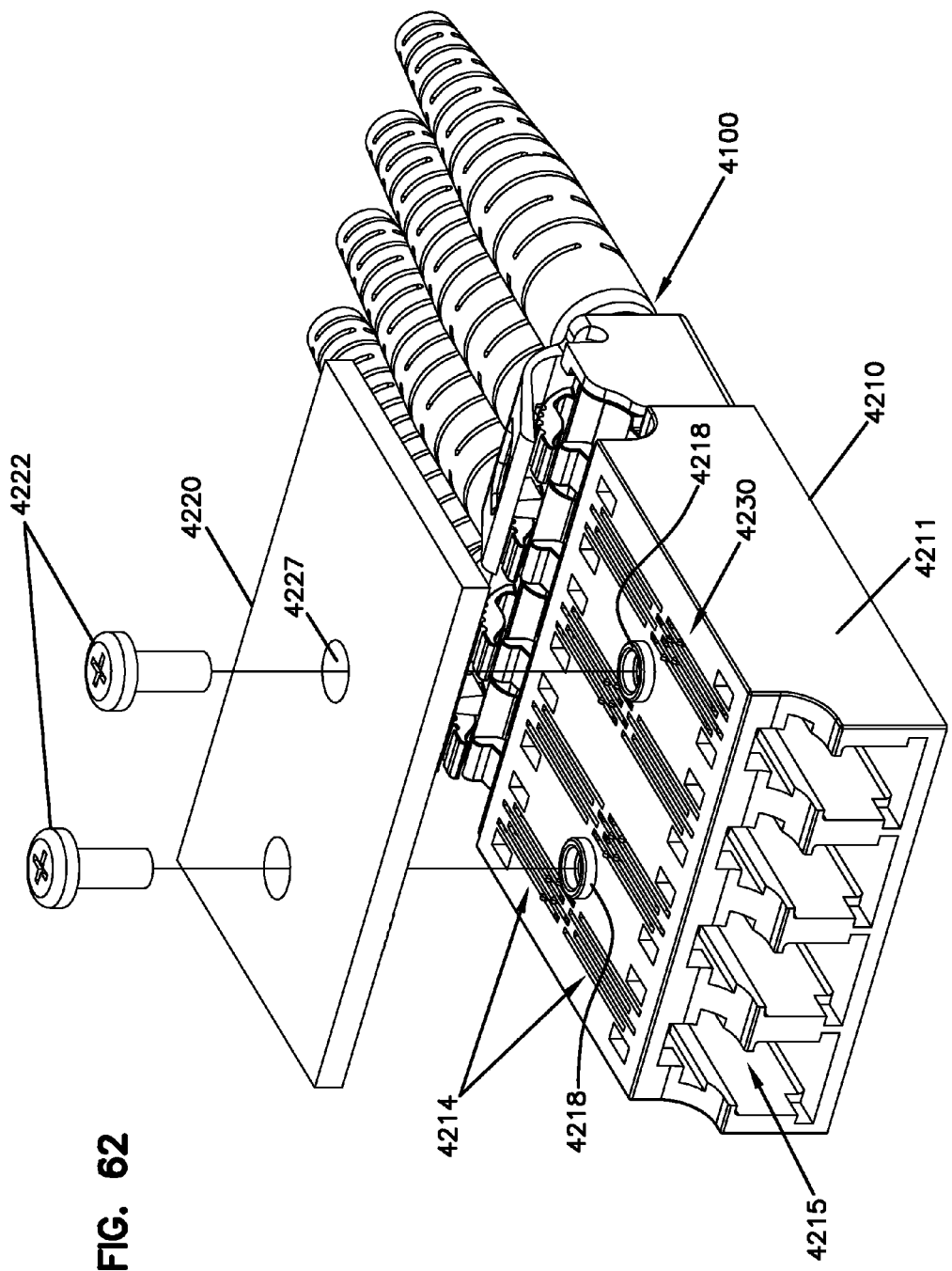

As shown in FIG. 62, a printed circuit board 4220 is configured to secure (e.g., via fasteners 4222) to the adapter housing 4210. In some implementations, the example adapter housing 4210 includes two annular walls 4218 in which the fasteners 4222 can be inserted to hold the printed circuit board 4220 to the adapter housing 4210. Non-limiting examples of suitable fasteners 4222 include screws, snaps, and rivets. For ease in understanding, only a portion of the printed circuit board 4220 is shown in FIG. 62. It is to be understood that the printed circuit board 4220 electrically connects to a data processor and/or to a network interface (e.g., the processor 217 and network interface 216 of FIG. 2). It is further to be understood that multiple communications coupler housings 4210 can be connected to the printed circuit board 4220 within a connector assembly (e.g., a communications panel).

The contact members 4231 extend between the slotted surface of the adapter housing 4210 and the passages 4215. Portions of each contact member 4231 engage contacts and tracings on the printed circuit board 4220 mounted to the slotted surface of the adapter housing 4210. Other portions of the contact members 4231 engage the electrical contacts 4132 of the storage members 4130 attached to any connector arrangements 4100 positioned in the passages 4215 (see FIG. 67). A processor coupled to the circuit board 4220 can access the memory 4133 of each connector arrangement 4100 through corresponding ones of the contact members 4231, 4131.

In some implementations, each media reading interface 4230 of the fiber optic adapter 4200 includes four contact members 4231 (see FIG. 56) and each storage device 4130 of the fiber optic connector 4110 includes four contact pads 4132 (see FIGS. 50-55). In the example shown in FIGS. 64-67, two contact members 4231 are visibly positioned within a slot 4214 defined in a fiber optic adapter 4210, shown in cross-section. Two additional contact members 4231 also are positioned in the slot 4214, but cannot be seen since the additional contact members 4231 laterally align with the visible contact members 4231. In other implementations, however, greater or fewer contact members 4231 may be positioned within the housing.

In accordance with some aspects, the media reading interfaces 4230 of the adapter are configured to detect when a connector arrangement is inserted into one or more passages 4215. The contact members 4231 can function as presence detection sensors or trigger switches. In some implementations, the contact members 4231 of a media reading interface 4230 are configured to form a complete circuit with the circuit board 4220 only when a connector 4110 is inserted within a respective passage 4215. For example, at least a portion of each contact member 4231 may be configured to contact the circuit board 4220 only after being pushed toward the circuit board 4220 by a connector 4210. In other example implementations, portions of the contact members 4231 can be configured to complete a circuit until pushed away from the circuit board 4220 or a shorting rod by a connector 4110. In accordance with other aspects, however, some implementations of the contact members 4231 may be configured to form a complete circuit with the circuit board 4220 regardless of whether a connector 4110 is received in a passage 4215.

One example type of contact member 4231 is shown in FIG. 63. Each contact member 4231 includes at least three moveable (e.g., flexible) contact sections 4233, 4235, and 4236 defining contact surfaces. The flexibility of the contact sections 4233, 4235, and 4236 provides tolerance for differences in spacing between the contact member 4231 and the respective printed circuit board 4220 when the coupler assembly 4200 is manufactured. Certain types of contact members 4231 also include at least one stationary contact 4237 having a contact surface of the contact member 4231.

The first moveable contact section 4233 is configured to extend through the slot 4214 and engage the circuit board 4220. The first stationary contact 4237 also is configured to extend through the slot 4214 to engage the circuit board 4220. The ability of the first contact section 4233 to flex relative to the stationary contact 4237 provides tolerance for placement of the contact member 4231 relative to the circuit board 4220. The second moveable contact section 4235 is configured to extend into the passage 4215 and engage the connector 4110 positioned in the passage 4215. If a storage device 4130 is installed on the connector 4110, then the second contact surface 4235 is configured to engage the contact pads 4132 of the storage device 4130.

The third moveable contact surface 4236 is configured to selectively extend through the slot 4214 and engage the circuit board 4220. For example, the third contact surface 4236 may be configured to engage the circuit board 4220 when a connector 4110 is inserted into a passage 4215 corresponding with the contact member 4231. The example contact member 4231 also includes a resilient section 4234 that biases the third contact surface 4236 upwardly through the slot 4214 (e.g., toward the circuit board 4220). In some implementations, the resilient section 4234 defines at least a partial arc. For example, in the implementation shown in FIG. 63, the resilient section 4234 defines a partial circle. In other implementations, the resilient section 4234 may define a series of curves, folds, and/or bends.

The example contact member 4231 is configured to seat in one of the slots 4214 of the adapter housing 4210. For example, the contact member 4231 includes a base 4232 that is configured to abut the support wall 4205 of the adapter housing 4210 (see FIGS. 61-67). In one implementation, the side of the base 4232 that abuts the support wall 4205 is flat. In another implementation, the side of the base 4232 that abuts the support wall 4205 defines one or more notches. One end 4237 of the base 4232 defines a stationary contact 4237 that is configured to extend through the slot 4214 and contact the circuit board 4220.

Another end of the base 4232 defines an attachment section 4238 that engages a portion of the support wall 4205 to secure the contact member 4231 within the slot 4214. In some implementations, the attachment section 4238 of the contact member 4231 includes a first leg 4241 and a second leg 4243 extending from the base 4232 (FIG. 63). In one implementation, the first leg 4241 defines a bump 4242. In one implementation, the attachment section 4238 is configured to snap-fit into the support wall 4205. In other implementations, the attachment section 4238 may otherwise mount to the support wall 4205.

The example contact member 4231 also includes a third leg 4244 that extends outwardly from the base 4232 generally parallel with the second leg 4243. A distal end of the third leg 4244 bends or curves upwardly toward the circuit board 4220. In the example shown, the third leg 4244 is generally J-shaped. In other implementations, the third leg 4244 may be L-shaped, C-shaped, V-shaped, etc. The first contact surface 4233 is defined at the distal end of the third leg 4244. In the example shown, the distal end of the third leg 4244 defines an arched or ball-shaped first contact surface 4233. In one implementation, the first contact section 4233 and/or the stationary contact 4237 may provide grounding for the contact member 4231 through the circuit board 4220.

The contact member 4231 also includes a fourth leg 4245 that extends outwardly from the base 4232. In the example shown, the fourth leg 4245 extends outwardly between the second and third legs 4243, 4244 and generally parallel to the second and third legs 4243, 4244. The fourth leg 4245 separates into first arm 4246, which defines the third contact surface 4236, and a second arm 4247, which defines the second contact surface 4235. The first arm 4246 extends upwardly from the fourth leg 4245 towards the circuit board 4220. For example, in some implementations, the first arm 4246 arcs upwardly into a planar extension that terminates at the third contact surface 4236. In the example shown, the third contact surface 4236 defines an arched or ball-shaped distal end of the first arm 4246.

The second arm 4247 initially extends away from the fourth leg 4245 and subsequently extends back towards the base 4232 to increase the beam length of the contact 4231. For example, in some implementations, the second arm 4247 extends downwardly to define the resilient section 4234 and upwardly into a bend section 4239. From the bend section 4239, the second arm 4247 changes direction (i.e., curves, bends, folds, arcs, angles, etc.) downwardly and back toward the base 4232 along an elongated section 4248, which may be straight or contoured. In the example shown, the elongated section 4248 defines a bend about part-way through.

Figure 66:
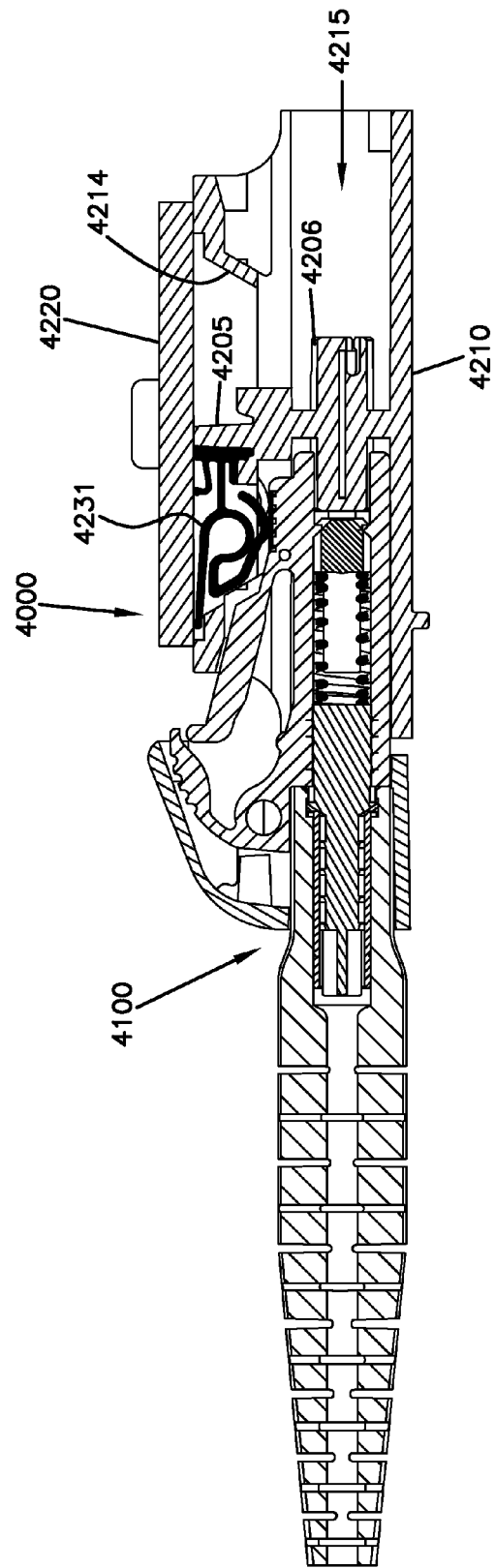
Figure 67:
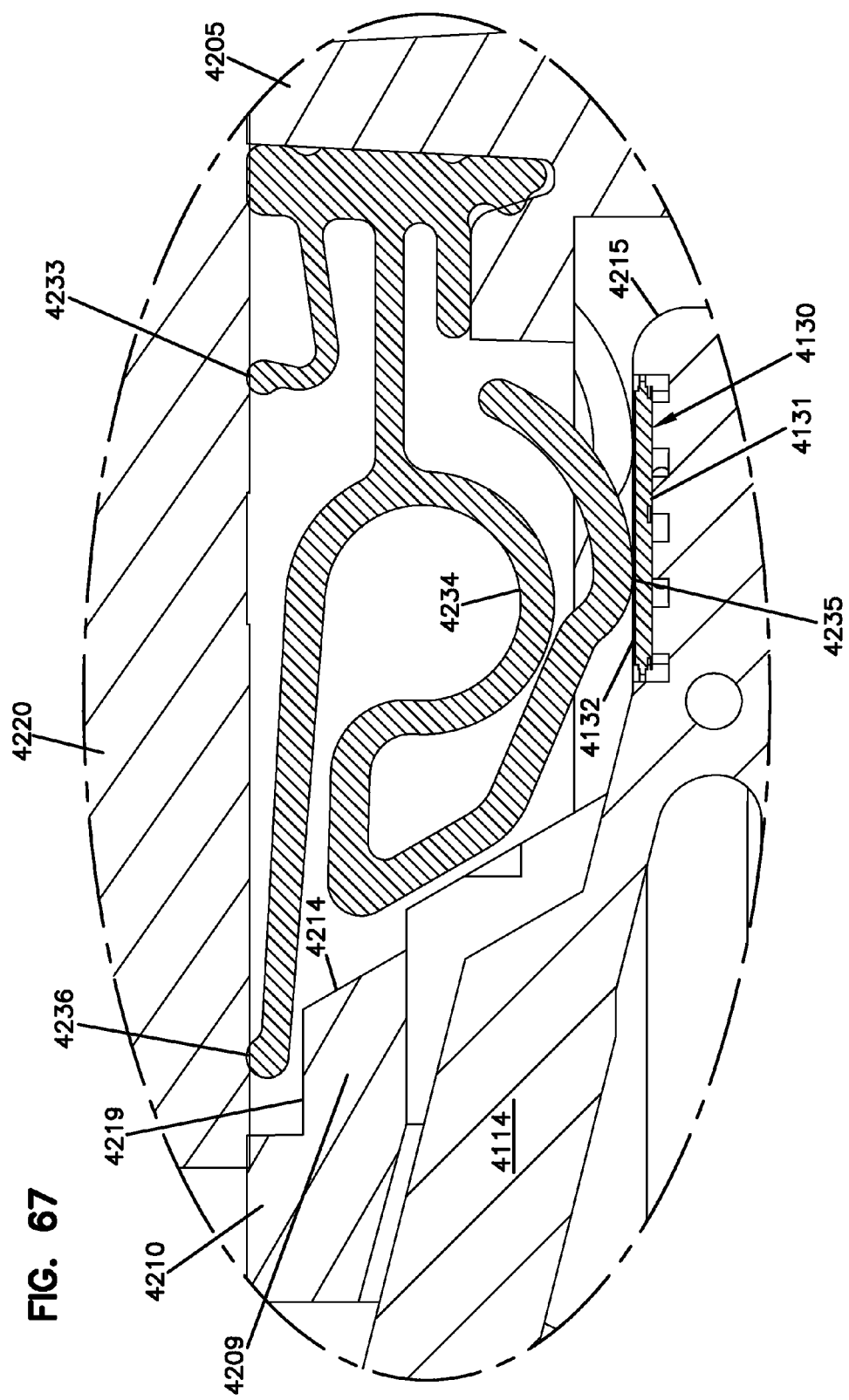

A tail 4249 extends from the elongated section 4248 toward the base 4230. In the example shown, the tail 4249 curves downwardly to define the second contact surface 4235 before curving upwardly towards the base 4232. As shown in FIGS. 66-68, at least a portion of the elongated section 4248 and the tail 4249 extend completely through the slots 4214 and into the socket 4215. At least a distal end of the tail 4249 of each contact member 4231 extends out of the socket 4215 and back into the respective slot 4214. Accordingly, the tail 4249 is inhibited from touching the adjacent contact members 4231.

At least the tail 4249 of the contact member 4231 is configured to deflect or flex when the front surface 4118 of the key 4115 of a connector 4110 pushes against a portion of the second arm 4247 of the contact member 4231 when a connector 4110 is inserted into the socket 4215. In the example shown, the tail 4249 and the elongated portion 4248 flex when deflected by the key 4115. For example, the elongated portion 4248 and tail 4249 flex when the deflecting surface 4118 pushes against an outer surface of the elongated section 4248. In some implementations, the tail 4249 defines the second contact surface 4235. In other implementations, an outer surface of the elongated section 4248 defines the second contact surface 4235. In still other implementations, the elongated section 4248 and the tail 4249 cooperate to define the second contact section 4235.

The resilient section 4234 is configured to transfer the force applied to a second arm 4247 of the contact member 4231 to the first arm 4246. For example, in some implementations, the resilient section 4234 is configured to lift the first arm 4246 to swipe the third contact surface 4236 against the printed circuit board 4220 (see FIGS. 66-68). In certain implementations, the inner side of the elongated section 4248 is configured to abut against the resilient section 4234 when a connector 4110 is positioned in the passage 4215 to aid in transferring the force to the first arm 4246.

In some implementations, the body of the contact member 4231 extends between a first and second end. In the example shown in FIG. 63, the base 4232 is located at the first end and the third contact section 4236 is located at the second end. The contact member 4231 also extends between a top and a bottom. In some implementations, the contact surfaces of the first and third contact sections 4233, 4236 face the top of the contact member 4231 and the contact surface of the second contact section 4235 faces the bottom of the contact member 4231. In the example shown, the first and third contact sections 4233, 4236 extend at least partially towards the top of the contact member 4231 and the second contact section 4235 extends towards the bottom of the contact member 4231. As used herein, the terms "top" and "bottom" are not meant to imply a proper orientation of the contact member 4231 or that the top of the contact member 4231 must be located above the bottom of the contact member 4231. Rather, the terms are used for ease in understanding and are assigned relative to the viewing plane of FIG. 63.

Figure 72:
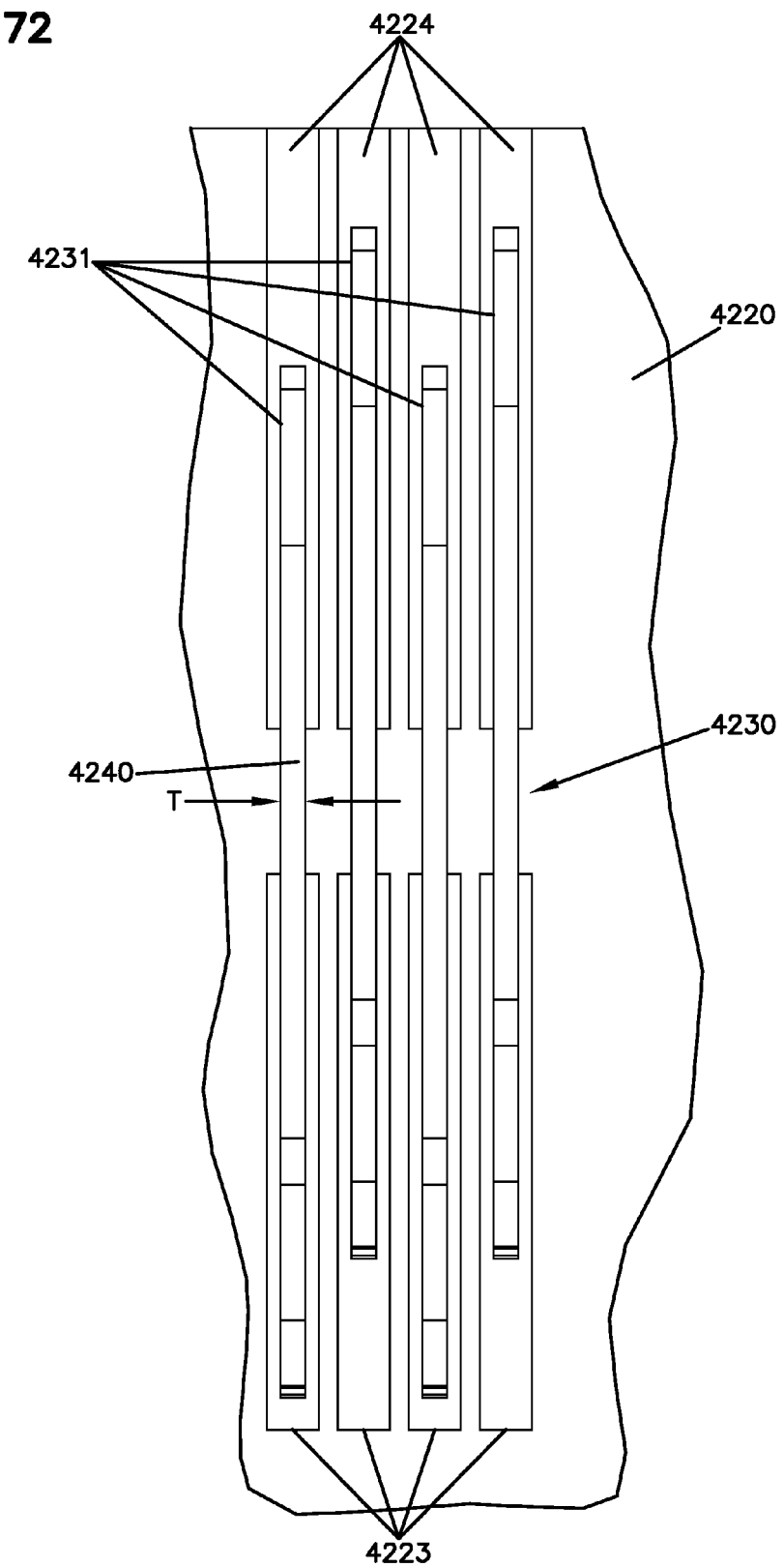

The contact member 4231 defines a body having a circumferential edge 4240 (FIG. 72) extending between planar major sides (FIG. 63). In certain implementations, the edge 4240 defines the contact surface of each contact section 4233, 4235, 4236, 4237 (see FIG. 68). In some implementations, the edge 4240 has a substantially continuous thickness T (FIG. 72). In various implementations, the thickness T ranges from about 0.05 inches to about 0.005 inches. In certain implementations, the thickness T is less than about 0.02 inches. In some implementation, the thickness T is less than about 0.012 inches. In another implementation, the thickness T is about 0.01 inches. In another implementation, the thickness T is about 0.009 inches. In another implementation, the thickness T is about 0.008 inches. In another implementation, the thickness T is about 0.007 inches. In another implementation, the thickness T is about 0.006 inches. In other implementations, the thickness T may vary across the body of the contact member 4231.

Portions of the planar surfaces of the contact member 4231 may increase and/or decrease in width. For example, in the example shown in FIG. 63, the base 4232 is wider than each of the arms 4243, 4244, 4245. The bend section 4239 is wider than the resilient section 4234. In certain implementations, each of the contact surfaces of the contact sections 4233, 4235, 4236 are rounded or otherwise contoured. For example, in FIG. 63, the first and third contact sections 4233, 4236 define bulbous tips and the second contact section 4235 defines an arced section extending from a linear section of the contact member 4231 (see FIG. 63).

In one implementation, the contact member 4231 is formed monolithically (e.g., from a continuous sheet of metal or other material). For example, in some implementations, the contact member 4231 may be manufactured by cutting a planar sheet of metal or other material. In other implementations, the contact member 4231 may be manufactured by etching a planar sheet of metal or other material. In other implementations, the contact member 4231 may be manufactured by laser trimming a planar sheet of metal or other material. In still other implementations, the contact member 4231 may be manufactured by stamping a planar sheet of metal or other material.

Figure 64:
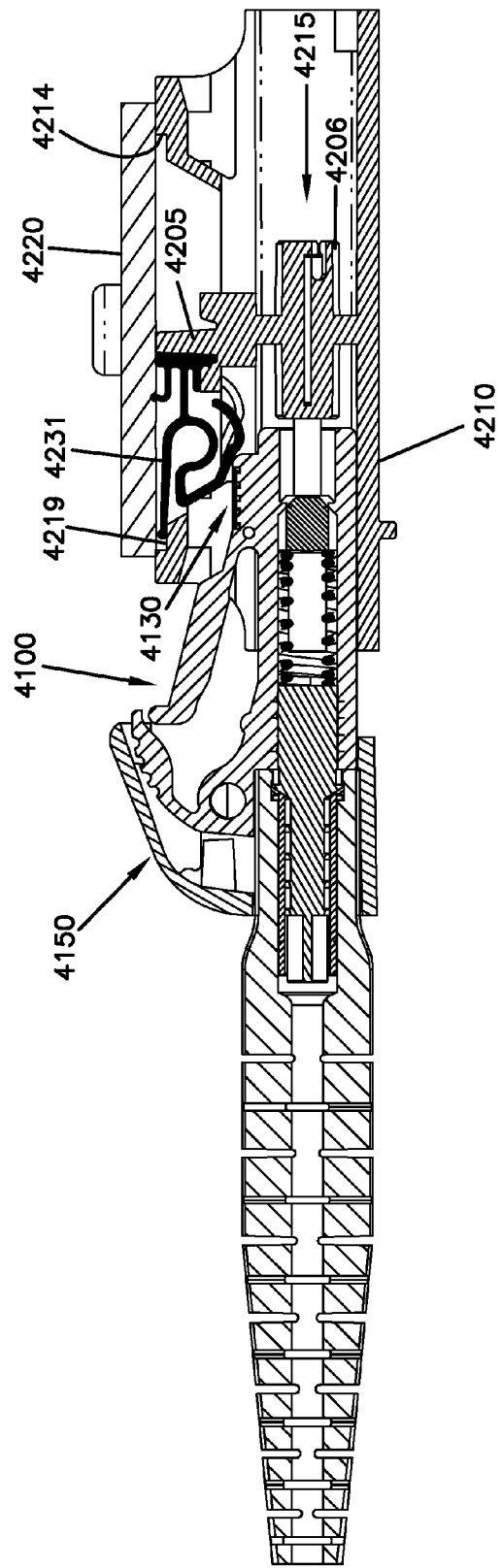
Figure 65:
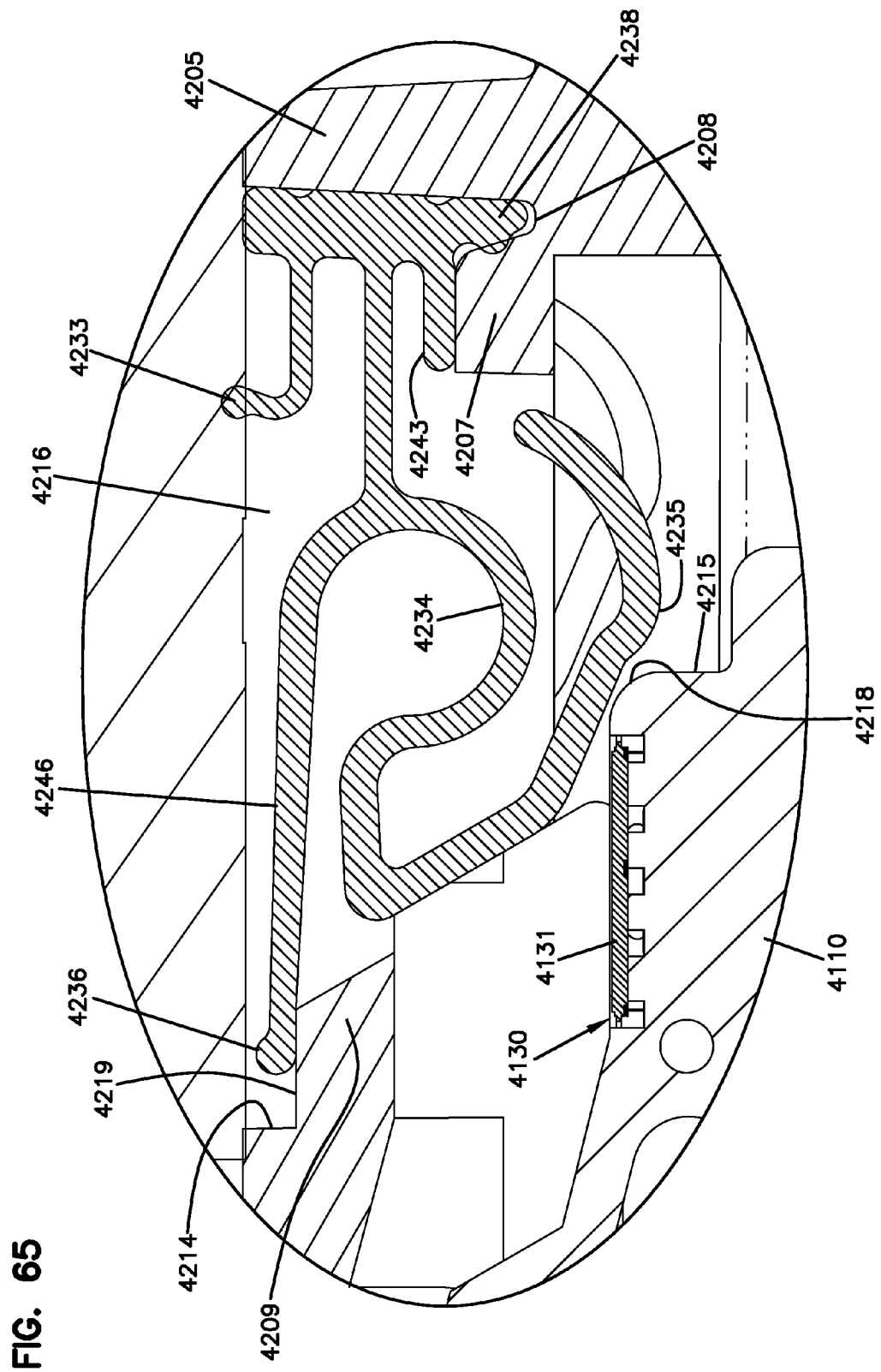

FIGS. 64-67 illustrate one example contact member 4231 positioned in a slot 4214 of an adapter 4210 before and after insertion of a connector 4110 in a passage 4215 of the adapter 4210. In the example shown, the first leg 4241 of the attachment section 4238 extends generally vertically and the second leg 4243 extends generally horizontally (e.g., see FIGS. 65-68). In some implementations, the support wall 4205 of the adapter housing 4210 defines a recess or channel 4208 and an extension 4207 (FIG. 65). When the attachment section 4238 is mounted to the support wall 4205, the first leg 4241 of the attachment section 4238 fits in the recess 4208 and the second leg 4242 seats on the extension 4207. The first contact surface 4233 extends through the slot 4214 and contacts the circuit board 3220.

In some implementations, a support portion 4209 (FIGS. 65-68) of the adapter housing 4210 projects partially into the passages 4215 opposite the support wall 4205. The support portion 4209 defines a ledge 4219 recessed within each slot 4214. The distal end of the first arm 4246 seats on the ledge 4219 spaced from the circuit board 4220 when a connector 4110 is not positioned within a respective passage 4215 (see FIGS. 64-65). Inserting a connector 4110 into the passage 4215 biases the distal end of the first arm 4246 upwardly from the ledge 4219 toward the circuit board 4220 (see FIGS. 66-68). In certain implementations, biasing the distal end of the first arm 4246 upwardly causes the third contact surface 4236 to engage (e.g., touch or slide against) the circuit board 4220.

The tail 4249 of the contact member 4231 extends into the passage 4215 associated with the slot 4214. Inserting the connector 4110 into the passage 4215 causes the deflection surface 4118 of the key 4115 of a connector 4110 to press against the outer surface of the elongated section 4248 (see FIGS. 64 and 65). The deflection surface 4118 deflects the elongated section 4248 and the tail 4249 upwardly and toward the support wall 4205. In certain implementations, the inner surface of the elongated portion 4248 abuts against and applies an upwardly directed pressure to the resilient section 4234 of the contact member 3231. The resilient section 4234 biases the distal end of the first arm 4246 of the contact member 4231 through the slot 4214 to slide or wipe across the circuit board 4220 (see FIGS. 66-71). Accordingly, the presence of the connector 4110 in the passage 4215 may be detected when the deflection surface 4118 of the connector key 4115 engages the contact member 4231.

In some implementations, the connector 4110 does not include a storage device 4130. For example, the connector 4110 may be part of a duplex connector arrangement 4100 in which the other connector 4110 holds the storage device 4130. In other implementations, the connector 4110 may be an existing connector that does not store physical layer information. In other implementations, however, the connector 4110 may include a storage device 4130. In such implementations, the second contact surface 4235 of the contact member 4231 slides or wipes across the surface of the contacts 4132 of the storage device 4130 during insertion of the connector (see FIGS. 66-68).

In some implementations, the storage device 4130 is stored in a cavity defined only in a top of the key 4115 (e.g., see FIG. 48). In such implementations, the second contact surface 4235 of the connector 4130 is defined by a leading edge or bottom-most portion of the tail 4249, which slides across the contacts 4132 of the storage device 4130 after the tail 4249 is raised by the deflection surface 4118 of the key 4115. Accordingly, the presence of the connector 4110 within the passage 4215 may be detected before the memory 4133 of the storage device 4130 can be accessed.

In other implementations, the storage device 4130 is accessible through a recess in the deflection surface 4118 (e.g., see FIGS. 50 and 54). In such implementations, the second contact surface 4235 of the connector 4130 is defined by the outer edge of the elongated section 4248, which touches the storage device contacts 4132 as the elongated section 4248 is being deflected by the deflection surface 4118. Accordingly, the presence of the connector 4110 within the passage 4215 may be detected at approximately the same time that the memory 4133 of the storage device 4130 can be accessed.

As discussed above, a processor (e.g., processor 217 of FIG. 2) or other such equipment also can be electrically coupled to the printed circuit board 4220. Accordingly, the processor can communicate with the memory circuitry 4133 on the storage device 4130 via the contact members 4231 and the printed circuit board 4220. In accordance with some aspects, the processor is configured to obtain physical layer information from the storage device 4130. In accordance with other aspects, the processor is configured to write (e.g., new or revised) physical layer information to the storage device 4130. In accordance with other aspects, the processor is configured to delete physical layer information to the storage device 4130. In still other implementations, the processor detects the presence or absence of a connector 4110 in each passage 4215.

Removing the connector 4110 from the passage 4215 releases the second arm 4247 from the upwardly biased position (see FIG. 66), thereby allowing the elongated portion 4248 and tail 4249 to move back to the unbiased position (see FIG. 64). When in the unbiased position, an upward pressure is no longer applied to the resilient section 4234. Accordingly, the resilient section 4234 allows the distal end of the first arm 4246 to drop into the slot 4214 and rest against the ledge 4219 (see FIG. 64). Dropping the first arm 4246 disengages the third contact surface 4236 from the circuit board 4220, thereby interrupting the circuit created by the contact member 4231. Interrupting the circuit enables a processor connected to the circuit board 4220 to determine that the connector 4110 has been removed from the passage 4215.

FIGS. 69-72 shows one example implementation of the circuit board 4220 described above. The same or similar circuit boards 4220 are suitable for use in any of the coupler assemblies described herein. In some implementations, the circuit board 4220 defines fastener receiving openings 4227 through which fasteners 4222 may be inserted to secure the circuit board 4220 (see FIG. 62).

The example circuit board 4220 includes a plurality of first contact pads 4223 and a plurality of second contact pads 4224 spaced from the first contact pads 4223. In certain implementations, the first contact pads 4223 are laterally aligned with each other and the second contact pads 4224 are laterally aligned with each other. In other implementations, however, the first contact pads 4223 may be laterally offset or staggered from each other and/or the second contact pads 4224 may be laterally offset of staggered from each other. In certain implementations, each of the first contact pads 4223 is longitudinally aligned with one of the second contact pads 4224 to form a landing pair. In other implementations, however, the first and second contact pads 4223, 4224 may be longitudinally offset from each other.

A media reading interface (e.g., media reading interface 4230) may be seated on the printed circuit board 4220. In the example shown, the first moveable contact surface 4233 of each contact member 4231 of the media reading interface 4230 touches one of the first contact pads 4223. In certain implementations, the stationary contacts 4237 also touch the first contact pads 4223. The third moveable contact surface 4239 of each contact member 4231 is configured to selectively touch the second contact pad 4224 that forms a landing pair with the first contact pad 4223.

FIGS. 73-104 illustrate a fifth example implementation of a connector system 5000 that can be utilized on a connector assembly having PLI functionality as well as PLM functionality. The example connector system 5000 includes at least one communications coupler assembly 5200 positioned between two printed circuit boards 5220. One or more example connector arrangements 5100 (FIGS. 81-83), which terminate segments 5010 of communications media, are configured to communicatively couple to other segments of physical communications media at the coupler assemblies 5200. Accordingly, communications data signals carried by the media segments 5010 terminated by the connector arrangements 5100 can be transmitted to other media segments.

The coupler assembly 5200 includes one or more coupler housings 5210. At least one coupler housing 5210 is sandwiched between a first circuit board 5220A and a second circuit board 5220B (e.g., via fasteners 5222A, 5222B). In some implementations, multiple (e.g., two, three, four, eight, twelve, sixteen, twenty, etc.) coupler housings 5210 may be sandwiched between two circuit boards (e.g., see FIG. 52 above). In some implementations, the first circuit board 5220A can be electrically coupled to the second circuit board 5220B via a fixed connector (e.g., a card edge connector). In other implementations, the first circuit board 5220A can be electrically coupled to the second circuit board 5220B via a flexible or ribbon cable arrangement. In still other implementations, the circuit boards 5220A, 5220B are interconnected using other suitable circuit board connection techniques.

Figure 73:
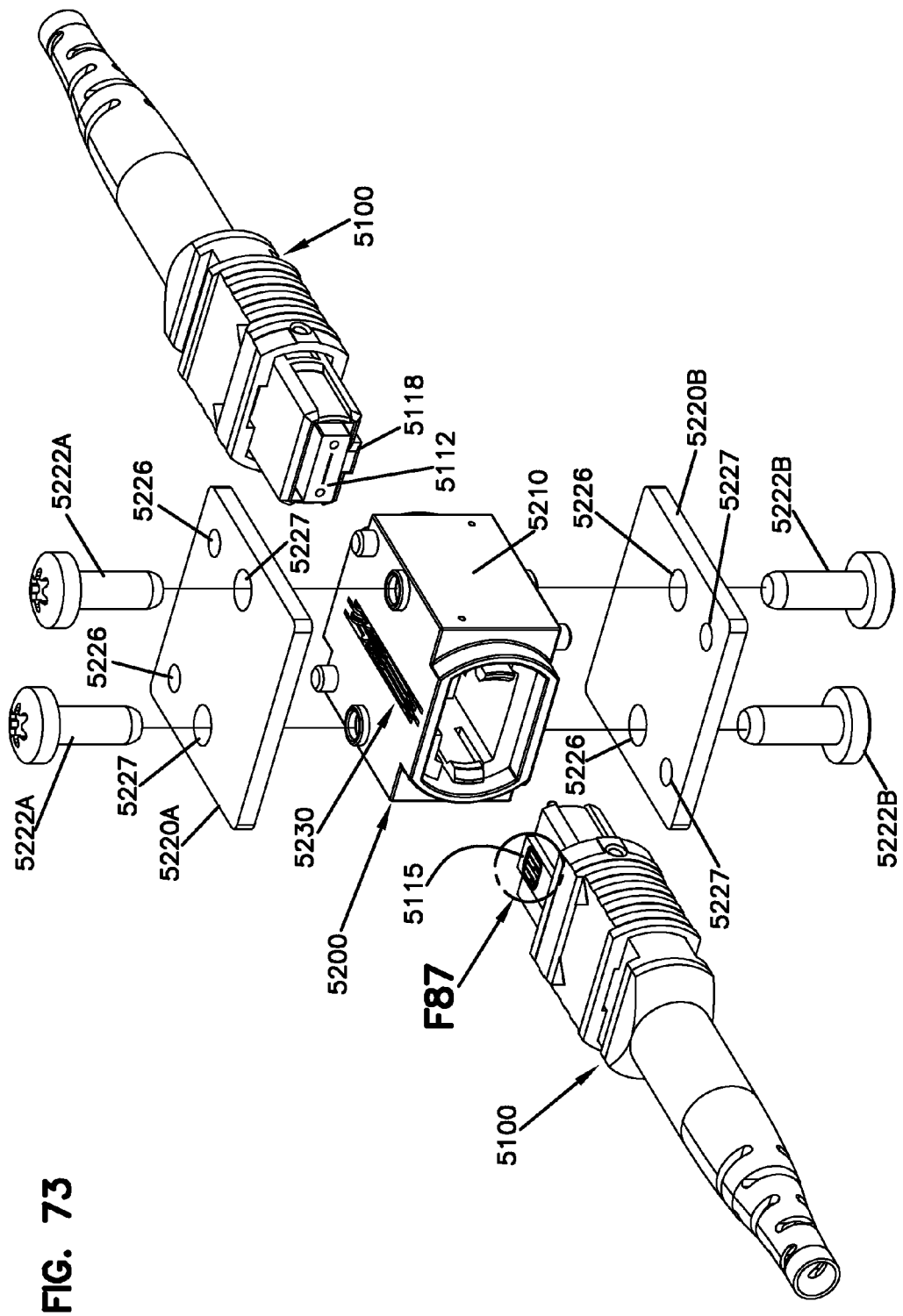
Figure 74:
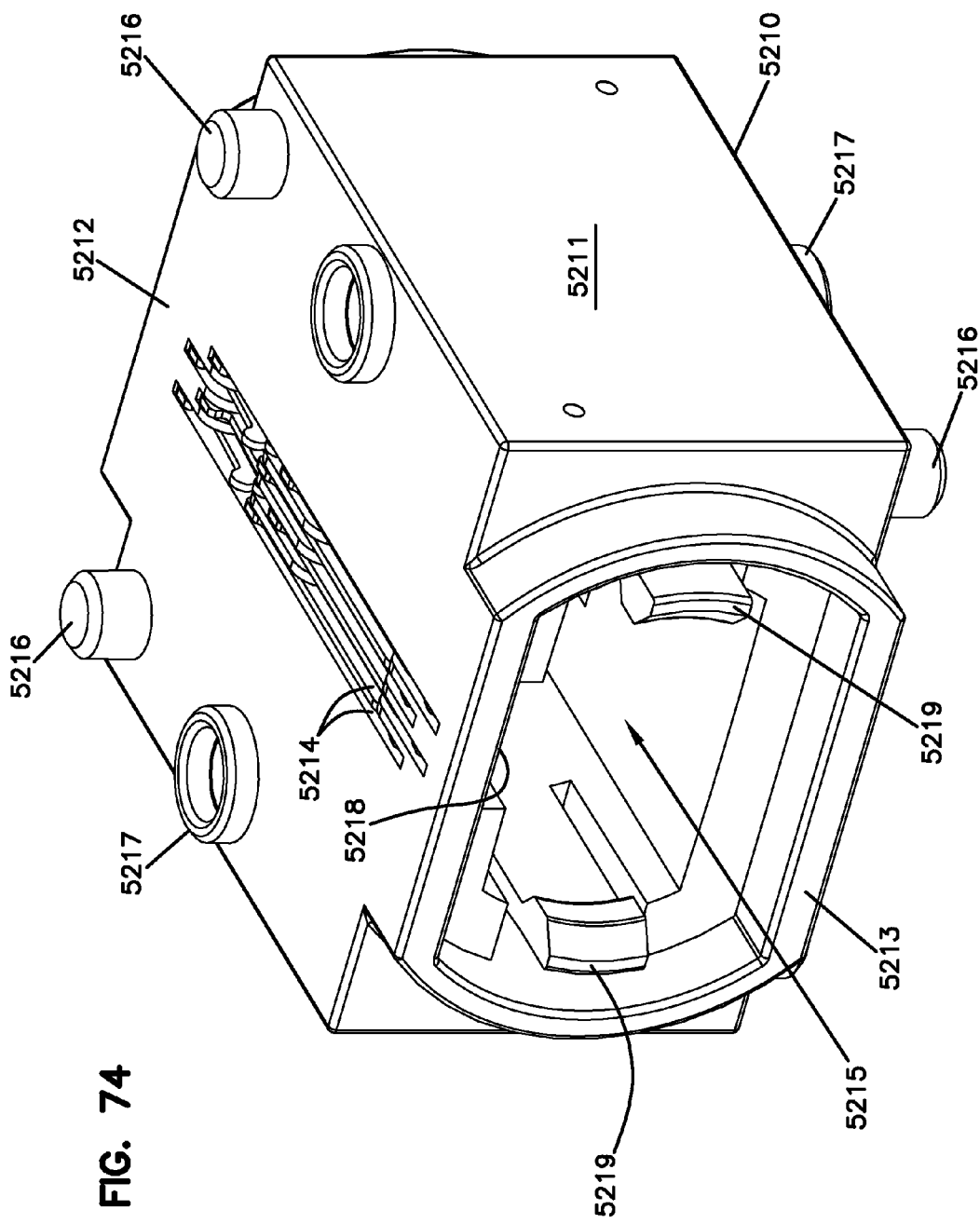
Figure 75:
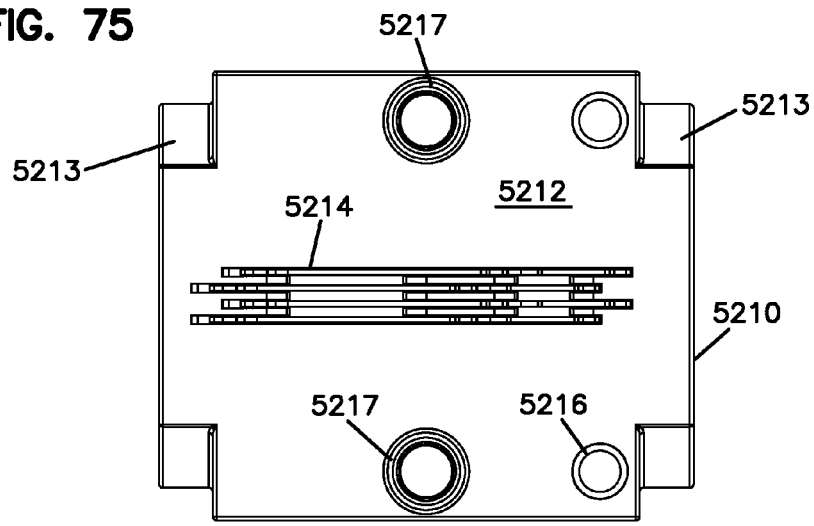
Figure 76:
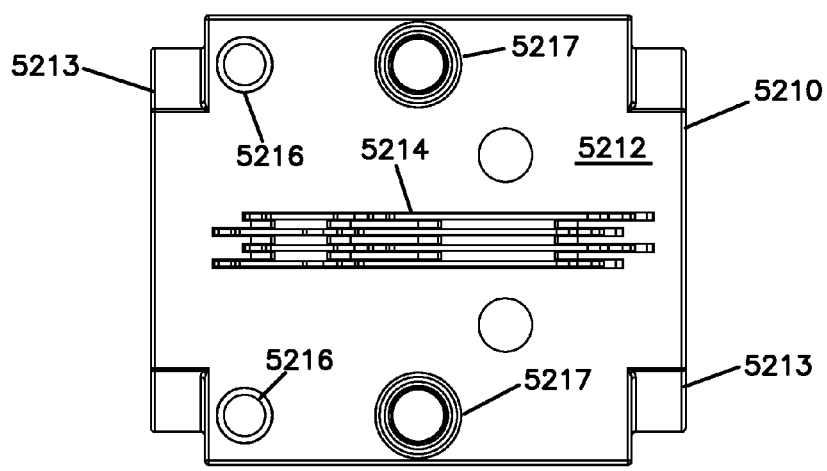
Figure 77:
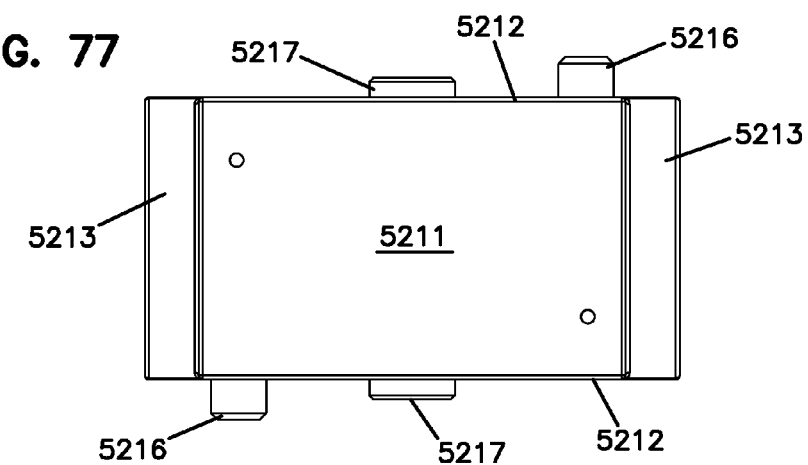
Figure 78:
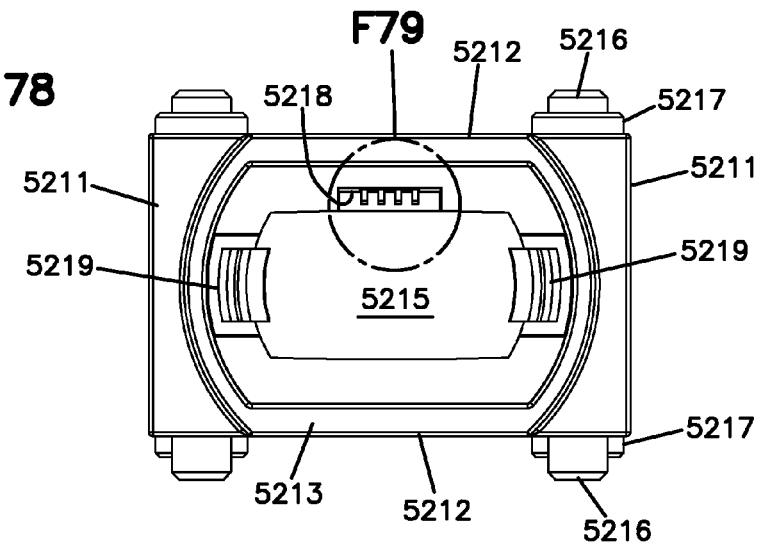
Figure 79:
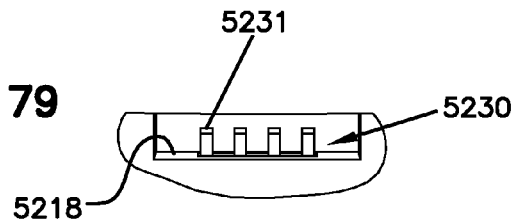
Figure 80:
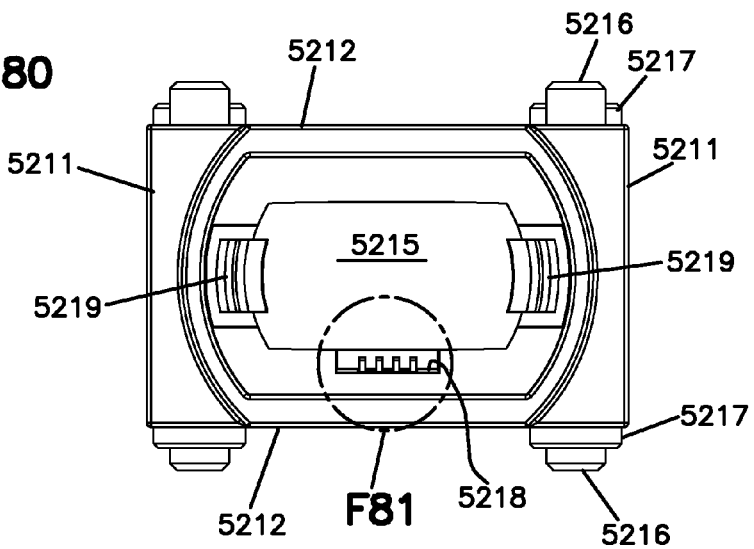
Figure 81:
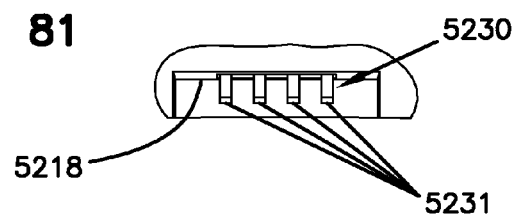

For ease in understanding, only portions of the example printed circuit boards 5220A, 5220B of the connector system 5000 are shown in FIG. 73. It is to be understood that the printed circuit boards 5220A, 5220B electrically connect to a data processor and/or to a network interface (e.g., processor 217 and network interface 216 of FIG. 2) as part of a connector assembly 5200. As noted above, non-limiting examples of such connector assemblies 5200 include bladed chassis and drawer chassis. Furthermore, additional coupler housings 5210 can be connected to different portions of the printed circuit boards 5220A, 5220B or at other locations within an example connector assembly.

One example coupler housing 5210 is shown in FIGS. 74-80. The example coupler housing 5210 defines a single passage 5215 extending between opposite open ends (e.g., a front and rear of the coupler housing 5210). In other example implementations, however, each coupler housing 5210 can include a greater number (e.g., two, three, four, six, eight, twelve, etc.) of passages 5215. Each open end of each passage 5215 is configured to receive a segment of communications media (e.g., a connectorized end of an optical fiber 5010). In some implementations, flexible latching tabs 5219 are located at the entrances of the passages 5215 to aid in retaining connector arrangements 5100 within the passages 5215. In the example shown, each latching tab 5219 defines a ramped surface and latching surface.

In the example shown, each coupler housing 5210 is implemented as a fiber optic adapter configured to receive Multi-fiber Push-On (MPO) connectors. Each passage 5215 of the MPO adapters 5210 is configured to align and connect two MPO connector arrangements 5100 (see FIGS. 97-99). In other implementations, each passage 5215 can be configured to connect other types of physical media segments. For example, one or more passages 5215 of the MPO adapters 5200 can be configured to communicatively couple together an MPO connector arrangement 5100 with a media converter (not shown) to convert the optical data signals into electrical data signals, wireless data signals, or other type of data signals.

In the example shown in FIGS. 74-80, each adapter 5210 is formed from opposing sides 5211 interconnected by first and second ends 5212. The sides 5211 and ends 5212 each extend between an open front and an open rear to define the passage 5215. In some implementations, the sides 5211 and ends 5212 define a generally rectangular box. In certain implementations, a port entrance 5213 extends from the front and rear of the adapter 5210. In certain implementation, the port entrance 5213 is oblong-shaped. In the example shown, the entrance 5213 is obround-shaped having planar top and bottom surfaces and rounded side surfaces.

Figure 101:
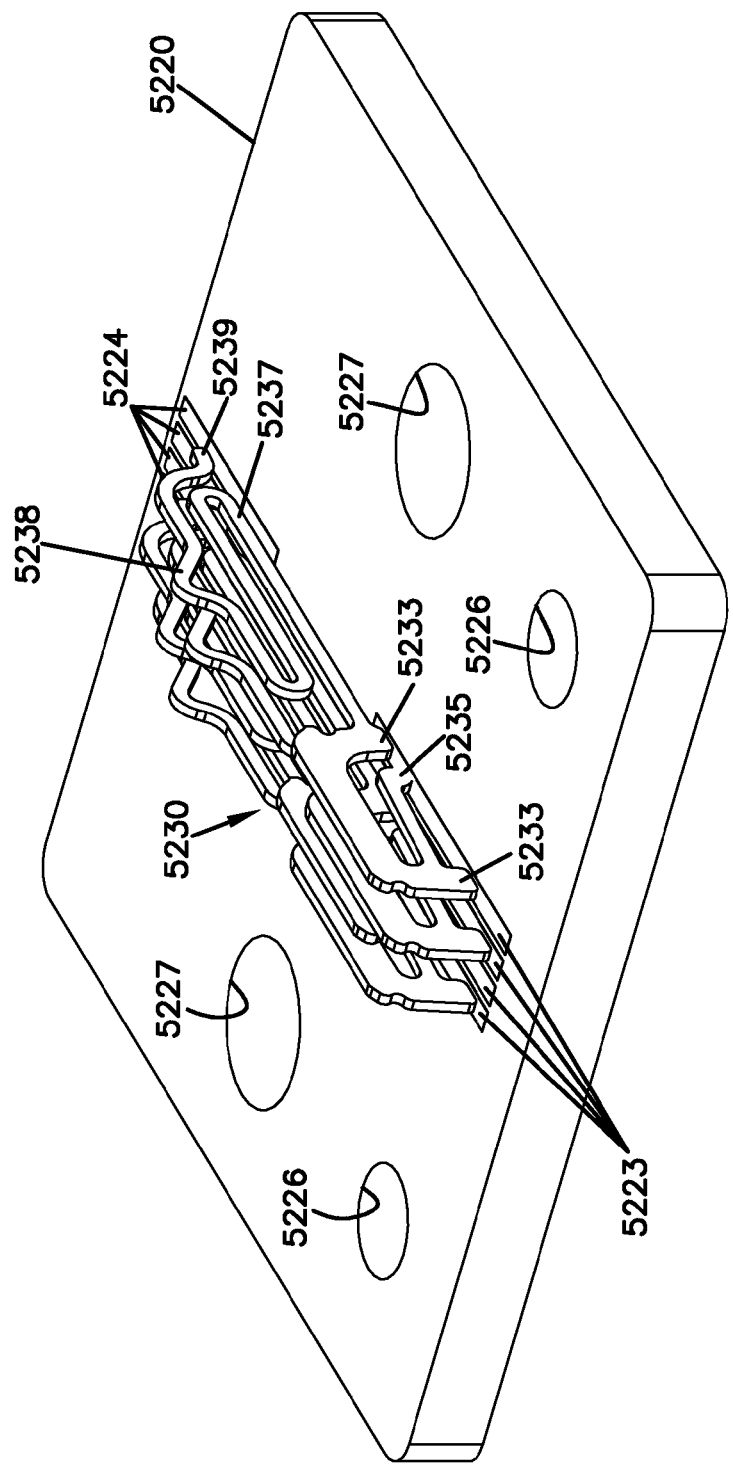
Figure 102:
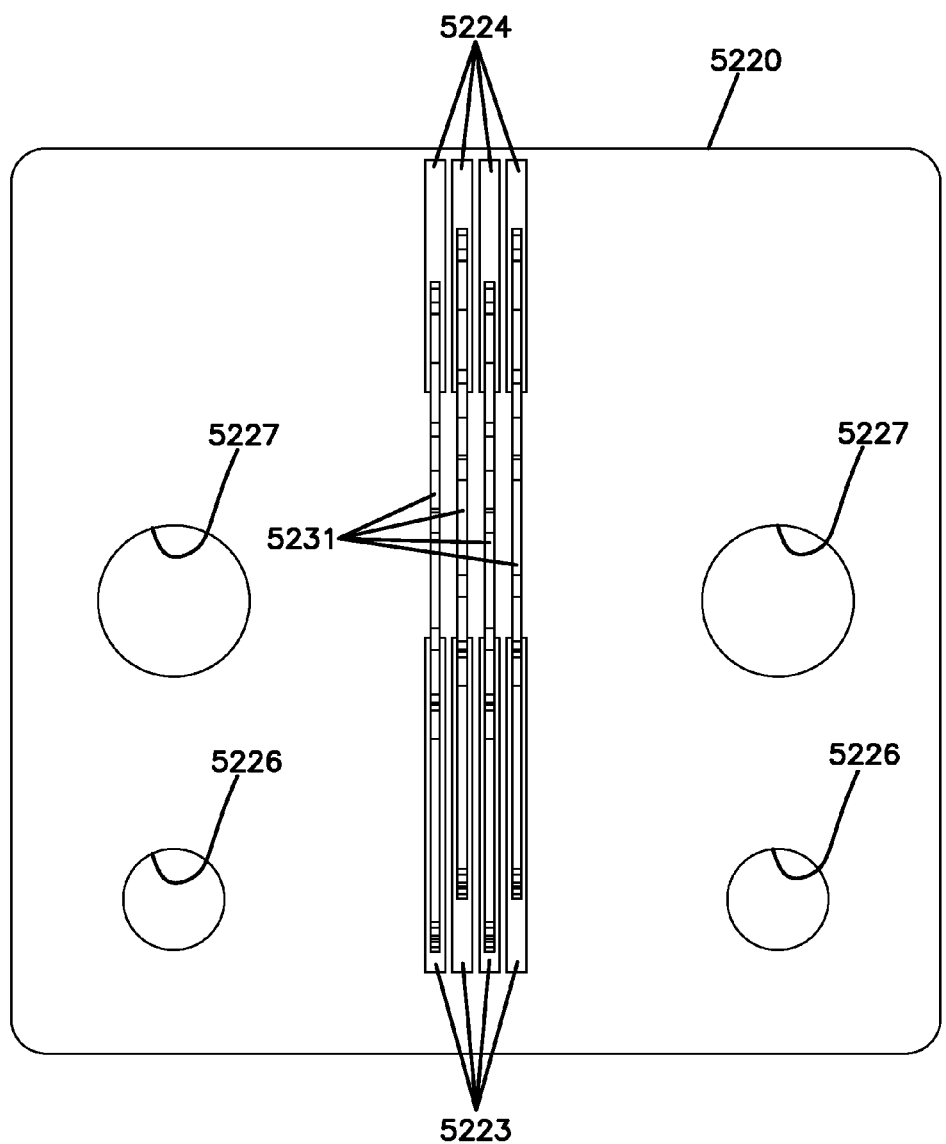

The adapter 5210 also includes mounting stations 5217 at which fasteners 5222 (FIG. 73) can be received to secure the adapter 5210 to one or more printed circuit boards 5220. In certain implementations, the fasteners 5222 pass through mounting openings 5227 defined by the printed circuit board 5220 (FIGS. 101-102). Non-limiting examples of suitable fasteners 5222 include screws, snaps, and rivets. For example, the mounting stations 5217 can aid in securing the adapter 5210 to the upper circuit board 5220A and the lower circuit board 5220B (see FIG. 73). In other implementations, the mounting stations 5217 can include latches, panel guides, or other panel mounting arrangements.

In some implementations, the adapter 5210 also includes alignment lugs 5216 that facilitate mounting the adapter 5210 to the circuit boards 5220 in the correct orientation. For example, the alignment lugs 5216 may align with openings 5226 (FIGS. 101-102) defined in the circuit boards 5220 (e.g., see FIG. 73). Accordingly, the alignment lugs 5216 inhibit mounting of the adapter 5210 backwards on one or both of the circuit boards 5220. In the example shown, two alignment lugs 5216 extend from a first end 5212 of the adapter 5210 at the front of the adapter 5210 and two alignment lugs 5216 extend from a second end 5212 of the adapter 5210 at the rear of the adapter 5210. In other implementations, however, greater or fewer alignment lugs 5216 may extend from the ends 5212 in the same or a different configuration to form a keying arrangement with the printed circuit board 5220.

The MPO adapter 5210 also defines channels 5218 extending partly along the length of the passages 5215 (e.g., see FIGS. 77, 79, and 98) to accommodate portions of the fiber connector arrangements 5100. In some implementations, the adapter 5210 may define a channel 5218 extending inwardly from each open end of the passage 5215. In one example implementation, a first channel 5218 extends along a top of the housing 5210 from a first end of each passage 5215 and a second channel 5218 extends along a bottom of the housing 5210 from a second end of each passage 5215.

Each adapter housing 5210 includes at least one media reading interface 5230 (e.g., see FIGS. 77, 79, and 98) configured to acquire the physical layer information from a storage device 5130 of a fiber connector arrangement 5100 (see FIGS. 83-91). In the example shown, each MPO adapter 5210 includes at least one media reading interface 5230 that is configured to communicate with the storage device 5130 on an MPO connector 5110 plugged into the MPO adapter 5210. For example, in one implementation, the adapter 5210 can include a media reading interface 5230 associated with each passage 5215. In another implementation, the adapter 5210 can include a media reading interface 5230 associated with each connection end of a passage 5215. As shown in FIGS. 130 and 132, each media reading interface 5230 includes one or more contact members 531 at least extending into the channels 5218 of the adapter 5210.

Figure 83:
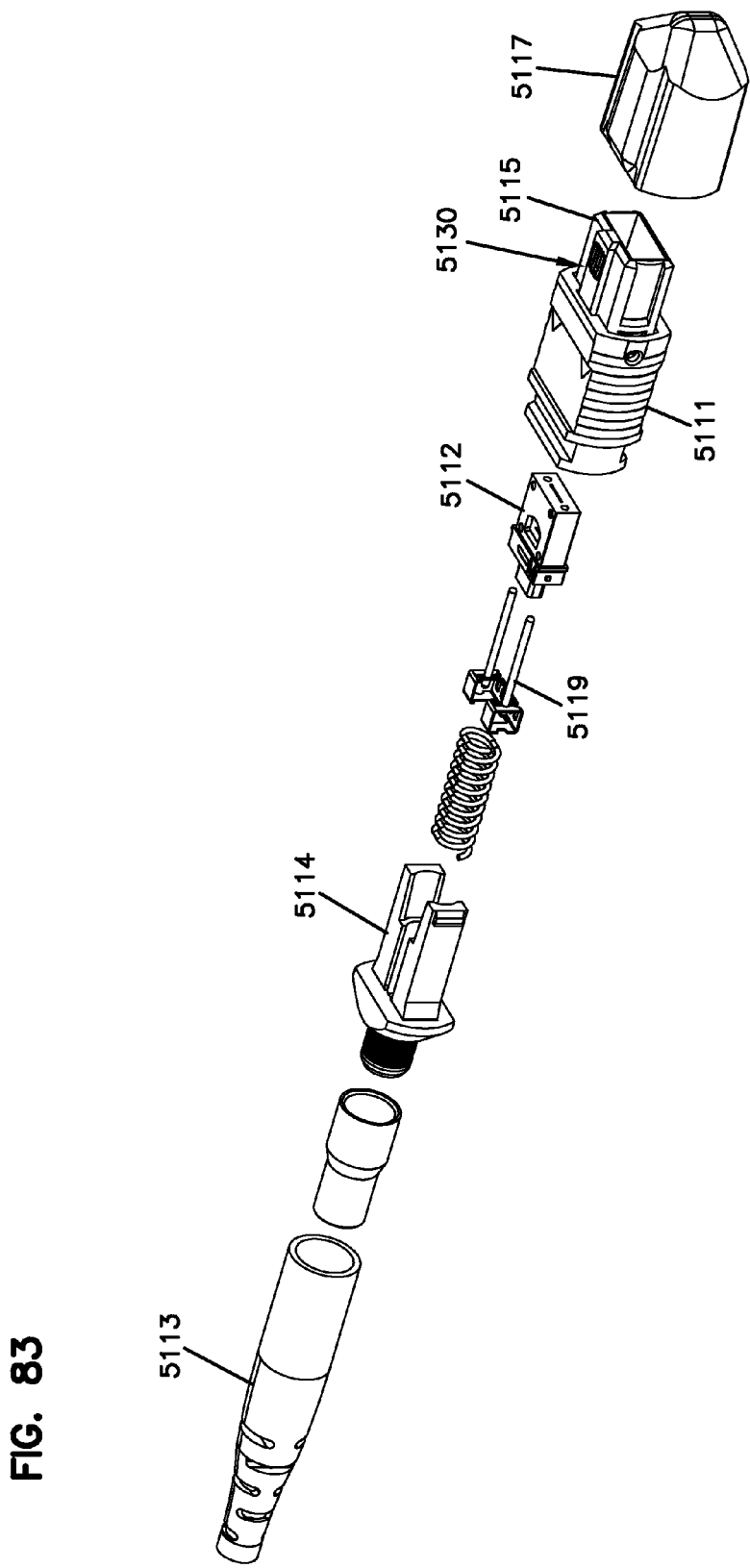

FIGS. 81-91 show one example implementation of a connector arrangement 5100 implemented as an MPO connector 5110 that is configured to terminate a multi-fiber optical cable 5010. As shown in FIG. 83, each MPO connector 5110 includes a front connector body 5111 and a rear connector body 5114 enclosing a ferrule 5112 (FIG. 83) that retains multiple optical fibers (e.g., 2, 3, 4, 8, 12, or 16 fibers). The front connector body 5111 includes a key 5115 that is configured to fit in a keying slot or channel (e.g., channel 5218) defined in the adapter 5210 to properly orient the connector 5100. The key 5115 includes a raised (i.e., or stepped up) portion of the front connector body 5111 located adjacent the ferrule 5112.

In certain implementations, the connector 5110 includes a pin arrangement 5119 that extends from a front of the ferrule 5112. In other implementations, the connector 5110 defines openings in the ferrule 5112 for receiving the pin arrangement 5119 of another connector 5100 to align the ferrules 5112 of the two connectors 5110 (e.g., see FIGS. 97-99). The rear connector body 5114 is secured to a boot 5113 to provide bend protection to the optical fibers. An example MPO dust cap 5118 is configured to mount to the front connector body 5111 to cover and protect the ferrule 5112.

Each connector arrangement 5100 is configured to store physical layer information (e.g., media information). For example, the physical layer information can be stored in a memory device 5130 mounted on or in the connector 5110. One example storage device 5130 includes a printed circuit board 5131 on which memory circuitry can be arranged (e.g., see FIGS. 87-91). Electrical contacts 5132 also may be arranged on the printed circuit board 5131 for interaction with a media reading interface of the communications coupler assembly 5200 (described in more detail herein). In one example implementation, the storage device 5130 includes an EEPROM circuit 5133 arranged on the printed circuit board 5131. In the example shown in FIG. 83, an EEPROM circuit 5133 is arranged on the non-visible side of the circuit board 5131. In other implementations, however, the storage device 5130 can include any suitable type of non-volatile memory.

Figure 84:
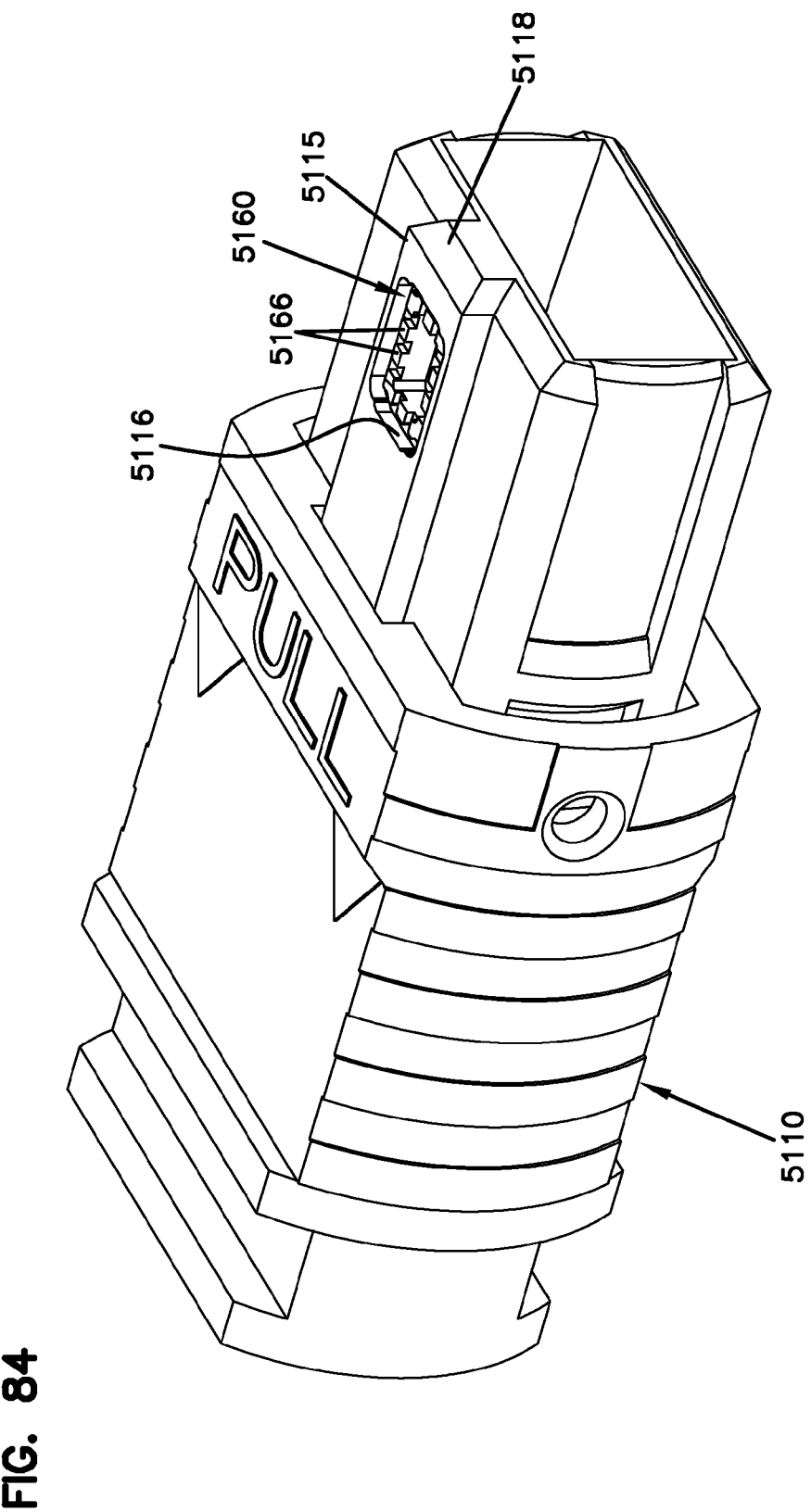
Figure 85:
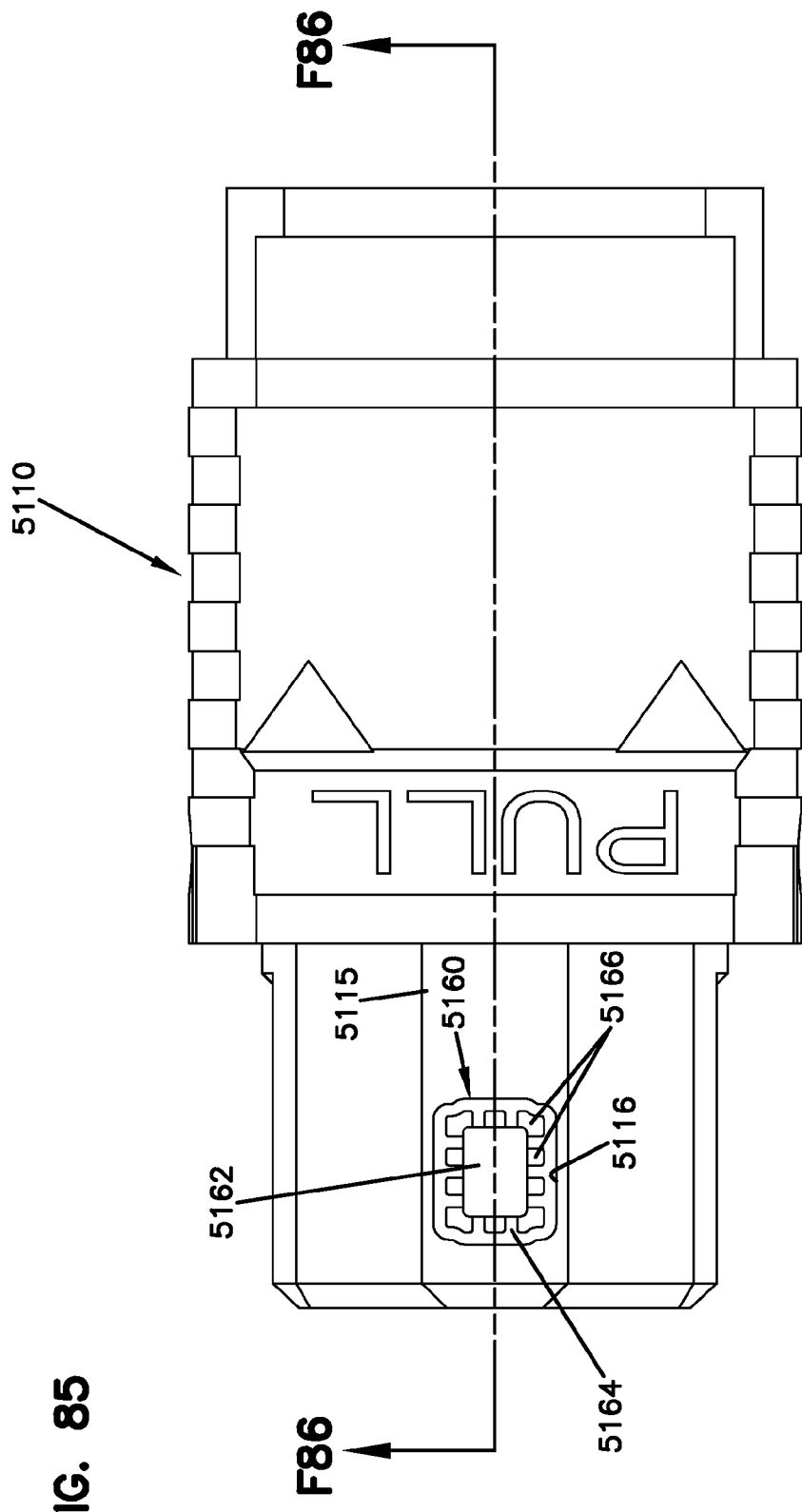
Figure 86:
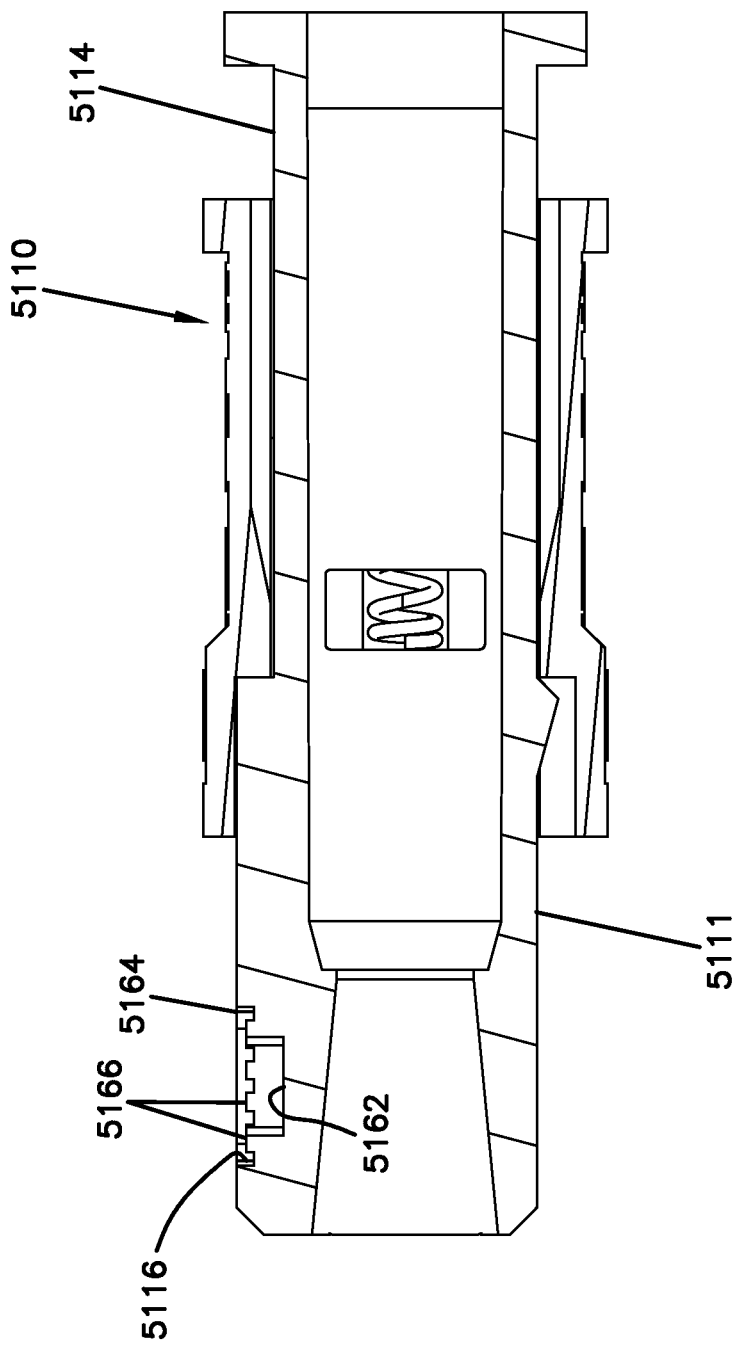

As shown in FIGS. 84-86, the front body 5111 of one example fiber optic connector 5110 may define a recessed section or cavity 5116 in which the storage device 5130 may be positioned. In some implementations, the cavity 5116 is provided in the key 5115 of the connector 5110. In other implementations, the cavity 5116 may be provided elsewhere in the connector 5110. In some implementations, the cavity 5116 has a stepped configuration 5160 to facilitate positioning of the storage device 5130.

In the example shown, the cavity 5116 includes a well 5162 surrounded by a ledge 5164 (see FIG. 86). The ledge 5164 is configured to support the storage device 5130. For example, the ledge 5164 may support the printed circuit board 5131 of an example storage device 5130. The well 5162 is sufficiently deep to accommodate an EEPROM circuit 5133 coupled to one side of the printed circuit board 5131. The ledge 5164 is recessed sufficiently within the connector body 5111 to enable electrical contacts 5132 provided on the opposite side of the printed circuit board 5131 to be generally flush with the key 5115 of the connector body 5111.

In certain implementations, the ledge 5164 has a ridged or otherwise contoured surface to facilitate mounting the storage device within the cavity 5116. For example, in some implementations, contoured sections 5166 of the ledge 5164 may increase the surface area over which an adhesive may be applied to secure the storage device 5130 within the cavity 5116. In the example shown, the contoured sections 5166 include rectangular-shaped protrusions and/or depressions. In other implementations, however, the ledge 5164 may have bumps, ridges, or some other texture to increase the surface area over which adhesive is applied.

FIGS. 73 and 87-91 show three different implementations of example storage devices 5130 installed on example connectors 5110. FIGS. 73 and 87 show a first example connector 5110 that includes a key 5115 having a width W9 (FIG. 137). The key 5115 has a front surface 5118 against which contacts 5231 of the communications coupler assembly 5200 deflect during insertion of the connector 5110 as will be described in more detail herein. The key 5115 also defines a recessed section or cavity 5116A in which a storage device 5130A can be positioned. In the example shown in FIG. 87, the cavity 5116A is defined in a top of the key 5115 and not on or in the deflecting surface 5118. In some implementations, a cover can be positioned over the storage device 5130A to enclose the storage device 5130A within the recessed section 5116A of the key 5115. In other implementations, the storage device 5130A is left uncovered and exposed.

The storage device 5130A shown in FIG. 87 includes generally planar contacts 5132A positioned on a generally planar circuit board 5131A. Memory 5133 (FIGS. 97-99) of the storage device 5130A, which is located on the non-visible side of the board in FIG. 87, is accessed by engaging the tops of the contacts 5132A with an electrically conductive contact member (e.g., contact member 5231 of FIGS. 78 and 80). In certain implementations, the contact member 5231 initially contacts the deflecting surface 5118 and subsequently slides or wipes across the contacts 5132A (see FIGS. 97-99).

In some implementations, the contacts 5132A have different lengths. In certain implementations, the contacts 5132A have different shapes. For example, in some implementation, the contacts 5132A include one or more contact members 5132A' that have generally rounded ends opposite the deflecting end 5118 of the connector housing 5110. In certain implementations, the contacts 5132A also include one or more contact members 5132A" that are generally L-shaped. In the example shown, the L-shaped contacts 5132A" are longer than the rounded end contacts 5132A'. In other implementations, however, the contacts 5132A may have the same length or may each have different lengths.

Figure 88:
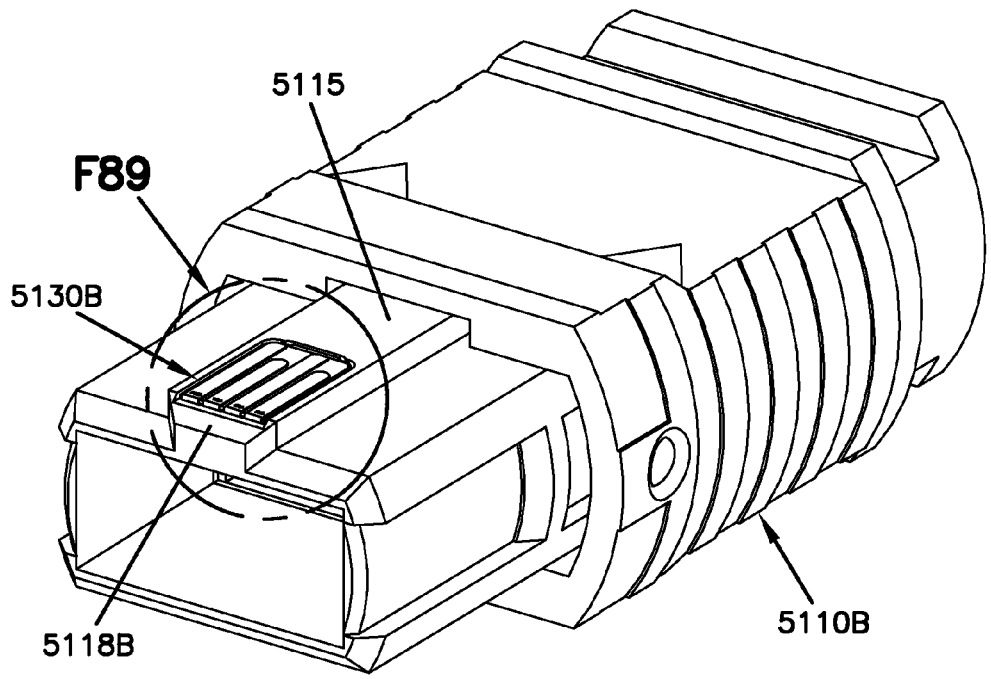
Figure 89:
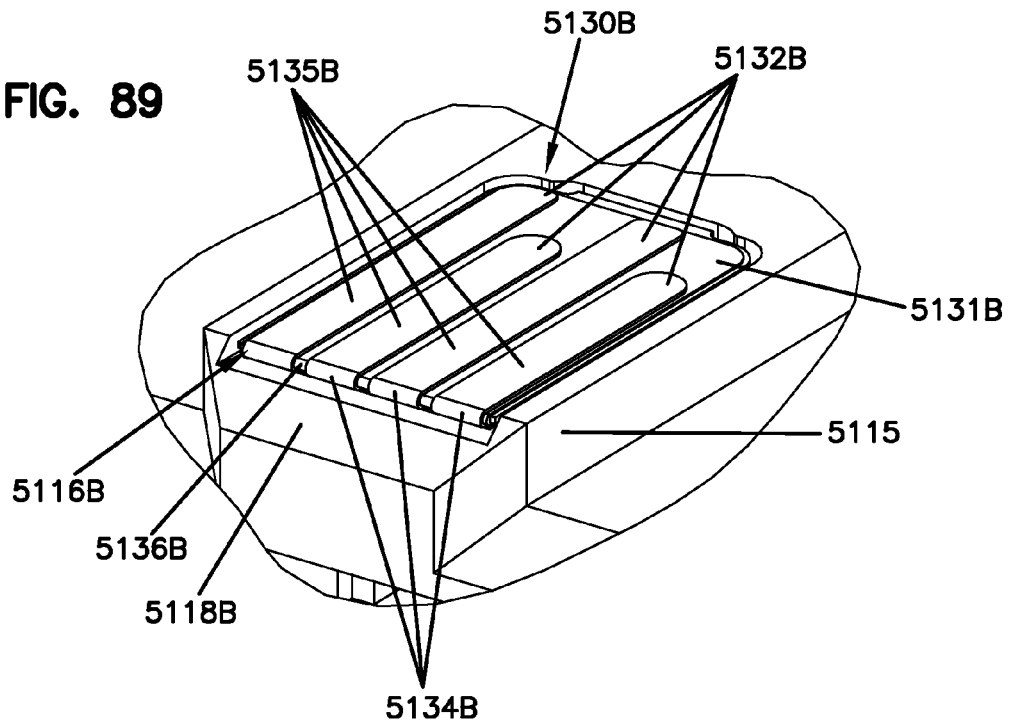

FIGS. 88 and 89 show a second example front connector body 5110B that includes a key 5115 having a deflection surface 5118B. The key 5115 defines a recessed section or cavity 5116B in which a storage device 5130B can be positioned. In the example shown, the cavity 5116B cuts into the deflecting surface 5118B of the key 5115. In some implementations, a cover can be positioned over the storage device 5130B to enclose the storage device 5130B within the key 5115. In other implementations, the storage device 5130B is left uncovered and exposed. In the example shown, the first sections 5135B of the contacts 5132B have two different lengths. In other implementations, however, the first sections 5135B of the contacts 5132B may all be the same length or may each be a different length. In certain implementations, the contacts 5132B may be the same shape of different shapes.

The storage device 5130B shown in FIG. 89 includes contacts 5132B having first sections 5135B that extend over a generally planar circuit board 5131B and folded sections 5134B that curve, fold, or bend over a front end 5136B of the board 5131B. In some implementations, the memory 5133 of the storage device 5130B, which is located on the non-visible side of the board in FIG. 89, is accessed by sliding or wiping the contact member 5231 (FIGS. 79 and 81) of the coupler housing 5210 across the folded sections 5134B of the contacts 5132B. In other implementations, the memory 5133 of the storage device 5130B is accessed by sliding or wiping the contact member 5231 of the coupler housing 5210 across the first sections 5135B of the contacts 5132B.

Figure 90:
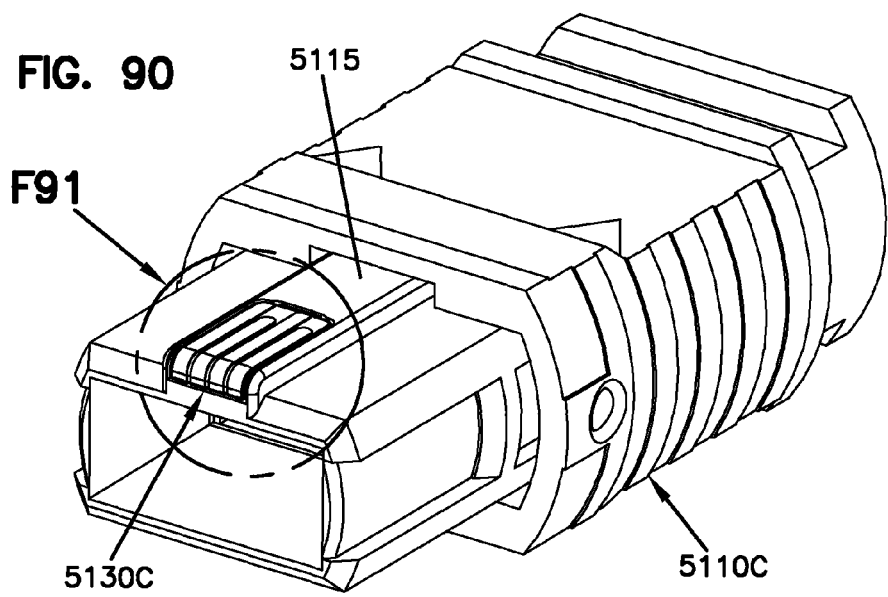
Figure 91:
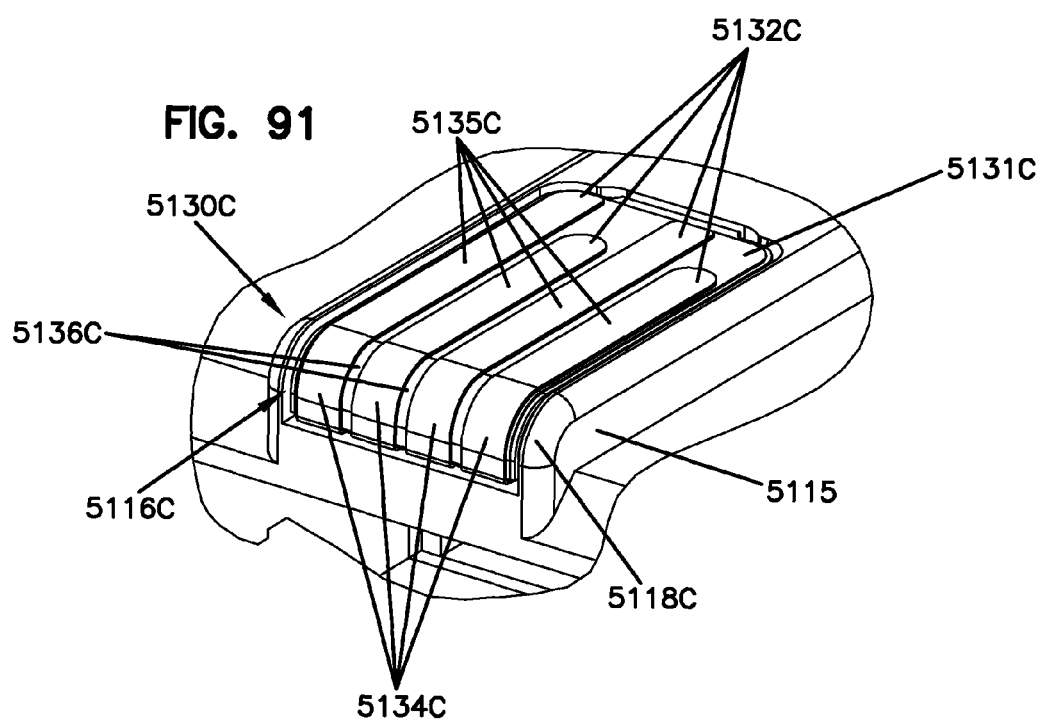

FIGS. 90 and 91 show a third example front connector body 5110C that includes a key 5115 having a deflection wall 5118. The key 5115 defines a recessed section or cavity 5116C in which a storage device 5130C can be positioned. In the example shown, the cavity 5116C cuts into the deflection wall 5118C of the key 5115. In some implementations, a cover can be positioned over the storage device 5130C to enclose the storage device 5130C within the key 5115. In other implementations, the storage device 5130C is left uncovered and exposed. In the example shown, the first sections 5135C of the contacts 5132C have two different lengths. In other implementations, however, the first sections 5135C of the contacts 5132C may all be the same length or may each be a different length. In certain implementations, the contacts 5132C may be different shapes or the same shape.

The storage device 5130C shown in FIG. 91 includes contacts 5132C having first sections 5135C that extend over a generally planar circuit board 5131C and contoured sections 5134C that curve, fold, or bend over a contoured section 5136C at the front of the board 5131C. In some implementations, the memory 5133 of the storage device 5130C, which is located on the non-visible side of the board in FIG. 91, is accessed by sliding or wiping the contact member 5231 (FIGS. 78 and 80) of the coupler housing 5210 across the contoured section 5134C of the contacts 5132C. In other implementations, the memory 5133 of the storage device 5130C is accessed by sliding or wiping the contact member 5231 of the coupler housing 5210 across the first sections 5135C of the contacts 5132C.

In general, memory circuitry is arranged on a circuit board 5131 of the storage device 5130 and connected to the contacts 5132 via conductive tracings. In one example embodiment, the storage device 5130 includes an EEPROM circuit arranged on the printed circuit board 5131. In other embodiments, however, the storage device 5130 can include any suitable type of memory. In some implementations, the cavity 5116 is two-tiered, thereby providing a shoulder on which the storage device 5130 can rest and space to accommodate circuitry (e.g., memory 5133) located on a bottom of the storage device 5130. In other implementations, the storage device 5130 can be otherwise mounted to the connector housing 5110.

Figure 92:
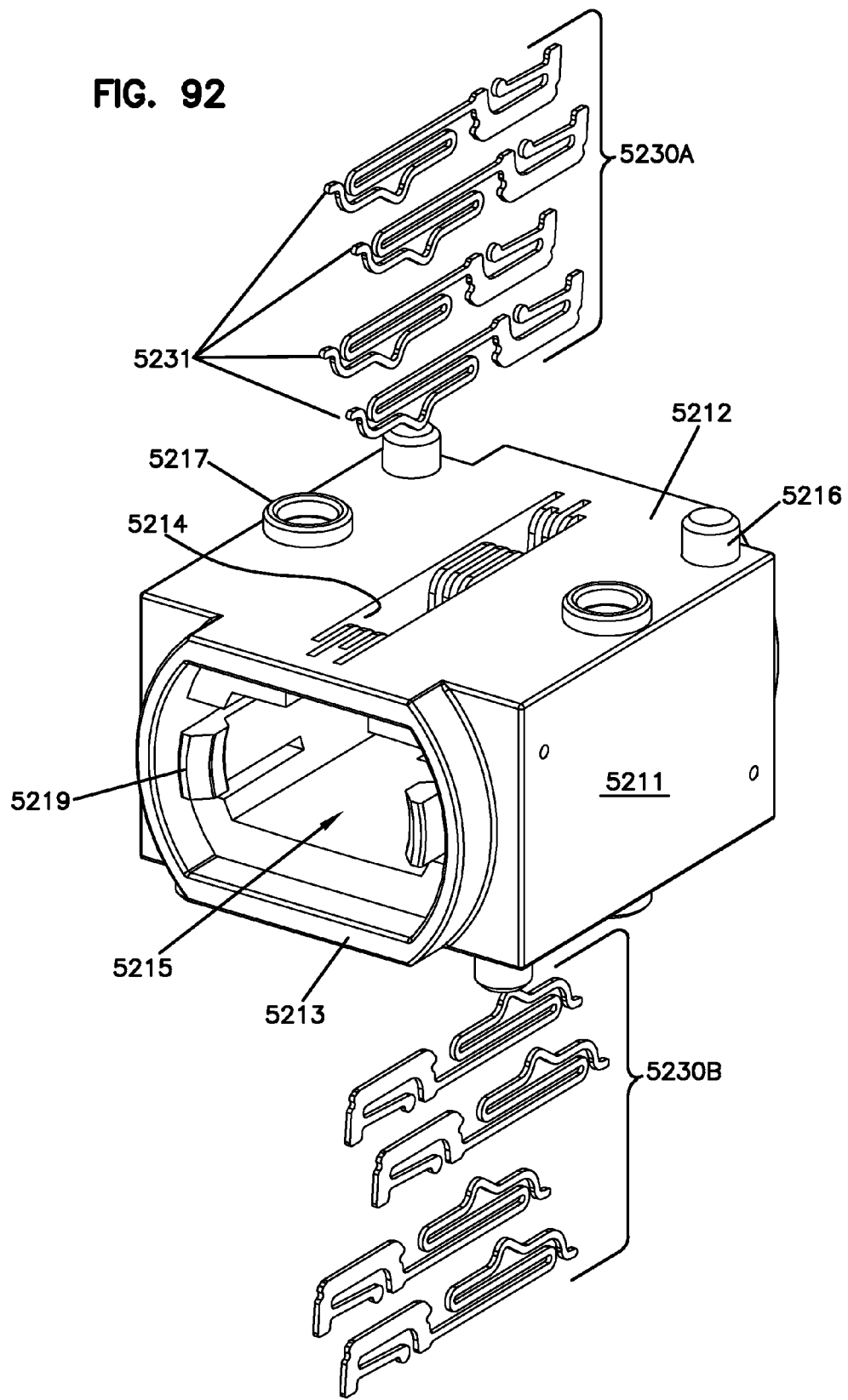

FIGS. 92-94 show an example media reading interface 5230 of the MPO adapter 5200. In general, each media reading interface 5230 is formed from one or more contact members 5231. One or both ends 5212 of the adapter housing 5210 defines one or more slots 5214 that lead to the channels 5218 (see FIG. 97). The contact members 5231 are positioned within the slots 5214 as will be described in more detail herein. In certain implementations, at least a portion of each contact member 5231 extends into the respective channel 5218 (e.g., see FIG. 97) to engage the electrical contacts 5132 of the storage member 5130 of any MPO connector 5100 positioned in the passage 5215. Other portions of the contact members 5231 are configured to protrude outwardly through the slots 5214 to engage contacts and tracings on a printed circuit board 5220 (e.g., see FIG. 97).

In some implementations, the MPO adapter housing 5210 includes a first media reading interface 5230A and a second media reading interface 5230B. For example, in some implementations, the first media reading interface 5230A is associated with a first connection end of the passage 5215 and the second media reading interface 5230B is associated with a second connection end of the passage 5215. In the example shown, the second media reading interface 5230B is flipped (i.e., located on an opposite side of the housing 5210) relative to the first media reading interface 5230A. In some such implementations, the channel 5218 extending inwardly from the first connection end of the passage 5215 also is flipped with respect to the channel 5218 extending inwardly from the second end of the passage 5215 (compare FIGS. 77 and 78). In other implementations, each adapter housing 5210 may include greater or fewer media reading interfaces 5230.

In the example shown in FIGS. 74, 75, 97, and 98, flipping the orientation of the connectors 5110 between the front and rear ports enables each of the major surfaces 5212 of the adapter 5210 to be configured to receive only one media reading interface 5130 for each passage 5215. For example, in some implementations, the media reading interfaces 5130 for the front ports of the passages 5215 are accommodated by a first of the major surfaces 5212 and the media reading interfaces 5130 for the rear ports of the passages 5215 are accommodated by a second of the major surfaces 5212. Such a configuration enables each slot 5214 to extend more than half-way between the front and rear of the adapter 5210.

In other implementations, each major surface 5212 of the adapter 5210 may accommodate the media reading interfaces 5130 for some of the front ports and some of the rear ports. For example, in one implementation, each major surface 5212 accommodates the media reading interfaces for alternating ones of the front and rear ports. In particular, a first slot in the first major surface 5212 may accommodate a media reading interface 5130 for a front port of a first passage 5215 and a first slot 5214 in the second major surface 5212 may accommodate a media reading interface 5130 for a rear port of the first passage 5215. A second slot 5214 in the first major surface 5212 may accommodate a media reading interface 5130 for a rear port of a second passage 5215 and a second slot 5214 in the second major surface 5212 may accommodate a media reading interface 5130 for a front port of the second passage 5215. Such configurations also enable each slot 5214 to extend more than half-way between the front and rear of the adapter 5210.

Lengthening the slots 5214 enables longer contact members 5231 to be received within each slot 5214. For example, each contact member 5231 may extend at least half-way across the adapter 5210 between the front and rear of the adapter 5210. In certain implementations, each contact member 5231 may extend across a majority of the distance between the front and rear of the adapter 5210. Lengthening the contact members 5231 increases the beam length of each contact member 5231. The beam length affects the ability of the contact member 5231 to deflect toward and away from the circuit boards 5220.

In some implementations, the contact members 5231 of a single media reading interface 5230 are positioned in a staggered configuration to facilitate access to the contacts 5132 on the connector storage device 5130 of a connector arrangement 5100. For example, alternating contact members 5231 can be staggered between at least front and rear locations within the channels 5218. FIG. 92 is a perspective view of an example coupler housing 5210 with first and second media reading interfaces 5230A, 5230B exploded out from the slots 5214 defined in the coupler housing 5210. FIG. 93 shows the contact members 5231 of an example media reading interface 5230 positioned within an example slot 5214 in a staggered configuration. In other implementations, the contact members 5231 may be laterally aligned.

In some implementations, each media reading interface 5230 includes about four contact members 5231 (see FIG. 92). In the example shown in FIGS. 97-100, at least portions of two contact members 5231 are visibly positioned within a slot 5214 defined in a fiber optic adapter 5210, shown in cross-section. Two additional contact members 5231 also are positioned in the slot 5214, but cannot be seen since the additional contact members 5231 laterally align with the visible contact members 5231. In other implementations, however, greater or fewer contact members 5231 may be positioned within the housing 5210.

One example type of contact member 5231 suitable for use in forming a media reading interface 5230 is shown in FIGS. 94-95. Each contact member 4231 defines at least three moveable (e.g., flexible) contact locations 5235, 5238, and 5239. The flexibility of the contact surfaces 5235, 5238, and 5239 provides tolerance for differences in spacing between the contact member 5231 and the respective printed circuit board 5220 when the coupler assembly 5200 is manufactured. Certain types of contact members 5231 also include at least one stationary contact 5233.

The example contact member 5231 shown includes a base 5232 that is configured to be positioned within a slot 5214 defined by an adapter 5210. The base 5232 of certain types of contact members 5231 is configured to secure (e.g., snap-fit, latch, pressure-fit, etc.) to the adapter 5210. A first arm 5234 of the contact member 5231 defines the first moveable contact location 5235 (e.g., at a distal end of the first arm 5234). A second arm 5236 of the contact member 5231 defines a resilient section 5237, the second moveable contact location 5238, and the third moveable contact location 5239. The base 5232 of the contact member body 5240 defines a support surface 5241 extending between first and second legs 5242, 5243, respectively. The first arm 5234 extends from the first leg 5242 and the second arm 5236 extends from the second leg 5243. In the example shown, the first and second arms 5234, 5236 extend in generally the same direction from the first and second legs 5242, 5243.

Mounting sections 5244 are provided on the base 5232 between the support surface 5241 and the legs 5242, 5243. In the example shown, the mounting sections 5244 each include a recessed notch and a protruding bump to facilitate securing the base 5232 in a slot 5214 of the adapter 5210. In other implementations, however, other types of mounting configurations may be utilized. The second leg 5243 and the second arm 5236 define a second support surface 5245. In the example shown, the second support surface 5245 is rounded. In other implementations, the second support surface 5245 may define a right angle or an oblique angle.

Figure 97:
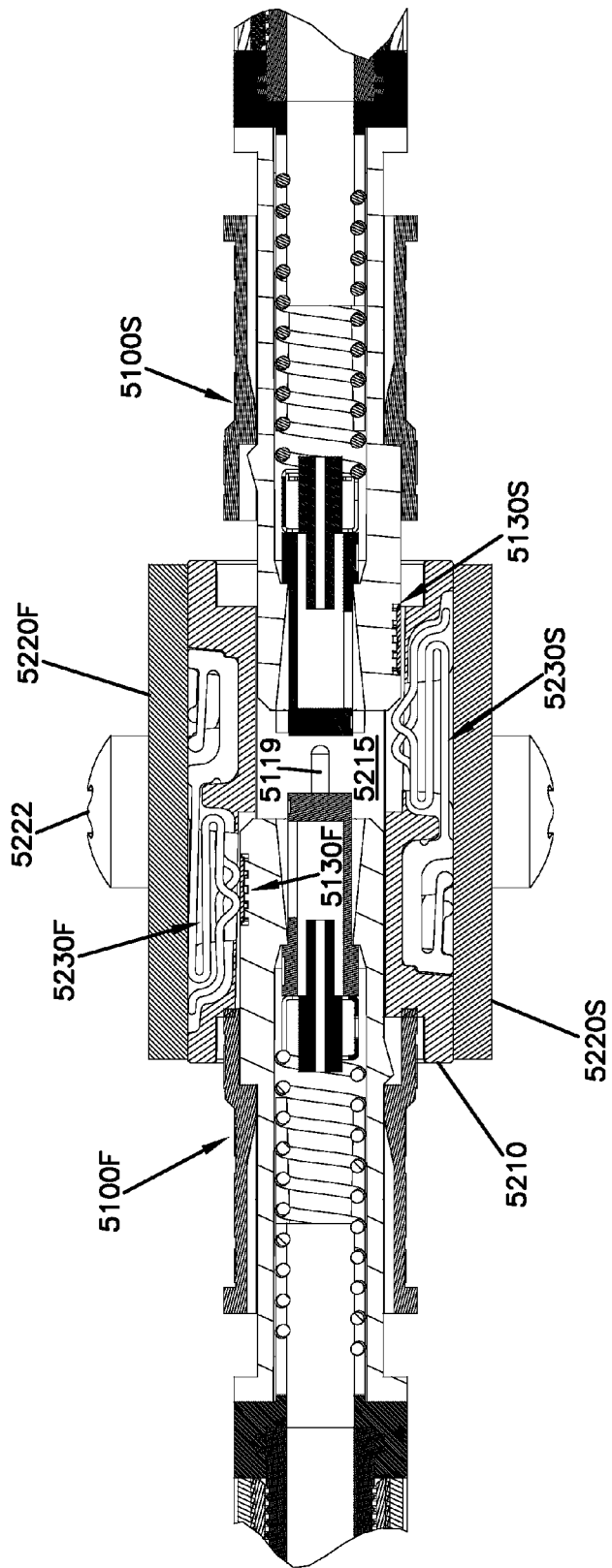
Figure 98:
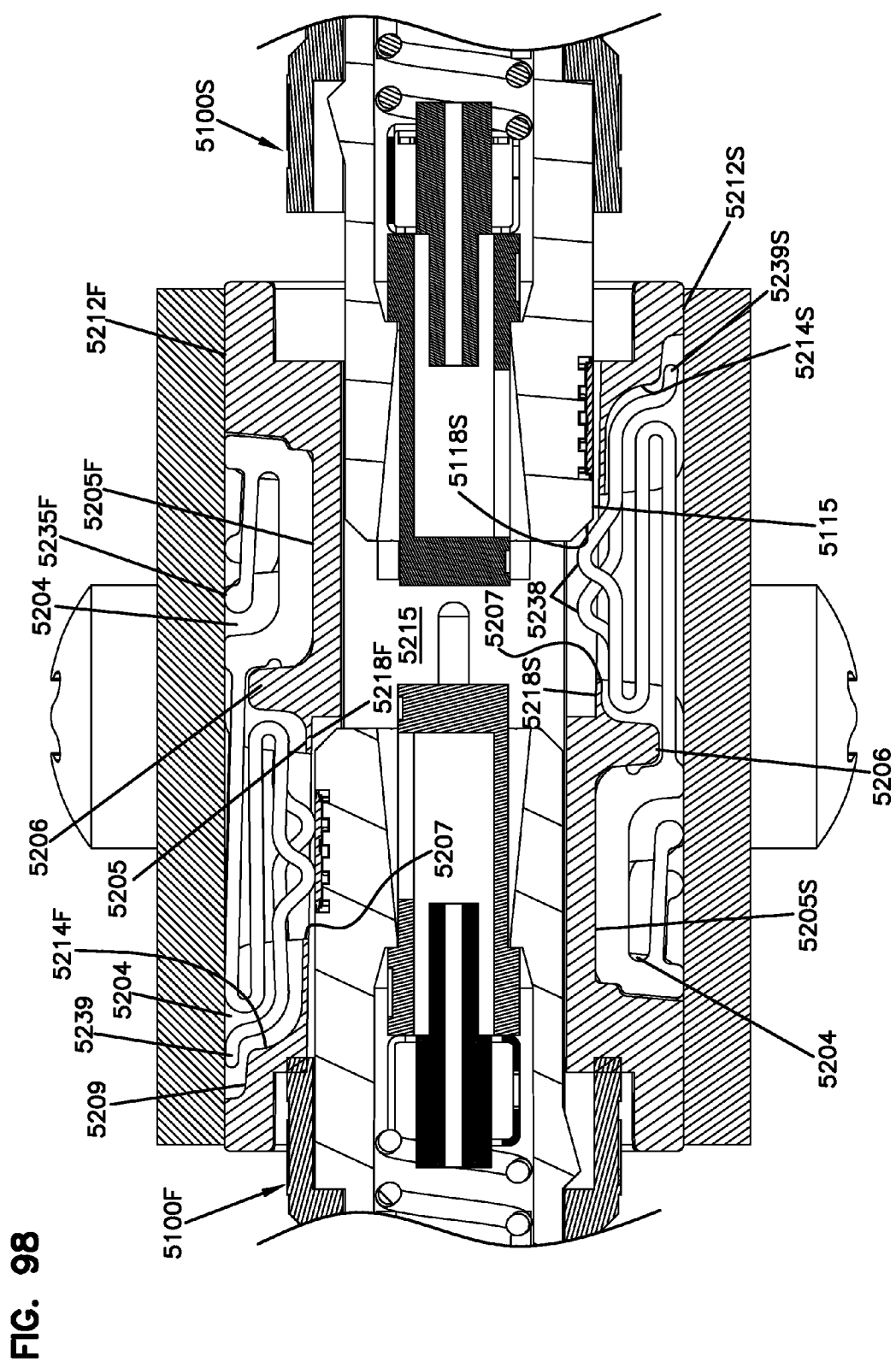
Figure 99:
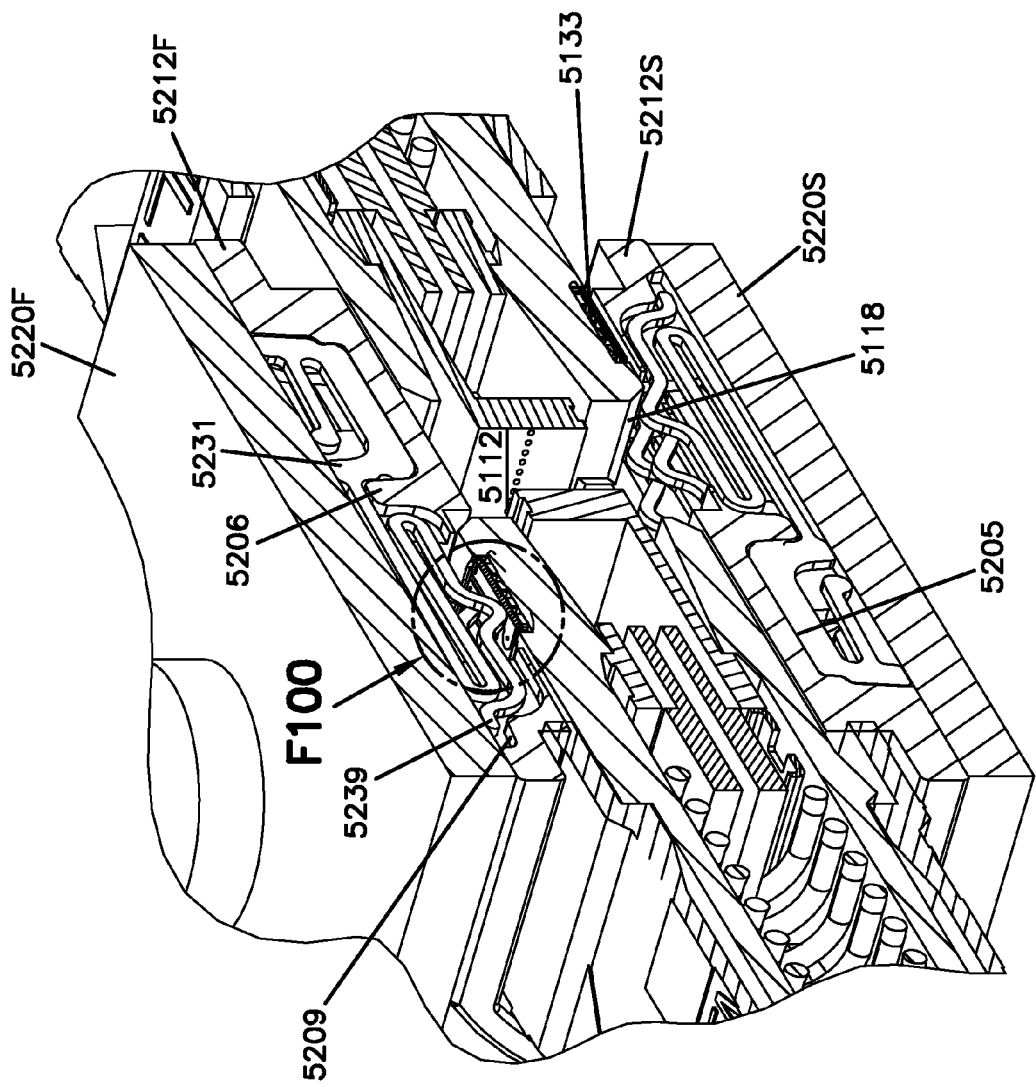

At least the first moveable contact location 5235 is aligned and configured to extend outwardly of the adapter housing 5210 through the slots 5214 to touch a first contact pad on the corresponding circuit board 5220 (e.g., see FIGS. 97-99). The ability of the first arm 5234 to flex relative to the legs 5242, 5243 provides tolerance for placement of the contact member 5231 relative to the circuit board 5220. In certain implementations, each of the legs 5242, 5243 defines a stationary contact location 5233 that also touches the first contact pad on the circuit board 5220. In one implementation, the stationary contacts 5233 and first moveable contact 5235 provide grounding of the contact member 5231.

In some implementations, the resilient section 5237 is implemented as a looped/bent section of the second arm 5236. In one implementation, the resilient section 5237 of the second arm 5236 is formed from one or more elongated sections connected by U-shaped bends. In other implementations, the second arm 5236 can otherwise include springs, reduced width sections, or portions formed from more resilient materials. In the example shown, the resilient section 5237 is formed from a first elongated section 5246 extending away from the second leg 5243, a second elongated section 5247 extending generally parallel to the first elongated section 5246 back towards the second leg 5243, and a third elongated section 5248 extending generally parallel to the first and second elongated sections 5246, 5247 and away from the second leg 5243.

The third elongated section 5248 includes a trough that defines the second contact location 5238. In certain implementations, the trough defining the second contact location 5238 is located at an intermediate portion of the third elongated section 5248. In one implementation, the trough defining the second contact location 5238 is located at about the center of the third elongated member 5248. A tail 5249 extends from the third elongated section 5248 to define the third contact location 5239. In some implementations, the tail 5249 is generally S-shaped. In other implementations, however, the tail 5249 may be C-shaped, J-shaped, U-shaped, L-shaped, or linear.

In some implementations, the body of the contact member 5231 extends between a first and second end. In the example shown in FIG. 94, the first leg 5242 is located at the first end and the third contact section 5239 is located at the second end. The contact member 5231 also extends between a top and a bottom. In some implementations, the contact surfaces of the first and third contact sections 5235, 5239 face and/or define the top of the contact member 5231 and the contact surface of the second contact section 5238 faces and/or defines the bottom of the contact member 5231. In the example shown, the first and third contact sections 5235, 5239 extend at least partially towards the top of the contact member 5231 and the second contact section 5238 extends towards the bottom of the contact member 5231. As used herein, the terms "top" and "bottom" are not meant to imply a proper orientation of the contact member 5231 or that the top of the contact member 5231 must be located above the bottom of the contact member 5231. Rather, the terms are used for ease in understanding and are assigned relative to the viewing plane of FIG. 94.

The contact member 5231 defines a body having a circumferential edge 5240 (FIG. 95) extending between planar major sides (FIG. 94). In certain implementations, the edge 5240 defines the contact surface of each contact section 5233, 5235, 5238, 5239 (see FIGS. 99-102). In some implementations, the edge 5240 has a substantially continuous thickness T2 (FIG. 95A). In various implementations, the thickness T2 ranges from about 0.05 inches to about 0.005 inches. In certain implementations, the thickness T2 is less than about 0.02 inches. In some implementation, the thickness T2 is less than about 0.012 inches. In another implementation, the thickness T2 is about 0.01 inches. In another implementation, the thickness T2 is about 0.009 inches. In another implementation, the thickness T2 is about 0.008 inches. In another implementation, the thickness T2 is about 0.007 inches. In another implementation, the thickness T2 is about 0.006 inches. In other implementations, the thickness T2 may vary across the body of the contact member 5231.

Portions of the planar surfaces of the contact member 5231 may increase and/or decrease in width. For example, in the example shown in FIG. 94, the base 5232 and legs 5242, 5243 are wider than either of the arms 5234, 5236. In certain implementations, the contact surface of the first contact section 5235 may be rounded or otherwise contoured. For example, in FIG. 94, the first contact section 5235 defines a bulbous tip. The second contact section 5238 defines a trough in the third elongated member 5248. The mounting sections 5244 define detents and protrusions in the planar surface of the base 5232.

In some implementations, the contact member 5231 is formed monolithically (e.g., from a continuous sheet of metal or other material). For example, in some implementations, the contact member 5231 may be manufactured by cutting a planar sheet of metal or other material. In other implementations, the contact member 5231 may be manufactured by etching a planar sheet of metal or other material. In other implementations, the contact member 5231 may be manufactured by laser trimming a planar sheet of metal or other material. In still other implementations, the contact member 5231 may be manufactured by stamping a planar sheet of metal or other material.

FIG. 97 shows a cross-sectional view of an MPO adapter housing 5210 defining a passage 5215 extending between the front and rear of the adapter 5210. The adapter housing 5210 is sandwiched between the first example circuit board 5220F and the second example circuit board 5220S via fasteners 5222. A first connector 5100F is fully inserted into the adapter passage 5215 from the front end of the adapter 5210 and a second connector 5100S is partially inserted into the adapter passage 5215 from the rear end of the adapter 5210. In some implementations, each of the connectors 5100F, 5100S includes a storage device 5130F, 5130S, respectively. In other implementations, only one of the connectors 5100F, 5100S includes a storage device.

The adapter housing 5210 defines at least a first slot 5214F extending through a top end 5212F of the adapter 5210 and at least a second slot 5214S extending through a bottom end 5212S of the adapter 5210. In some implementations, each end 5212F, 5212S of the adapter housing 5210 defines one slot 5214 that is configured to hold one or more contact members 5231. In other implementations, each end 5212F, 5212S of the adapter housing 5210 defines multiple slots 5214F, 5214S, which are each configured to hold one or more contact members 5231. The slots 5214F, 5214S extend at least part-way across the passage 5215. In the example shown, each slot 5214F, 5214S extends across a majority of the length of the passage 5215. In other implementations, each slot 5214F, 5214S may extend a greater or lesser distance across the passage 5215.

As discussed above, each adapter 5210 includes a first channel 5218F extending inwardly from a front connection end of the passage 5215 and a second channel 5218S extending inwardly from a rear connection end of the passage 5215. Each channel 5218F, 5218S is configured to accommodate the key 5215 of the respective connector 5100F, 5100S. In some implementations, each channel 5218F, 5218S extends about half-way through the passage 5215. In other implementations, each channel 5218F, 5218S extends a greater or lesser distance through the passage 5215. Each channel 5218F, 5218S is associated with one of the slots 5214F, 5214S. In some implementations, each channel 5218F, 5218S extends fully across the respective slot 5214F, 5214S. In other implementations, each channel 5218F, 5218S extends only partially across the respective slot 5214F, 5214S.

In some implementations, at least a portion of each slot 5214F, 5214S extends partially through the top and bottom ends 5212F, 5212S of the adapter 5210. For example, one or more portions of the slots 5214F, 5214S can extend through the respective ends 5212F, 5212S to recessed surfaces 5205 (FIG. 98). In certain implementations, at least a portion of each slot 5214F, 5214S is shallower than the rest of the slot 5214F, 5214S. For example, the first and second ends 5212F, 5212S may define support walls 5206 (FIG. 98) extending from the recessed surfaces 5205 towards the exterior of the ends 5212F, 5212S. At least a portion of the top and bottom ends 5212F, 5212S of the adapter 5210 define openings 5207 (FIG. 98) that connect the slots 5214F, 5214S to the associated channels 5218F, 5218S. At least a portion of the top and bottom ends 5212F, 5212S defines a shoulder 5209 at one end of each slot 5214F, 5214S.

A first media reading interface 5230F is positioned in the first slot 5214F and a second media reading interface 5230S is positioned in the second slot 5214B. In some implementations, each media reading interface 5230F, 5230S includes one or more contact members 5231 (see FIG. 94). The first support surface 5241 of the base 5232 of each contact member 5231 is seated on the recessed surface 5205 of each slot 5214F, 5214S. The second support surface 5245 of each contact member 5231 abuts a support wall 5206 in each slot 5214F, 5214S. The second contact location 5238 of each contact member 5231 aligns with the openings 5207 that connect the slots 5214F, 5214S to the channels 5218F, 5218S. The third contact location 5239 of each contact members 5237 is accommodated by the shoulder 5209 at the end of each slot 5214F, 5214S.

In the example shown, the contact members 5231 are staggered within the slots 5214F, 5214S. In other implementations, the contact members 5231 may be laterally aligned within the slots 5214F, 5214S. In some implementations, the first and second ends 5212F, 5212S of the adapter 5210 define intermediate walls that extend between pairs of adjacent contact members 5231. The intermediate walls inhibit contact between adjacent contact members 5231. In certain implementations, the intermediate walls extend fully between the adjacent contact members 5231. In other implementations, intermediate wall sections 5204 extend between portions of the adjacent contact members 5231.

In the example shown in FIG. 98, each slot 5214F, 5214S includes one or more intermediate wall sections 5204 between each pair of adjacent contact members 5231. For example, in certain implementations, an intermediate wall section 5204 in each slot 5214F, 5214S extends across the first leg 5242 of one or both contact members 5231 in each pair of adjacent contact members 5231 to aid in securing the contact member 5231 in the respective slot 5214F, 5214S (e.g., see intermediate wall section 5204 in slot 5214S in FIG. 98).

In some implementations, an intermediate wall section 5204 in each slot 5214F, 5214S extends across the first contact location 5235 of one or both contact members 5231 in each pair of adjacent contact members 5231 (e.g., see intermediate wall section 5204 in slot 5214F in FIG. 98). For example, the intermediate wall section 5204 may inhibit lateral bending of the first arm 5234 of one or more contact members 5231 within the slot 5214F, 5214S. In some implementations, the intermediate wall section 5204 extends across the first contact locations 5235 of alternating contact members 5231. In other implementations, the intermediate wall section 5204 is sufficiently wide to extend across the first contact locations 5235 of adjacent staggered contact member 5231. In still other implementations, the intermediate wall section 5204 may extend across the first contact locations 5235 of adjacent non-staggered contact members 5231.

In some implementations, an intermediate wall section 5204 extends across at least a portion of the second arm 5236 of one or both contact members 5231 in each pair of adjacent contact members 5231. In certain implementations, the intermediate wall section 5204 extends between the U-shaped bends joining the second and third elongated sections 5247, 5248 of the resilient sections 5237 of one or more contact members 5231 in the slot 5214F, 5214S. In certain implementations, the intermediate wall section 5204 extends across the second leg 5243 of one or both contact members 5231 in each pair of adjacent contact members 5231. In certain implementations, the support walls 5206 extend laterally between the intermediate walls 5204 (e.g., see FIG. 98).

In some implementations, an intermediate wall section 5204 extends across the third contact location 5239 of one or both contact members 5231 in each pair of adjacent contact members 5231. For example, the intermediate wall section 5204 may inhibit lateral bending of the tail 5239 of one or more contact members 5231 within the slot 5214F, 5214S. In certain implementations, the intermediate wall section 5204 extends between the U-shaped bends joining the first and second elongated sections 5246, 5247 of the resilient sections 5237 of one or more contact members 5231 in the slot 5214F, 5214S.

As discussed above, a processor (e.g., processor 217 of FIG. 2) or other such equipment also can be electrically coupled to the printed circuit boards 5220F, 5220S. Accordingly, the processor can communicate with the memory circuitry on the storage devices 5130F, 5130S via the contact members 5231 and the printed circuit boards 5220F, 5220S. In accordance with some aspects, the processor is configured to obtain physical layer information from the storage devices 5130F, 5130S. In accordance with other aspects, the processor is configured to write (e.g., new or revised) physical layer information to the storage devices 5130F, 5130S. In accordance with other aspects, the processor is configured to delete physical layer information to the storage device 5130F, 5130S. In one example implementation of a media reading interface 5230F, 5230S, at least a first contact member 5231 transfers power, at least a second contact member 5231 transfers data, and at least a third contact member 5231 provide grounding. However, any suitable number of contact members 5231 can be utilized within each media reading interfaces 5230F, 5230S.

In accordance with some aspects, the contact members 5231 are configured to selectively form a complete circuit with one or more of the printed circuit boards 5220. For example, each printed circuit board 5220 may include two contact pads for each contact member. In certain implementations, a first portion of each contact member 5231 touches a first of the contact pads and a second portion of each contact member 5231 selectively touches a second of the contact pads. The processor coupled to the circuit board 5220 may determine when the circuit is complete. Accordingly, the contact members 5231 can function as presence detection sensors for determining whether a media segment has been inserted into the passages 5215.

In certain implementations, the first moveable contact 5235 of each contact member is configured to contact one of the contact pads of the circuit board 5220. In one implementation, the first moveable contact location 5235 is configured to permanently touch the contact pad as long as the circuit board 5220 and contact member 5231 are assembled on the adapter 5210. The third contact location 5239 of certain types of contact members 5231 is configured to touch a second contact pad of the printed circuit board 5220 only when a segment of physical communications media (e.g., an MPO connector 5110) is inserted within an adapter passage 5215 and pushes the second contact location 5238 out of the channel 2218, which pushes the third contact location 5239 through the slot 5214 and against the circuit board 5220. In accordance with other aspects, the contact members 5231 are configured to form a complete circuit with the printed circuit board 5220 regardless of whether a media segment is received in the passage 5215.

For example, as shown in FIGS. 97 and 99, the stationary contacts 5233 and the first moveable contact location 5235 of each contact member 5231 are configured to extend through the respective slot 5214F, 5214S to touch contacts or tracings on the respective printed circuit board 5220F, 5220S mounted to the adapter end 5212A, 5212S defining the slot 5214F, 5214S. In certain implementations, the stationary contact 5233 and the first contact location 5235 touch the respective printed circuit board 5220F, 5220S regardless of whether or not a connector arrangement 5100F, 5100S has been inserted into the passage 5215.

The resilient section 5237 (FIG. 94) of each contact member 5231 is configured to bias the second contact location 5238 out of the respective slot 5214F, 5214S towards the respective channel 5218F, 5218S. For example, when a connector arrangement (e.g., see second connector arrangement 5100S of FIG. 97) is being inserted into the passage 5215 of the MPO adapter 5210, the key 5115 of the second connector arrangement 5110S slides within the second channel 5218S of the adapter 5210. When the second connector arrangement 5100S is at least partially within the passage 5215, the deflecting end 5118B of the key 5115 engages the second contact location 5238 of each contact member 5231 of the second media reading interface 5230S. Continuing to insert the connector arrangement 5100S biases the second contact locations 5238 from the second channel 5218S towards the second slot 5214S.

Figure 100:
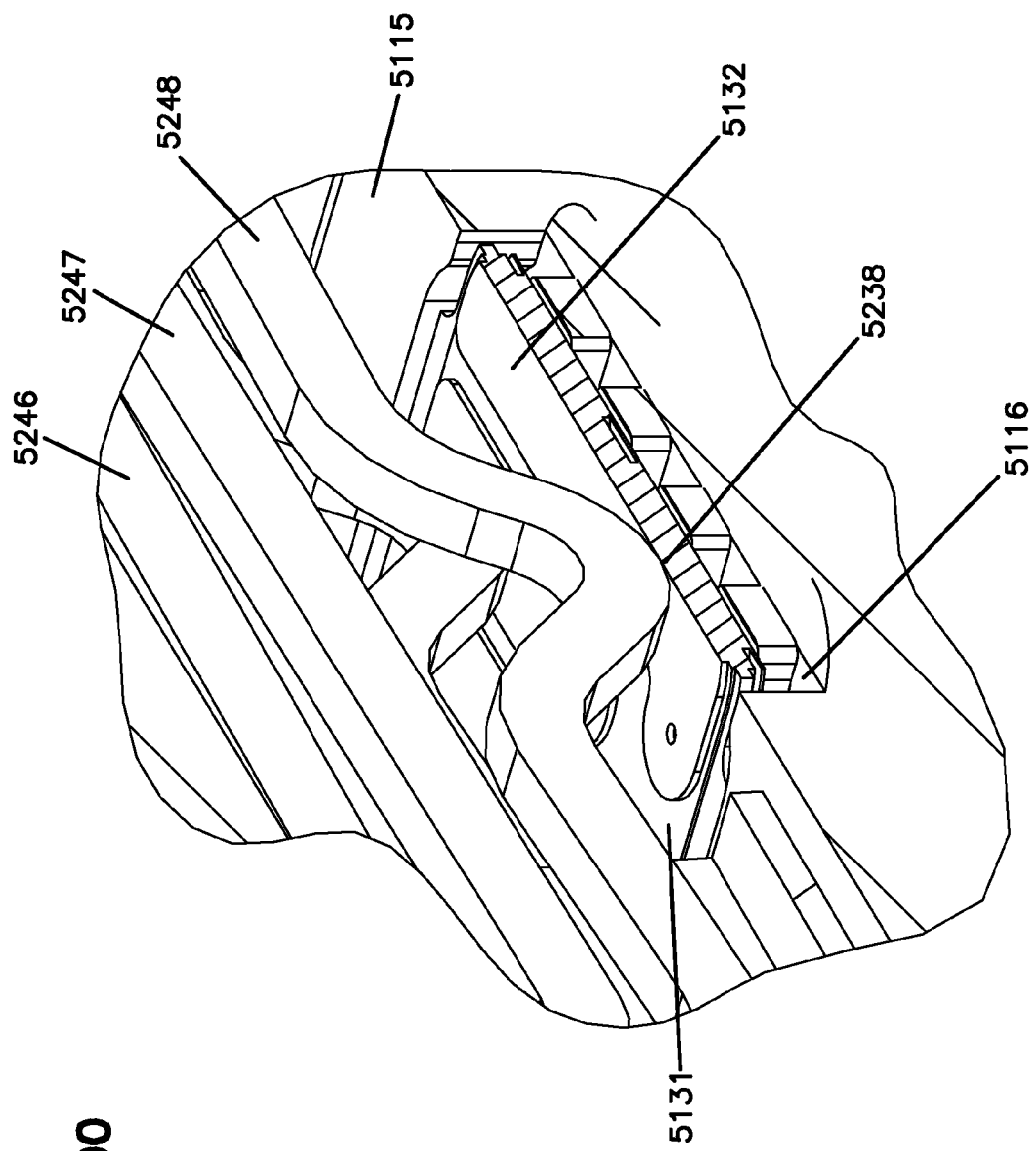

When a connector arrangement (e.g., see first connector arrangement 5100F of FIG. 97) has been fully inserted within the passage 5215 of the adapter 5210, the second contact locations 5238 of the contact members 5231 of the first media reading interface 5230F touch the contact members 5132 of the storage device 5130F of the first connector arrangement 5100F (e.g., see FIG. 100). In some implementations, the second contact locations 5238 touch the contacts 5132 of the storage device 5130F only when the first connector arrangement 5100F has been inserted completely within the passage 5215. In other implementations, the second contact locations 5238 touch the contacts 5132 of the storage device 5130F when the deflecting surface 5118 of the connector arrangement 5100 contacts the trough defined by the second arm 5236 of each contact member 5231.

The third contact location 5239 of each contact member 5231 is configured to be positioned initially within the shoulder section 5209 of the respective slot 5214F, 5214S of the adapter housing 5210. In some implementations, the distal end of the tail 5249 rests against the shoulder 5209 when a respective connector arrangement 5100F, 5100S is not within the passage 5215. In other implementations, the distal end of the tail 5249 is located between the shoulder 5209 and the respective printed circuit board 5220 when the respective connector arrangement 5100F, 5100S is not within the passage 5215.

The resilient section 5237 of each contact member 5231 is configured to bias the third contact location 5239 away from the shoulder 5209 and towards the respective circuit board 5220F, 5220S when the respective connector arrangement 5100F, 5100S or other media segment pushes against the second contact location 5238 (see FIGS. 98 and 100). For example, inserting an MPO connector (e.g., second connector arrangement 5110S) into the passage 5215 would cause the key 5115 of the second connector arrangement 5100S to push the second contact location 5238 toward the second circuit board 5220S, which would push the third contact location 5239 through the second slot 5214S and toward the second circuit board 5220S.

In accordance with some aspects, the contact members 5231 are configured to form a complete circuit with one or more of the printed circuit boards 5220F, 5220S only when a segment of physical communications media is inserted within the adapter passage 5215. For example, the third contact location 5239 of each contact member 5231 can be configured to contact the respective circuit board 5220F, 5220S only after being pushed through the respective slot 5214F, 5214S by the media segment. Accordingly, certain types of contact members 5231 function as presence detection sensors for determining whether a media segment has been inserted into the passages 5215.

In certain implementations, the resilient section 5237 of each contact member 5231 is configured to bias the third contact surface 5239 towards the circuit board 5220F, 5220S when the key of a connectorized media segment (e.g., MPO connectors 5100F, 5100S) is inserted into the passage 5215 regardless of whether a storage device 5130 is provided on or in the key 5115. In accordance with other aspects, the contact members 5231 are configured to form a complete circuit with the respective circuit board 5220F, 5220S regardless of whether a media segment is received in the passage 5215.

Figure 103:
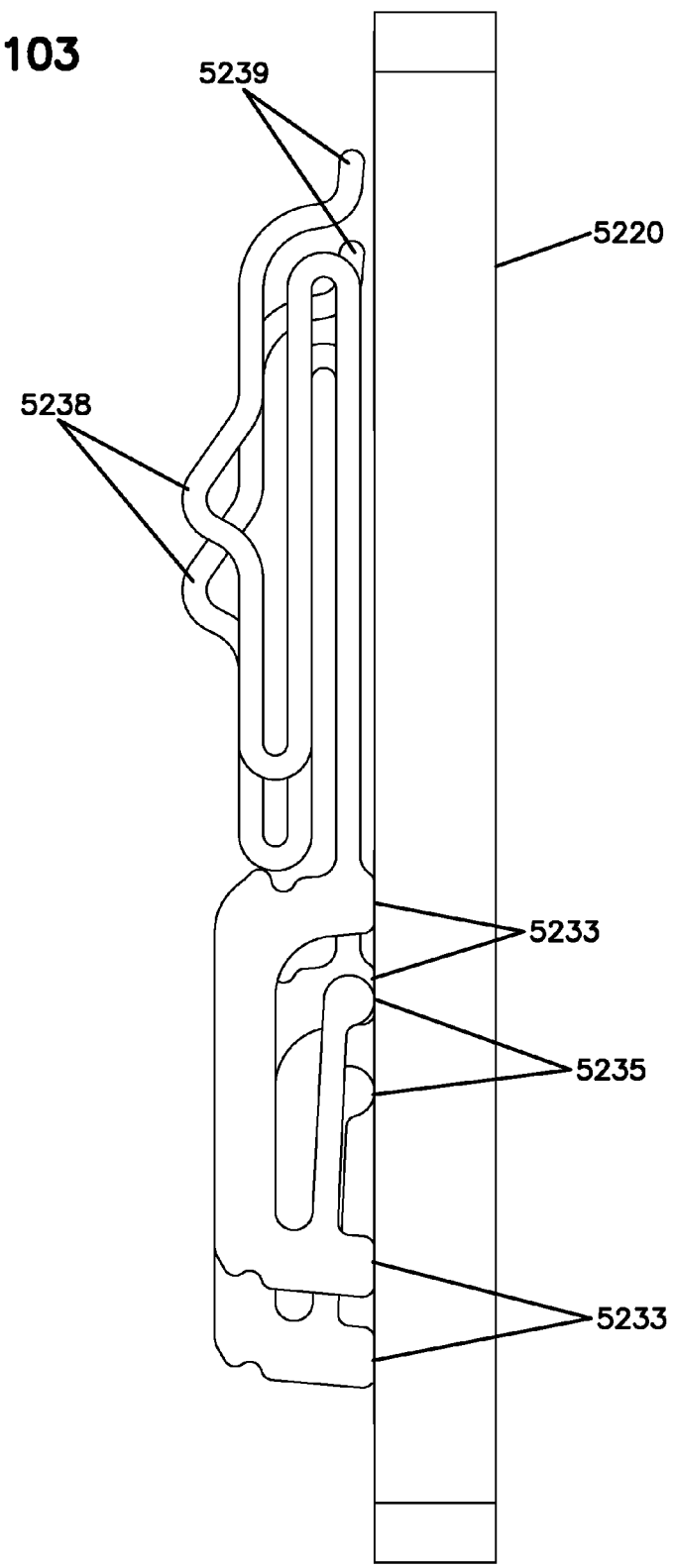

FIGS. 101-103 show one example implementation of the circuit board 5220 described above. The same or similar circuit boards 5220 are suitable for use in any of the coupler assemblies described herein. In some implementations, the circuit board 5220 defines fastener receiving openings 5227 through which fasteners 5222 may be inserted to secure the circuit board 5220. In certain implementations, the circuit board 5220 defines alignment openings 5226 in which alignment lugs 5216 are seated. The example circuit board 5220 includes a plurality of first contact pads 5223 and a plurality of second contact pads 5224 spaced from the first contact pads 5223. In certain implementations, the first contact pads 5223 are laterally aligned with each other and the second contact pads 5224 are laterally aligned with each other. In other implementations, however, the first contact pads 5223 may be laterally offset or staggered from each other and/or the second contact pads 5224 may be laterally offset of staggered from each other. In certain implementations, each of the first contact pads 5223 is longitudinally aligned with one of the second contact pads 5224 (see FIG. 102) to form a landing pair.

In other implementations, however, the first and second contact pads 5223, 5224 may be longitudinally offset from each other.

A media reading interface (e.g., media reading interface 5230) may be seated on the printed circuit board 5220. In the example shown, the first moveable contact surface 5235 of each contact member 5231 of the media reading interface 5230 touches one of the first contact pads 5223. In certain implementations, the stationary contacts 5223 also touch the first contact pads 5223. The third moveable contact surface 5239 of each contact member 5231 is configured to selectively touch the second contact pad 5224 that forms a landing pair with the first contact pad 5223. In certain implementations, at least a portion of the resilient section 5237 also selectively touches the second contact pad 5224 (see FIG. 98) when the third contact surface 5239 touches the second contact pad 5224.

Referring to FIGS. 104-107, dust caps 5250 can be used to protect passages 5215 of the adapter housings 5210 when connector arrangements 5100 or other physical media segments are not received within the passages 5215. For example, a dust cap 5250 can be configured to fit within a front entrance or a rear entrance of each adapter passage 5215. The dust caps 5250 are configured to inhibit the ingress of dust, dirt, or other contaminants into the passage 5215. In accordance with some implementations, the dust caps 5250 are configured not to trigger the presence sensor/switch of the adapter 5210.

Figure 104:
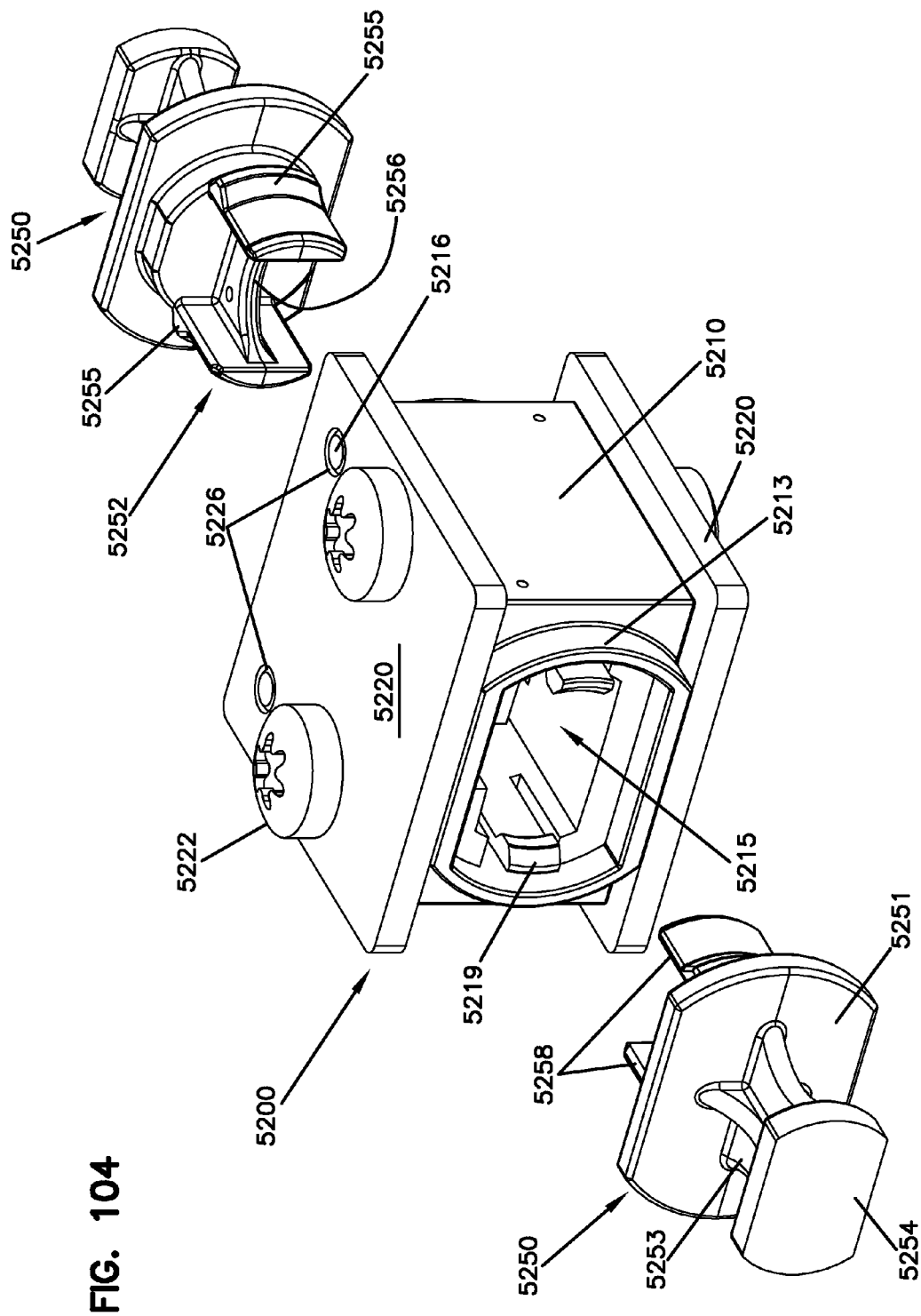
Figure 105:
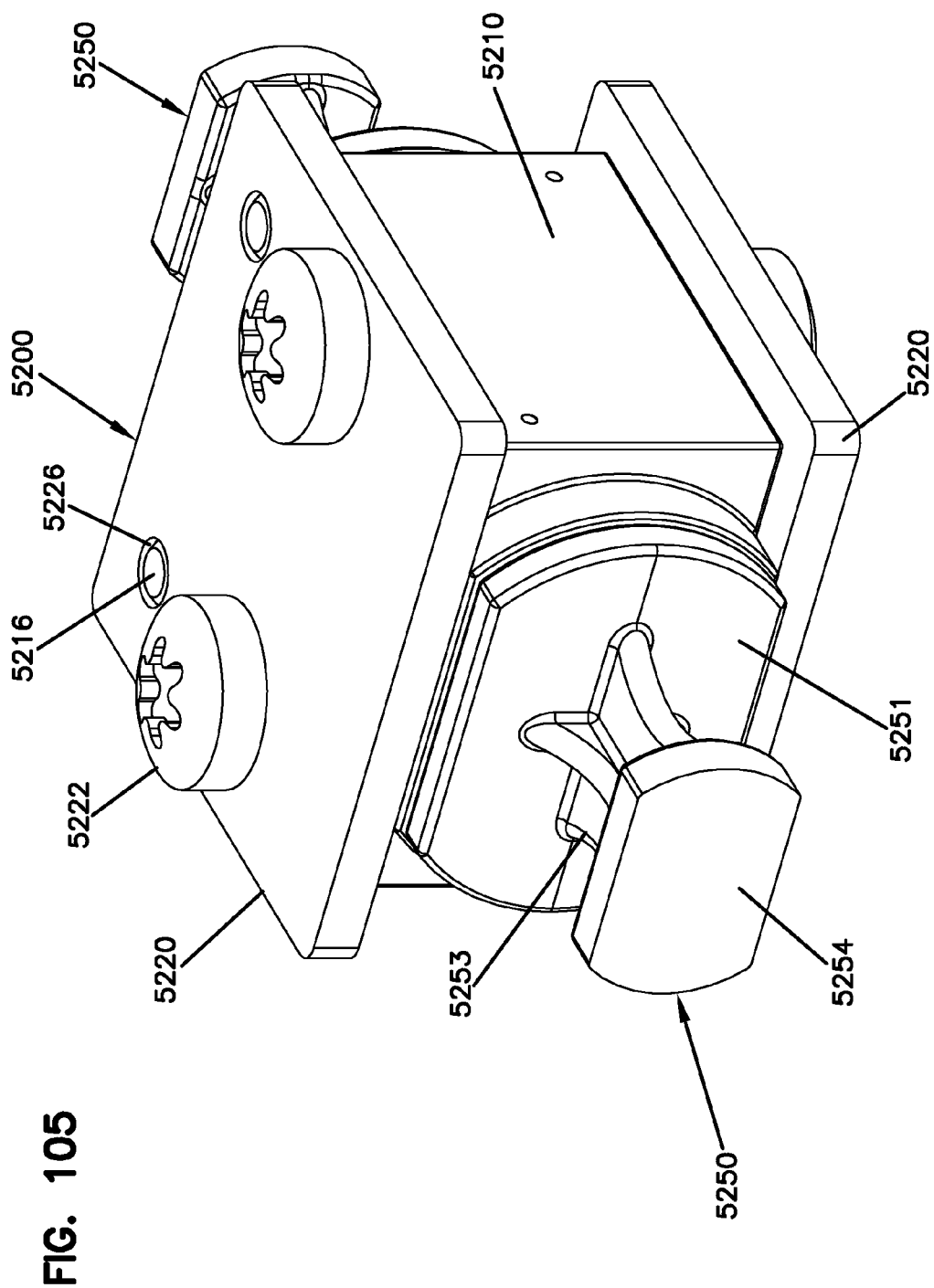
Figure 106:
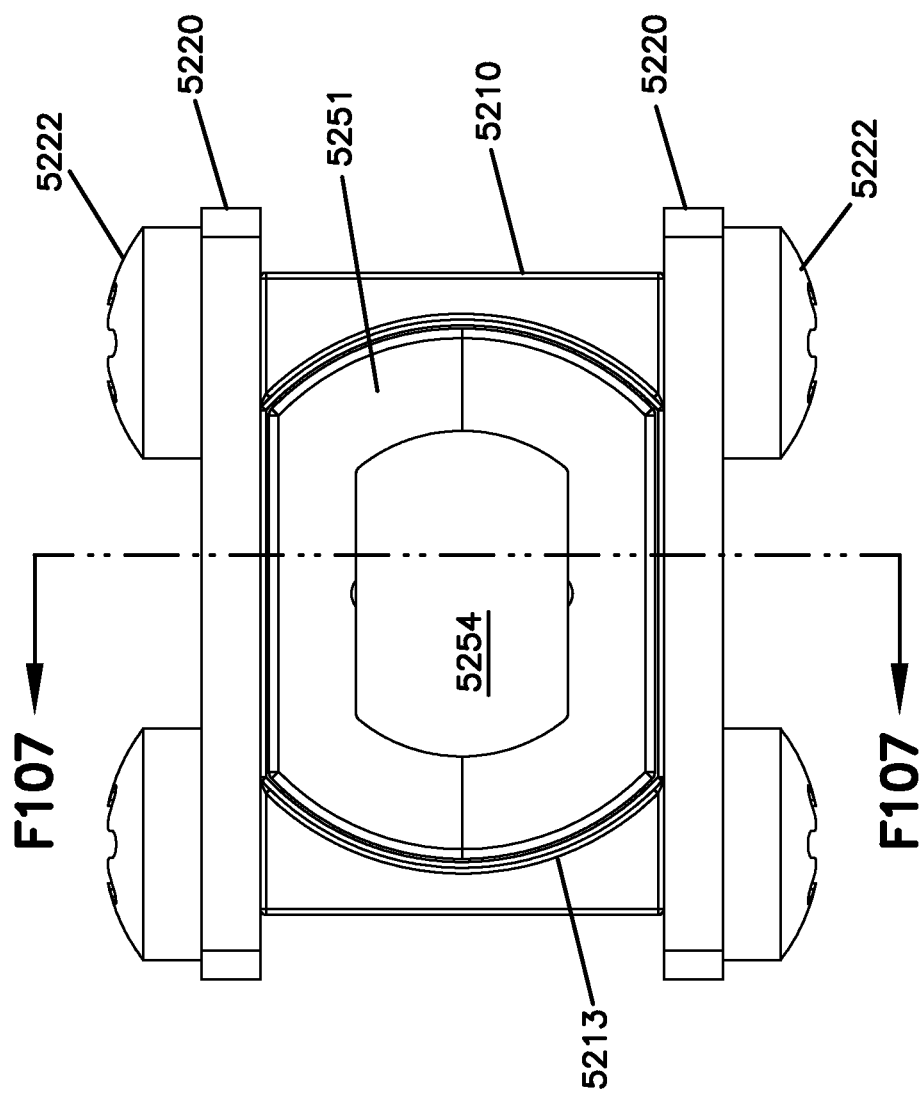

FIG. 104 shows one example implementation of an adapter dust cap 5250. The example dust cap 5250 includes a cover 5251 configured to fit over a mouth 5213 of the passage 5215. A handle including a stem 5253 and grip 5254 extend outwardly from a first side of the cover 5251. The handle facilitates insertion and withdrawal of the dust cap 5250 from the passage 5215. A retaining section 5252 extends outwardly from a second side of the cover 5251. The retaining section 5252 defines a concave contour 5256 extending between two fingers 5258. One or both fingers 5258 include lugs 5255 that are configured to interact with the flexible tabs 5219 of the adapter housing 5210 to retain the dust cap 5250 within the passage 5215. In the example shown, each lug 5255 defines a ramped surface.

Figure 107:
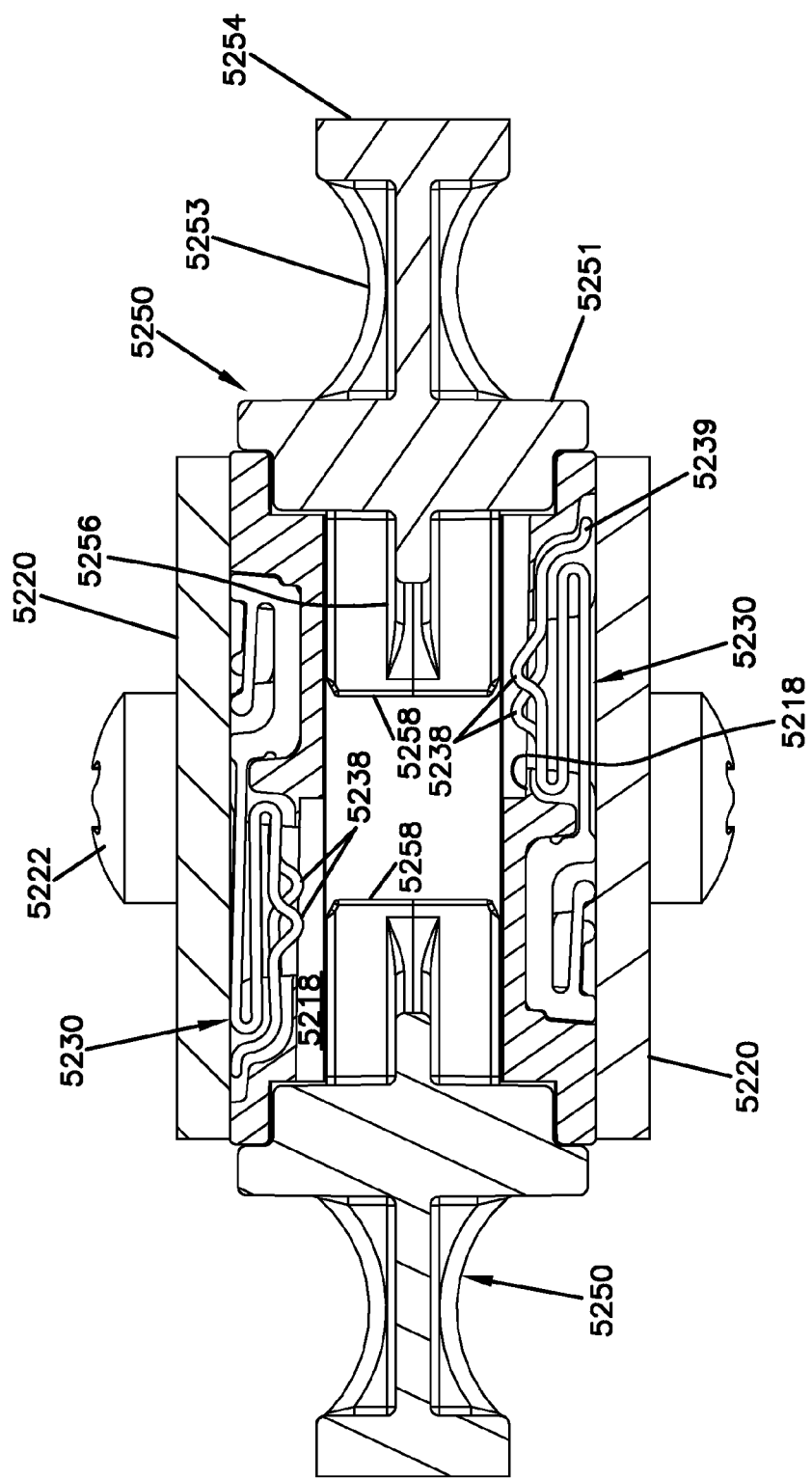

In some implementations, the retaining section 5252 is configured to fit within the passage 5215 without pressing against the second contact location 5238 of each contact member 5231 of the media reading interfaces 5230 (see FIG. 107). In the example shown, the fingers 5258 of the retaining section 5252 are sufficiently short to remain within the passage 5215 of the adapter 5210 instead of extending into the channels 5218. Insertion of the dust cap 5250 within the passage 5215 does not cause the third contact location 5239 to press against the printed circuit board 5220. Accordingly, insertion of the dust cap 5250 does not trigger the presence detection sensor/switch.

The above specification, examples and data provide a complete description of the manufacture and use of the composition of the invention. Since many implementations can be made without departing from the spirit and scope of the invention, the invention resides in the claims hereinafter appended.

The invention claimed is:

1. A fiber optic connector comprising:
a connector body configured to terminate at least one optical fiber, the connector body defining a key area; and
a storage device mounted to the connector body at the key area, the storage device including memory configured to store physical layer information, the storage device also including at least one contact member that is electrically connected to the memory, the storage device including at least three contact members, and the contact members of the storage device having at least two different lengths.

2. The fiber optic connector of claim 1, wherein the storage device is mounted within a cavity defined in the key area.

3. The fiber optic connector of claim 2, wherein the contact member is flush with a top of the key area when the storage device is mounted in the cavity.

4. The fiber optic connector of claim 2, wherein the cavity includes an outer ledge on which the storage device seats.

5. The fiber optic connector of claim 4, wherein the ledge is contoured to increase surface area of the ledge.

6. The fiber optic connector of claim 4, wherein the storage device includes a printed circuit board, wherein the memory is positioned at a first side of the printed circuit board and the contact member is positioned at a second side of the printed circuit board.

7. The fiber optic connector of claim 6, wherein the memory is an EEPROM chip that is accommodated within the cavity.

8. The fiber optic connector of claim 6, wherein a plurality of contact members are provided at the second side of the printed circuit board, each contact member being electrically connected to the memory.

9. The fiber optic connector of claim 1, wherein at least a portion of the storage device extends through a front edge of the key area.

10. The fiber optic connector of claim 9, wherein the contact member curves over the front edge of the key area.

11. The fiber optic connector of claim 1, wherein the storage device includes four contact members.

12. The fiber optic connector of claim 1, wherein the contact members of the storage device are staggered.

13. The fiber optic connector of claim 1, wherein at least portions of the contact members of the storage device extend in parallel strips.

14. The fiber optic connector of claim 1, wherein the connector body defines an LC connector.

15. The fiber optic connector of claim 1, wherein the connector body defines an MPO connector that is configured to terminate a plurality of optical fibers.

16. A connectorized optical fiber comprising:
an optical fiber having a first end;
a ferrule coupled to the first end of the optical fiber;
a connector body housing the ferrule, the connector body defining a key area; and
a storage device mounted to the connector body at the key area, the storage device including memory configured to store physical layer information pertaining to the connectorized optical fiber, the storage device also including a plurality of contact members that are electrically connected to the memory, the contact members of the storage device having at least two different lengths.

17. The connectorized optical fiber of claim 16, wherein the key area of the connector body defines a cavity and wherein the storage device is mounted within the cavity with the contact members facing outwardly from the key area.

18. The connectorized optical fiber of claim 17, wherein the cavity has an open top through which the contact members are accessible.

19. A fiber optic connector comprising:
a connector body configured to terminate at least one optical fiber, the connector body defining an opening leading to a cavity having an open top defined in the connector body; and a storage device positioned in the cavity defined in the connector body, the storage device including memory circuitry facing an interior of the cavity, the storage device also including a plurality of contact members at the open top of the cavity, the contact members being electrically connected to the memory circuitry, the contact members of the storage device having at least two different lengths.

20. The fiber optic connector of claim 19, wherein the contact members are about flush with an external surface of the connector body when the storage device is mounted in the cavity.

21. The fiber optic connector of claim 19, wherein the storage device includes a printed circuit board, and wherein the memory circuitry is positioned at a first side of the printed circuit board and the contact members are positioned at a second side of the printed circuit board.

22. The fiber optic connector of claim 21, wherein the cavity includes an outer ledge on which the first side of the printed circuit board seats.

23. The fiber optic connector of claim 22, wherein the outer ledge is contoured to increase surface area of the outer ledge.

24. The fiber optic connector of claim 21, wherein the memory circuitry is an EEPROM chip.

25. The fiber optic connector of claim 19, wherein the storage device includes at least three contact members.

26. The fiber optic connector of claim 25, wherein the storage device includes four contact members.

27. The fiber optic connector of claim 25, wherein at least portions of the contact members of the storage device extend in parallel strips.

28. The fiber optic connector of claim 19, wherein the contact members of the storage device are staggered.

29. The fiber optic connector of claim 19, wherein the connector body defines an LC connector.

30. The fiber optic connector of claim 19, wherein the connector body defines an MPO connector that is configured to terminate a plurality of optical fibers.

31. A connectorized optical fiber comprising:
an optical fiber having a first end;
a ferrule coupled to the first end of the optical fiber;
a connector body housing the ferrule, the connector body defining an open cavity; and
a storage device positioned in the cavity of the connector body, the storage device including memory configured to store physical layer information pertaining to the connectorized optical fiber, the storage device also including a plurality of contact members that are electrically connected to the memory, the contact members of the storage device having at least two different lengths.

32. The fiber optic connector of claim 31, wherein the storage device includes a printed circuit board, and wherein the memory circuitry is positioned at a first side of the printed circuit board and the contact members are positioned at a second side of the printed circuit board, the first side of the printed circuit board facing inwardly towards the cavity and the second side of the printed circuit board facing outwardly away from the cavity.

33. The fiber optic connector of claim 31, wherein the storage device includes at least three contact members.

34. The fiber optic connector of claim 31, wherein the storage device includes four contact members.

35. The fiber optic connector of claim 31, wherein the connector body is coupled to a second connector body using a non-removable clip to form a duplex connector arrangement.

* * * * *